United States Patent
Li et al.

(10) Patent No.: US 12,232,411 B2
(45) Date of Patent: *Feb. 18, 2025

(54) METAL COMPOUNDS, METHODS, AND USES THEREOF

(71) Applicant: ARIZONA BOARD OF REGENTS ON BEHALF OF ARIZONA STATE UNIVERSITY, Scottsdale, AZ (US)

(72) Inventors: Jian Li, Tempe, AZ (US); Guijie Li, Zhejiang (CN)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 202 days.

This patent is subject to a terminal disclaimer.

(21) Appl. No.: 17/385,968

(22) Filed: Jul. 27, 2021

(65) Prior Publication Data

US 2021/0391545 A1 Dec. 16, 2021

Related U.S. Application Data

(63) Continuation of application No. 16/834,229, filed on Mar. 30, 2020, now Pat. No. 11,114,626, which is a continuation of application No. 15/882,358, filed on Jan. 29, 2018, now Pat. No. 10,622,571, which is a continuation of application No. 14/430,454, filed as application No. PCT/US2013/061353 on Sep. 24, 2013, now Pat. No. 9,882,150.

(60) Provisional application No. 61/704,880, filed on Sep. 24, 2012.

(51) Int. Cl.
| | |
|---|---|
| *H01L 51/00* | (2006.01) |
| *C07F 15/00* | (2006.01) |
| *C09K 11/06* | (2006.01) |
| *H10K 85/30* | (2023.01) |
| *H10K 30/00* | (2023.01) |
| *H10K 50/11* | (2023.01) |
| *H10K 50/125* | (2023.01) |
| *H10K 101/10* | (2023.01) |

(52) U.S. Cl.
CPC ....... *H10K 85/346* (2023.02); *C07F 15/0086* (2013.01); *C09K 11/06* (2013.01); *C09K 2211/1007* (2013.01); *C09K 2211/1029* (2013.01); *C09K 2211/1033* (2013.01); *C09K 2211/1037* (2013.01); *C09K 2211/1044* (2013.01); *C09K 2211/1059* (2013.01); *C09K 2211/185* (2013.01); *H10K 30/00* (2023.02); *H10K 50/11* (2023.02); *H10K 50/125* (2023.02); *H10K 2101/10* (2023.02); *Y02E 10/549* (2013.01)

(58) Field of Classification Search
CPC .............. H10K 85/346; C07F 15/0086; C09K 2211/185

See application file for complete search history.

(56) References Cited

U.S. PATENT DOCUMENTS

| | | | |
|---|---|---|---|
| 4,769,292 A | 9/1988 | Tang | |
| 5,451,674 A | 9/1995 | Silver | |
| 5,641,878 A | 6/1997 | Dandliker | |
| 5,707,745 A | 1/1998 | Forrest | |
| 5,844,363 A | 12/1998 | Gu | |
| 6,200,695 B1 | 3/2001 | Arai | |
| 6,303,238 B1 | 10/2001 | Thompson | |
| 6,780,528 B2 | 8/2004 | Tsuboyama | |
| 7,002,013 B1 | 2/2006 | Chi | |
| 7,037,599 B2 | 5/2006 | Culligan | |
| 7,064,228 B1 | 6/2006 | Yu | |
| 7,268,485 B2 | 9/2007 | Tyan | |
| 7,279,704 B2 | 10/2007 | Walters | |
| 7,332,232 B2 | 2/2008 | Ma | |
| 7,442,797 B2 | 10/2008 | Itoh | |
| 7,501,190 B2 | 3/2009 | Ise | |
| 7,635,792 B1 | 12/2009 | Cella | |
| 7,655,322 B2 | 2/2010 | Forrest | |
| 7,854,513 B2 | 12/2010 | Quach | |
| 7,947,383 B2 | 5/2011 | Ise | |
| 8,106,199 B2 | 1/2012 | Jabbour | |
| 8,133,597 B2 | 3/2012 | Yasukawa | |
| 8,389,725 B2 | 3/2013 | Li | |
| 8,617,723 B2 | 12/2013 | Stoessel | |
| 8,669,364 B2 | 3/2014 | Li | |
| 8,778,509 B2 | 7/2014 | Yasukawa | |
| 8,816,080 B2 | 8/2014 | Li | |
| 8,846,940 B2 | 9/2014 | Li | |
| 8,871,361 B2 | 10/2014 | Xia | |
| 8,927,713 B2 | 1/2015 | Li | |
| 8,933,622 B2 | 1/2015 | Kawami | |
| 8,946,417 B2 | 2/2015 | Jian | |
| 8,987,451 B2 | 3/2015 | Tsai | |
| 9,059,412 B2 | 6/2015 | Zeng | |

(Continued)

FOREIGN PATENT DOCUMENTS

| | | |
|---|---|---|
| CN | 1680366 A | 10/2005 |
| CN | 1777663 | 5/2006 |

(Continued)

OTHER PUBLICATIONS

JP4460952 machine translation downloaded from Google patents Dec. 30, 2022, 21 pages.
U.S. Appl. No. 62/444,973, filed Jan. 11, 2017, Lichang Zeng, 36 pages. (Year: 2017).
Korean Office Action (with English translation) for App. No. KR10-2015-0104260, dated Jan. 12, 2022, 12 pages.
Tyler Fleetham, "Phosphorescent Pt(II) and Pd(II) Complexes for Efficient, High-Color-Quality, and Stable OLEDs", 52 pages, Material Science and Engineering, Arizona State University (Year: 2016).
Murakami; JP 2007324309, English machine translation from EPO, dated Dec. 13, 2007, 89 pages.

(Continued)

*Primary Examiner* — Alexander C Kollias
(74) *Attorney, Agent, or Firm* — Riverside Law LLP

(57) ABSTRACT

Disclosed herein are metal compounds useful in devices, such as, for example, OLEDs.

12 Claims, 1 Drawing Sheet

(56) References Cited

U.S. PATENT DOCUMENTS

| | | |
|---|---|---|
| 9,076,974 B2 | 7/2015 | Li |
| 9,082,989 B2 | 7/2015 | Li |
| 9,203,039 B2 | 12/2015 | Li |
| 9,221,857 B2 | 12/2015 | Li |
| 9,224,963 B2 | 12/2015 | Li |
| 9,238,668 B2 | 1/2016 | Li |
| 9,312,502 B2 | 4/2016 | Li |
| 9,312,505 B2 | 4/2016 | Brooks |
| 9,318,725 B2 | 4/2016 | Li |
| 9,324,957 B2 | 4/2016 | Li |
| 9,382,273 B2 | 7/2016 | Li |
| 9,385,329 B2 | 7/2016 | Li |
| 9,425,415 B2 | 8/2016 | Li |
| 9,461,254 B2 | 10/2016 | Tsai |
| 9,493,698 B2 | 11/2016 | Beers |
| 9,502,671 B2 | 11/2016 | Li |
| 9,550,801 B2 | 1/2017 | Li |
| 9,598,449 B2 | 3/2017 | Li |
| 9,617,291 B2 | 4/2017 | Li |
| 9,666,822 B2 | 5/2017 | Forrest |
| 9,673,409 B2 | 6/2017 | Li |
| 9,698,359 B2 | 7/2017 | Li |
| 9,711,739 B2 | 7/2017 | Li |
| 9,711,741 B2 | 7/2017 | Li |
| 9,711,742 B2 | 7/2017 | Li |
| 9,735,397 B2 | 8/2017 | Riegel |
| 9,755,163 B2 | 9/2017 | Li |
| 9,818,959 B2 | 11/2017 | Li |
| 9,865,825 B2 | 1/2018 | Li |
| 9,879,039 B2 | 1/2018 | Li |
| 9,882,150 B2* | 1/2018 | Li ................. C09K 11/06 |
| 9,899,614 B2 | 2/2018 | Li |
| 9,920,242 B2 | 3/2018 | Li |
| 9,923,155 B2 | 3/2018 | Li |
| 9,941,479 B2 | 4/2018 | Li |
| 9,947,881 B2 | 4/2018 | Li |
| 9,985,224 B2 | 5/2018 | Li |
| 10,020,455 B2 | 7/2018 | Li |
| 10,033,003 B2 | 7/2018 | Li |
| 10,056,564 B2 | 8/2018 | Li |
| 10,056,567 B2 | 8/2018 | Li |
| 10,158,091 B2 | 12/2018 | Li |
| 10,177,323 B2 | 1/2019 | Li |
| 10,211,411 B2 | 2/2019 | Li |
| 10,211,414 B2 | 2/2019 | Li |
| 10,263,197 B2 | 4/2019 | Li |
| 10,294,417 B2 | 5/2019 | Li |
| 10,392,387 B2 | 8/2019 | Li |
| 10,411,202 B2 | 9/2019 | Li |
| 10,414,785 B2 | 9/2019 | Li |
| 10,516,117 B2 | 12/2019 | Li |
| 10,566,553 B2 | 2/2020 | Li |
| 10,566,554 B2 | 2/2020 | Li |
| 10,622,571 B2* | 4/2020 | Li ................. C07F 15/0086 |
| 10,836,785 B2 | 11/2020 | Li |
| 11,114,626 B2* | 9/2021 | Li ................. H10K 85/346 |
| 2001/0019782 A1 | 9/2001 | Igarashi |
| 2002/0068190 A1 | 6/2002 | Tsuboyama |
| 2003/0062519 A1 | 4/2003 | Yamazaki |
| 2003/0180574 A1 | 9/2003 | Huang |
| 2003/0186077 A1* | 10/2003 | Chen ................. H10K 85/636 313/506 |
| 2004/0230061 A1 | 11/2004 | Seo |
| 2005/0037232 A1 | 2/2005 | Tyan |
| 2005/0139810 A1 | 6/2005 | Kuehl |
| 2005/0170207 A1 | 8/2005 | Ma |
| 2005/0260446 A1 | 11/2005 | Mackenzie |
| 2006/0024522 A1 | 2/2006 | Thompson |
| 2006/0032528 A1 | 2/2006 | Wang |
| 2006/0066228 A1 | 3/2006 | Antoniadis |
| 2006/0073359 A1 | 4/2006 | Ise |
| 2006/0094875 A1 | 5/2006 | Itoh |
| 2006/0127696 A1 | 6/2006 | Stossel |
| 2006/0182992 A1 | 8/2006 | Nii |
| 2006/0202197 A1 | 9/2006 | Nakayama |
| 2006/0210831 A1 | 9/2006 | Sano |
| 2006/0255721 A1 | 11/2006 | Igarashi |
| 2006/0263635 A1 | 11/2006 | Ise |
| 2006/0286406 A1 | 12/2006 | Igarashi |
| 2007/0057630 A1 | 3/2007 | Nishita |
| 2007/0059551 A1 | 3/2007 | Yamazaki |
| 2007/0082284 A1 | 4/2007 | Stoessel |
| 2007/0103060 A1* | 5/2007 | Itoh ................. H10K 85/346 313/504 |
| 2007/0160905 A1 | 7/2007 | Morishita |
| 2007/0252140 A1 | 11/2007 | Limmert |
| 2008/0001530 A1 | 1/2008 | Ise |
| 2008/0036373 A1 | 2/2008 | Itoh |
| 2008/0054799 A1 | 3/2008 | Satou |
| 2008/0079358 A1 | 4/2008 | Satou |
| 2008/0102310 A1 | 5/2008 | Thompson |
| 2008/0111476 A1 | 5/2008 | Choi |
| 2008/0241518 A1 | 10/2008 | Satou |
| 2008/0241589 A1 | 10/2008 | Fukunaga |
| 2008/0269491 A1 | 10/2008 | Jabbour |
| 2008/0315187 A1 | 12/2008 | Bazan |
| 2009/0026936 A1 | 1/2009 | Satou |
| 2009/0026939 A1 | 1/2009 | Kinoshita |
| 2009/0032989 A1 | 2/2009 | Karim |
| 2009/0039768 A1 | 2/2009 | Igarashi |
| 2009/0079340 A1 | 3/2009 | Kinoshita |
| 2009/0126796 A1 | 5/2009 | Yang |
| 2009/0128008 A1 | 5/2009 | Ise |
| 2009/0136779 A1 | 5/2009 | Cheng |
| 2009/0153045 A1 | 6/2009 | Kinoshita |
| 2009/0167167 A1 | 7/2009 | Aoyama |
| 2009/0205713 A1 | 8/2009 | Mitra |
| 2009/0218561 A1 | 9/2009 | Kitamura |
| 2009/0261721 A1 | 10/2009 | Murakami |
| 2009/0267500 A1 | 10/2009 | Kinoshita |
| 2010/0000606 A1 | 1/2010 | Thompson |
| 2010/0013386 A1 | 1/2010 | Thompson |
| 2010/0043876 A1 | 2/2010 | Tuttle |
| 2010/0093119 A1 | 4/2010 | Shimizu |
| 2010/0127246 A1 | 5/2010 | Nakayama |
| 2010/0141127 A1 | 6/2010 | Xia |
| 2010/0147386 A1 | 6/2010 | Benson-Smith |
| 2010/0171111 A1 | 7/2010 | Takada |
| 2010/0171418 A1 | 7/2010 | Kinoshita |
| 2010/0200051 A1 | 8/2010 | Triani |
| 2010/0204467 A1 | 8/2010 | Lamarque |
| 2010/0270540 A1 | 10/2010 | Chung |
| 2010/0288362 A1 | 11/2010 | Hatwar |
| 2010/0297522 A1 | 11/2010 | Creeth |
| 2010/0301315 A1 | 12/2010 | Masui |
| 2010/0307594 A1 | 12/2010 | Zhu |
| 2011/0028723 A1 | 2/2011 | Li |
| 2011/0049496 A1 | 3/2011 | Fukuzaki |
| 2011/0062858 A1 | 3/2011 | Yersin |
| 2011/0132440 A1 | 6/2011 | Sivarajan |
| 2011/0217544 A1 | 9/2011 | Young |
| 2011/0227058 A1 | 9/2011 | Masui |
| 2011/0301351 A1 | 12/2011 | Li |
| 2012/0024383 A1 | 2/2012 | Kaiho |
| 2012/0025588 A1 | 2/2012 | Humbert |
| 2012/0039323 A1 | 2/2012 | Hirano |
| 2012/0095232 A1 | 4/2012 | Li |
| 2012/0108806 A1 | 5/2012 | Li |
| 2012/0146012 A1 | 6/2012 | Limmert |
| 2012/0181528 A1 | 7/2012 | Takada |
| 2012/0199823 A1 | 8/2012 | Molt |
| 2012/0202997 A1 | 8/2012 | Parham |
| 2012/0204960 A1 | 8/2012 | Kato |
| 2012/0215001 A1 | 8/2012 | Li |
| 2012/0223634 A1 | 9/2012 | Xia |
| 2012/0264938 A1 | 10/2012 | Li |
| 2012/0273736 A1 | 11/2012 | James |
| 2012/0302753 A1 | 11/2012 | Li |
| 2013/0048963 A1 | 2/2013 | Beers |
| 2013/0082245 A1 | 4/2013 | Kottas |
| 2013/0137870 A1 | 5/2013 | Li |
| 2013/0168656 A1 | 7/2013 | Tsai |
| 2013/0172561 A1 | 7/2013 | Tsai |
| 2013/0200340 A1 | 8/2013 | Otsu |

(56) References Cited

U.S. PATENT DOCUMENTS

| | | |
|---|---|---|
| 2013/0203996 A1 | 8/2013 | Li |
| 2013/0237706 A1 | 9/2013 | Li |
| 2013/0341600 A1 | 12/2013 | Lin |
| 2014/0014922 A1 | 1/2014 | Lin |
| 2014/0014931 A1 | 1/2014 | Riegel |
| 2014/0027733 A1 | 1/2014 | Zeng |
| 2014/0042475 A1 | 2/2014 | Park |
| 2014/0066628 A1 | 3/2014 | Li |
| 2014/0073798 A1 | 3/2014 | Li |
| 2014/0084261 A1 | 3/2014 | Brooks |
| 2014/0114072 A1 | 4/2014 | Li |
| 2014/0147996 A1 | 5/2014 | Vogt |
| 2014/0148594 A1 | 5/2014 | Li |
| 2014/0191206 A1 | 7/2014 | Cho |
| 2014/0203248 A1 | 7/2014 | Zhou |
| 2014/0249310 A1 | 9/2014 | Li |
| 2014/0326960 A1 | 11/2014 | Kim |
| 2014/0330019 A1 | 11/2014 | Li |
| 2014/0364605 A1 | 12/2014 | Li |
| 2015/0008419 A1 | 1/2015 | Li |
| 2015/0018558 A1 | 1/2015 | Li |
| 2015/0028323 A1 | 1/2015 | Xia |
| 2015/0060804 A1 | 3/2015 | Kanitz |
| 2015/0069334 A1 | 3/2015 | Xia |
| 2015/0105556 A1 | 4/2015 | Li |
| 2015/0123047 A1 | 5/2015 | Maltenberger |
| 2015/0162552 A1 | 6/2015 | Li |
| 2015/0194616 A1 | 7/2015 | Li |
| 2015/0207086 A1 | 7/2015 | Li |
| 2015/0228914 A1 | 8/2015 | Li |
| 2015/0274762 A1 | 10/2015 | Li |
| 2015/0287938 A1 | 10/2015 | Li |
| 2015/0311456 A1 | 10/2015 | Li |
| 2015/0318500 A1 | 11/2015 | Li |
| 2015/0349279 A1 | 12/2015 | Li |
| 2015/0380666 A1 | 12/2015 | Szigethy |
| 2016/0028028 A1 | 1/2016 | Li |
| 2016/0028029 A1 | 1/2016 | Li |
| 2016/0043331 A1 | 2/2016 | Li |
| 2016/0072082 A1 | 3/2016 | Brooks |
| 2016/0133861 A1 | 5/2016 | Li |
| 2016/0133862 A1 | 5/2016 | Li |
| 2016/0181529 A1 | 6/2016 | Tsai |
| 2016/0194344 A1 | 7/2016 | Li |
| 2016/0197285 A1 | 7/2016 | Zeng |
| 2016/0197291 A1 | 7/2016 | Li |
| 2016/0204358 A1 | 7/2016 | Stoessel |
| 2016/0285015 A1 | 9/2016 | Li |
| 2016/0359120 A1 | 12/2016 | Li |
| 2016/0359125 A1 | 12/2016 | Li |
| 2017/0005278 A1 | 1/2017 | Li |
| 2017/0012224 A1 | 1/2017 | Li |
| 2017/0040555 A1 | 2/2017 | Li |
| 2017/0047533 A1 | 2/2017 | Li |
| 2017/0066792 A1 | 3/2017 | Li |
| 2017/0069855 A1 | 3/2017 | Li |
| 2017/0077420 A1 | 3/2017 | Li |
| 2017/0125708 A1 | 5/2017 | Li |
| 2017/0267923 A1 | 9/2017 | Li |
| 2017/0271611 A1 | 9/2017 | Li |
| 2017/0301871 A1 | 10/2017 | Li |
| 2017/0305881 A1 | 10/2017 | Li |
| 2017/0309943 A1 | 10/2017 | Angell |
| 2017/0331056 A1 | 11/2017 | Li |
| 2017/0342098 A1 | 11/2017 | Li |
| 2017/0373260 A1 | 12/2017 | Li |
| 2018/0006246 A1 | 1/2018 | Li |
| 2018/0013096 A1 | 1/2018 | Hamada |
| 2018/0037812 A1 | 2/2018 | Pegington |
| 2018/0052366 A1 | 2/2018 | Hao |
| 2018/0053904 A1 | 2/2018 | Li |
| 2018/0062084 A1 | 3/2018 | Watabe |
| 2018/0130960 A1 | 5/2018 | Li |
| 2018/0138428 A1 | 5/2018 | Li |
| 2018/0148464 A1 | 5/2018 | Li |
| 2018/0159051 A1 | 6/2018 | Li |
| 2018/0166655 A1 | 6/2018 | Li |
| 2018/0175329 A1 | 6/2018 | Li |
| 2018/0194790 A1 | 7/2018 | Li |
| 2018/0198081 A1 | 7/2018 | Zeng |
| 2018/0219161 A1 | 8/2018 | Li |
| 2018/0226592 A1 | 8/2018 | Li |
| 2018/0226593 A1 | 8/2018 | Li |
| 2018/0277777 A1 | 9/2018 | Li |
| 2018/0301641 A1 | 10/2018 | Li |
| 2018/0312750 A1 | 11/2018 | Li |
| 2018/0331307 A1 | 11/2018 | Li |
| 2018/0334459 A1 | 11/2018 | Li |
| 2018/0337345 A1 | 11/2018 | Li |
| 2018/0337349 A1 | 11/2018 | Li |
| 2018/0337350 A1 | 11/2018 | Li |
| 2018/0353771 A1 | 12/2018 | Kim |
| 2019/0013485 A1 | 1/2019 | Li |
| 2019/0058137 A1 | 2/2019 | Ko |
| 2019/0067602 A1 | 2/2019 | Li |
| 2019/0109288 A1 | 4/2019 | Li |
| 2019/0119312 A1 | 4/2019 | Chen |
| 2019/0157352 A1 | 5/2019 | Li |
| 2019/0194536 A1 | 6/2019 | Li |
| 2019/0221757 A1 | 7/2019 | Tarran |
| 2019/0259963 A1 | 8/2019 | Li |
| 2019/0276485 A1 | 9/2019 | Li |
| 2019/0312217 A1 | 10/2019 | Li |
| 2019/0367546 A1 | 12/2019 | Li |
| 2019/0389893 A1 | 12/2019 | Li |
| 2020/0006678 A1 | 1/2020 | Li |
| 2020/0055885 A1 | 2/2020 | Tarran |
| 2020/0071330 A1 | 3/2020 | Li |
| 2020/0075868 A1 | 3/2020 | Li |
| 2020/0119288 A1 | 4/2020 | Li |
| 2020/0119289 A1 | 4/2020 | Lin |
| 2020/0140471 A1 | 5/2020 | Chen |
| 2020/0152891 A1 | 5/2020 | Li |
| 2020/0227656 A1 | 7/2020 | Li |
| 2020/0227660 A1 | 7/2020 | Li |
| 2020/0239505 A1 | 7/2020 | Li |
| 2020/0243776 A1 | 7/2020 | Li |
| 2020/0287153 A1 | 9/2020 | Li |
| 2020/0332185 A1 | 10/2020 | Li |
| 2020/0373505 A1 | 11/2020 | Li |
| 2020/0403167 A1 | 12/2020 | Li |
| 2021/0024526 A1 | 1/2021 | Li |
| 2021/0024559 A1 | 1/2021 | Li |
| 2021/0047296 A1 | 2/2021 | Li |
| 2021/0091316 A1 | 3/2021 | Li |
| 2021/0292351 A1 | 9/2021 | Macinnis |

FOREIGN PATENT DOCUMENTS

| | | |
|---|---|---|
| CN | 1894267 | 1/2007 |
| CN | 1894269 A | 1/2007 |
| CN | 101142223 A | 3/2008 |
| CN | 101667626 | 3/2010 |
| CN | 102449108 A | 5/2012 |
| CN | 102892860 A | 1/2013 |
| CN | 102971396 A | 3/2013 |
| CN | 103102372 | 5/2013 |
| CN | 104232076 A | 12/2014 |
| CN | 104377231 | 2/2015 |
| CN | 104576934 | 4/2015 |
| CN | 104693243 A | 6/2015 |
| CN | 105367605 A | 3/2016 |
| CN | 105418591 A | 3/2016 |
| CN | 106783922 | 5/2017 |
| EP | 1617493 | 1/2006 |
| EP | 1808052 A1 | 7/2007 |
| EP | 1874893 A1 | 1/2008 |
| EP | 1874894 A1 | 1/2008 |
| EP | 1919928 A1 | 5/2008 |
| EP | 1968131 | 9/2008 |
| EP | 2020694 | 2/2009 |
| EP | 2036907 A1 | 3/2009 |
| EP | 2096690 | 9/2009 |
| EP | 2112213 A2 | 10/2009 |

(56) References Cited

FOREIGN PATENT DOCUMENTS

| | | |
|---|---|---|
| EP | 2417217 A2 | 2/2012 |
| EP | 2684932 | 1/2014 |
| EP | 2711999 A2 | 3/2014 |
| EP | 3032293 | 6/2016 |
| JP | 2002010505 | 1/2002 |
| JP | 2002105055 | 4/2002 |
| JP | 2003342284 | 12/2003 |
| JP | 2005031073 | 2/2005 |
| JP | 2005267557 | 9/2005 |
| JP | 2005310733 A | 11/2005 |
| JP | 2006047240 A | 2/2006 |
| JP | 2006232784 A | 9/2006 |
| JP | 2006242080 | 9/2006 |
| JP | 2006242081 A | 9/2006 |
| JP | 2006256999 A | 9/2006 |
| JP | 2006257238 A | 9/2006 |
| JP | 2006261623 A | 9/2006 |
| JP | 2006290988 A | 10/2006 |
| JP | 2006313796 A | 11/2006 |
| JP | 2006332622 A | 12/2006 |
| JP | 2006351638 A | 12/2006 |
| JP | 2007019462 A | 1/2007 |
| JP | 2007031678 | 2/2007 |
| JP | 2007042875 A | 2/2007 |
| JP | 2007051243 A | 3/2007 |
| JP | 2007053132 A | 3/2007 |
| JP | 2007066581 | 3/2007 |
| JP | 2007073620 A | 3/2007 |
| JP | 2007073845 A | 3/2007 |
| JP | 2007073900 A | 3/2007 |
| JP | 2007080593 | 3/2007 |
| JP | 2007080677 A | 3/2007 |
| JP | 2007088105 | 4/2007 |
| JP | 2007088164 A | 4/2007 |
| JP | 2007096259 A | 4/2007 |
| JP | 2007099765 A | 4/2007 |
| JP | 2007110067 | 4/2007 |
| JP | 2007110102 A | 4/2007 |
| JP | 2007519614 | 7/2007 |
| JP | 2007258550 A | 10/2007 |
| JP | 2007324309 | 12/2007 |
| JP | 2008010353 A | 1/2008 |
| JP | 2008091860 A | 4/2008 |
| JP | 2008103535 A | 5/2008 |
| JP | 2008108617 A | 5/2008 |
| JP | 2008109085 | 5/2008 |
| JP | 2008109103 A | 5/2008 |
| JP | 2008116343 A | 5/2008 |
| JP | 2008117545 A | 5/2008 |
| JP | 2008160087 A | 7/2008 |
| JP | 2008198801 A | 8/2008 |
| JP | 2008270729 A | 11/2008 |
| JP | 2008270736 | 11/2008 |
| JP | 2008310220 A | 12/2008 |
| JP | 2009016184 A | 1/2009 |
| JP | 2009016579 | 1/2009 |
| JP | 2009032977 A | 2/2009 |
| JP | 2009032988 A | 2/2009 |
| JP | 2009059997 | 3/2009 |
| JP | 2009076509 | 4/2009 |
| JP | 2009161524 A | 7/2009 |
| JP | 2009247171 | 10/2009 |
| JP | 2009266943 A | 11/2009 |
| JP | 2009267171 A | 11/2009 |
| JP | 2009267244 A | 11/2009 |
| JP | 2009272339 A | 11/2009 |
| JP | 2009283891 A | 12/2009 |
| JP | 4460952 | 5/2010 |
| JP | 2010135689 A | 6/2010 |
| JP | 2010171205 A | 8/2010 |
| JP | 2011071452 A | 4/2011 |
| JP | 2012074444 A | 4/2012 |
| JP | 2012079895 A | 4/2012 |
| JP | 2012079898 A | 4/2012 |
| JP | 5604505 | 9/2012 |
| JP | 2012522843 | 9/2012 |
| JP | 2012207231 A | 10/2012 |
| JP | 2012222255 A | 11/2012 |
| JP | 2012231135 A | 11/2012 |
| JP | 2013023500 A | 2/2013 |
| JP | 2013048256 A | 3/2013 |
| JP | 2013053149 A | 3/2013 |
| JP | 2013525436 | 6/2013 |
| JP | 2014019701 A | 2/2014 |
| JP | 2014058504 A | 4/2014 |
| JP | 2014520096 | 8/2014 |
| JP | 2012709899 | 11/2014 |
| JP | 2014221807 A | 11/2014 |
| JP | 2014239225 A | 12/2014 |
| JP | 2015081257 A | 4/2015 |
| KR | 20060011537 | 2/2006 |
| KR | 20060015371 | 2/2006 |
| KR | 20060115371 | 11/2006 |
| KR | 20070061830 | 6/2007 |
| KR | 20070112465 | 11/2007 |
| KR | 20130043460 | 4/2013 |
| KR | 101338250 | 12/2013 |
| KR | 20140052501 | 5/2014 |
| TW | 200701835 | 1/2007 |
| TW | 201249851 | 12/2012 |
| TW | 201307365 A | 2/2013 |
| TW | 201710277 | 3/2017 |
| WO | 0070655 A2 | 11/2000 |
| WO | 2000070655 | 11/2000 |
| WO | 2004003108 | 1/2004 |
| WO | 2004070655 | 8/2004 |
| WO | 2004085450 | 10/2004 |
| WO | 2004108857 | 12/2004 |
| WO | 2005042444 A2 | 5/2005 |
| WO | 2005042550 A1 | 5/2005 |
| WO | 2005113704 | 12/2005 |
| WO | 2006033440 A1 | 3/2006 |
| WO | 2006067074 | 6/2006 |
| WO | 2006081780 | 8/2006 |
| WO | 2006098505 A1 | 9/2006 |
| WO | 2006113106 | 10/2006 |
| WO | 2006115299 A1 | 11/2006 |
| WO | 2006115301 | 11/2006 |
| WO | 2007034985 A1 | 3/2007 |
| WO | 2007069498 A1 | 6/2007 |
| WO | 2008054578 | 5/2008 |
| WO | 2008066192 A1 | 6/2008 |
| WO | 2008066195 A1 | 6/2008 |
| WO | 2008066196 A1 | 6/2008 |
| WO | 2008101842 A1 | 8/2008 |
| WO | 2008117889 | 10/2008 |
| WO | 2008123540 | 10/2008 |
| WO | 2008131932 A1 | 11/2008 |
| WO | 2009003455 | 1/2009 |
| WO | 2009008277 | 1/2009 |
| WO | 2009011327 | 1/2009 |
| WO | 2009017211 A1 | 2/2009 |
| WO | 2009023667 | 2/2009 |
| WO | 2009086209 | 7/2009 |
| WO | 2009111299 | 9/2009 |
| WO | 2010007098 A1 | 1/2010 |
| WO | 2010056669 | 5/2010 |
| WO | 2010093176 | 8/2010 |
| WO | 2010105141 | 9/2010 |
| WO | 2010118026 A2 | 10/2010 |
| WO | 2011064335 A1 | 6/2011 |
| WO | 2011070989 A1 | 6/2011 |
| WO | 2011089163 | 7/2011 |
| WO | 2011137429 A2 | 11/2011 |
| WO | 2011137431 A2 | 11/2011 |
| WO | 2012074909 | 6/2012 |
| WO | 2012112853 A1 | 8/2012 |
| WO | 2012116231 | 8/2012 |
| WO | 2012142387 | 10/2012 |
| WO | 2012162488 A1 | 11/2012 |
| WO | 2012163471 A1 | 12/2012 |
| WO | 2013130483 A1 | 9/2013 |
| WO | 2014009310 | 1/2014 |
| WO | 2014016611 | 1/2014 |

(56) References Cited

FOREIGN PATENT DOCUMENTS

| WO | 2014031977 | 2/2014 |
|---|---|---|
| WO | 2014047616 A1 | 3/2014 |
| WO | 2014109814 | 7/2014 |
| WO | 2014208271 | 12/2014 |
| WO | 2015027060 A1 | 2/2015 |
| WO | 2015131158 | 9/2015 |
| WO | 2016025921 | 2/2016 |
| WO | 2016029137 | 2/2016 |
| WO | 2016029186 | 2/2016 |
| WO | 2016088354 A1 | 6/2016 |
| WO | 2016197019 | 12/2016 |
| WO | 2017117935 | 7/2017 |
| WO | 2018071697 | 4/2018 |
| WO | 2018140765 | 8/2018 |
| WO | 2019079505 | 4/2019 |
| WO | 2019079508 | 4/2019 |
| WO | 2019079509 | 4/2019 |
| WO | 2019236541 | 12/2019 |
| WO | 2020018476 | 1/2020 |

OTHER PUBLICATIONS

Dorwald; "Side Reactions in Organic Synthesis: A Guide to Successful Synthesis Design," Chapter 1, 2005 Wiley-VCH Verlag Gmbh & Co. KGaA, Wienheim, 32 pages.
Marc Lepeltier et al., "Efficient blue green organic light-emitting devices based on a monofluorinated heteroleptic iridium(III) complex," Synthetic Metals, vol. 199, 2015, pp. 139-146.
JP2009267244, English Translation from EPO, Nov. 2009, 80 pages.
JP2010135689, English translation from EPO, dated Jun. 2010, 95 pages.
Chi et al.; Transition-metal phosphors with cyclometalating ligands: fundamentals and applications, Chemical Society Reviews, vol. 39, No. 2, Feb. 2010, pp. 638-655.
Satake et al., "Interconvertible Cationic and Neutral Pyridinylimidazole η3-Allylpalladium Complexes. Structural Assignment by 1H, 13C, and 15N NMR and X-ray Diffraction", Organometallics, vol. 18, No. 24, 1999, pp. 5108-5111.
Baldo et al., "Very high-efficiency green organic light-emitting devices based on electrophosphorescence," Applied Physics Letters, vol. 75, No. 1, Jul. 5, 1999, pp. 4-6.
Baldo et al., "Highly Efficient Phosphorescent Emission from Organic Electroluminescent Devices," Nature, vol. 395, Sep. 10, 1998, pp. 151-154.
Xiao-Chu Hang et al., "Highly Efficient Blue-Emitting Cyclometalated Platinum(II) Complexes by Judicious Molecular Design," Angewandte Chemie, International Edition, vol. 52, Issue 26, Jun. 24, 2013, pp. 6753-6756.
Ying Yang et al., "Induction of Circularly Polarized Electroluminescence from an Achiral Light-Emitting Polymer via a Chiral Small-Molecule Dopant," Advanced Materials, vol. 25, Issue 18, May 14, 2013, pp. 2624-2628.
Barry O'Brien et al.: White organic light emitting diodes using Pt-based red, green and blue phosphorescent dopants. Proc. SPIE, vol. 8829, pp. 1-6, Aug. 25, 2013.
Ayan Maity et al., "Room-temperature synthesis of cyclometalated iridium(III) complexes; kinetic isomers and reactive functionalities" Chem. Sci., vol. 4, pp. 1175-1181 (2013).
Shizuo Tokito et al. "Confinement of triplet energy on phosphorescent molecules for highly-efficient organic blue-light-emitting devices" Applied Physics Letters, vol. 83, No. 3, Jul. 21, 2003, pp. 569-571.
Vanessa Wood et al., "Colloidal quantum dot light-emitting devices," Nano Reviews 1, Jul. 2010, pp. 5202. (7 pages).
Glauco Ponterini et al., "Comparison of Radiationless Decay Processes in Osmium and Platinum Porphyrins," J. Am. Chem. Soc., vol. 105, No. 14, 1983, pp. 4639-4645.
Brian W. D'Andrade et al., "Controlling Exciton Diffusion in Multilayer White Phosphorescent Organic Light Emitting Devices", Adv. Mater., vol. 14, No. 2, Jan. 16, 2002, pp. 147-151.

Dileep A. K. Vezzu et al., "Highly Luminescent Tetradentate Bis-Cyclometalated Platinum Complexes: Design, Synthesis, Structure, Photophysics, and Electroluminescence Application," Inorg. Chem., vol. 49, 2010, pp. 5107-5119.
Evan L. Williams et al., "Excimer-Based White Phosphorescent Organic Light Emitting Diodes with Nearly 100% Internal Quantum Efficiency," Adv. Mater., vol. 19, 2007, pp. 197-202.
Shih-Chun Lo et al. "High-Triplet-Energy Dendrons: Enhancing the Luminescence of Deep Blue Phosphorescent Indium(III) Complexes" J. Am. Chem. Soc.,vol. 131, 2009, pp. 16681-16688.
Jan Kalinowski et al., "Light-emitting devices based on organometallic platinum complexes as emitters," Coordination Chemistry Reviews, vol. 255, 2011, pp. 2401-2425.
Ke Feng et al., "Norbornene-Based Copolymers Containing Platinum Complexes and Bis(carbazolyl)benzene Groups in Their Side-Chains," Macromolecules, vol. 42, 2009, pp. 6855-6864.
Chi-Ming Che et al. "Photophysical Properties and OLEO Applications of Phosphorescent Platinum(II) Schiff Base Complexes," Chem. Eur. J., vol. 16, 2010, pp. 233-247.
Stephen R. Forrest, "The path to ubiquitous and low-cost organic electronic appliances on plastic," Nature, vol. 428, Apr. 29, 2004, pp. 911-918.
Nicholas R. Evans et al., "Triplet Energy Back Transfer in Conjugated Polymers with Pendant Phosphorescent Iridium Complexes," J. Am. Chem. Soc., vol. 128, 2006, pp. 6647-6656.
Xiaofan Ren et al., "Ultrahigh Energy Gap Hosts in Deep Blue Organic Electrophosphorescent Devices," Chem. Mater., vol. 16, 2004, pp. 4743-4747.
Jeonghun Kwak et al., "Bright and Efficient Full-Color Colloidal Quantum Dot Light-Emitting Diodes Using an Inverted Device Structure," Nano Letters 12, Apr. 2, 2012, pp. 2362-2366.
Hirohiko Fukagawa et al., "Highly Efficient and Stable Red Phosphorescent Organic Light-Emitting Diodes Using Platinum Complexes," Adv. Mater., 2012, vol. 24, pp. 5099-5103.
Eric Turner et al., "Cyclometalated Platinum Complexes with Luminescent Quantum Yields Approaching 100%," Inorg. Chem., 2013, vol. 52, pp. 7344-7351.
Steven C. F. Kui et al., "Robust Phosphorescent Platinum(II) Complexes Containing Tetradentate O/\N/\C/\N Ligands: Excimeric Excited State and Application in Organic White-Light-Emitting Diodes," Chem. Eur. J., 2013, vol. 19, pp. 69-73.
Steven C. F. Kui et al., "Robust phosphorescent platinum(II) complexes with tetradentate O/\N/\C/\N ligands: high efficiency OLEDs with excellent efficiency stability," Chem. Commun., 2013, vol. 49, pp. 1497-1499.
Kai Li et al., "Light-emitting platinum(II) complexes supported by tetradentate dianionic bis(N-heterocyclic carbene) ligands: towards robust blue electrophosphors," Chem. Sci., 2013, vol. 4, pp. 2630-2644.
Pui Keong Chow et al., "Strongly Phosphorescent Palladium(II) Complexes of Tetradentate Ligands with Mixed Oxygen, Carbon, and Nitrogen Donor Atoms: Photophysics, Photochemistry, and Applications," Angew. Chem. Int. Ed. 2013, 52, 11775-11779.
Pui-Keong Chow et al., "Highly luminescent palladium(II) complexes with sub-millisecond blue to green phosphorescent excited states. Photocatalysis and highly efficient PSF-OLEDs," Chem. Sci., 2016, 7, 6083-6098.
Guijie Li et al., "Modifying Emission Spectral Bandwidth of Phosphorescent Platinum(II) Complexes Through Synthetic Control," Inorg. Chem. 2017, 56, 8244-8256.
Tyler Fleetham et al., "Efficient Red-Emitting Platinum Complex with Long Operational Stability," ACS Appl. Mater. Interfaces 2015, 7, 16240-16246.
Supporting Information: Xiao-Chun Hang et al., "Highly Efficient Blue-Emitting Cyclometalated Platinum(II) Complexes by Judicious Molecular Design," Wiley-VCH 2013, 7 pages.
Russell J. Holmes et al., "Blue and Near-UV Phosphorescence from Iridium Complexes with Cyclometalated Pyrazolyl or N-Heterocyclic Carbene Ligands," Inorganic Chemistry, 2005, vol. 44, No. 22, pp. 7995-8003.
Guijie Li et al., "Efficient and stable red organic light emitting devices from a tetradentate cyclometalated platinum complex," Organic Electronics, 2014, vol. 15 pp. 1862-1867.

(56) References Cited

OTHER PUBLICATIONS

Guijie Li et al., Efficient and Stable White Organic Light-Emitting Diodes Employing a Single Emitter, Adv. Mater., 2014, vol. 26, pp. 2931-2936.

Barry O'Brien et al., "High efficiency white organic light emitting diodes employing blue and red platinum emitters," Journal of Photonics for Energy, vol. 4, 2014, pp. 043597-1-043597-8.

Tyler Fleetham et al., "Efficient "pure" blue OLEDs employing tetradentate Pt complexes with a narrow spectral bandwidth," Advanced Materials (Weinheim, Germany), Vo. 26, No. 41, 2014, pp. 7116-7121.

Zhi-Qiang Zhu et.al., "Harvesting All Electrogenerated Excitons through Metal Assisted Delayed Fluorescent Materials," Adv. Mater. 27 (2015) 2533-2537.

Zhi-Qiang Zhu et. al., "Efficient Cyclometalated Platinum(II) Complex with Superior Operational Stability," Adv. Mater. 29 (2017) 1605002, pp. 1-5.

Maestri et al., "Absorption Spectra and Luminescence Properties of Isomeric Platinum (II) and Palladium (II) Complexes Containing 1,1'-Biphenyldiyl, 2-Phenylpyridine, and 2,2'-Bipyridine as Ligands," Helvetica Chimica Acta, vol. 71, Issue 5, Aug. 10, 1988, pp. 1053-1059.

Notice of Allowability dated Jan. 13, 2021 for U.S. Appl. No. 15/947,092 (pp. 1-4).

Office Action dated Feb. 4, 2021 for U.S. Appl. No. 16/481,179 (pp. 1-17).

Corrected Notice of Allowance dated Feb. 23, 2021 for U.S. Appl. No. 15/905,385 (pp. 1-3).

Notice of Allowance dated Feb. 25, 2021 for U.S. Appl. No. 16/668,010 (pp. 1-7).

Office Action dated Mar. 17, 2021 for U.S. Appl. No. 17/008,762 (pp. 1-11).

Office Action dated Mar. 17, 2021 for U.S. Appl. No. 16/739,480 (pp. 1-16).

Office Action dated Mar. 11, 2021 for U.S. Appl. No. 15/487,476 (pp. 1-9).

Notice of Allowance dated May 7, 2021 for U.S. Appl. No. 16/834,229 (pp. 1-8).

Notice of Allowance dated Apr. 19, 2021 for U.S. Appl. No. 15/984,036 (pp. 1-7).

Office Action dated May 3, 2021 for U.S. Appl. No. 15/845,575 (pp. 1-18).

Office Action dated May 14, 2021 for U.S. Appl. No. 16/481,179 (pp. 1-13).

Notice of Allowance dated Jul. 8, 2021 for U.S. Appl. No. 16/739,480 (pp. 1-10).

Notice of Allowance dated Jun. 30, 2020 for U.S. Appl. No. 15/882,267 (pp. 1-7).

Office Action dated Jun. 30, 2020 for U.S. Appl. No. 15/984,036 (pp. 1-21).

Notice of Allowance dated Dec. 10, 2020 for U.S. Appl. No. 15/905,385 (pp. 1-8).

Notice of Allowance dated Dec. 23, 2020 for U.S. Appl. No. 15/947,092 (pp. 1-7).

Notice of Allowance dated Oct. 8, 2020 for U.S. Appl. No. 16/043,908 (pp. 1-7).

Notice of Allowance dated Sep. 16, 2020 for U.S. Appl. No. 16/031,517 (pp. 1-8).

Office Action dated Nov. 2, 2020 for U.S. Appl. No. 15/487,476 (pp. 1-20).

Office Action dated Nov. 25, 2020 for U.S. Appl. No. 16/739,480 (pp. 1-15).

Office Action dated Oct. 20, 2020 for U.S. Appl. No. 16/668,010 (pp. 1-9).

Office Action dated Oct. 26, 2020 for U.S. Appl. No. 15/984,036 (pp. 1-21).

Office Action dated Sep. 16, 2020 for U.S. Appl. No. 15/947,092 (pp. 1-13).

Office Action dated Sep. 25, 2020 for U.S. Appl. No. 15/845,575 (pp. 1-19).

Written Opinion mailed on Aug. 17, 2012 for Intl. Pat. App. No. PCT/US2012/039323 filed May 24, 2012 and published as WO 2012/162488 on Nov. 29, 2012 (Applicants—Arizona Board of Regents Acting for and on Behalf of Arizona State University; Inventors—Li et al.; (6 pages).

Office Action dated Jan. 29, 2021 for U.S. Appl. No. 16/834,229 (pp. 1-15).

Office Action dated Dec. 23, 2020 for U.S. Appl. No. 17/008,762 (pp. 1-6).

Notice of Allowance dated Jul. 21, 2021 for U.S. Appl. No. 15/845,575 (pp. 1-10).

Office Action and Search Report (including English translation) for Taiwan Patent Application No. 101113338, dated Sep. 7, 2015, 7 pages.

Non Final Rejection was issued on Dec. 6, 2016 by the U.S. Patent and Trademark Office for U.S. Appl. No. 14/421,634, which was filed Feb. 13, 2015 and published asUS 2015-0207086 A1 on Jul. 23, 2015 (Inventor-Li et al) (6 pages).

Notice of Allowance issued on Apr. 17, 2014 for U.S. Appl. No. 13/399,252, filed Feb. 17, 2012 and granted as U.S. Pat. No. 8,816,080 on Aug. 26, 2014 (Inventor—Li, et al.) (9 pages).

Final Rejection was issued on Mar. 10, 2016 by the U.S. Patent and Trademark Office for U.S. Appl. No. 14/421,634, which was filed Feb. 13, 2015 and published asUS 2015-0207086 A1 on Jul. 23, 2015(Inventor-Li et al) (6 pages).

International Preliminary Report on Patentability issued on Nov. 26, 2013 for Intl. Pat. App. No. PCT/US2012/039323 filed May 24, 2012 and published as WO 2012/162488 on Nov. 29, 2012 (Applicants—Arizona Board of Regents Acting for and on Behalf of Arizona State University; Inventors—Li et al.; (7 pages).

Office Action dated Jan. 24, 2020 for U.S. Appl. No. 15/984,036 (pp. 1-24).

U.S. Appl. No. 16/751,561, filed Jan. 24, 2020, has not yet published. Inventor: Li.

U.S. Appl. No. 16/751,586, filed Jan. 24, 2020, has not yet published. Inventor: Li et al.

Shiro Koseki et al., "Spin-orbit coupling analyses of the geometrical effects on phosphorescence in Ir(ppy)3 and its derivatives", J. Phys. Chem. C, vol. 117, pp. 5314-5327 (2013).

Ji Hyun Seo et al., "Efficient blue-green organic light-emitting diodes based on heteroleptic tris-cyclometalated iridium (III) complexes". Thin Solid Films, vol. 517, pp. 1807-1810 (2009).

Ivaylo Ivanov et al., "Comparison of the INDO band structures of polyacetylene, polythiophene, polyfuran, and polypyrrole," Synthetic Metals, vol. 116, Issues 1-3, Jan. 1, 2001, pp. 111-114.

Xin Li et al., "Density functional theory study of photophysical properties of iridium (III) complexes with phenylisoquinoline and phenylpyridine ligands", The Journal of Physical Chemistry C, 2011, vol. 115, No. 42, pp. 20722-20731.

Sylvia Bettington et al. "Tris-Cyclometalated Iridium(III) Complexes of Carbazole(fluorenyl)pyridine Ligands: Synthesis, Redox and Photophysical Properties, and Electrophosphorescent Light-Emitting Diodes" Chemistry: A European Journal, 2007, vol. 13, pp. 1423-1431.

Christoph Ulbricht et al., "Synthesis and Characterization of Oxetane-Functionalized Phosphorescent Ir(III)-Complexes", Macromol. Chem. Phys. 2009, 210, pp. 531-541.

Dan Wang et al., "Carbazole and arylamine functionalized iridium complexes for efficient electro-phosphorescent light-emitting diodes", Inorganica Chimica Acta 370 (2011) pp. 340-345.

Huaijun Tang et al., "Novel yellow phosphorescent iridium complexes containing a carbazoleeoxadiazole unit used in polymeric light-emitting diodes", Dyes and Pigments 91 (2011) pp. 413-421.

Hoe-Joo Seo et al., "Blue phosphorescent iridium(III) complexes containing carbazole-functionalized phenyl pyridine for organic light-emitting diodes: energy transfer from carbazolyl moieties to iridium(III) cores", RSC Advances, 2011, 1, pp. 755-757.

D.F. O'Brien et al., "Improved energy transfer in electrophosphorescent devices," Appl. Phys. Lett., vol. 74, No. 3, Jan. 18, 1999, pp. 442-444.

Kwon-Hyeon Kim et al., "Controlling Emitting Dipole Orientation with Methyl Substituents on Main Ligand of Iridium Complexes for

(56) References Cited

OTHER PUBLICATIONS

Highly Efficient Phosphorescent Organic Light-Emitting Diodes", Adv. Optical Mater. 2015, 3, pp. 1191-1196.

Kwon-Hyeon Kim et al., "Crystal Organic Light-Emitting Diodes with Perfectly Oriented Non-Doped Pt-Based Emitting Layer", Adv. Mater. 2016, 28, pp. 2526-2532.

Z Liu et al., "Green and blue-green phosphorescent heteroleptic iridium complexes containing carbazole-functionalized beta-diketonate for non-doped organic light-emitting diodes", Organic Electronics 9 (2008) pp. 171-182.

Matthew J. Jurow et al., "Understanding and predicting the orientation of heteroleptic phosphors in organic light-emitting materials", Nature Materials, vol. 15, Jan. 2016, pp. 85-93.

Rui Zhu et al., "Color tuning based on a six-membered chelated iridium (III) complex with aza-aromatic ligand," Chemistry Letters, vol. 34, No. 12, 2005, pp. 1668-1669.

Jack W. Levell et al., "Carbazole/iridium dendrimer side-chain phosphorescent copolymers for efficient light emitting devices", New J. Chem., 2012, vol. 36, pp. 407-413.

V. Adamovich et al., "High efficiency single dopant white electrophosphorescent light emitting diodes", New J. Chem, vol. 26, pp. 1171-1178. 2002.

V. Thamilarasan et al., "Green-emitting phosphorescent iridium(III) complex: Structural, photophysical and electrochemical properties," Inorganica Chimica Acta, vol. 408, 2013, pp. 240-245.

Dorwald, Side Reactions in Organic Synthesis 2005, Wiley:VCH Weinheim Preface, pp. 1-15 & Chapter 1, pp. 279-308.

Baldo et al., "Very High-Efficiency Green Organic Light-Emitting Devices Based on Electrophosphorescence", Appl Phys Lett, 75(3):4-6 (1999).

Berson et al. (2007). "Poly(3-hexylthiophene) fibers for photovoltaic applications," Adv. Funct. Mat., 17, 1377-84.

Bouman et al. (1994). "Chiroptical properties of regioregular chiral polythiophenes," Mol. Cryst. Liq. Cryst., 256, 439-48.

Campbell et al. (2008). "Low-temperature control of nanoscale morphology for high performance polymer photovoltaics," Nano Lett., 8, 3942-47.

Coakley et al. (2004). "Conjugated polymer photovoltaic cells," Chem. Mater., 16, 4533-4542.

Finikova,M.A. et al., New Selective Synthesis of Substituted Tetrabenzoporphyris, Doklady Chemistry, 2003, vol. 391, No. 4-6, pp. 222-224.

Galanin et al. Synthesis and Properties of meso-Phenyl-Substituted Tetrabenzoazaporphines Magnesium Complexes. Russian Journal of Organic Chemistry (Translation of Zhurnal Organicheskoi Khimii) (2002), 38(8), 1200-1203.

Gong et al., Highly Selective Complexation of Metal Ions by the Self-Tuning Tetraazacalixpyridine macrocycles, Tetrahedron, 65(1): 87-92 (2009).

Gottumukkala, V. et al., Synthesis, cellular uptake and animal toxicity of a tetra carboranylphenyl N-tetrabenzoporphyr in, Bioorganic & Medicinal Chemistry, 2006, vol. 14, pp. 1871-1879.

Hansen (1969). "The universality of the solubility parameter," I & EC Product Research and Development, 8, 2-11.

Imre et al (1996). "Liquid-liquid demixing ffrom solutions of polystyrene. 1. A review. 2. Improved correlation with solvent properties," J. Phys. Chem. Ref. Data, 25, 637-61.

Jeong et al. (2010). "Improved efficiency of bulk heterojunction poly (3-hexylthiophene):[6,6]-phenyl-C61-butyric acid methyl ester photovoltaic devices using discotic liquid crystal additives," Appl. Phys. Lett . . . 96, 183305. (3 pages).

Kim et al (2009). "Altering the thermodynamics of phase separation in inverted bulk-heterojunction organic solar cells," Adv. Mater., 21, 3110-15.

Kim et al. (2005). "Device annealing effect in organic solar cells with blends of regioregular poly (3-hexylthiophene) and soluble fullerene," Appl. Phys. Lett. 86, 063502. (3 pages).

Kroon et al. (2008). "Small bandgap olymers for organic solar cells," Polymer Reviews, 48, 531-82.

Lee et al. (2008). "Processing additives for inproved efficiency from bulk heterojunction solar cells," J. Am. Chem. Soc, 130, 3619-23.

Li et al. (2005). "Investigation of annealing effects and film thickness dependence of polymer solar cells based on poly (3-hexylthiophene)," J. Appl. Phys., 98, 043704. (5 pages).

Li et al. (2007). "Solvent annealing effect in polymer solar cells based on poly(3-hexylthiophene) and methanofullerenes," Adv. Funct. Mater, 17, 1636-44.

Liang, et al. (2010). "For the bright future-bulk heterojunction polymer solar cells with power conversion efficiency of 7.4%, "Adv. Mater. 22, E135-38.

Galanin et al., meso-Phenyltetrabenzoazaporphyrins and their zinc complexes. Synthesis and spectral properties, Russian Journal of General Chemistry (2005), 75(4), 651-655.

Morana et al. (2007). "Organic field-effect devices as tool to characterize the bipolar transport in polymer-fullerene blends: the case of P3HT-PCBM," Adv. Funct. Mat., 17, 3274-83.

Moule et al. (2008). "Controlling morphology in Polymer-Fullerene mixtures," Adv. Mater., 20, 240-45.

Nillson et al. (2007). "Morphology and phase segregation of spin-casted films of polyfluorene/PCBM Blends," Macromolecules, 40, 8291-8301.

Olynick et al. (2009). "The link between nanoscale feature development in a negative resist and the Hansen solubility sphere," Journal of Polymer Science: Part B: Polymer Physics, 47, 2091-2105.

Peet et al. (2007). "Efficiency enhancement in low-bandgap polymer solar cells by processing with alkane dithiols," Nature Materials, 6, 497-500.

Pivrikas et al. (2008). "Substituting the postproduction treatment for bulk-heterojunction solar cells using chemical additives," Organic Electronics, 9, 775-82.

Saricifci et al. (1993). "Semiconducting polymerbuckminsterfullerene heterojunctions: diodes photodiodes, and photovoltaic cells," Appl. Phys. Lett., 62, 585-87.

Saunders et al. (2008). "Nanoparticle-polymer photovoltaic cells," Advances in Colloid and Interface Science, 138, 1-23.

Shin et al. (2010). "Abrupt morphology change upon thermal annealing in Poly(3-hexathiophene)/soluble fullerene blend films for polymer solar cells," Adv. Funct. Mater., 20, 748-54.

Wang et al. (2010). "The development of nanoscale morphology in polymer: fullerene photovoltaic blends during solvent casting," Soft Matter, 6, 4128-4134.

Wang et al., C(aryl)-C(alkyl) bond formation from Cu(CI04)2-mediated oxidative cross coupling reaction between arenes and alkyllithium reagents through structurally well-defined Ar-Cu(III) intermediates, Chem Commun, 48: 9418-9420 (2012).

Yakubov, L.A. et al., Synthesis and Properties of Zinc Complexes of mesoHexadecyloxy-Substituted Tetrabenzoporphyrin and Tetrabenzoazaporphyrins, Russian Journal of Organic Chemistry, 2008, vol. 44, No. 5, pp. 755-760.

Yang et al. (2005). "Nanoscale morphology of high-performance polymer solar cells," Nano Lett., 5, 579-83.

Yao et al. (2008). "Effect of solvent mixture on nanoscale phase separation in polymer solar cells," Adv. Funct. Mater., 18, 1783-89.

Yao et al., Cu(CI04)2-Mediated Arene C-H Bond Halogenations of Azacalixaromatics Using Alkali Metal Halides as Halogen Sources, The Journal of Organic Chemistry, 77(7): 3336-3340 (2012).

Yu et al. (1995). "Polymer Photovoltaic Cells: Enhanced efficiencies via a network of internal donor-acceptor heterojunctions," Science, 270, 1789-91.

Z Xu et al., "Synthesis and properties of iridium complexes based 1,3,4-oxadiazoles derivatives", Tetrahedron 64 (2008) pp. 1860-1867.

U.S. Appl. No. 61/692,937.

U.S. Appl. No. 61/719,077.

Chew, S. et al: Photoluminescence and electroluminescence of a new blue-emitting homoleptic iridium complex. Applied Phys. Letters; vol. 88, pp. 093510-1-093510-3, 2006.

Adachi, C. et al., "High-efficiency organic electrophosphorescent devices with tris(2-phenylpyridine)iridium doped into electron-transporting materials", Applied Physics Letters, Aug. 2000, vol. 77, No. 6, pp. 904-906 <DOI:10.1063/1.1306639>.

(56) References Cited

OTHER PUBLICATIONS

Williams, E. et al., "Organic light-emitting diodes having exclusive near-infrared electrophosphorescence", Applied Physics Letters, Aug. 2006, vol. 89, No. 8, pp. 083506-1-083506-3 <DOI:10.1063/1.2335275>.

Baldo, M. et al., "High-efficiency fluorescent organic light-emitting devices using a phosphorescent sensitizer", Nature, Feb. 2000, vol. 403, pp. 750-753.

Baldo, M et al., "Excitonic singlet-triplet ratio in a semiconducting organic thin film", Physical Review B, Nov. 1999, vol. 60, No. 20, pp. 14422-14428 <DOI:10.1103/PhysRevB.60.14422>.

Brooks, J. et al., "Synthesis and Characterization of Phosphorescent Cyclometalated Platinum Complexes", Inorganic Chemistry, May 2002, vol. 41, No. 12, pp. 3055-3066 <DOI:10.1021/ic0255508>.

Brown, A. et al., "Optical spectroscopy of triplet excitons and charged excitations in poly(p-phenylenevinylene) light-emitting diodes", Chemical Physics Letters, Jul. 1993, vol. 210, No. 1-3, pp. 61-66 <DOI:10.1016/0009-2614(93)89100-V>.

Burroughes, J. et al., "Light-emitting diodes based on conjugated polymers", Nature, Oct. 1990, vol. 347, pp. 539-541.

Chen, F. et al., "High-performance polymer light-emitting diodes doped with a red phosphorescent iridium complex", Applied Physics Letters, Apr. 2002 [available online Mar. 2002], vol. 80, No. 13, pp. 2308-2310 <10.1063/1.1462862>.

Chen, X., et al., "Fluorescent Chemosensors Based on Spiroring-Opening of Xanthenes and Related Derivatives", Chemical Reviews, 2012 [available online Oct. 2011], vol. 112, No. 3, pp. 1910-1956 <DOI:10.1021/cr200201z>.

Colombo, M. et al., "Synthesis and high-resolution optical spectroscopy of bis[2-(2-thienyl)pyridinato-C3, N'](2,2'-bipyridine)iridium(III)", Inorganic Chemistry, Jul. 1993, vol. 32, No. 14, pp. 3081-3087 <DOI:10.1021/ic00066a019>.

D'Andrade, B. et al., "Operational stability of electrophosphorescent devices containing p and n doped transport layers ", Applied Physics Letters, Nov. 2003, vol. 83, No. 19, pp. 3858-3860 <DOI:10.1063/1.1624473>.

Dsouza, R., et al., "Fluorescent Dyes and Their Supramolecular Host/Guest Complexes with Macrocycles in Aqueous Solution", Oct. 2011, vol. 111, No. 12, pp. 7941-7980 <DOI:10.1021/cr200213s>.

Holmes, R. et al., "Efficient, deep-blue organic electrophosphorescence by guest charge trapping", Applied Physics Letters, Nov. 2003 [available online Oct. 2003], vol. 83, No. 18, pp. 3818-3820 <DOI:10.1063/1.1624639>.

Kwong, R. et al., "High operational stability of electrophosphorescent devices", Applied Physics Letters, Jul. 2002 [available online Jun. 2002], vol. 81, No. 1, pp. 162-164 <DOI:10.1063/1.1489503>.

Lamansky, S. et al., "Cyclometalated Ir complexes in polymer organic light-emitting devices", Journal of Applied Physics, Aug. 2002 [available online Jul. 2002], vol. 92, No. 3, pp. 1570-1575 <10.1063/1.1491587>.

Lamansky, S. et al., "Synthesis and Characterization of Phosphorescent Cyclometalated Iridium Complexes", Inorganic Chemistry, Mar. 2001, vol. 40, No. 7, pp. 1704-1711 <DOI:10.1021/ic0008969>.

Li, J. et al., "Synthesis and characterization of cyclometalated Ir(III) complexes with pyrazolyl ancillary ligands", Polyhedron, Jan. 2004, vol. 23, No. 2-3, pp. 419-428 <DOI:10.1016/j.poly.2003.11.028>.

Li, J., et al., "Synthetic Control of Excited-State Properties in Cyclometalated Ir(III) Complexes Using Ancillary Ligands", Inorganic Chemistry, Feb. 2005, vol. 44, No. 6, pp. 1713-1727 <DOI:10.1021/ic048599h>.

Markham, J. et al., "High-efficiency green phosphorescence from spin-coated single-layer dendrimer light-emitting diodes ", Applied Physics Lettersm Apr. 2002, vol. 80, vol. 15, pp. 2645-2647 <DOI:10.1063/1.1469218>.

Michl, J., "Relationship of bonding to electronic spectra", Accounts of Chemical Research, May 1990, vol. 23, No. 5, pp. 127-128 <DOI:10.1021/ar00173a001>.

Miller, R. et al., "Polysilane high polymers", Chemical Reviews, Sep. 1989, vol. 89, No. 6, pp. 1359-1410 <DOI:10.1021/cr00096a006>.

Nazeeruddin, M. et al., "Highly Phosphorescence Iridium Complexes and Their Application in Organic Light-Emitting Devices", Journal of the American Chemical Society, Jun. 2003, vol. 125, No. 29, pp. 8790-8797 <DOI:10.1021/ja021413y>.

Sajoto, T. et al., "Temperature Dependence of Blue Phosphorescent Cyclometalated Ir(III) Complexes", Journal of the American Chemical Society, Jun. 2009, vol. 131, No. 28, pp. 9813-9822 <DOI:10.1021/ja903317w>.

Strouse, G. et al., "Optical Spectroscopy of Single Crystal [Re(bpy)(CO)4](PF6): Mixing between Charge Transfer and Ligand Centered Excited States", Inorganic Chemistry, Oct. 1995, vol. 34, No. 22, pp. 5578-5587 <DOI:10.1021/ic00126a031>.

Tang, C. et al., "Organic electroluminescent diodes", Applied Physics Letters, Jul. 1987, vol. 51, No. 12, pp. 913-915 <DOI:10.1063/1.98799>.

Tsuoboyama, A. et al., "Homoleptic Cyclometalated Iridium Complexes with Highly Efficient Red Phosphorescence and Application to Organic Light-Emitting Diode", Journal of the American Chemical Society, Sep. 2003, vol. 125, No. 42, pp. 12971-12979 <DOI:10.1021/ja034732d>.

Turro, N., "Modern Molecular Photochemistry" (Sausalito, California, University Science Books, 1991), p. 48. (3 pages).

Williams, E. et al., "Excimer Based White Phosphorescent Organic Light Emitting Diodes with Nearly 100 % Internal Quantum Efficiency", Advanced Materials, Jan. 2007, vol. 19, No. 2, pp. 197-202 <DOI:10.1002/adma.200602174>.

Yang, X. et al., "Efficient Blue☐ and White☐Emitting Electrophosphorescent Devices Based on Platinum(II) [1,3☐Difluoro☐4,6☐di(2☐pyridinyl)benzene] Chloride", Advanced Materials, Jun. 2008, vol. 20, No. 12, pp. 2405-2409 <DOI:10.1002/adma.200702940>.

Zhu, W. et al., "Highly efficient electrophosphorescent devices based on conjugated polymers doped with iridium complexes", Applied Physics Letters, Mar. 2002, vol. 80, No. 12, pp. 2045-2047 <DOI:10.1063/1.1461418>.

Results from SciFinder Compound Search on Dec. 8, 2016. (17 pages).

U.S. Appl. No. 16/739,480, filed Jan. 10, 2020.

U.S. Appl. No. 16/668,010, filed Oct. 30, 2019.

Chow; "Strongly Phosphorescent Palladium (II) Complexes of Tetradentate Ligands with Mixed Oxygen, Carbon, and Nitrogen Donor Atoms: Photophysics, Photochemistry, and Applications", Angew. Chem. Int. Ed. 2013, 52, 11775 -11779. DOI: 10.1002/anie.201305590 (Year: 2013) (5 pages).

Bronner; "Dipyrrin based luminescent cyclometallated palladium and platinum complexes", Dalton Trans., 2010, 39, 180-184. DOI: 10.1039/b908424j (Year: 2010) (5 pages).

Hatakeyama, T. et al., "Ultrapure Blue Thermally Activated Delayed Fluorescence Molecules: Efficient HOMO—LUMO Separation by the Multiple Resonance Effect", Advanced Materials, Apr. 2016, vol. 28, No. 14, pp. 2777-2781, <DOI:10.1002/adma.201505491>.

Graf, A. et al., "Correlating the transition dipole moment orientation of phosphorescent emitter molecules in OLEDs with basic material properties", Journal of Materials Chemistry C, Oct. 2014, vol. 2, No. 48, pp. 10298-10304 <DOI:10.1039/c4tc00997e>.

Fuchs, C. et al., "Enhanced light emission from top-emitting organic light-emitting diodes by optimizing surface plasmon polariton losses", Physical Review B, Dec. 2015, vol. 92, No. 24, pp. 245306-1-245306-10 <DOI:10.1103/PhysRevB.92.245306>.

Fuchs, C. et al., "Enhanced light emission from top-emitting organic light-emitting diodes by optimizing surface plasmon polariton losses", arXiv, submitted Mar. 2015, 11 pages, arXiv:1503.01309.

Gather, M. et al., "Recent advances in light outcoupling from white organic light-emitting diodes," Journal of Photonics for Energy, May 2015, vol. 5, No. 1, 057607-1-057607-20 <DOI:10.1117/1.JPE.5.057607>.

Kim, HY. et al., "Crystal Organic Light-Emitting Diodes with Perfectly Oriented Non-Doped Pt-Based Emitting Layer", Advanced Functional Materials, Feb. 2016, vol. 28, No. 13, pp. 2526-2532 <DOI:10.1002/adma.201504451>.

(56) References Cited

OTHER PUBLICATIONS

Kim, JJ., "Setting up the new efficiency limit of OLEDs; Abstract" [online], Electrical Engineering—Princeton University, Aug. 2014 [retrieved on Aug. 24, 2016], retrieved from the internet: <URL:http://ee.princeton.edu/events/setting-new-efficiency-limit-oled> 2 pages.

Kim, SY. et al., "Organic Light-Emitting Diodes with 30% External Quantum Efficiency Based on a Horizontally Oriented Emitter", Advanced Functional Materials, Mar. 2013, vol. 23, No. 31, pp. 3896-3900 <DOI:10.1002/adfm.201300104>.

Lampe, T. et al., "Dependence of Phosphorescent Emitter Orientation on Deposition Technique in Doped Organic Films", Chemistry of Materials, Jan. 2016, vol. 28, pp. 712-715 <DOI:10.1021/acs.chemmater.5b04607>.

Li, J., "Efficient and Stable OLEDs Employing Square Planar Metal Complexes and Inorganic Nanoparticles", in DOE SSL R&D Workshop (Raleigh, North Carolina, 2016), Feb. 2016, 15 pages.

Lin, TA et al., " Sky-Blue Organic Light Emitting Diode with 37% External Quantum Efficiency Using Thermally Activated Delayed Fluorescence from Spiroacridine-Triazine Hybrid", Advanced Materials, Aug. 2016, vol. 28, No. 32, pp. 6876-6983 <DOI:10.1002/adma.201601675>.

Sakai, Y. et al., "Simple model-free estimation of orientation order parameters of vacuum-deposited and spin-coated amorphous films used in organic light-emitting diodes", Applied Physics Express, Aug. 2015, vol. 8, No. 9, pp. 096601-1-096601-4 <DOI:10.7567/APEX.8.096601>.

Senes, A. et al., "Transition dipole moment orientation in films of solution processed fluorescent oligomers: investigating the influence of molecular anisotropy", Journal of Materials Chemistry C, Jun. 2016, vol. 4, No. 26, pp. 6302-6308 <DOI: 10.1039/c5tc03481g>.

Vezzu, D. et al.: Highly luminescent tridentate platinum complexes featured in fused five-six-membered metallocycle and diminishing quenching. Inorganic Chem., vol. 50 (17), pp. 8261-8273, 2011.

Wong. Challenges in organometallic research—Great opportunity for solar cells and OLEDs. Journal of Organometallic Chemistry 2009, vol. 694, pp. 2644-2647.

Stefan Bernhard, "The First Six Years: A Report," Department of Chemistry, Princeton University, May 2008, 11 pages.

1 Machine-translated English version of JP 2012/074444 A, Sekine Noboru, Apr. 12, 2012 (Year: 2012) 75 pages.

\* cited by examiner

METAL COMPOUNDS, METHODS, AND USES THEREOF

CROSS-REFERENCE TO RELATED APPLICATIONS

The present application is a continuation of U.S. patent Ser. No. 16/834,229, filed Mar. 30, 2020, now allowed, which is a continuation of U.S. patent application Ser. No. 15/882,358, filed Jan. 29, 2018, now U.S. Pat. No. 10,622,571, which is a continuation of U.S. patent application Ser. No. 14/430,454, filed Mar. 23, 2015, now U.S. Pat. No. 9,882,150, which a 35 U.S.C. § 371 national phase application from, and claiming priority to, International Application PCT/US2013/061353, filed Sep. 24, 2013, which claims the benefit of U.S. Provisional Patent Application No. 61/704,880, filed on Sep. 24, 2012, all of which applications are incorporated herein by reference in their entireties.

BACKGROUND

Technical Field

The present disclosure relates to metal compounds that are useful in devices, such as, for example, organic light emitting diodes (OLEDs).

Technical Background

Compounds capable of absorbing and/or emitting light can be ideally suited for use in a wide variety of optical and electro-optical devices, including, for example, photo-absorbing devices such as solar- and photo-sensitive devices, photo-emitting devices, OLEDs, or devices capable of both photo-absorption and emission. Much research has been devoted to the discovery and optimization of organic and organometallic materials for using in optical and electro-optical devices. Generally, research in this area aims to accomplish a number of goals, including improvements in absorption and emission efficiency, as well as improvements in processing ability.

Despite significant advances in research devoted to optical and electro-optical materials, many currently available materials exhibit a number of disadvantages, including poor processing ability, inefficient emission or absorption, and less than ideal stability, among others. Thus, a need exists for new materials which exhibit improved performance in optical and electro-optical devices. This need and other needs are satisfied by the present invention.

SUMMARY

Disclosed herein are metal compounds that are useful in devices, such as, for example, organic light emitting diodes (OLEDs).

Disclosed herein is a compound having the formula

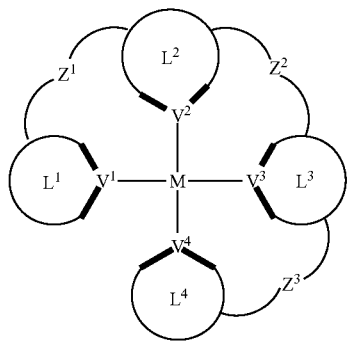

wherein each of $L^1$, $L^2$, $L^3$, and $L^4$ independently is a substituted or unsubstituted aryl, cycloalkyl, cycloalkenyl, heterocyclyl, heteroaryl, carbene, or N-heterocyclic carbene, wherein each of $Z^1$, $Z^2$, and $Z^3$ independently is present or absent, and if present each of $Z^1$, $Z^2$, and $Z^3$ independently is A, $A^1$, or $A^2$, wherein each of A, $A^1$, or $A^2$ independently is O, S, S=O, $SO_2$, Se, $NR^3$, $PR^3$, RP=O, $CR^1R^2$, C=O, $SiR^1R^2$, $GeR^1R^2$, BH, P(O)H, PH, NH, $CR^1H$, $CH_2$, $SiH_2$, $SiHR^1$, BH, or $BR^3$, wherein M is Pt, Pd, Au, Ir, Rh, Ru, Fe, Co, Ni, Cu, Zn, Ag, Hg, Cd, or Zr, wherein at least one of $L^1$, $L^2$, $L^3$, and $L^4$ comprises

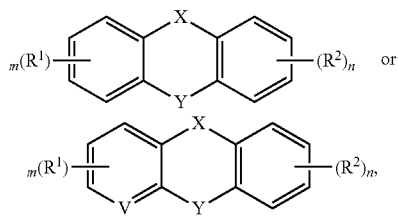

wherein m and n independently is an integer from 0 to 4, wherein each of V, X, and Y independently is $V^1$, $V^2$, $V^3$, $V^4$, O, S, SO, $SO_2$, Se, $NR^3$, $PR^3$, $R^1P$=O, $CR^1R^2$, C=O, $SiR^1R^2$, $GeR^1R^2$, BH, P(O)H, PH, NH, $CR^1H$, $CH_2$, $SiH_2$, $SiHR^1$, BH, or $BR^3$, or any one of

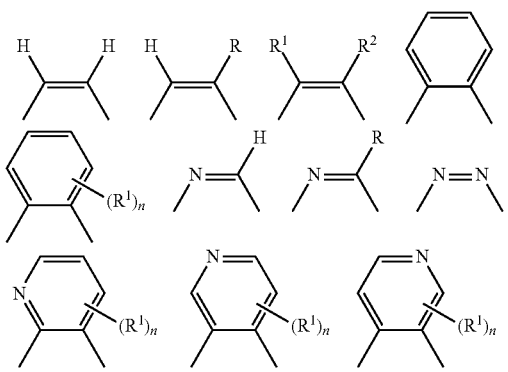

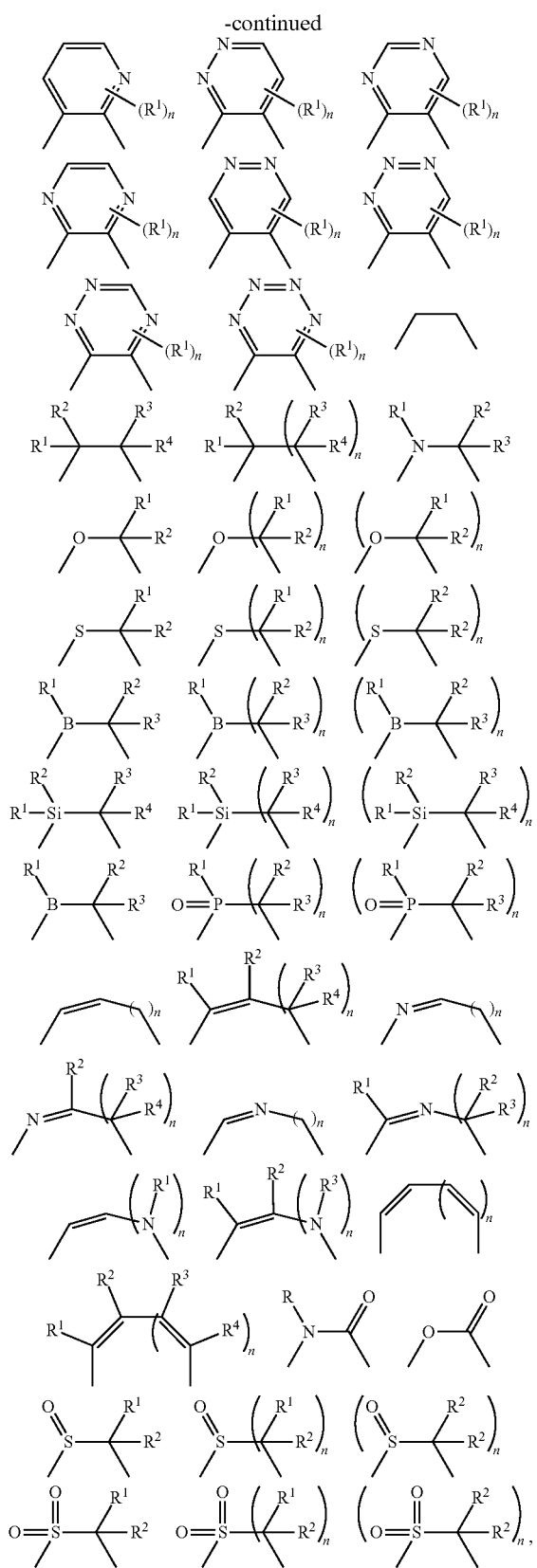

wherein at least one of V, X, and Y is $V^1$, $V^2$, $V^3$, or $V^4$,
wherein m and n independently is an integer from 0 to 4, wherein each of $V^1$, $V^2$, $V^3$ and $V^4$ independently is coordinated to M, and wherein each of $V^1$, $V^2$, $V^3$ and $V^4$ independently is N, C, CH, P, B, SiH, or Si, wherein each of R, $R^1$, $R^2$, $R^3$, and $R^4$, independently is hydrogen, aryl, cycloalkyl, cycloalkenyl, heterocyclyl, heteroaryl, alkyl, alkenyl, alkynyl, deuterium, halogen, hydroxyl, thiol, nitro, cyano, amino, a mono- or di-alkylamino, a mono- or diaryl amino, alkoxy, aryloxy, haloalkyl, aralkyl, ester, nitrile, isonitrile, alkoxycarbonyl, acylamino, alkoxycarbonylamino, aryloxycarbonylamino, sulfonylamino, sulfamoyl, carbamoyl, alkylthio, sulfinyl, ureido, phosphoramide, amercapto, sulfo, carboxyl, hydrzino, substituted silyl, or polymerizable, or any conjugate or combination thereof, wherein each of $V^1$, $V^2$, $V^3$ and $V^4$ independently optionally is substituted for any one of $V^1$, $V^2$, $V^3$ and $V^4$.

Also disclosed herein are devices, such as, for example, OLEDs, comprising one or more of the disclosed compounds.

BRIEF DESCRIPTION OF THE FIGURES

The accompanying figures, which are incorporated in and constitute a part of this specification, illustrate several aspects and together with the description serve to explain the principles of the invention.

Figure 1:
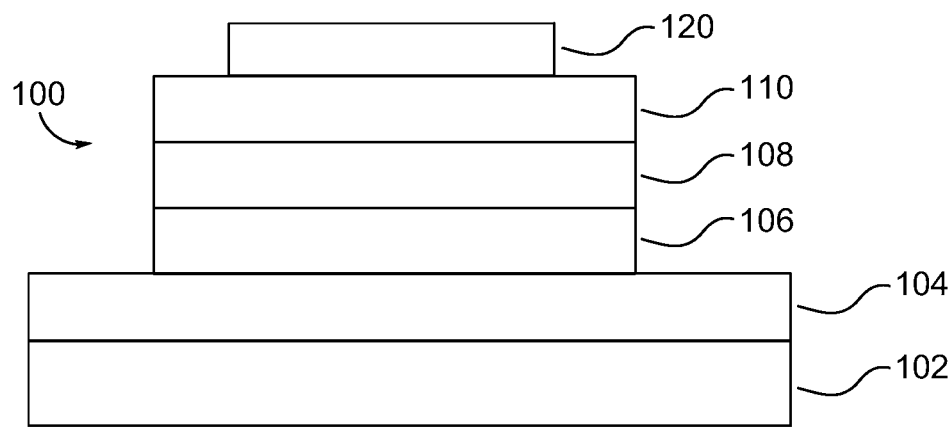
FIG. 1 shows a drawing of a cross-section of an exemplary organic light-emitting diode (OLED).
Figure 2:
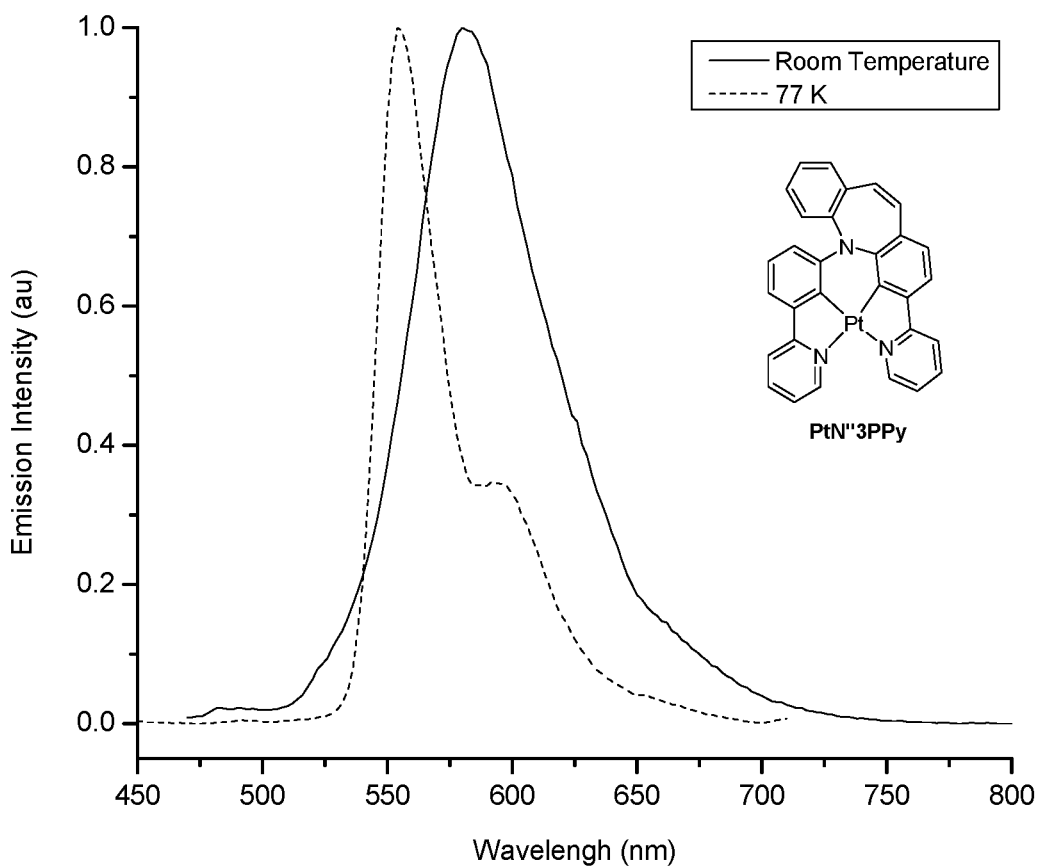
FIG. 2 is a emission spectra of PtN"3PPy in $CH_2Cl_2$ at room temperature and in 2-MeTHF at 77K.

Additional aspects of the invention will be set forth in part in the description which follows, and in part will be obvious from the description, or can be learned by practice of the invention. The advantages of the invention will be realized and attained by means of the elements and combinations particularly pointed out in the appended claims. It is to be understood that both the foregoing general description and the following detailed description are exemplary and explanatory only and are not restrictive of the invention, as claimed.

DESCRIPTION

The present invention can be understood more readily by reference to the following detailed description of the invention and the Examples included therein.

Before the present compounds, devices, and/or methods are disclosed and described, it is to be understood that they are not limited to specific synthetic methods unless otherwise specified, or to particular reagents unless otherwise specified, as such can, of course, vary. It is also to be understood that the terminology used herein is for the purpose of describing particular aspects only and is not intended to be limiting. Although any methods and materials similar or equivalent to those described herein can be used in the practice or testing of the present invention, example methods and materials are now described.

1. Definitions

As used in the specification and the appended claims, the singular forms "a," "an" and "the" include plural referents unless the context clearly dictates otherwise. Thus, for example, reference to "a component" includes mixtures of two or more components.

Ranges can be expressed herein as from "about" one particular value, and/or to "about" another particular value.

When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

As used herein, the terms "optional" or "optionally" means that the subsequently described event or circumstance can or cannot occur, and that the description includes instances where said event or circumstance occurs and instances where it does not.

Disclosed are the components to be used to prepare the compositions of the invention as well as the compositions themselves to be used within the methods disclosed herein. These and other materials are disclosed herein, and it is understood that when combinations, subsets, interactions, groups, etc. of these materials are disclosed that while specific reference of each various individual and collective combinations and permutation of these compounds cannot be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions of the invention. Thus, if there are a variety of additional steps that can be performed it is understood that each of these additional steps can be performed with any specific embodiment or combination of embodiments of the methods of the invention.

As referred to herein, a linking atom connect two groups such as, for example, a N and C group. The linking atom can, if valency permits, have other chemical moieties attached. For example, an oxygen would not have any other chemical groups attached as the valency is satisfied once it is bonded to the two groups (N and/or C groups). In another example, when carbon is the linking atom, two additional chemical moieties would be attached to the carbon as valency would require such. Suitable chemical moieties includes, but are not limited to, hydrogen, hydroxyl, alkyl, alkoxy, =O, halogen, nitro, amine, amide, thiol, aryl, heteroaryl, cycloalkyl, and heterocyclyl.

The term "alkyl" as used herein is a branched or unbranched saturated hydrocarbon group of 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dodecyl, tetradecyl, hexadecyl, eicosyl, tetracosyl, and the like. The alkyl group can be cyclic or acyclic. The alkyl group can be branched or unbranched. The alkyl group can also be substituted or unsubstituted. For example, the alkyl group can be substituted with one or more groups including, but not limited to, optionally substituted alkyl, cycloalkyl, alkoxy, amino, ether, halide, hydroxy, nitro, silyl, sulfo-oxo, or thiol, as described herein. A "lower alkyl" group is an alkyl group containing from one to six (e.g., from one to four) carbon atoms.

The terms "amine" or "amino" as used herein are represented by the formula $NA^1A^2A^3$, where $A^1$, $A^2$, and $A^3$ can be, independently, hydrogen or optionally substituted alkyl, cycloalkyl, alkenyl, cycloalkenyl, alkynyl, cycloalkynyl, aryl, or heteroaryl group as described herein.

The term "halide" as used herein refers to the halogens fluorine, chlorine, bromine, and iodine.

The term "hydroxyl" as used herein is represented by the formula —OH.

The term "nitro" as used herein is represented by the formula —$NO_2$.

The term "nitrile" as used herein is represented by the formula —CN.

The term "thiol" as used herein is represented by the formula —SH.

The term "heterocyclyl" or the like terms refer to cyclic structures including a heteroatom. Thus, "heterocyclyl" includes both aromatic and non-aromatic ring structures with one or more heteroatoms. Non-limiting examples of heterocyclic includes, pyridine, isoquinoline, methylpyrrole and thiophene etc. "Heteroaryl" specifically denotes an aromoatic cyclic structure including a heteroatom.

As briefly described above, the present invention is directed to multidentate, for example, tetradentate cyclometalated metal complexes. In one aspect, such complexes can be incorporated with heptacyclic or higher order materials. In another aspect, such complexes can be useful, for example, in displays and lighting applications.

In various aspects, the compounds of the present disclosure can comprise one or more of platinum (Pt) complexes, palladium (Pd) complexes, gold (Au) complexes, iridium (Ir) complexes, rhodium (Rh) complexes, ruthenium (Ru) complexes, iron (Fe) complexes, cobalt (Co) complexes, nickel (Ni) complexes, copper (Cu) complexes, zinc (Zn) complexes, silver (Ag) complexes, mercury (Hg) complexes, cadmium (Cd) complexes, zirconium (Zr) complexes, or other metal complexes not specifically recited herein which are capable of emitting light and are thus useful as an emissive materials in devices.

The term "each of $V^1$, $V^2$, $V^3$ and $V^4$ independently optionally is substituted for any one of $V^1$, $V^2$, $V^3$ and $V^4$" as used herein means that any one of $V^1$, $V^2$, $V^3$, and $V^4$ can be substituted for another of $V^1$, $V^2$, $V^3$, and $V^4$. For example, $V^1$ can be substituted for $V^2$, $V^3$, or $V^4$. In another example, $V^3$ can be substituted for $V^1$, $V^2$, or $V^4$. In one example, $V^2$ can be substituted for $V^1$. In another example, $V^3$ can be substituted for $V^1$. In another example, $V^4$ can be substituted for $V^2$. In another example, $V^3$ can be substituted for $V^2$. In one aspect, V, as described herein, can be $V^1$, $V^2$, $V^3$, or $V^4$ as described herein. For example, V can be $V^1$. In another example, V can be $V^2$. In another example, V can be $V^3$. In another example, V can be $V^4$.

As used herein, the terms "compound" and "complex" are used interchangeably.

2. Compounds

In one aspect, disclosed herein are compounds comprising a metal, such as platinum (Pt), palladium (Pd), gold (Au), iridium (Ir), rhodium (Rh), ruthenium (Ru), iron (Fe), cobalt (Co), nickel (Ni), copper (Cu), zinc (Zn), silver (Ag), mercury (Hg), cadmium (Cd), or zirconium (Zr). The disclosed compounds can emit electromagnetic radiation. In another aspect, the emission of the disclosed compounds can be tuned, for example, from the ultraviolet to near-infrared, by, for example, modifying the ligand structure. In another aspect, the disclosed compounds can provide emission over a majority of the visible spectrum. In a specific example, the disclosed compounds can emit light over a range of from about 400 nm to about 700 nm. In another aspect, the disclosed compounds have improved stability and efficiency over traditional emission complexes. In yet another aspect, the disclosed compounds can be useful as luminescent labels in, for example, bio-applications, anti-cancer agents, emitters in organic light emitting diodes (OLED), or a combination thereof. In another aspect, the disclosed compounds can be useful in light emitting devices, such as, for example, compact fluorescent lamps (CFL), light emitting diodes (LED), incandescent lamps, and combinations thereof.

The disclosed compounds can be, for example, multidentate compounds.

Disclosed herein are compounds having the formula

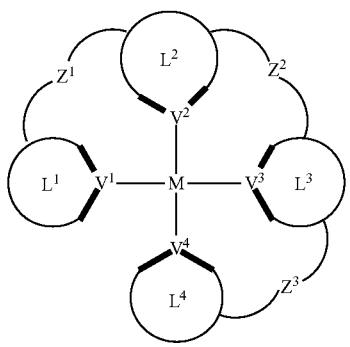

wherein each of $L^1$, $L^2$, $L^3$, and $L^4$ independently is a substituted or unsubstituted aryl, cycloalkyl, cycloalkenyl, heterocyclyl, heteroaryl, carbene, or N-heterocyclic carbene, wherein each of $Z^1$, $Z^2$, and $Z^3$ independently is present or absent, and if present each of $Z^1$, $Z^2$, and $Z^3$ independently is A, $A^1$, or $A^2$, wherein each of A, $A^1$, or $A^2$ independently is O, S, S=O, $SO_2$, Se, $NR^3$, $PR^3$, RP=O, $CR^1R^2$, C=O, $SiR^1R^2$, $GeR^1R^2$, BH, P(O)H, PH, NH, $CR^1H$, $CH_2$, $SiH_2$, $SiHR^1$, BH, or $BR^3$, wherein M is Pt, Pd, Au, Ir, Rh, Ru, Fe, Co, Ni, Cu, Zn, Ag, Hg, Cd, or Zr, wherein at least one of $L^1$, $L^2$, $L^3$, and $L^4$ comprises

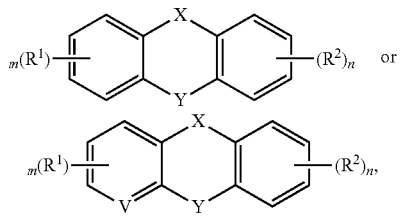

wherein m and n independently is an integer from 0 to 4, wherein each of V, X, and Y independently is $V^1$, $V^2$, $V^3$, $V^4$, O, S, S=O, $SO_2$, Se, $NR^3$, $PR^3$, $R^1P$=O, $CR^1R^2$, C=O, $SiR^1R^2$, $GeR^1R^2$, BH, P(O)H, PH, NH, $CR^1H$, $CH_2$, $SiH_2$, $SiHR^1$, BH, or $BR^3$, or any one of

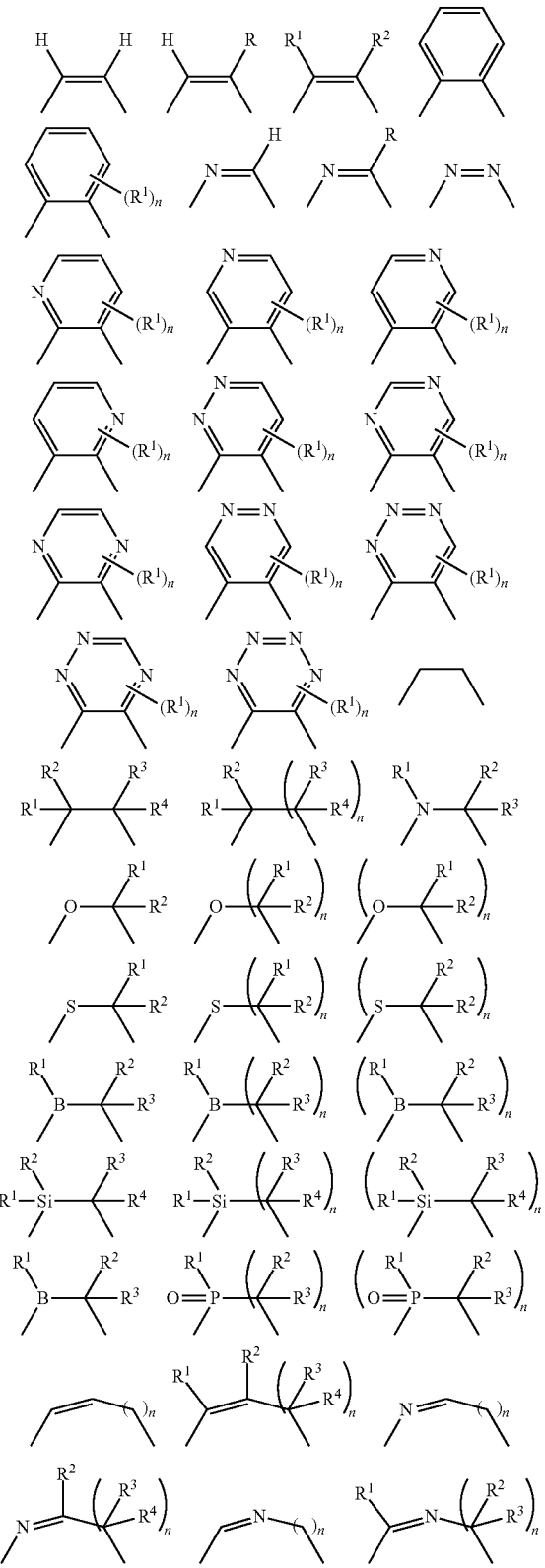

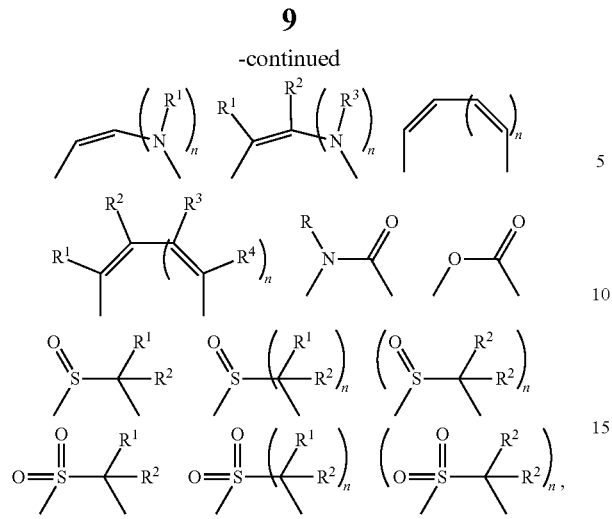

wherein at least one of V, X, and Y is $V^1$, $V^2$, $V^3$, or $V^4$, wherein m and n independently is an integer from 0 to 4, wherein each of $V^1$, $V^2$, $V^3$ and $V^4$ independently is coordinated to M, and wherein each of $V^1$, $V^2$, $V^3$ and $V^4$ independently is N, C, CH, P, B, SiH, or Si, wherein each of R, $R^1$, $R^2$, $R^3$, and $R^4$, independently is hydrogen, aryl, cycloalkyl, cycloalkenyl, heterocyclyl, heteroaryl, alkyl, alkenyl, alkynyl, deuterium, halogen, hydroxyl, thiol, nitro, cyano, amino, a mono- or di-alkylamino, a mono- or diaryl amino, alkoxy, aryloxy, haloalkyl, aralkyl, ester, nitrile, isonitrile, alkoxycarbonyl, acylamino, alkoxycarbonylamino, aryloxycarbonylamino, sulfonylamino, sulfamoyl, carbamoyl, alkylthio, sulfinyl, ureido, phosphoramide, amercapto, sulfo, carboxyl, hydrzino, substituted silyl, or polymerizable, or any conjugate or combination thereof, wherein each of $V^1$, $V^2$, $V^3$ and $V^4$ independently optionally is substituted for any one of $V^1$, $V^2$, $V^3$ and $V^4$.

In one aspect each of $Z^1$, $Z^2$, and $Z^3$ independently is present. In another aspect, $Z^1$ and $Z^2$ are present and $Z^3$ is absent. In yet another aspect, $Z^2$ and $Z^3$ are present and $Z^1$ is absent. In yet another aspect, $Z^1$ and $Z^3$ are present and $Z^2$ is absent. In yet another aspect, each of $Z^1$, $Z^2$, and $Z^3$ independently is absent. In another aspect, $Z^1$ and $Z^2$ are absent and $Z^3$ is present. In yet another aspect, $Z^2$ and $Z^3$ are absent and $Z^1$ is present. In yet another aspect, $Z^1$ and $Z^3$ are absent and $Z^2$ is present.

In one aspect, the compound can have the structure

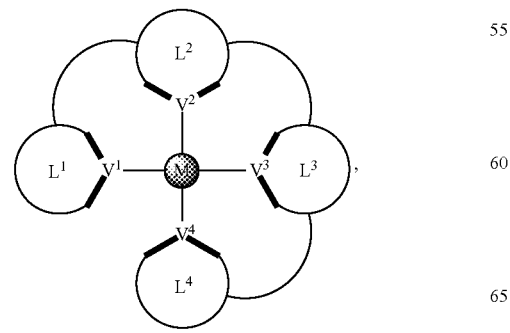

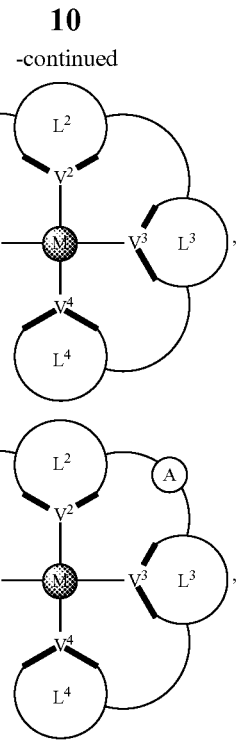

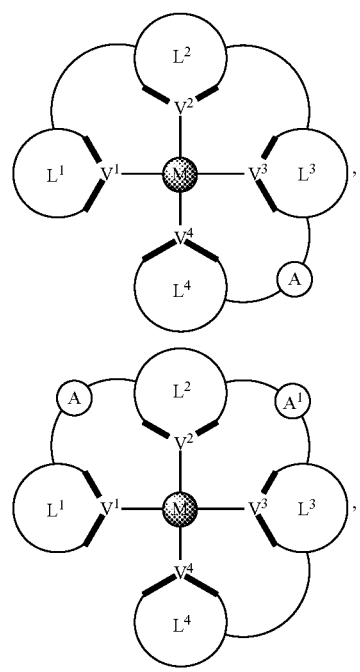

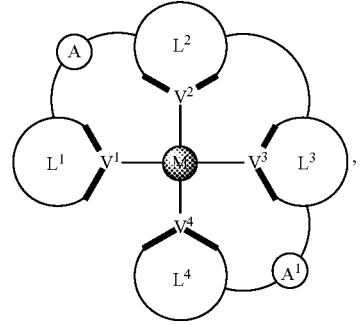

-continued
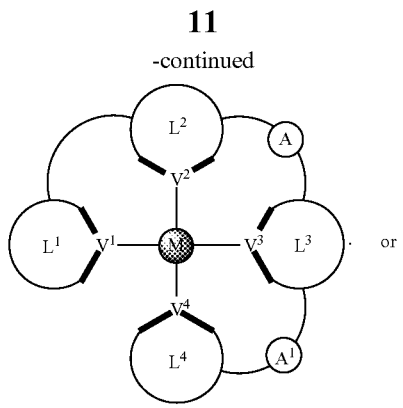
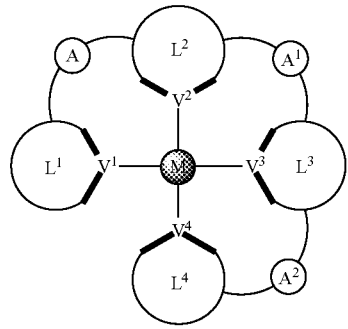
In another aspect, the compound can have the structure.
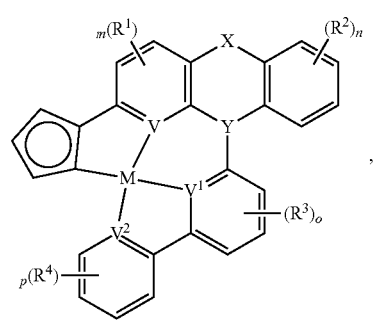
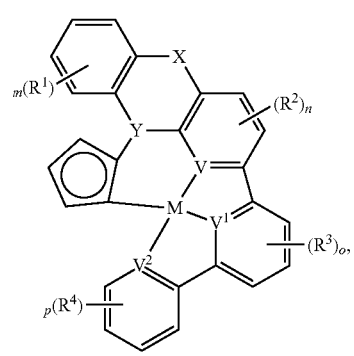
-continued
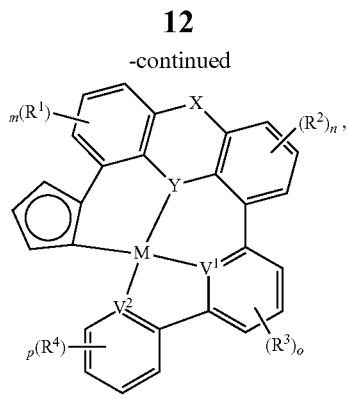
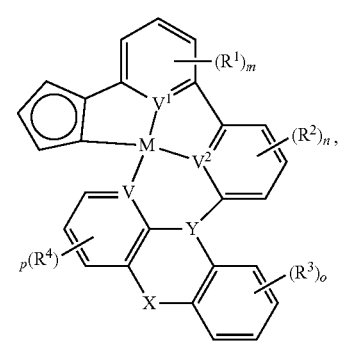
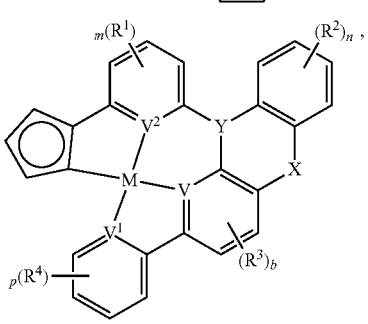
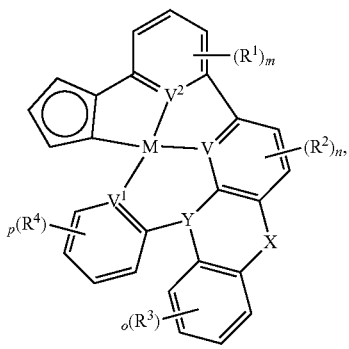
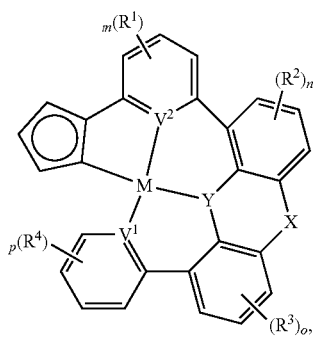

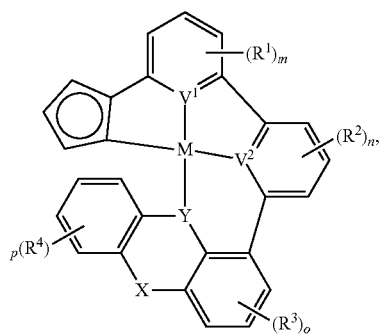
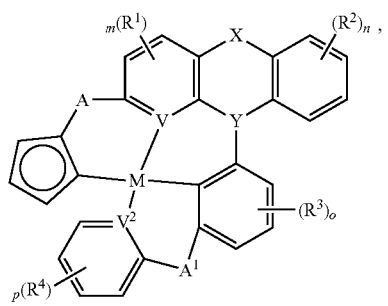
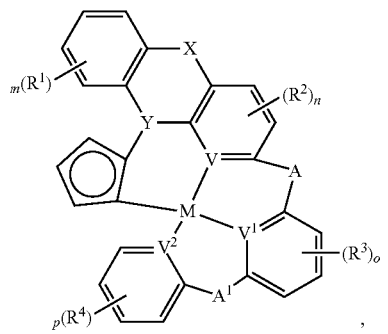
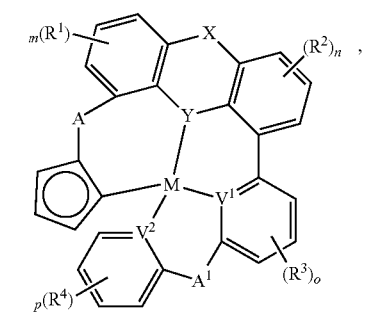
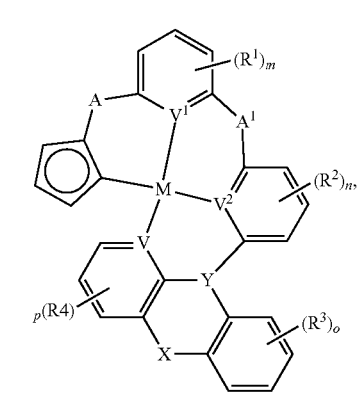
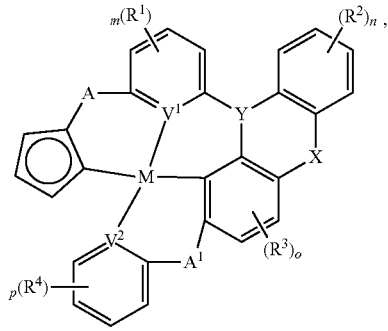
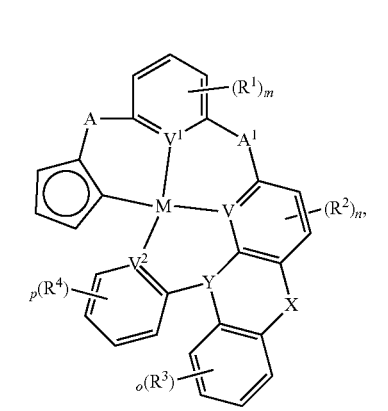
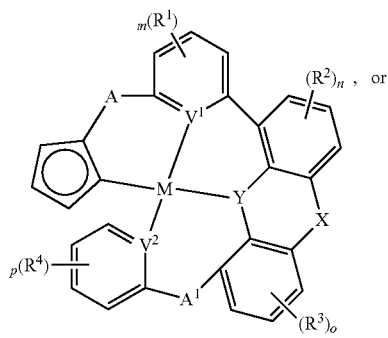
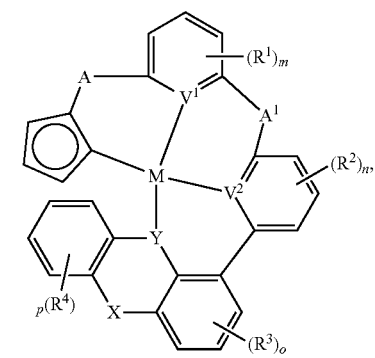
wherein each of o and p independently is an integer of 0 to 4.

In another aspect, the compound can have the structure:
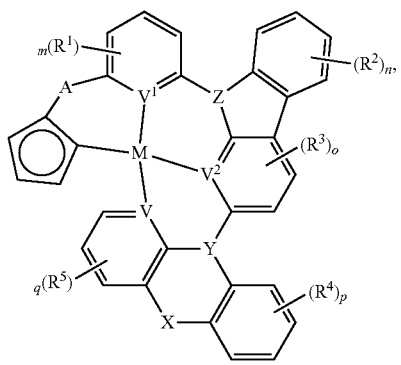
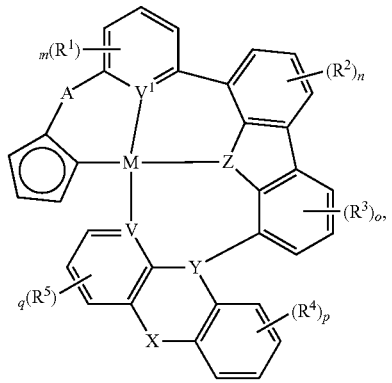
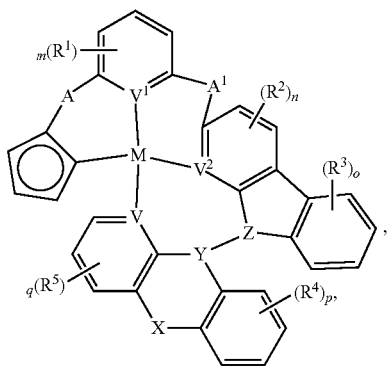
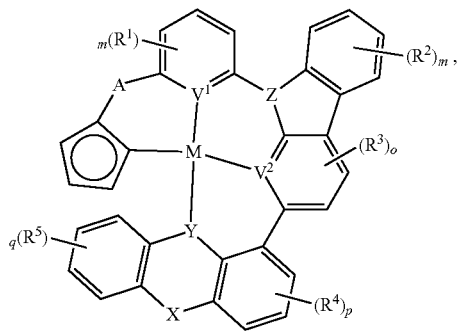
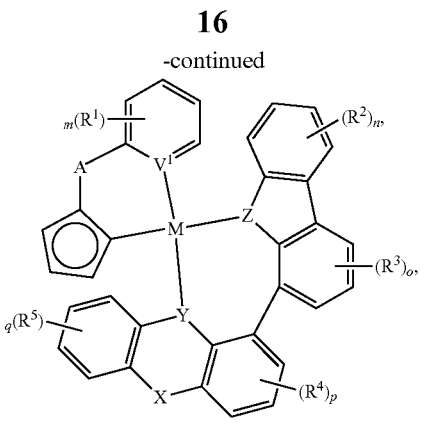
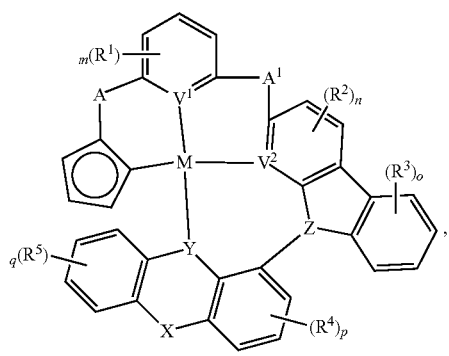
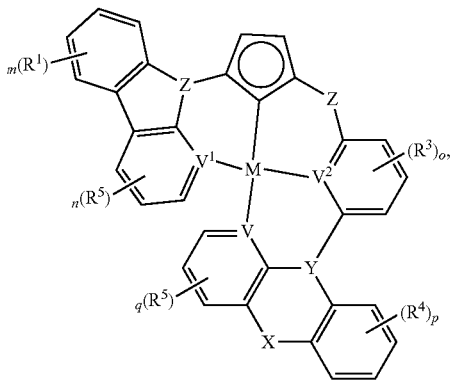
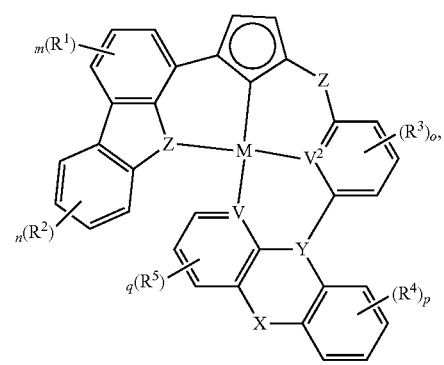

-continued
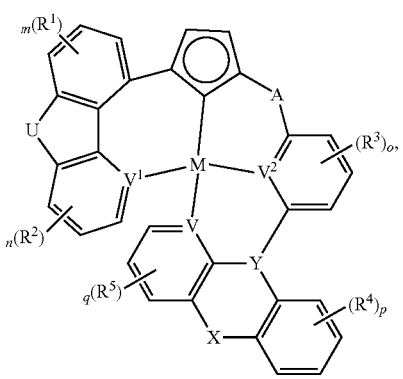
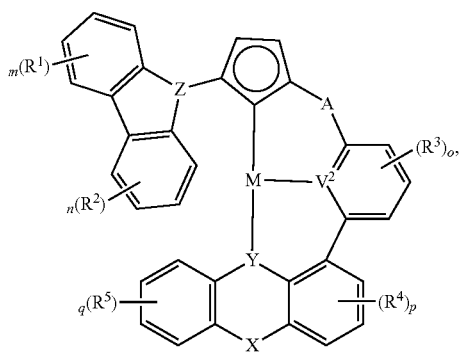
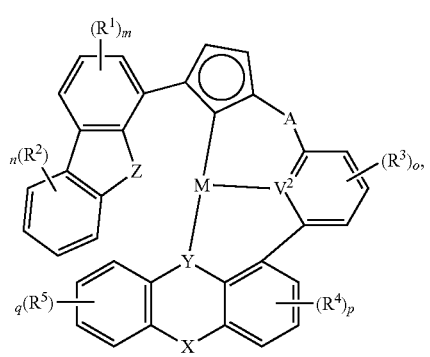
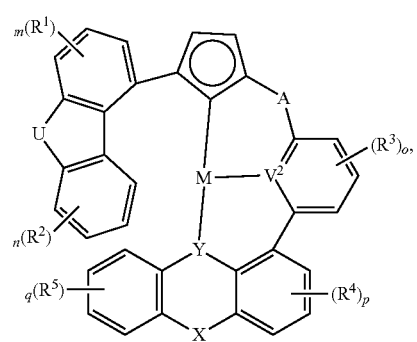
-continued
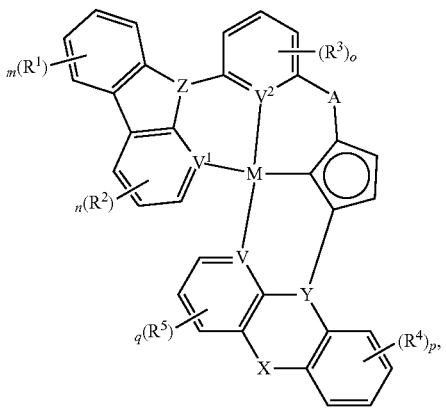
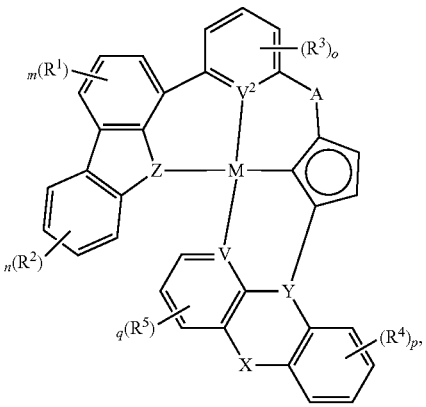
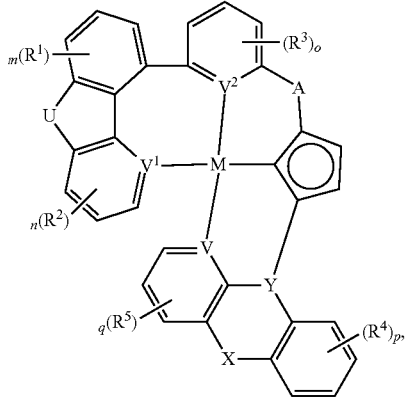
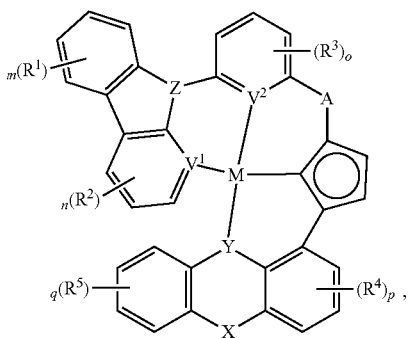

-continued
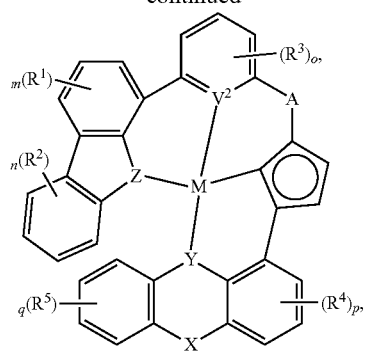
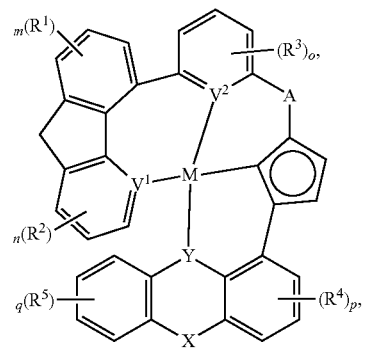
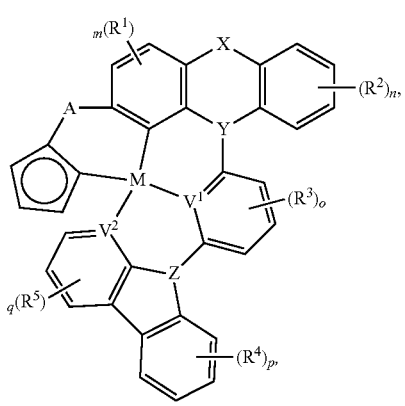
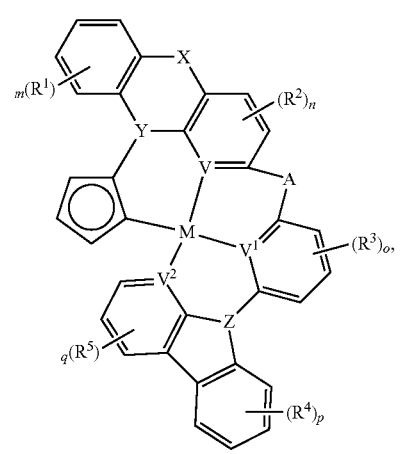
-continued
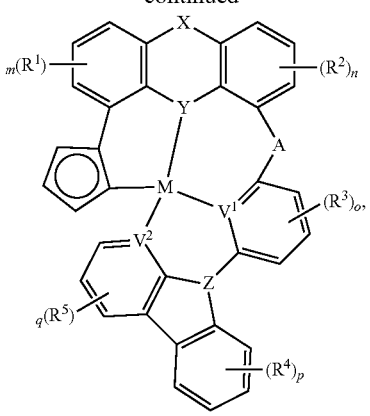
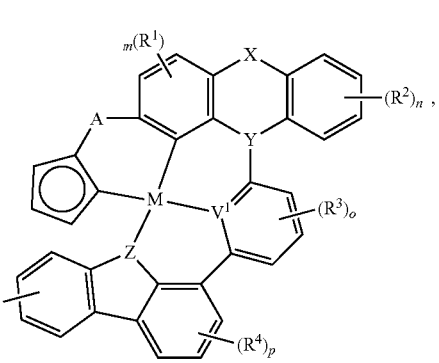
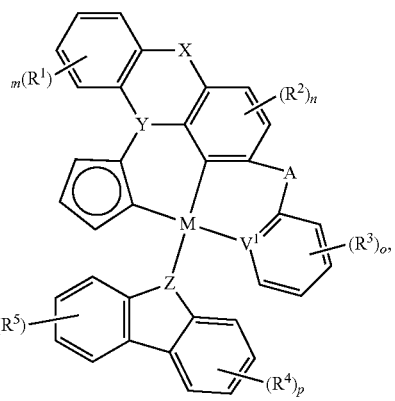
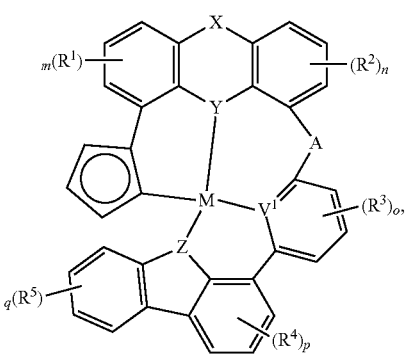

-continued
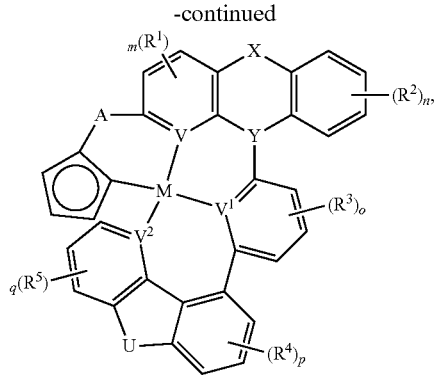
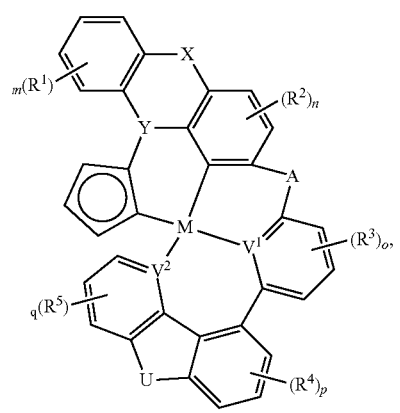
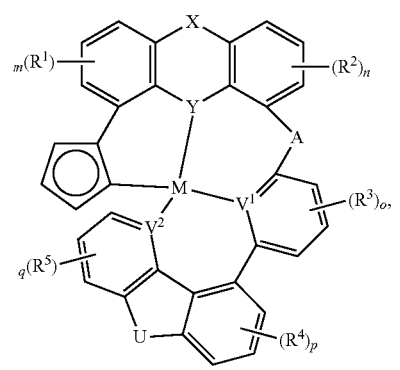
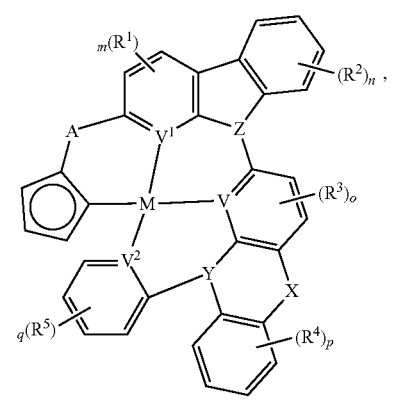
-continued
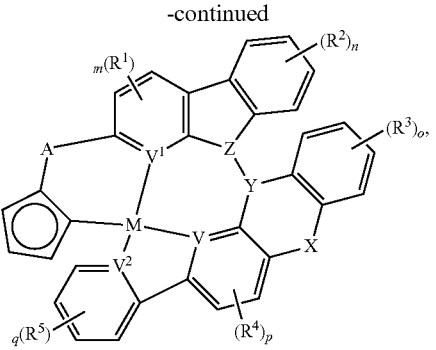
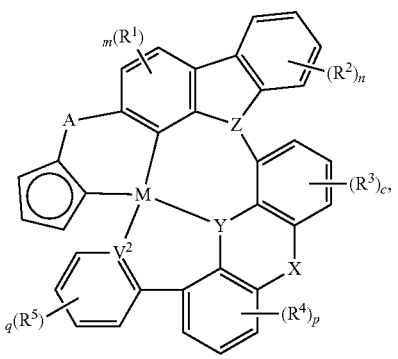
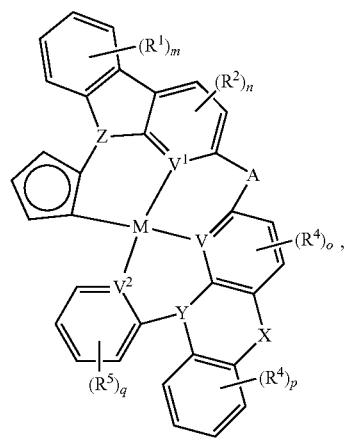
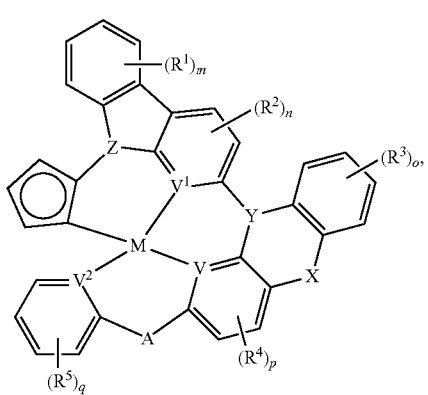

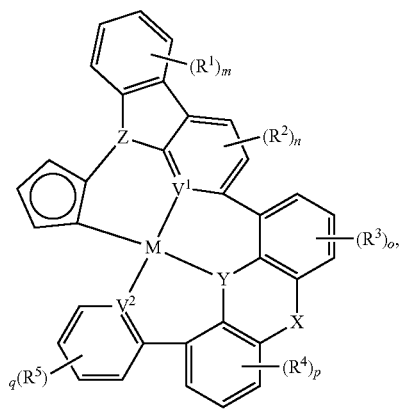
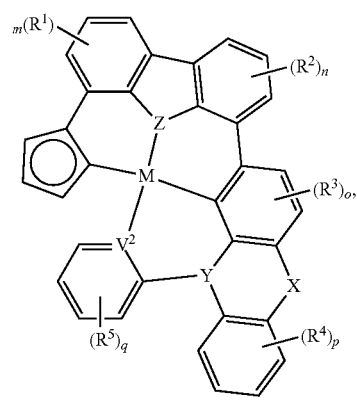
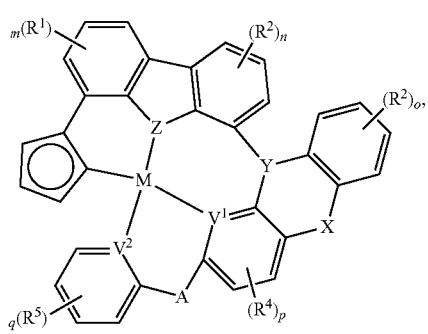
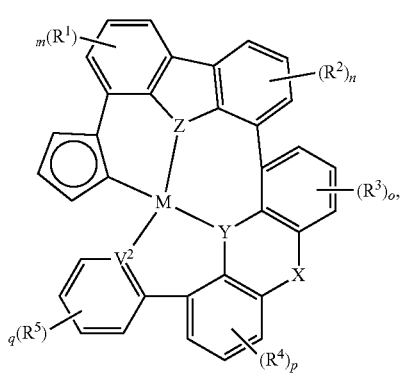
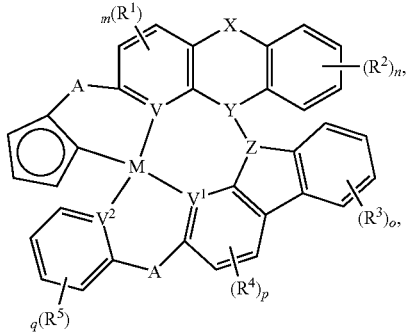
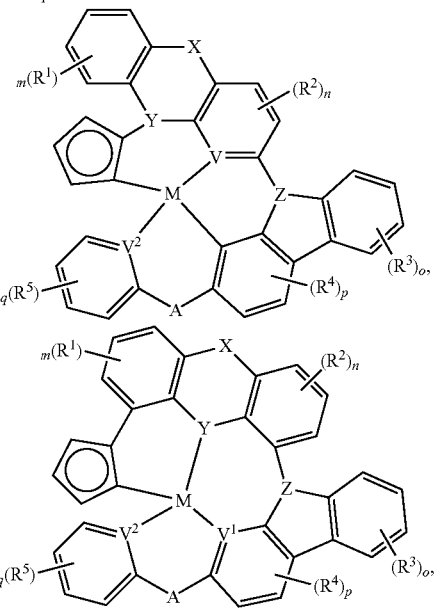
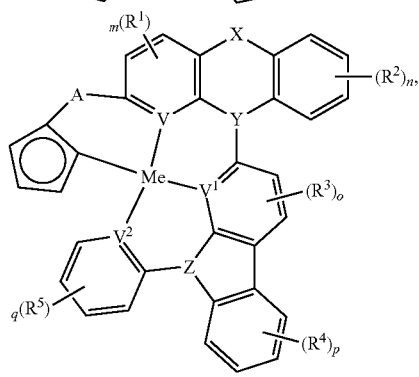
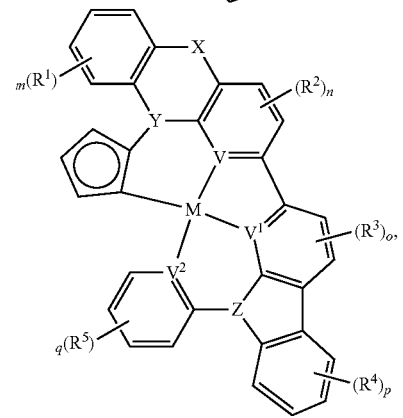

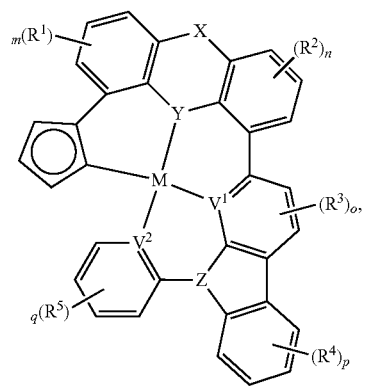
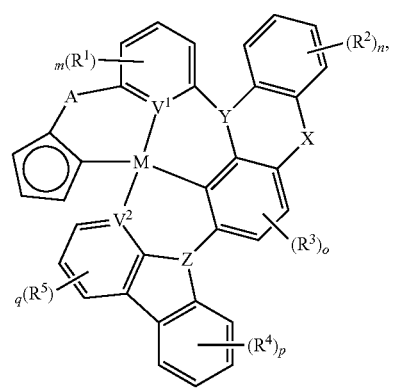
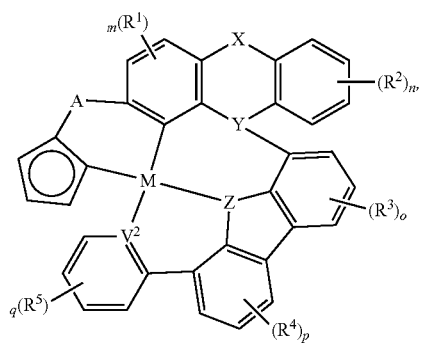
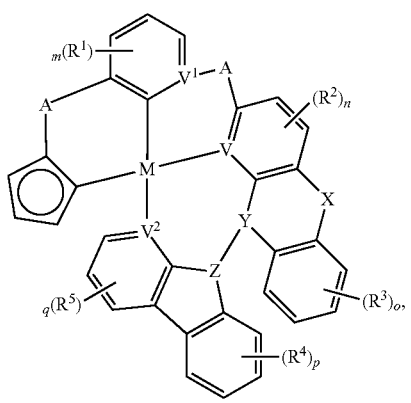
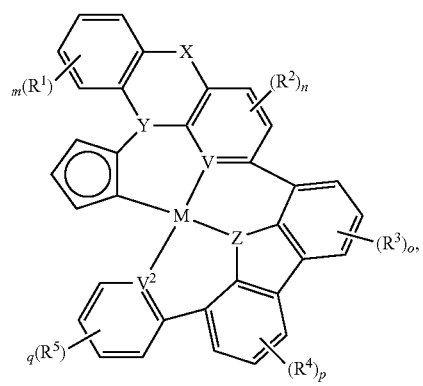
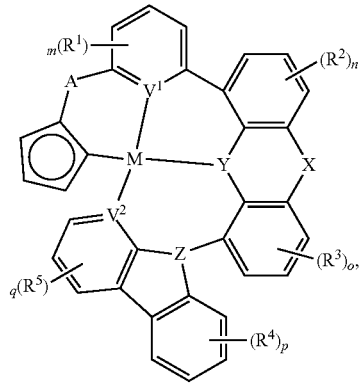
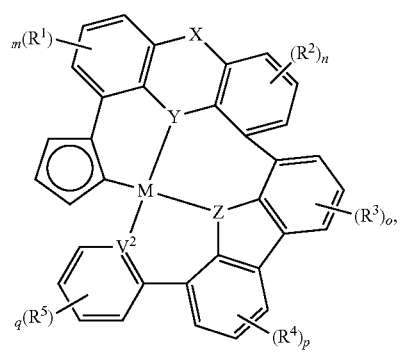
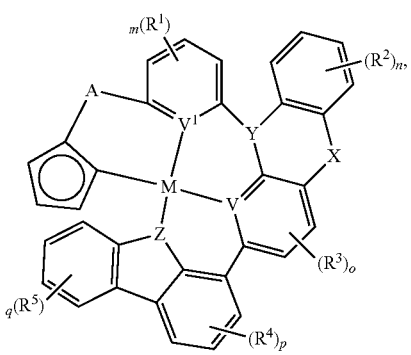

-continued
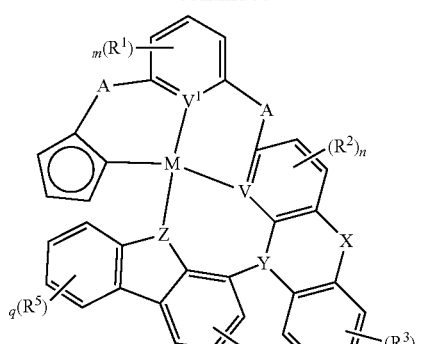
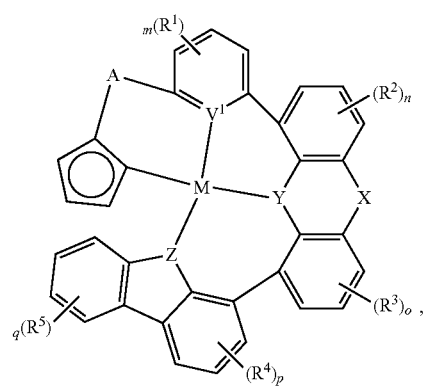
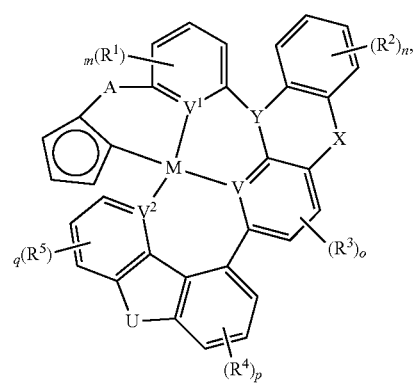
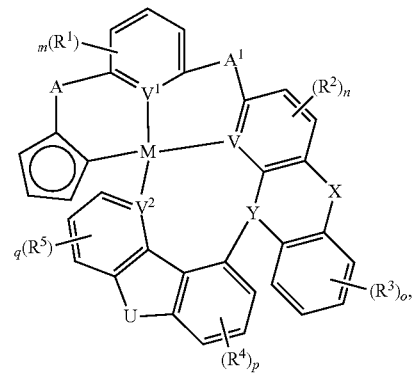
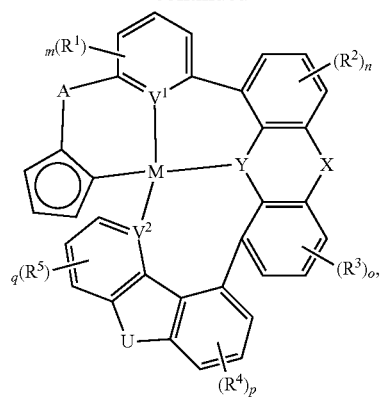
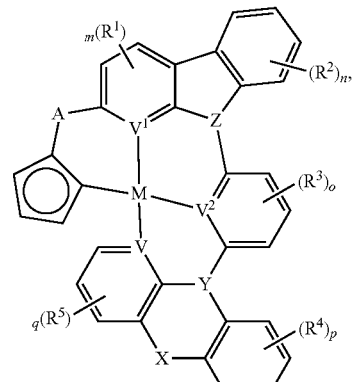
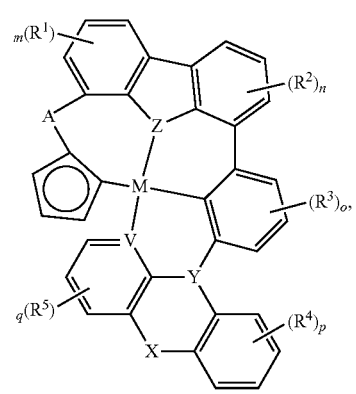
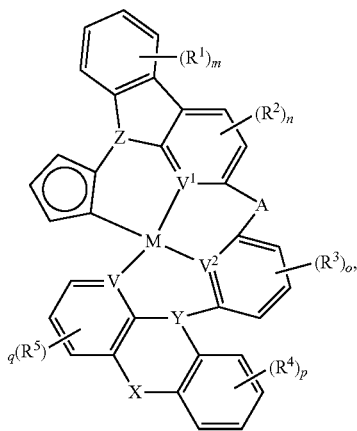

-continued

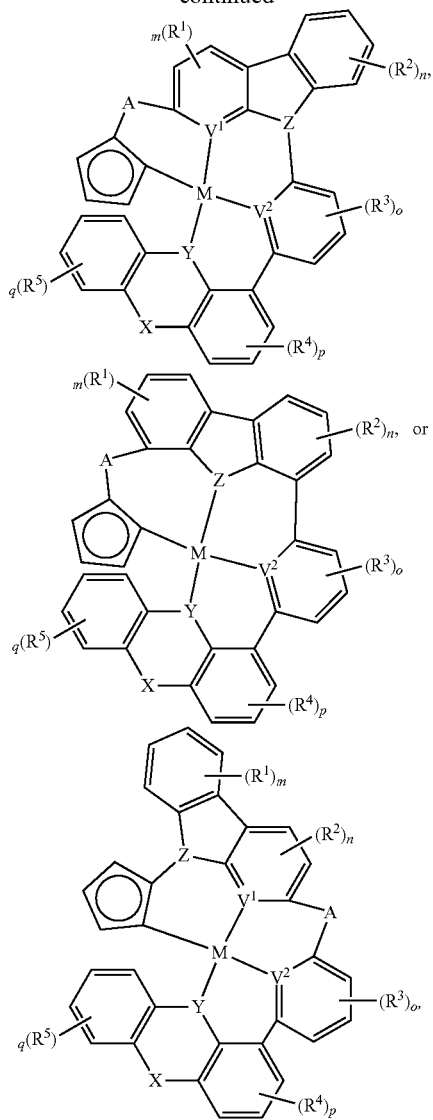

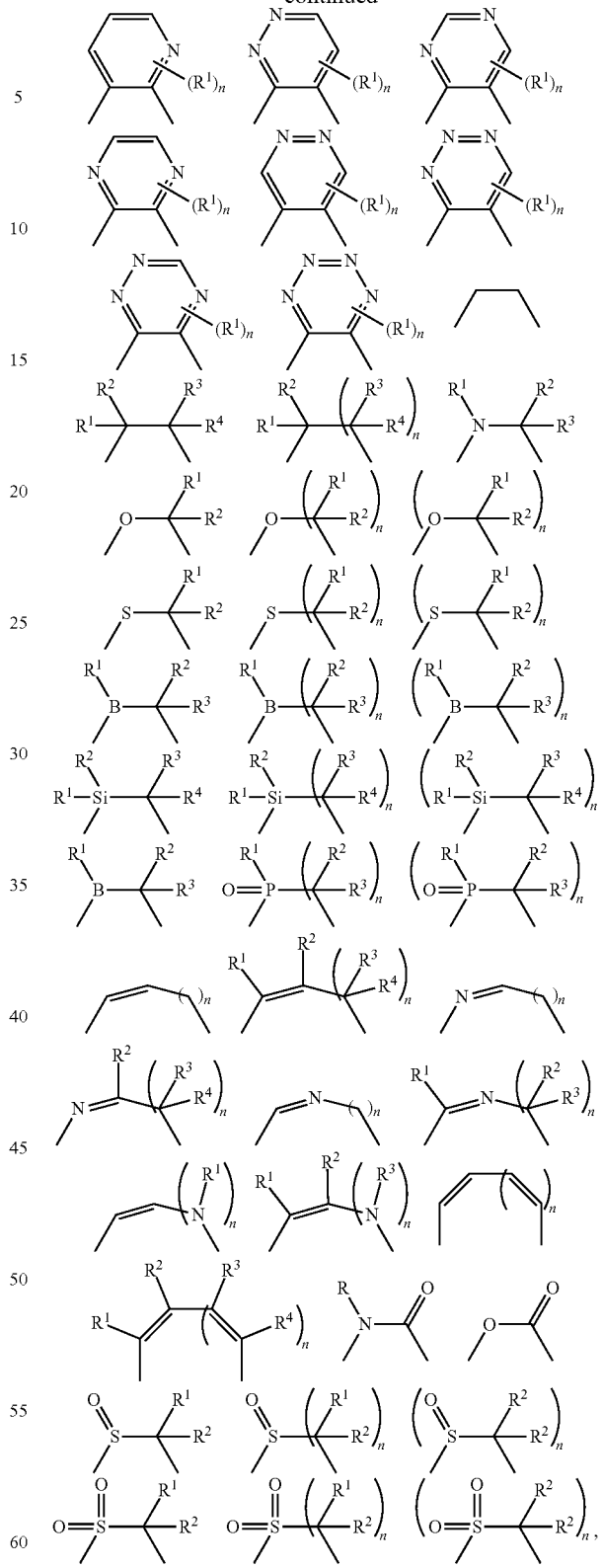

wherein each of o, p, and q independently is an integer of 0 to 4, wherein each of Z and U independently is $V^1$, $V^2$, $V^1$, $V^4$, O, S, S=O, $SO_2$, Se, $NR^3$, $PR^3$, $R^1P$=O, $CR^1R^2$, C=O, $SiR^1R^2$, $GeR^1R^2$, BH, P(O)H, PH, NH, $CR^1H$, $CH_2$, $SiH_2$, $SiHR^1$, BH, or $BR^3$, or any one of

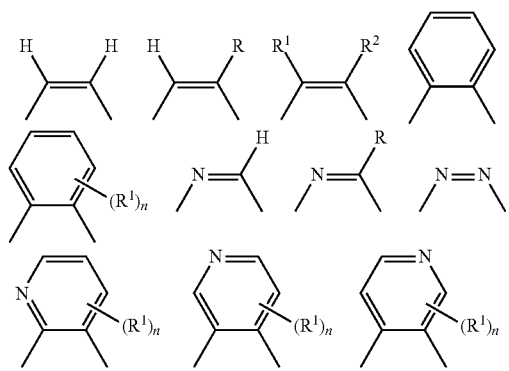

wherein at least one of U, V, X, Y, and Z is $V^1$, $V^2$, $V^3$, or $V^4$.

wherein each $R^5$ independently is hydrogen, aryl, cycloalkyl, cycloalkenyl, heterocyclyl, heteroaryl, alkyl, alkenyl, alkynyl, deuterium, halogen, hydroxyl, thiol, nitro, cyano, amino, a mono- or di-alkylamino, a mono- or diaryl amino, alkoxy, aryloxy, haloalkyl, aralkyl, ester, nitrile, isonitrile, alkoxycarbonyl, acylamino, alkoxycarbonylamino, aryloxycarbonylamino, sulfonylamino, sulfamoyl, carbamoyl, alkylthio, sulfinyl, ureido, phosphoramide, amercapto, sulfo, carboxyl, hydrzino, substituted silyl, or polymerizable, or any conjugate or combination thereof.

In one aspect, the compound can have the structure:

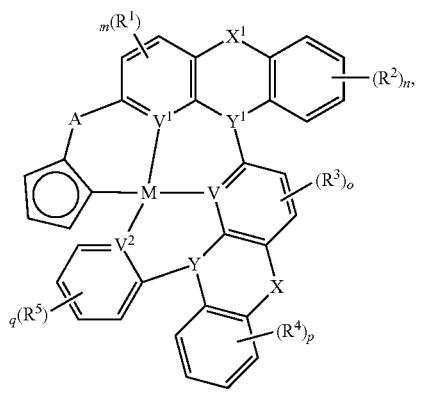

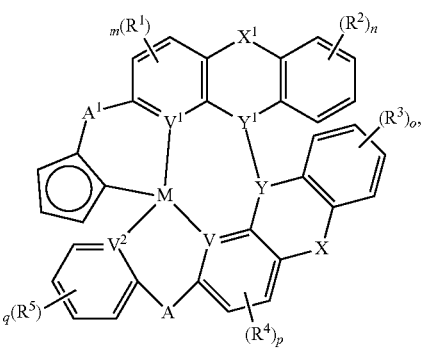

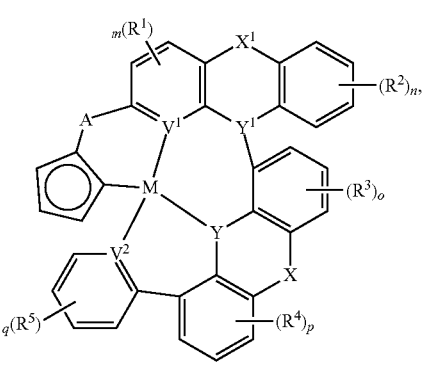

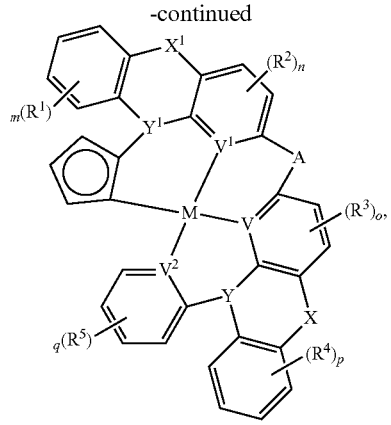

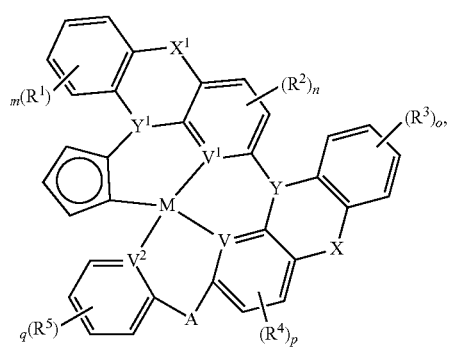

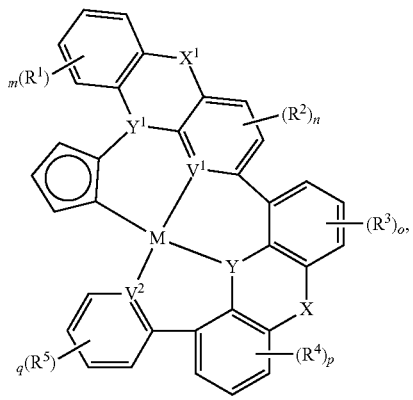

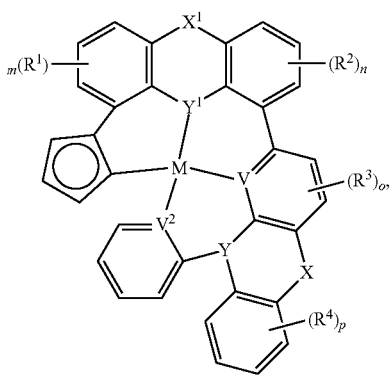

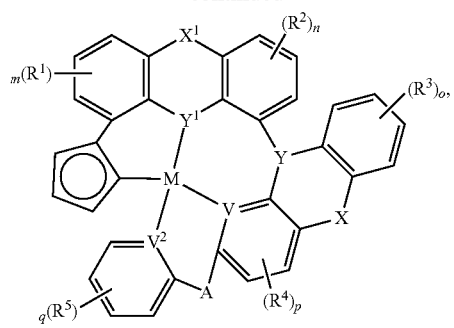
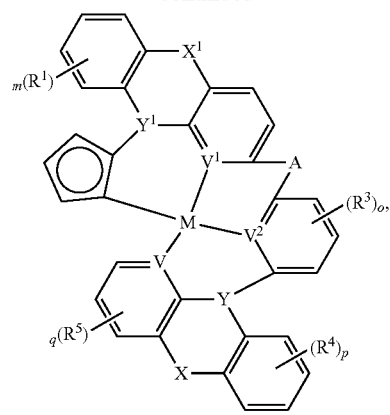
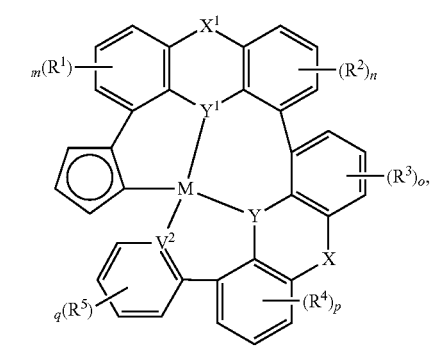
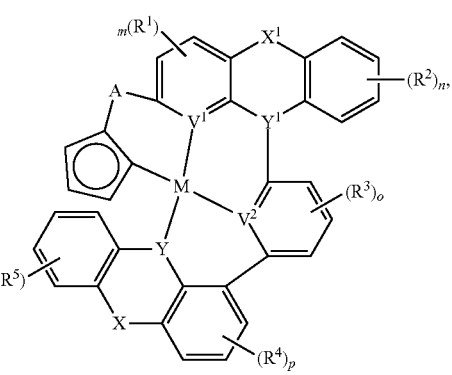
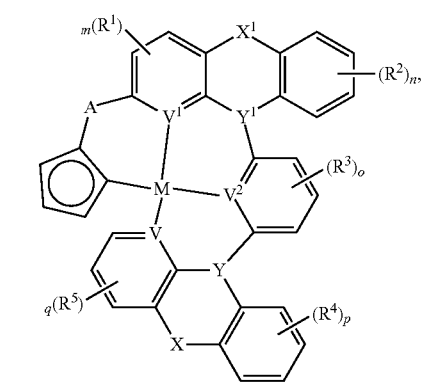
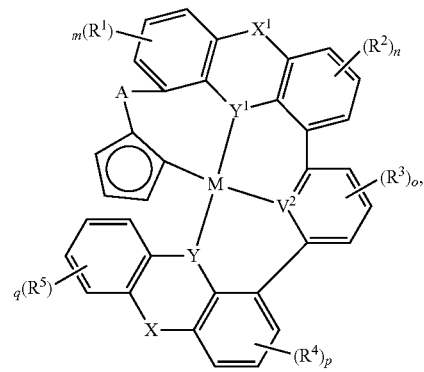
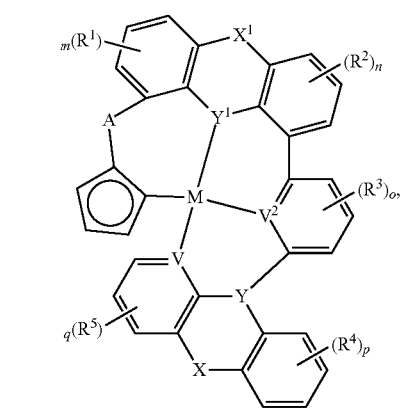
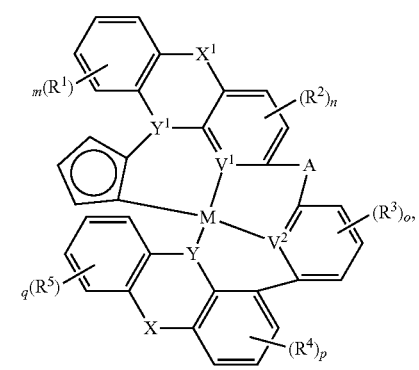

-continued
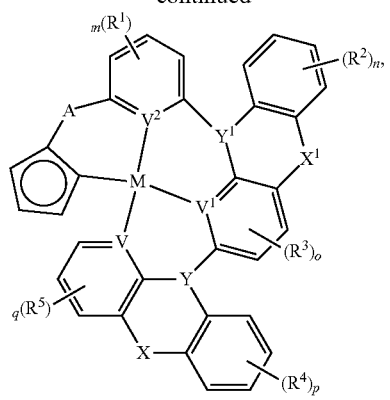
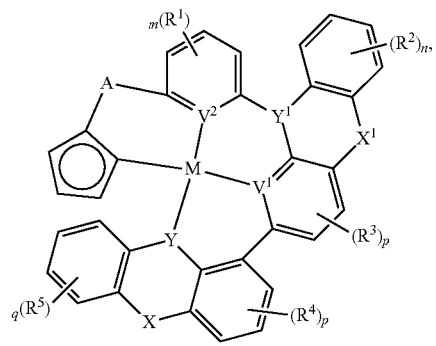
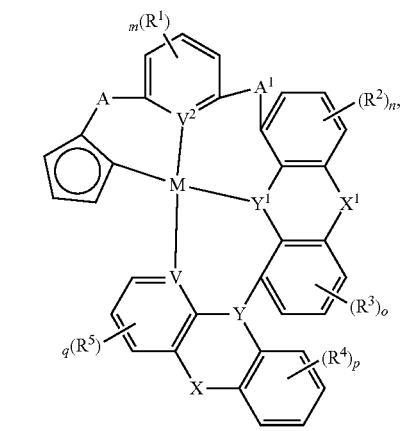
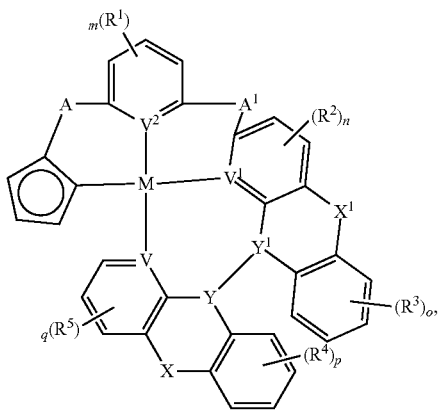
-continued
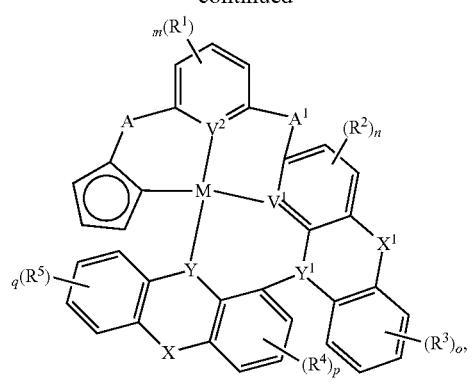
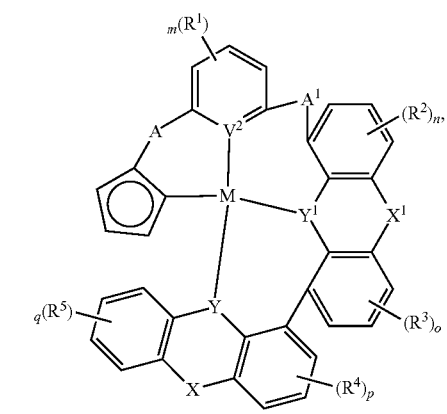
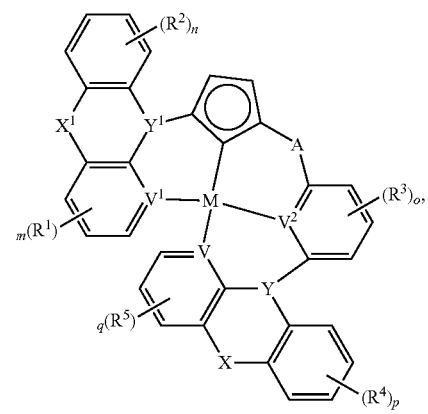
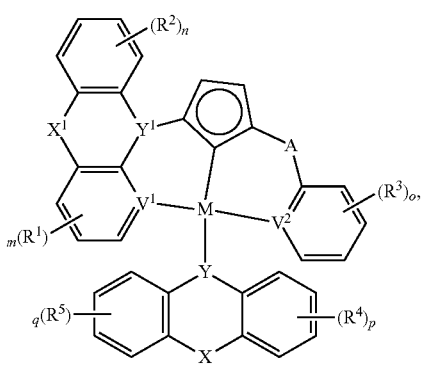

37
-continued
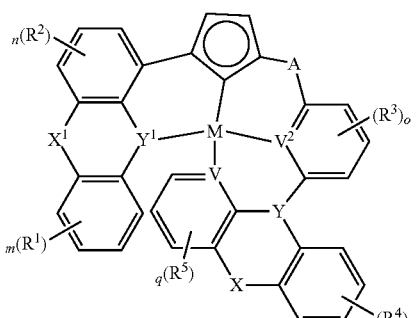
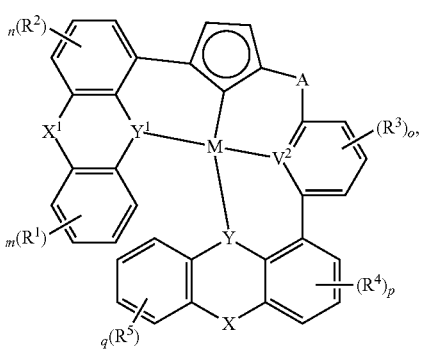
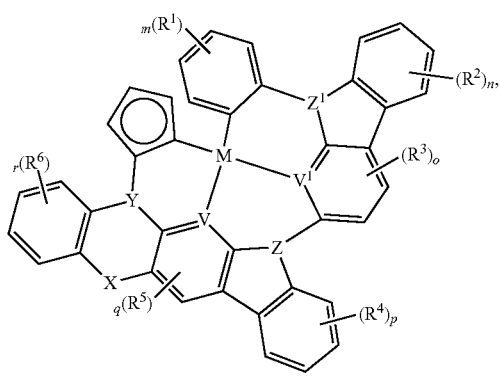
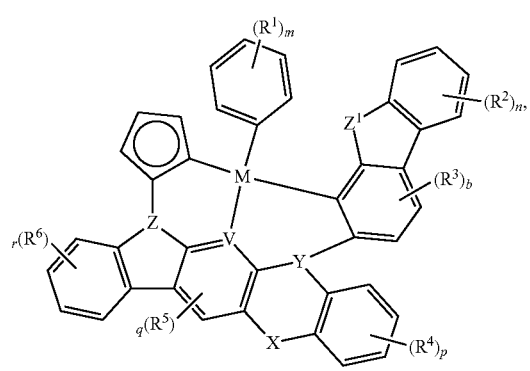
38
-continued
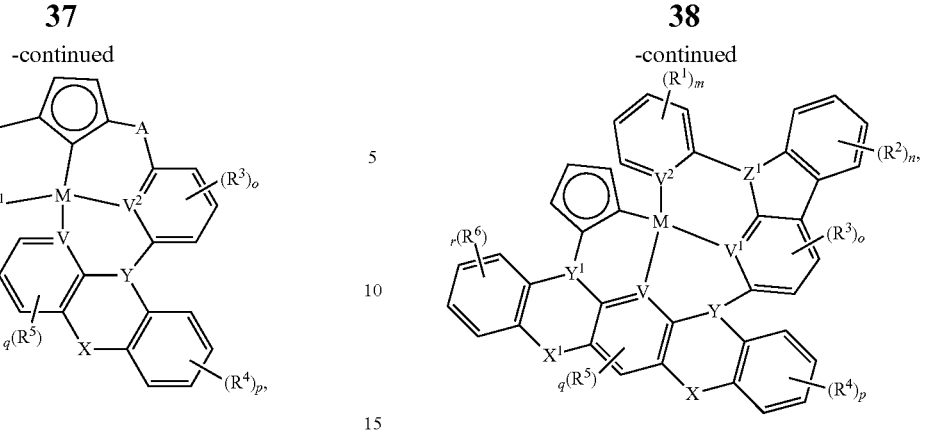
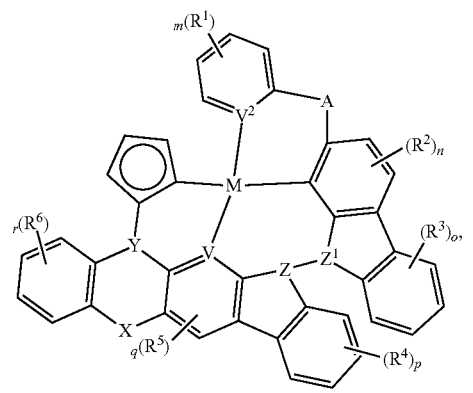
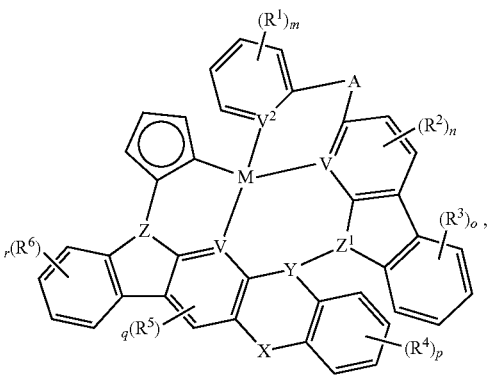
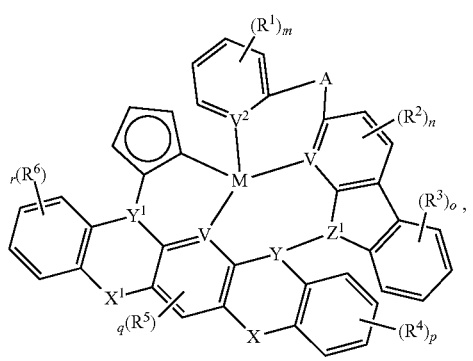

-continued
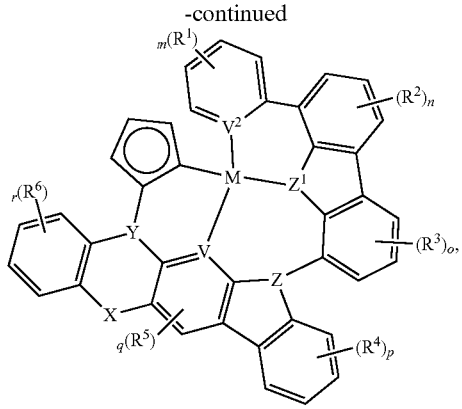
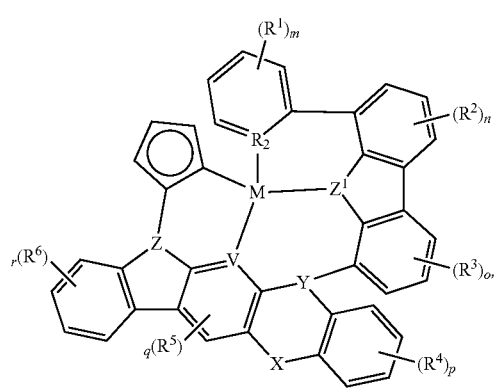
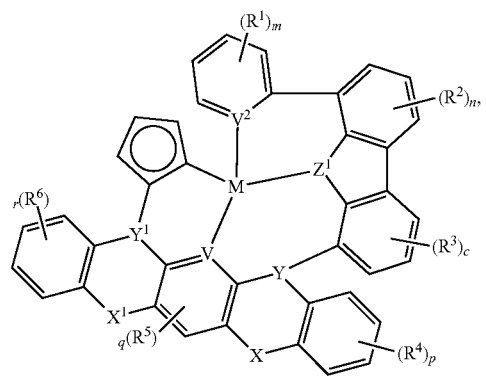
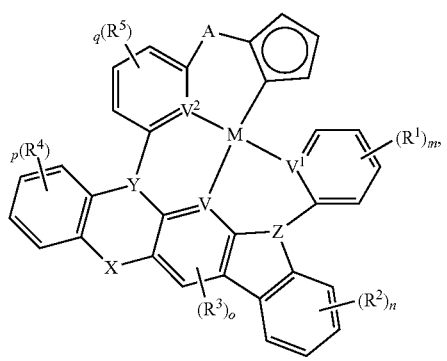
-continued
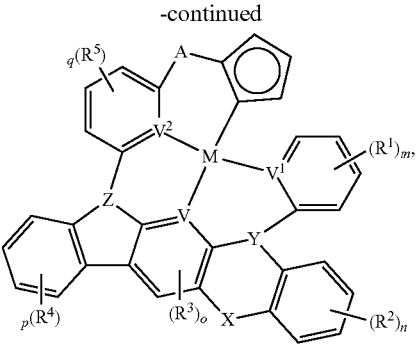
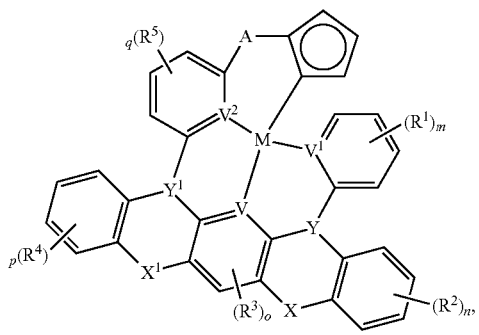
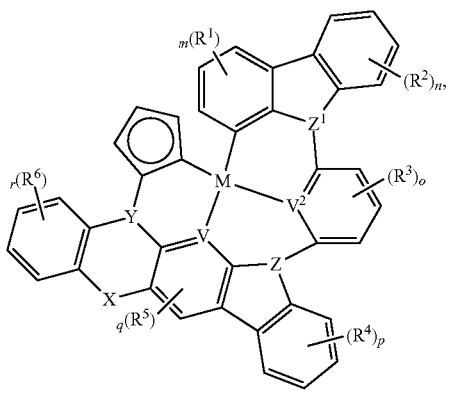
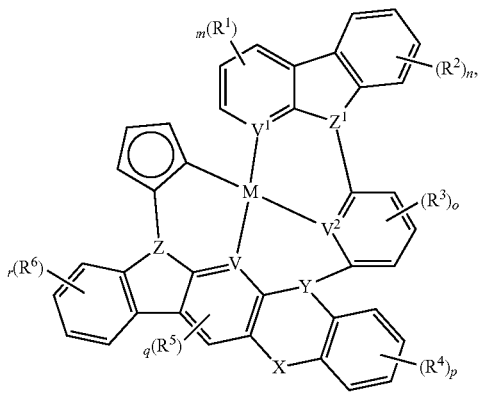

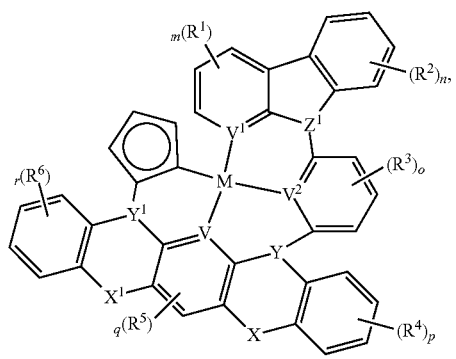
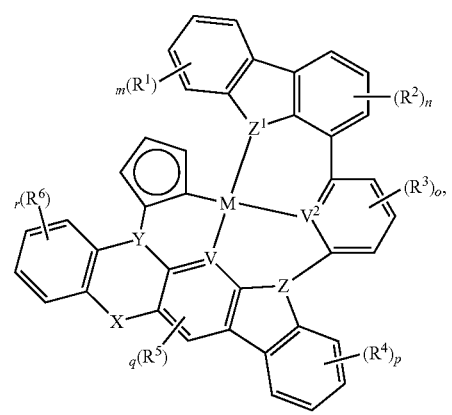
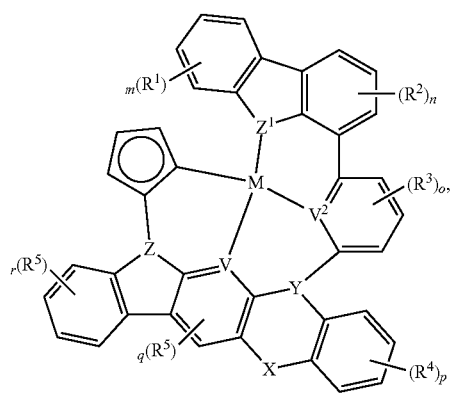
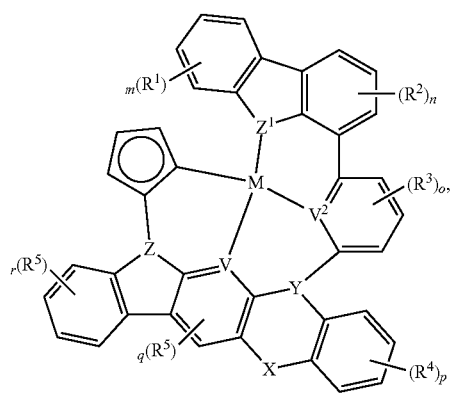
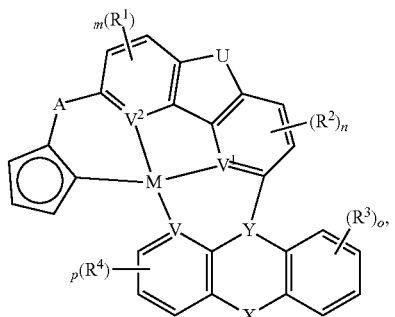
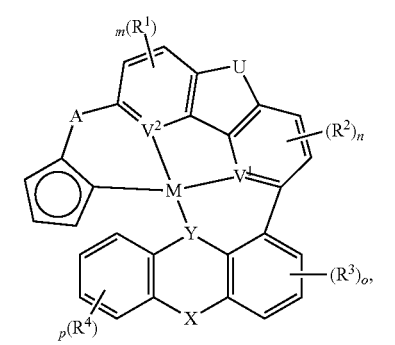
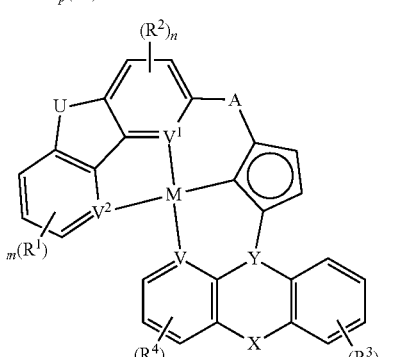
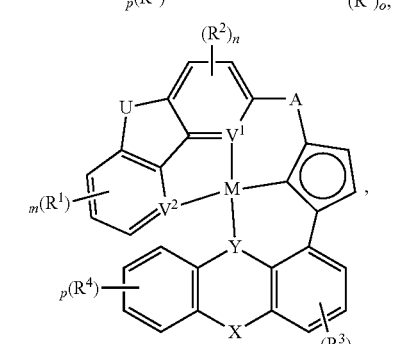
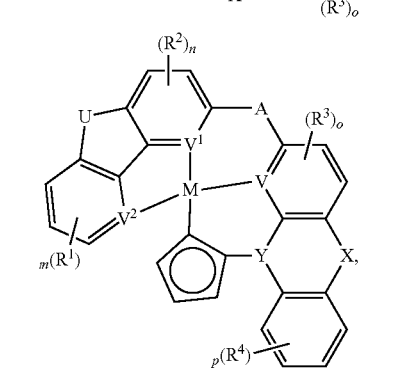

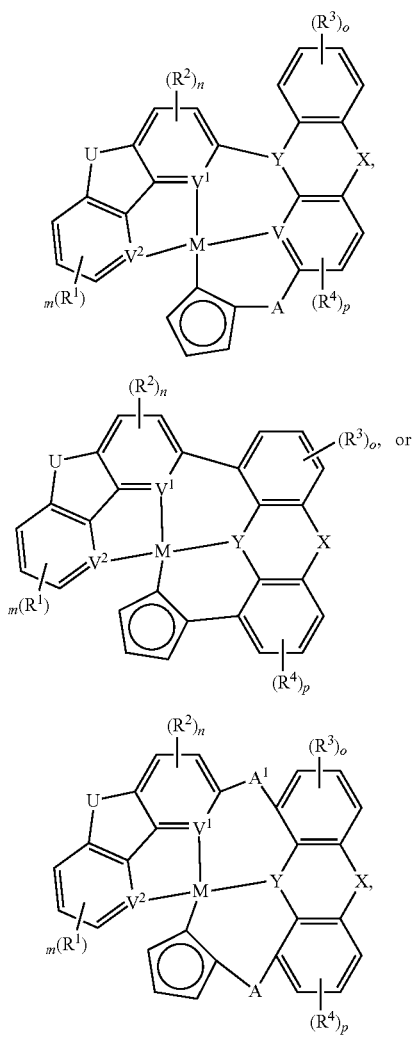
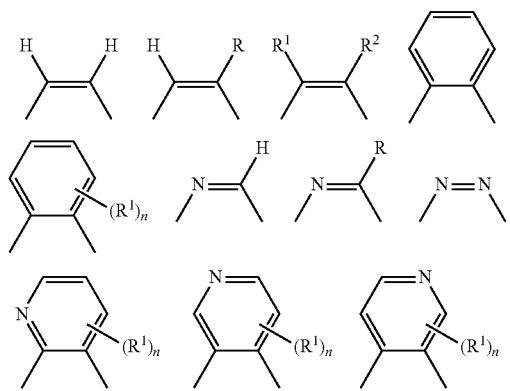
wherein each of o, p, q, and r independently is an integer of 0 to 4,
wherein each of U, $Y^1$, $X^1$, Z, and $Z^1$, independently is $V^1$, $V^2$, $V^3$, $V^4$, O, S, S=O, $SO_2$, Se, $NR^3$, $PR^3$, $R^1P$=O, $CR^1R^2$, C=O, $SiR^1R^2$, $GeR^1R^2$, BH, P(O)H, PH, NH, $CR^1H$, $CH_2$, $SiH_2$, $SiHR^1$, BH, or $BR^3$, or any one of
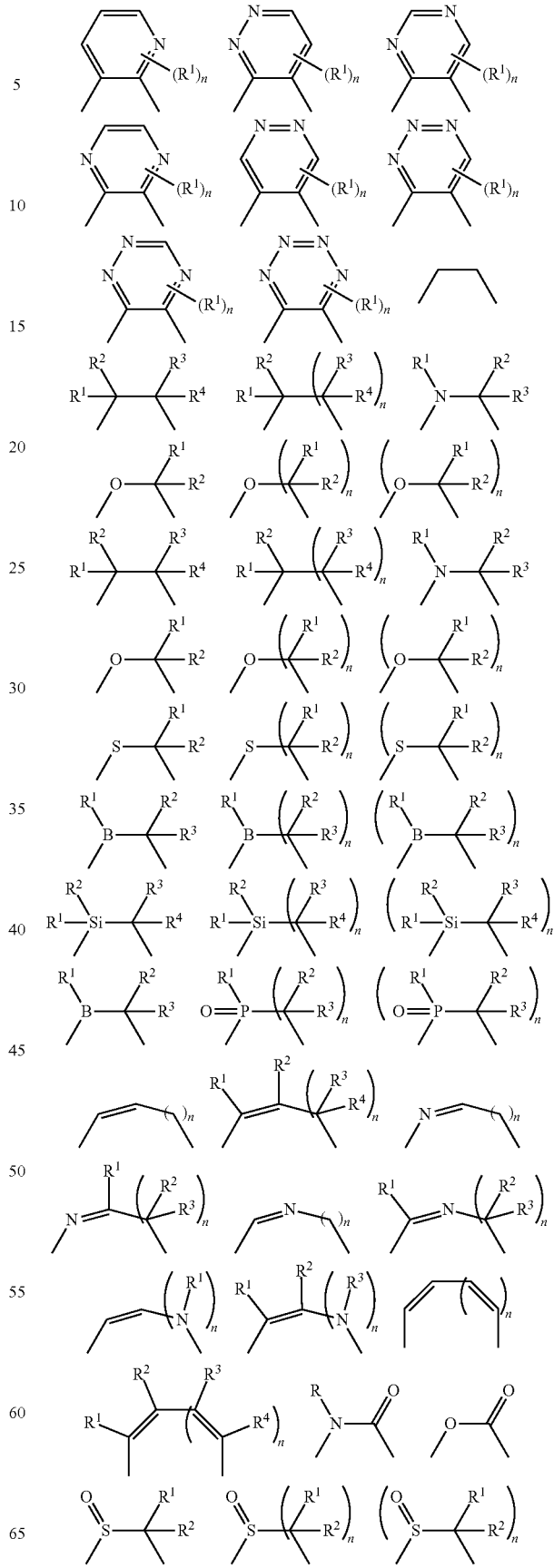

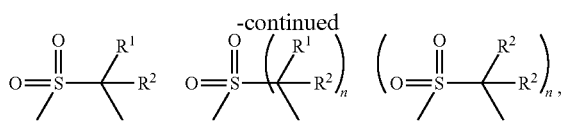

wherein at least one of U, V, X, Y, and Z is $V^1$, $V^2$, $V^3$, or $V^4$, wherein each $R^5$ independently is hydrogen, aryl, cycloalkyl, cycloalkenyl, heterocyclyl, heteroaryl, alkyl, alkenyl, alkynyl, deuterium, halogen, hydroxyl, thiol, nitro, cyano, amino, a mono- or di-alkylamino, a mono- or diaryl amino, alkoxy, aryloxy, haloalkyl, aralkyl, ester, nitrile, isonitrile, alkoxycarbonyl, acylamino, alkoxycarbonylamino, aryloxycarbonylamino, sulfonylamino, sulfamoyl, carbamoyl, alkylthio, sulfinyl, ureido, phosphoramide, amercapto, sulfo, carboxyl, hydrzino, substituted silyl, or polymerizable, or any conjugate or combination thereof.

In one aspect, in the disclosed compounds,

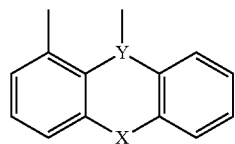

can be

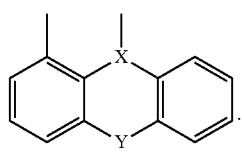

In one aspect, in the disclosed compounds,

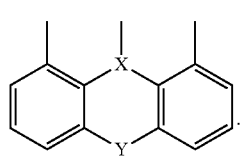

can be

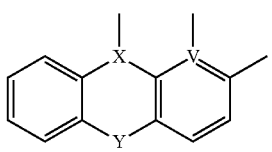

In one aspect, at least two of $L^1$, $L^2$, $L^3$, and $L^4$ is substituted or un substituted aryl or heteroaryl.

In one aspect, at least one of $V^1$, $V^2$, $V^3$, and $V^4$ is N. In another aspect, at least one of $V^1$, $V^2$, $V^3$, and $V^4$ is C. In yet another aspect, at least one of $V^1$, $V^2$, $V^3$, and $V^4$ is N and at least one of $V^1$, $V^2$, $V^3$, and $V^4$ is C. In yet another aspect, at least two of $V^1$, $V^2$, $V^3$, and $V^4$ is N and at least one of $V^1$, $V^2$, $V^3$, and $V^4$ is C. In yet another aspect, at least one of $V^1$, $V^2$, $V^3$, and $V^4$ is N and at least two of $V^1$, $V^2$, $V^3$, and $V^4$ is C.

In one aspect, at least one of $L^1$, $L^2$, $L^3$, and $L^4$ together with $V^1$, $V^2$, $V^3$, and $V^4$ respectively can comprise one or more of the following structures:

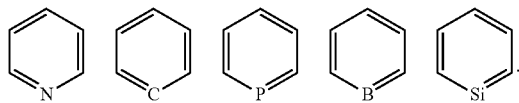

In another aspect, at least one of $L^1$, $L^2$, $L^3$, and $L^4$ together with $V^1$, $V^2$, $V^3$, and $V^4$ respectively or

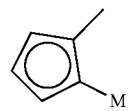

can comprise one or more of the following structures:

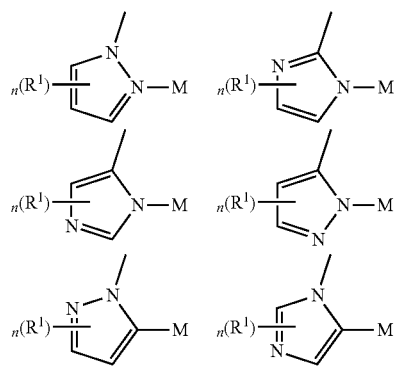

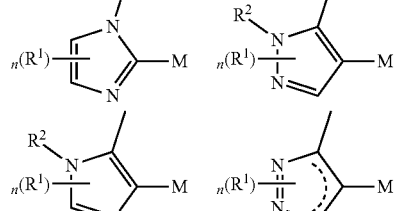

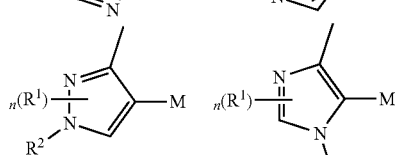

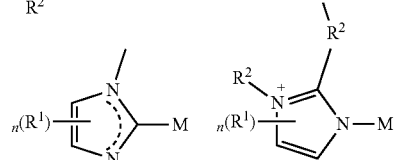

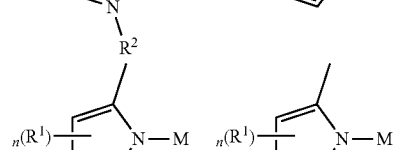

-continued
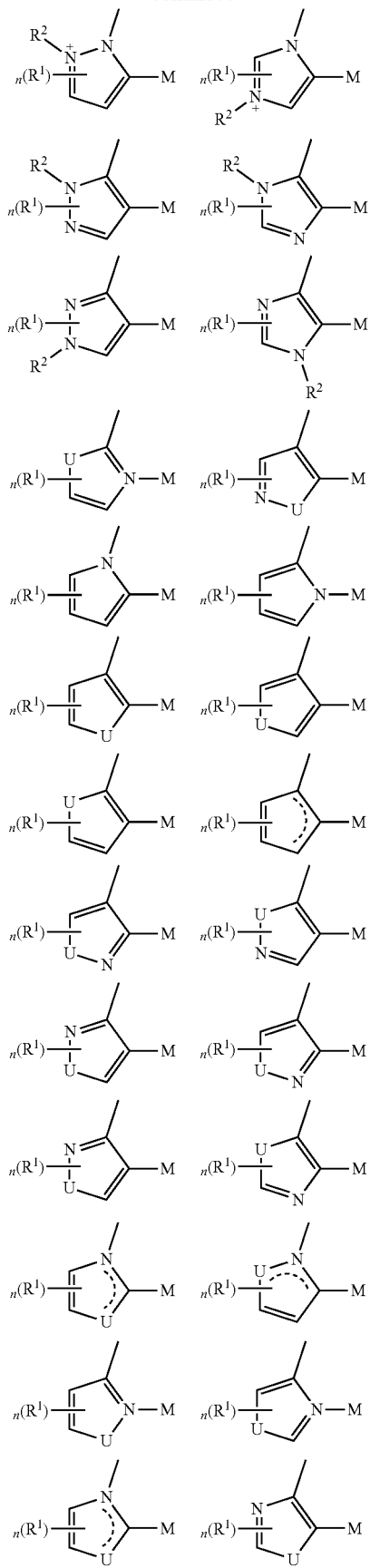
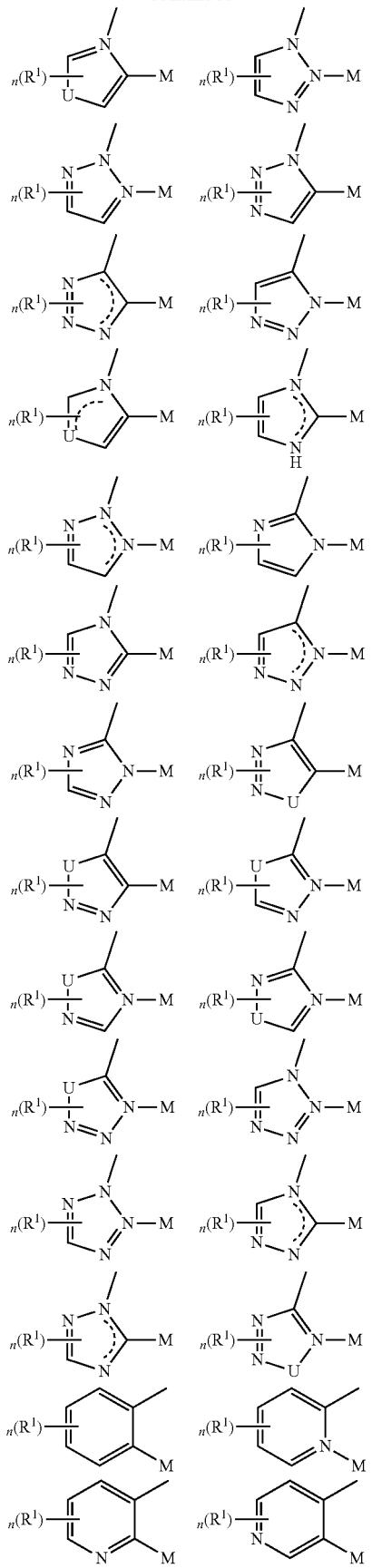

-continued
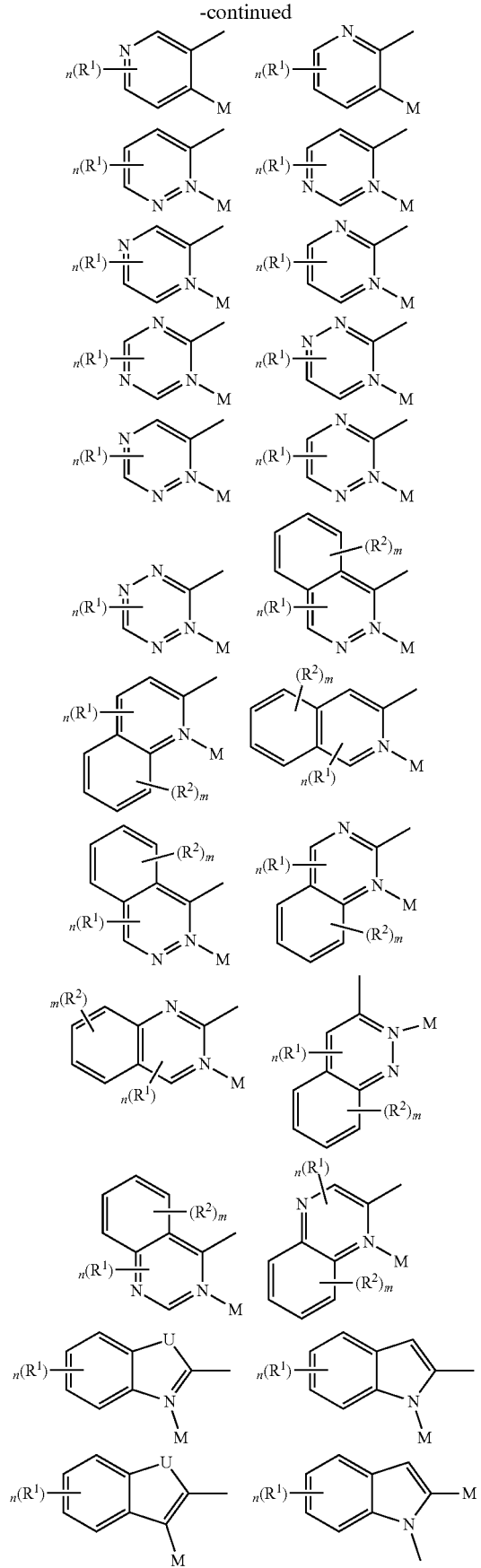
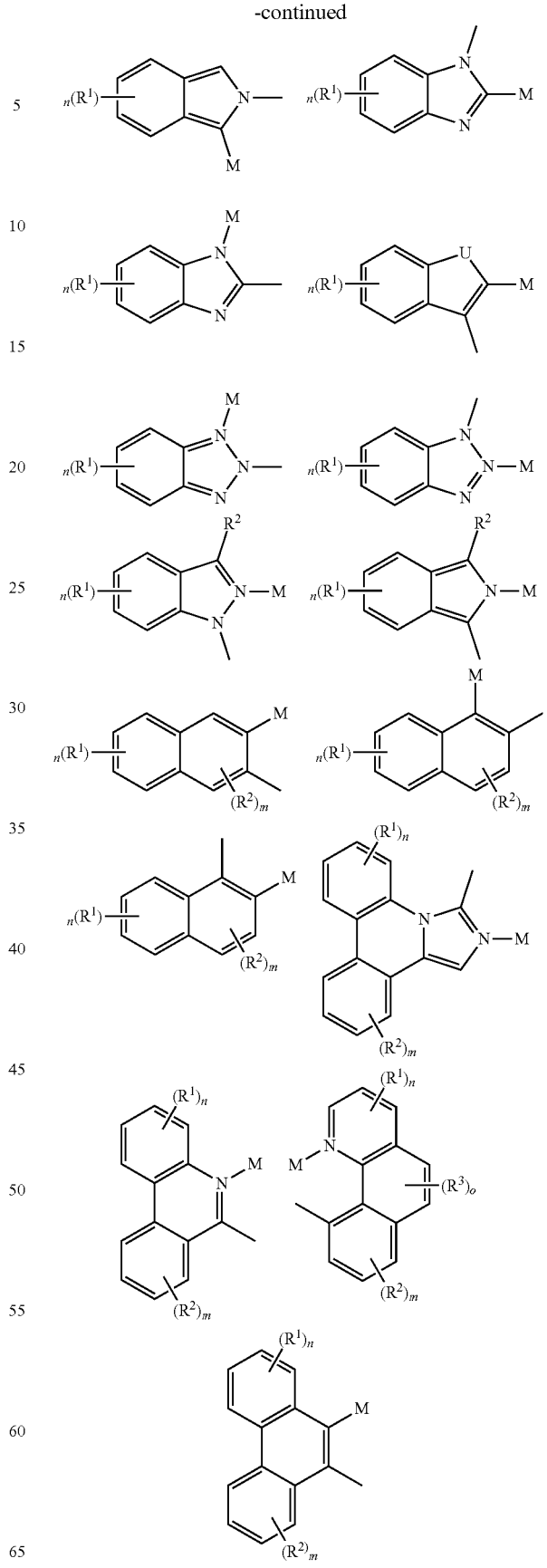

In one aspect,
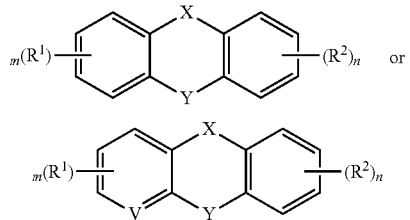
or
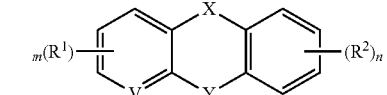
can have the structure
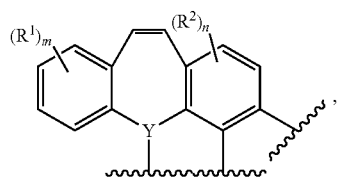,
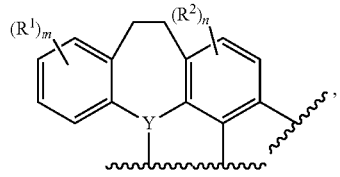,
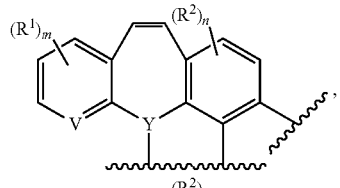,
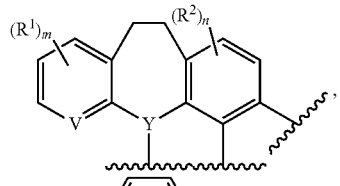,
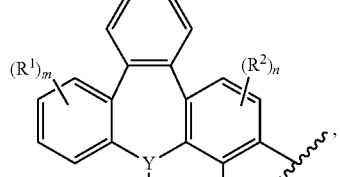,
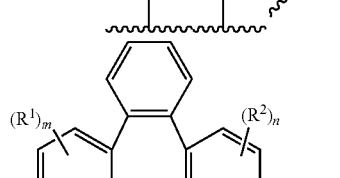,
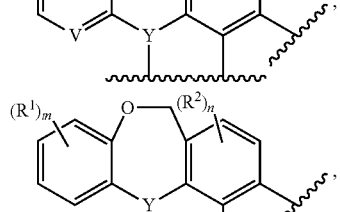,
-continued
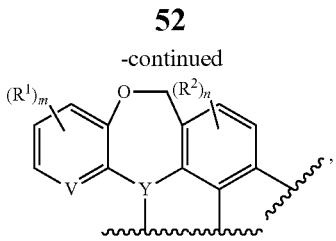,
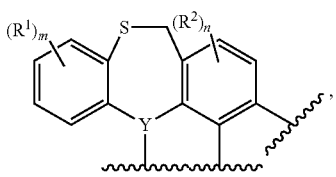,
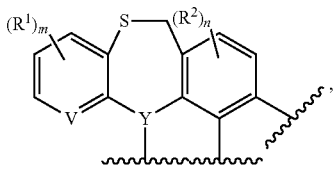,
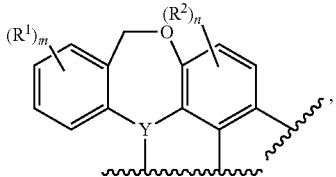,
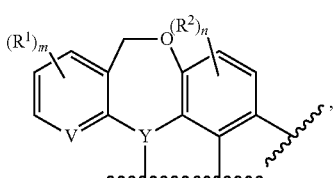,
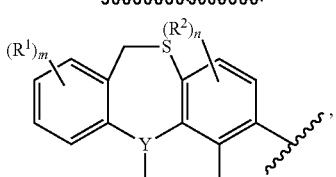,
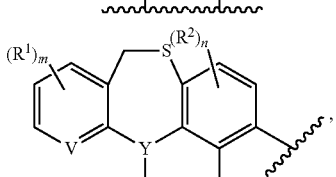,
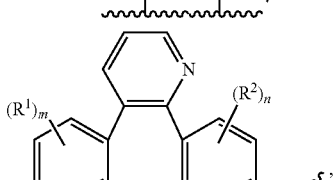,
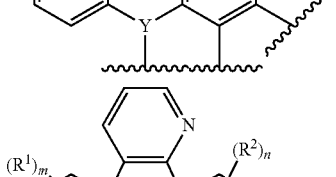,
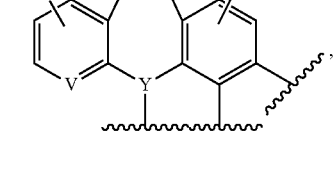,

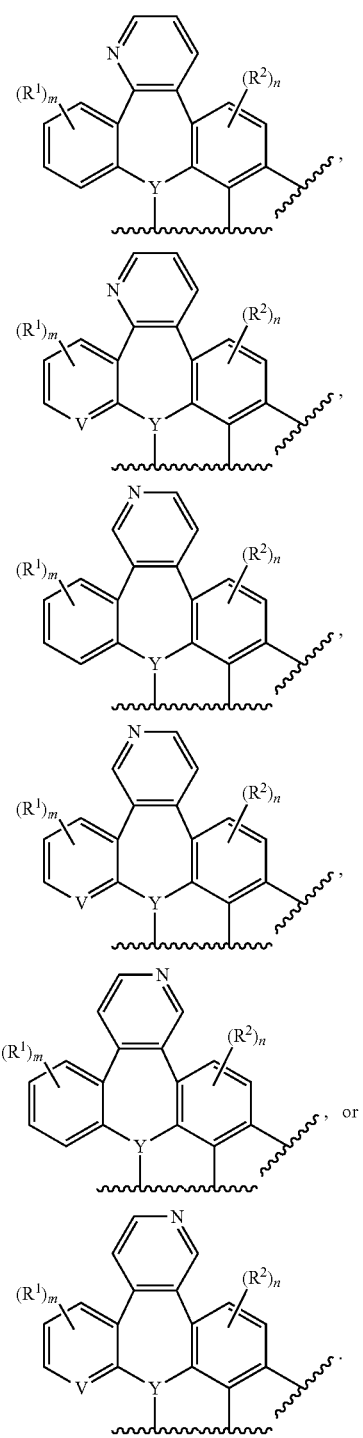
Such as for example,
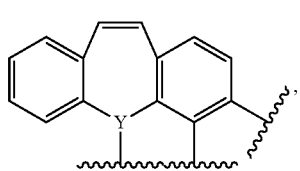
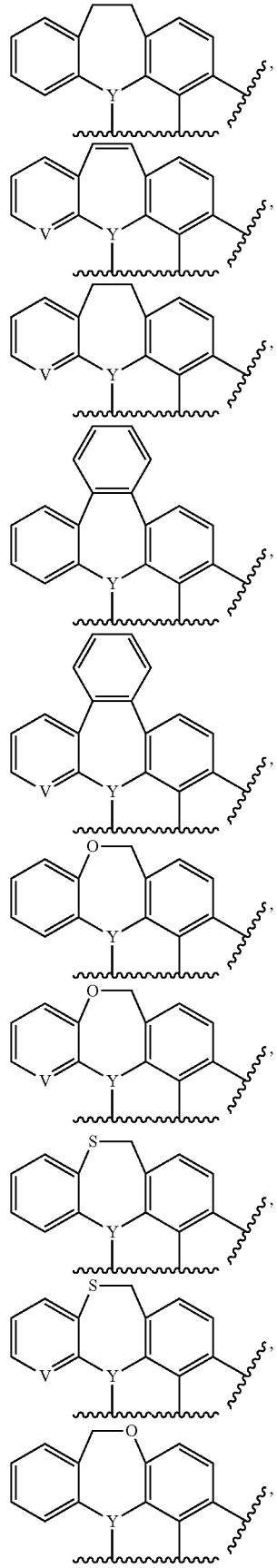

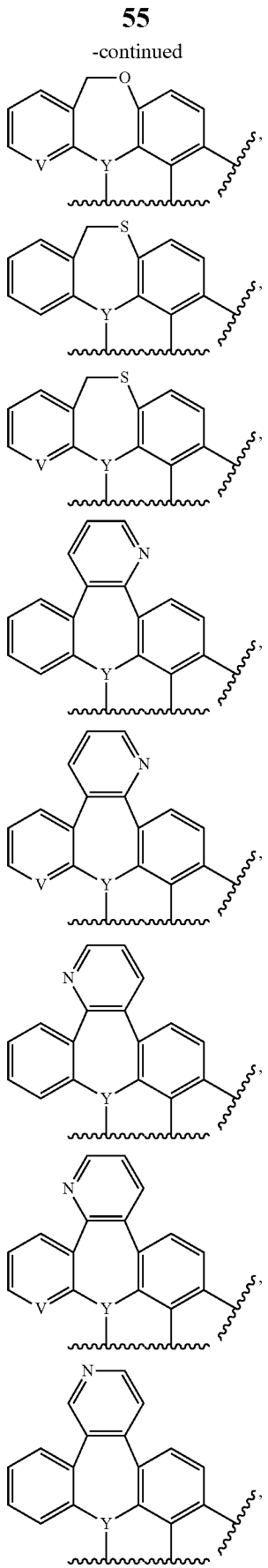

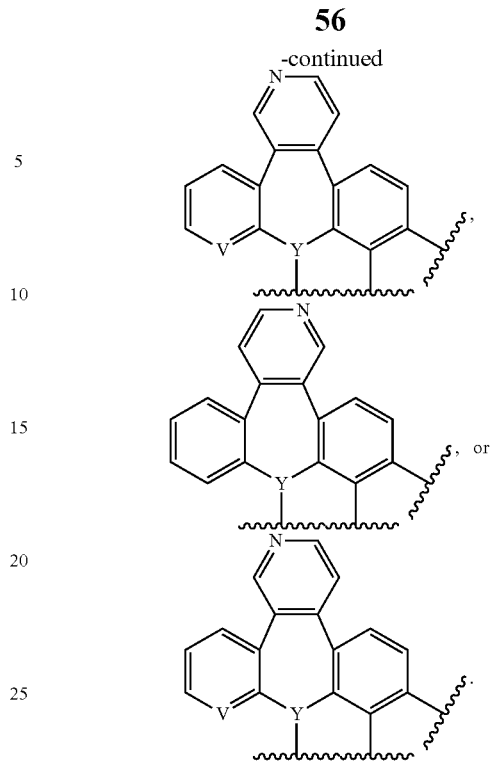

In one aspect, each of m, n, o, p, q, or r can independently be 0. In another aspect, each of m, n, o, p, q, or r can independently be 0 or 1. In another aspect, each of m, n, o, p, q, or r can independently be 1.

The compound of any one claims 1-10, wherein the compound comprises at least one phenyl and at least one pyridine.

In one aspect, for any of the formulas illustrated in this disclosure,

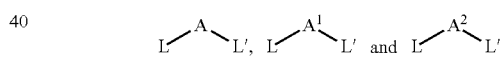

are intended to mean that L and L' are either linked directly or that L and L' are linked by a linkage group, wherein each of the linkage groups can independently be an oxygen (O), sulfur (S), nitrogen (N), phosphor (P), carbon (C), silicon (Si) or boron (B). In another aspect,

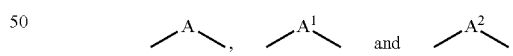

can each independently represent one or more of the following structures:

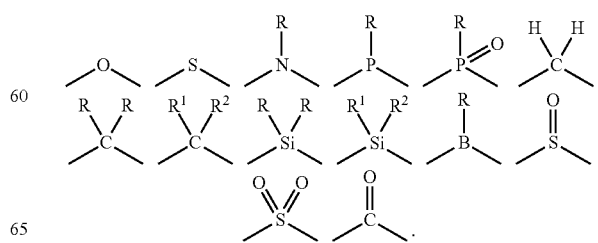

In another aspect, for any of the formulas illustrated in this disclosure,

can represent one or more of the following structures:

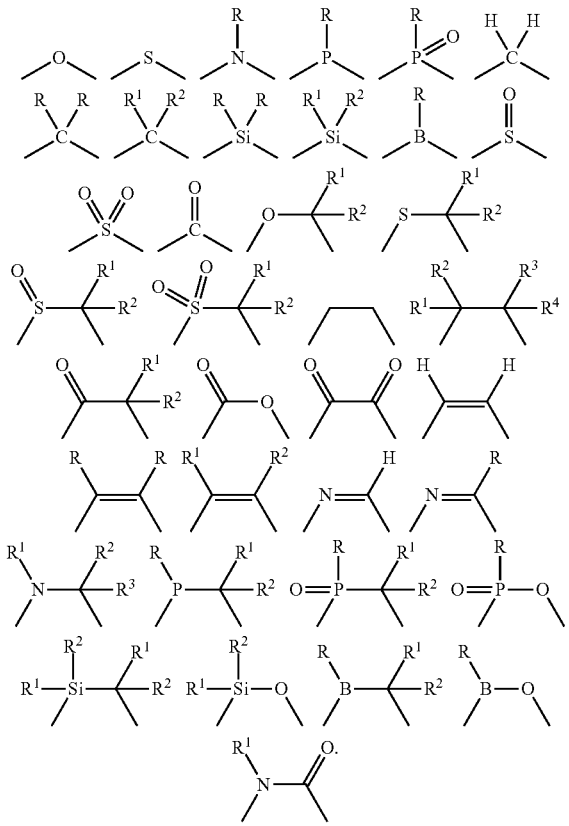

In yet another aspect, for any of the formulas illustrated in this disclosure,

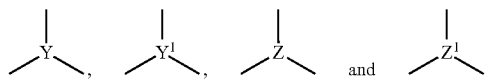

can each independently represent one or more of the following structures:

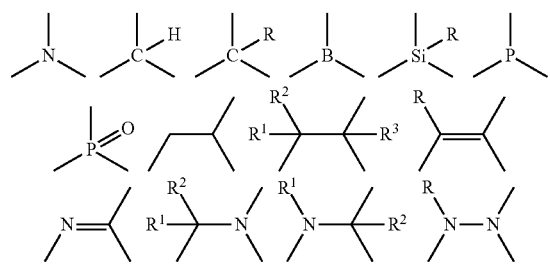

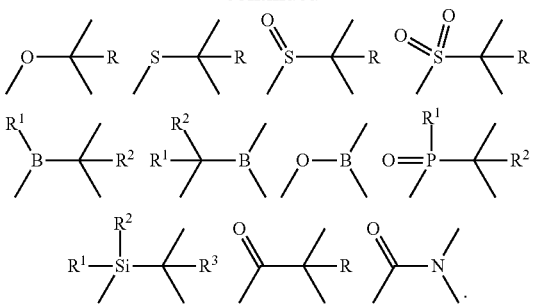

In still another aspect,

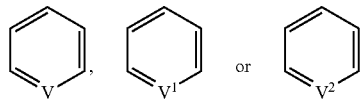

as shown in the disclosed compounds can be one of the following structures:

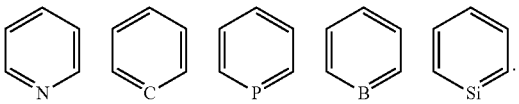

In still another aspect, for any of the formulas illustrated in this disclosure,

can represent one or more of the following structures:

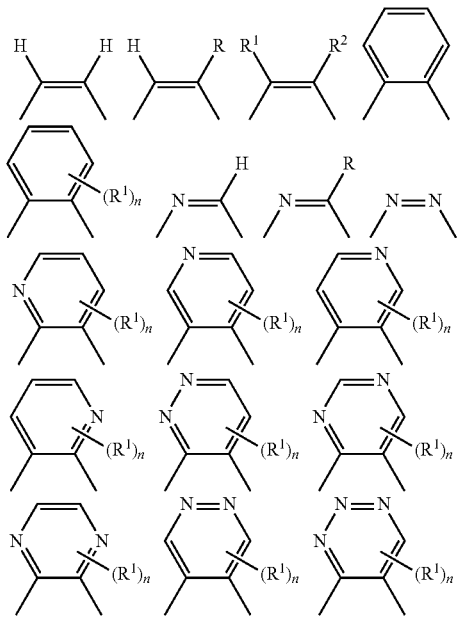

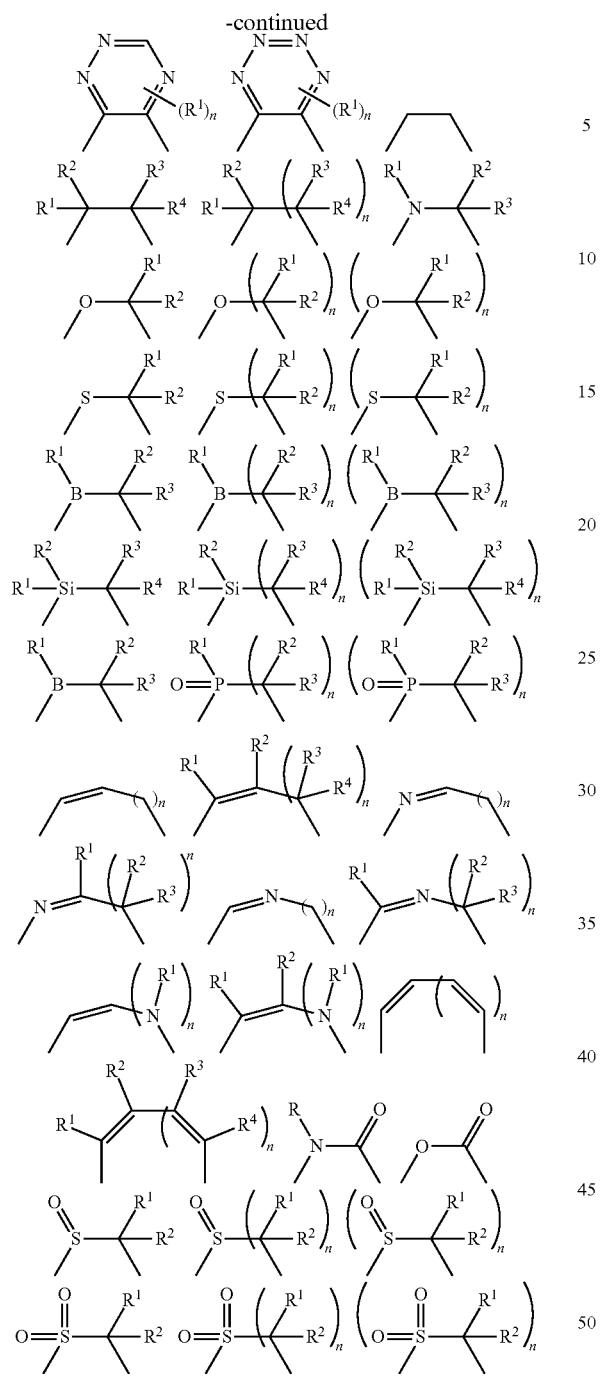

In one aspect, each of $R^1$, $R^2$, $R^3$, $R^4$, and $R^5$ can independently be hydrogen, aryl, cycloalkyl, cycloalkenyl, heterocyclyl, heteroaryl, alkyl, alkenyl, alkynyl, deuterium, halogen, hydroxyl, thiol, nitro, cyano, amino, a mono- or di-alkylamino, a mono- or diaryl amino, alkoxy, aryloxy, haloalkyl, aralkyl, ester, nitrile, isonitrile, alkoxycarbonyl, acylamino, alkoxycarbonylamino, aryloxycarbonylamino, sulfonylamino, sulfamoyl, carbamoyl, alkylthio, sulfinyl, ureido, phosphoramide, amercapto, sulfo, carboxyl, hydrzino, substituted silyl, or polymerizable, or any conjugate or combination thereof. In another aspect, each of $R^1$, $R^2$, $R^3$, $R^4$, and $R^5$ can independently be aryl, cycloalkyl, cycloalkenyl, heterocyclyl, heteroaryl, alkyl, alkenyl, alkynyl, halogen, hydroxyl, thiol, nitro, amino, haloalkyl, or any conjugate or a combination thereof. In yet another aspect, each of $R^1$, $R^2$, $R^3$, $R^4$, and $R^5$ can independently be aryl, cycloalkyl, cycloalkenyl, heterocyclyl, heteroaryl, alkyl, alkenyl, halogen, or hydroxyl, or a combination thereof.

In one aspect, for any of the metal complexes illustrated in this disclosure, can comprise one or more of the following structures. In another aspect, they can also comprise other structures or portions thereof not specifically recited herein, and the present invention is not intended to be limited to those structures or portions thereof specifically recited.

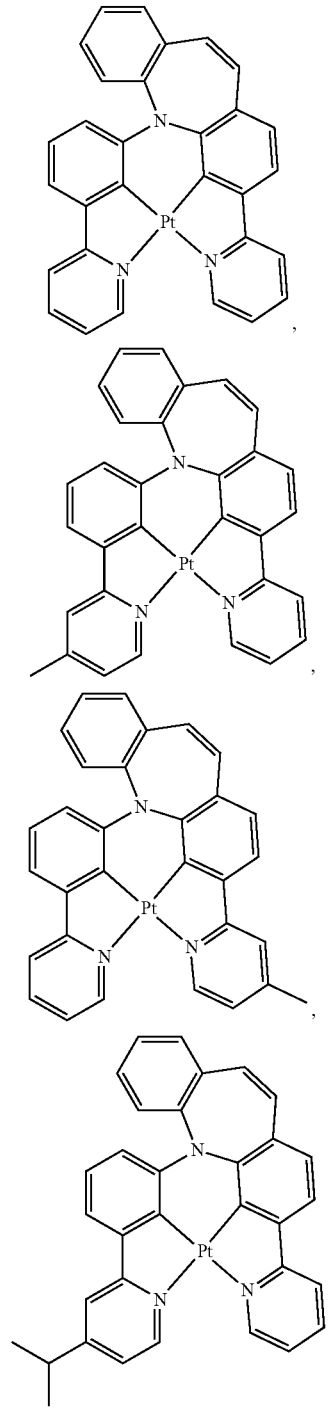

61
-continued
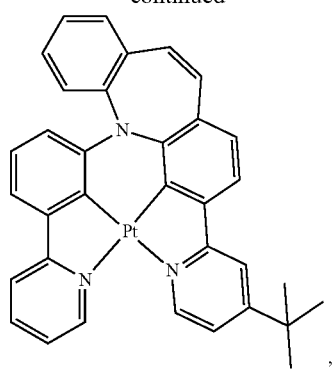
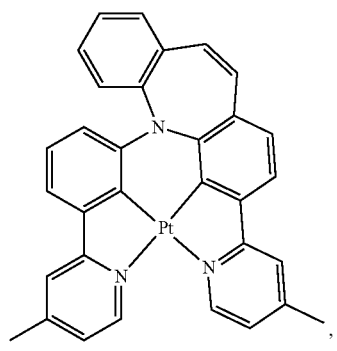
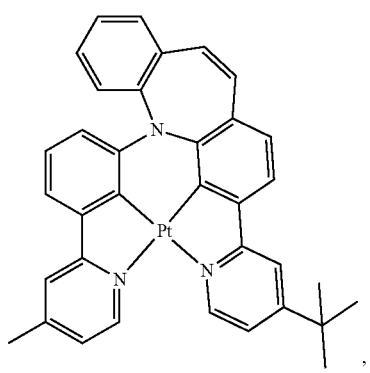
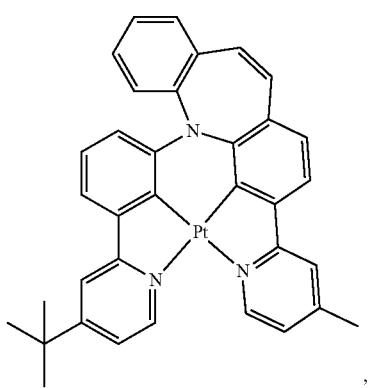
62
-continued
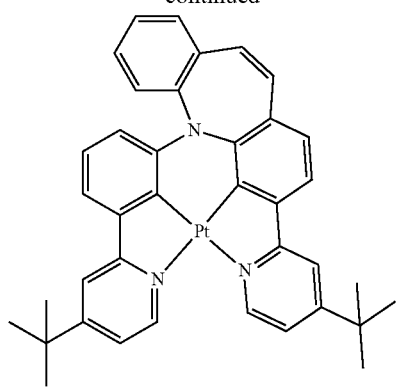
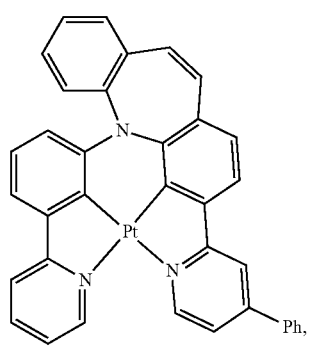
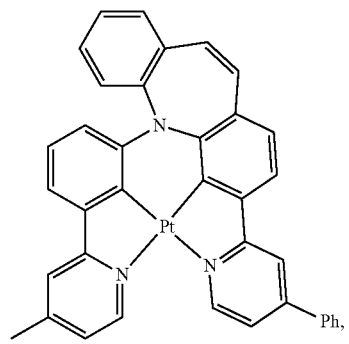
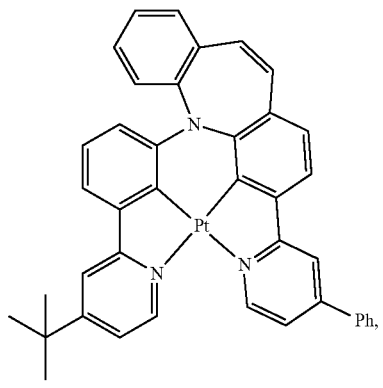

63
-continued
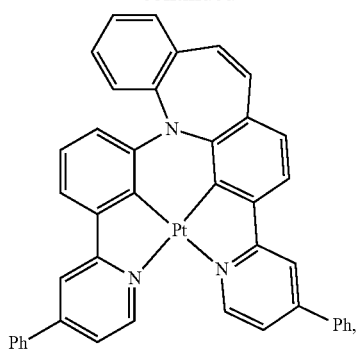
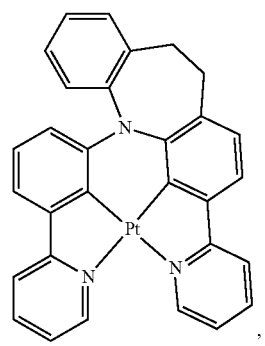
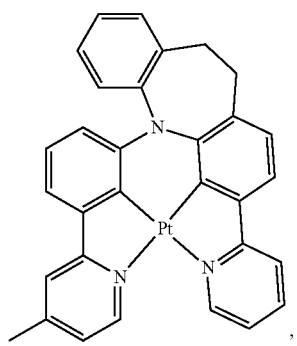
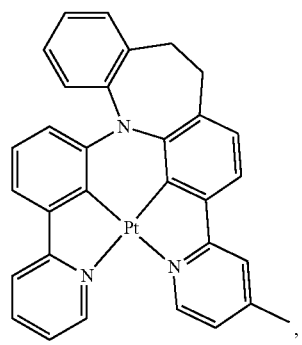
64
-continued
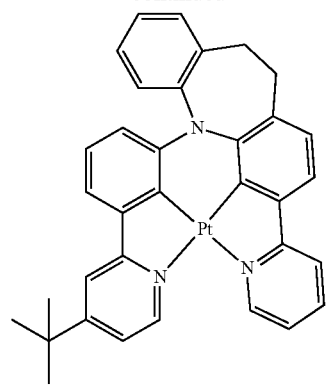
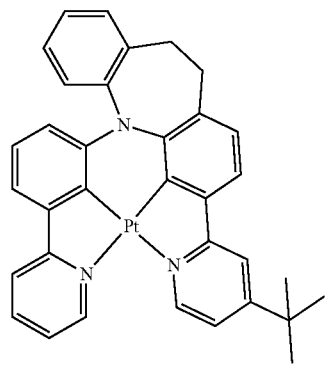
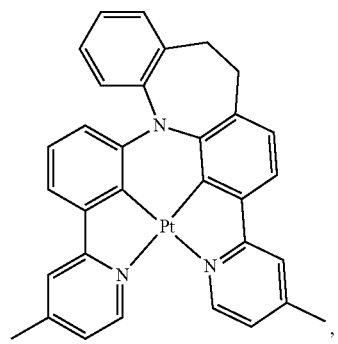
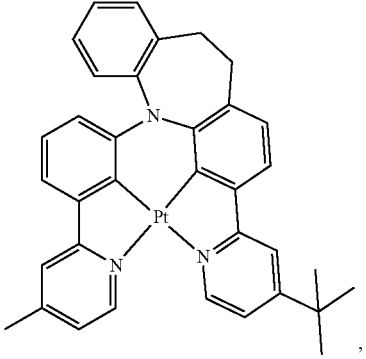

-continued
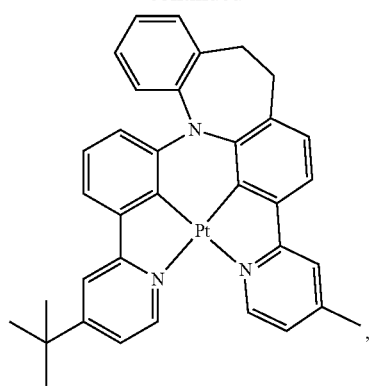
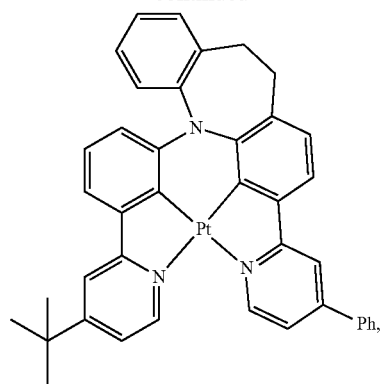
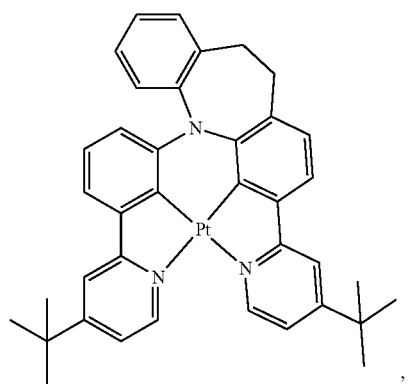
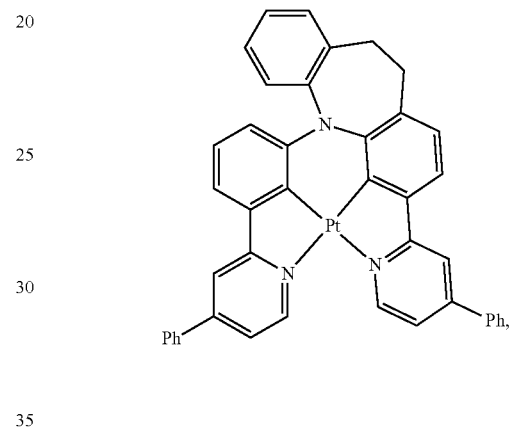
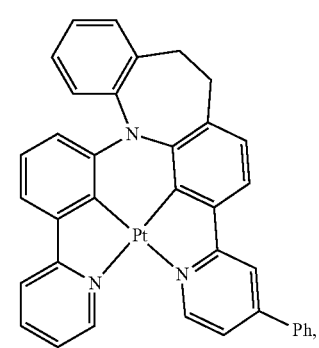
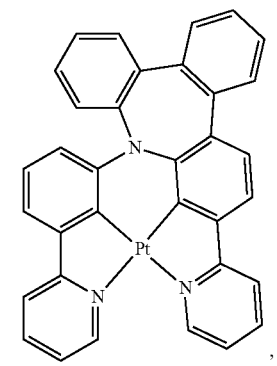
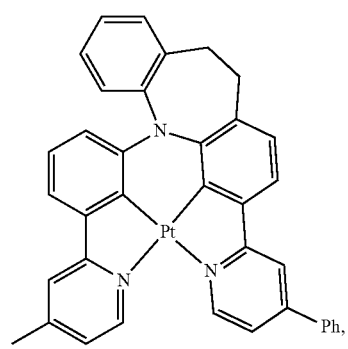
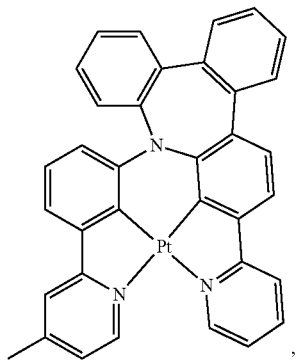

67
-continued
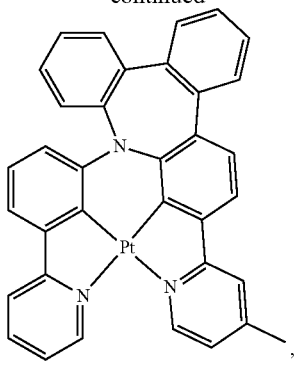
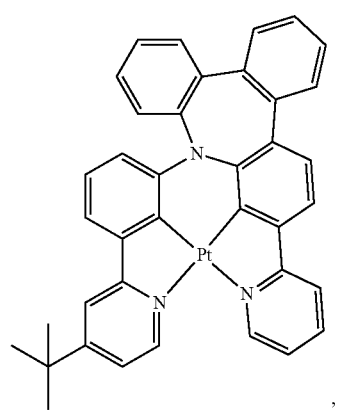
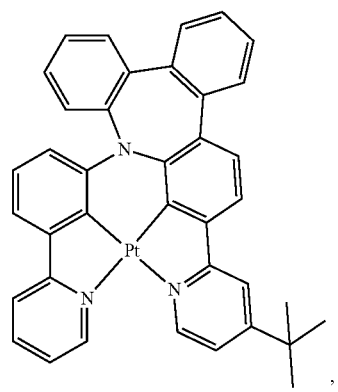
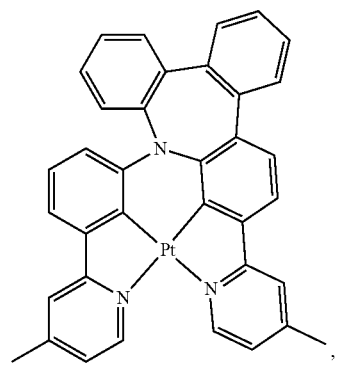
68
-continued
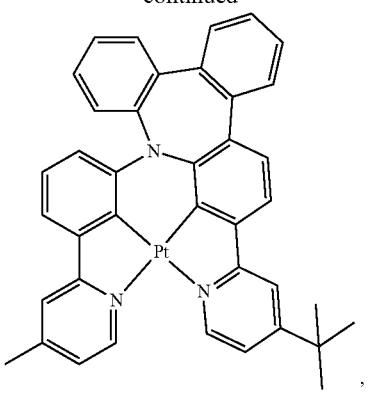
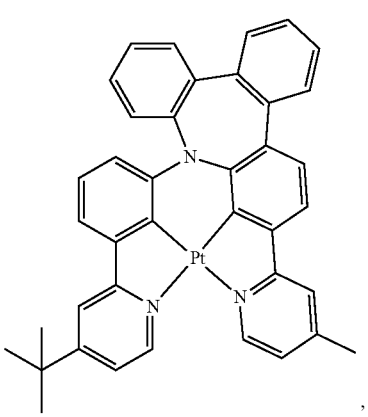
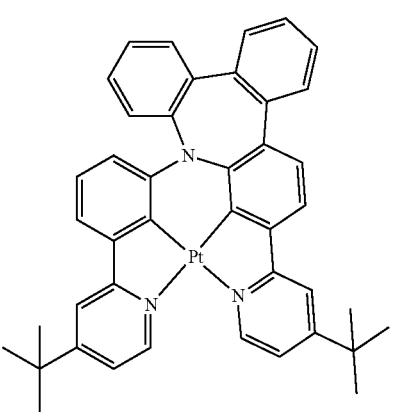
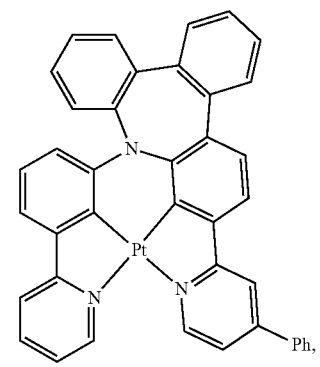

69
-continued
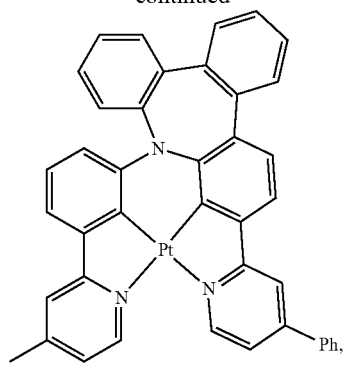
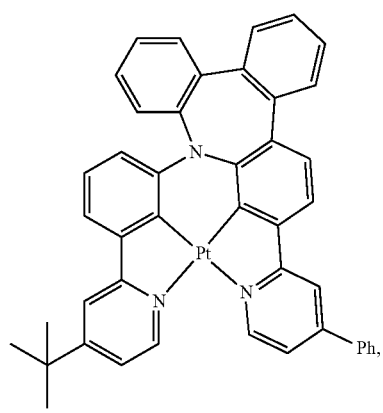
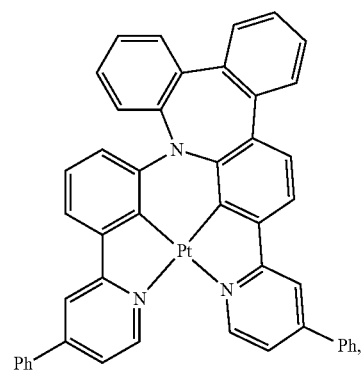
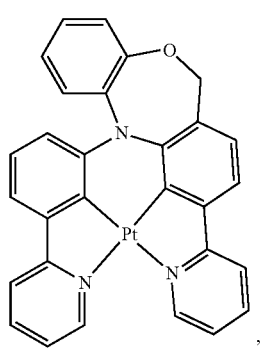
70
-continued
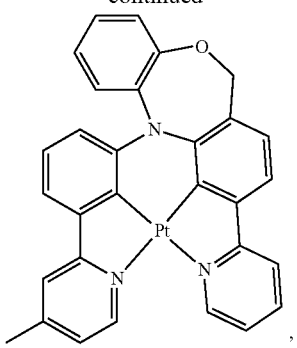
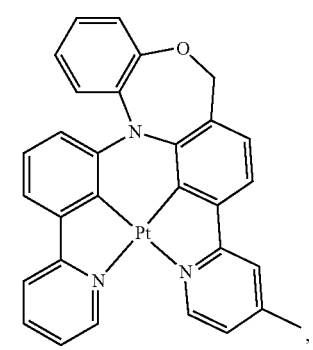
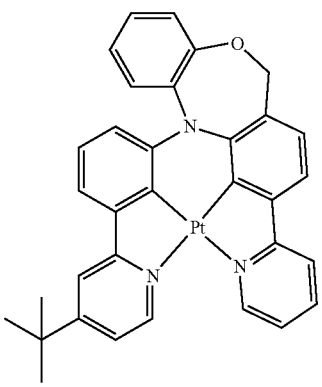
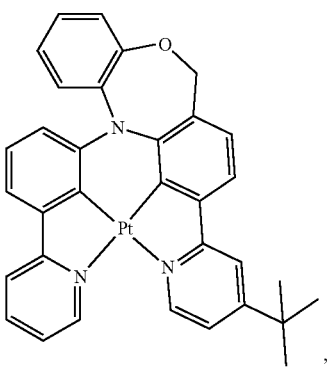

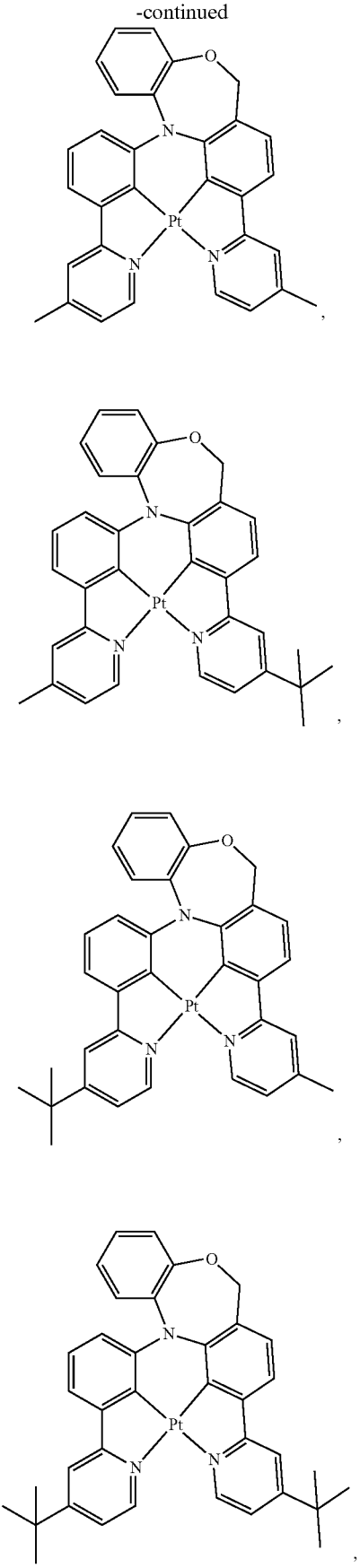
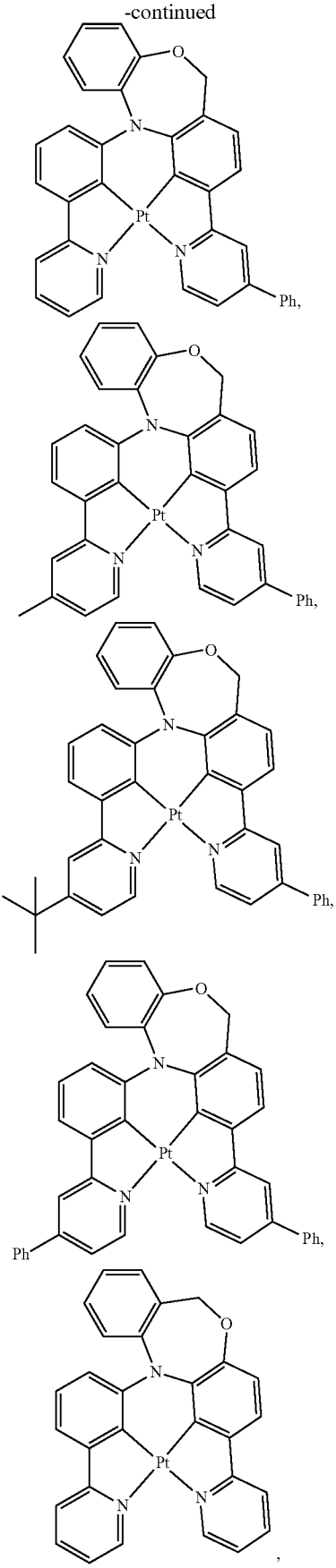

| 73 -continued | 74 -continued |
|---|---|
| 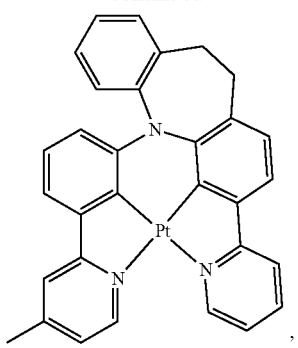 | 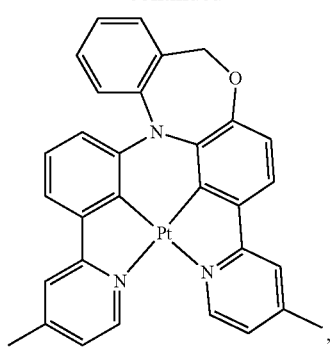 |
| 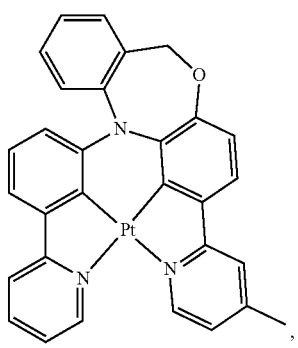 | 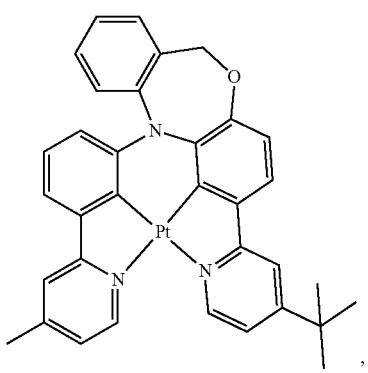 |
| 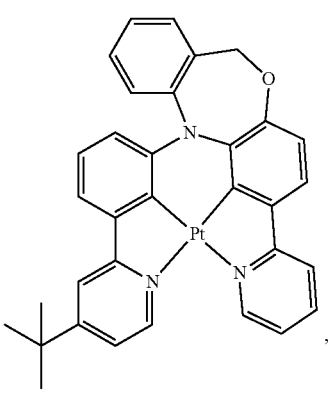 | 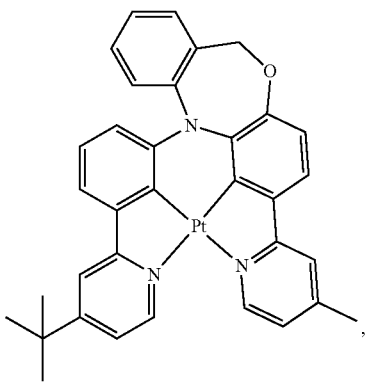 |
| 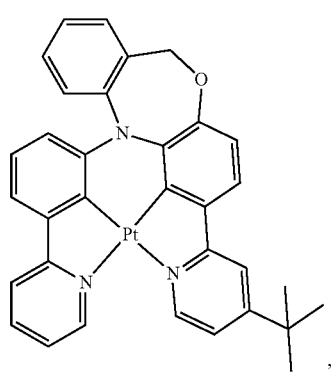 | 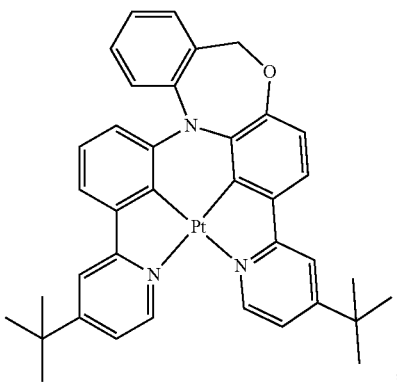 |

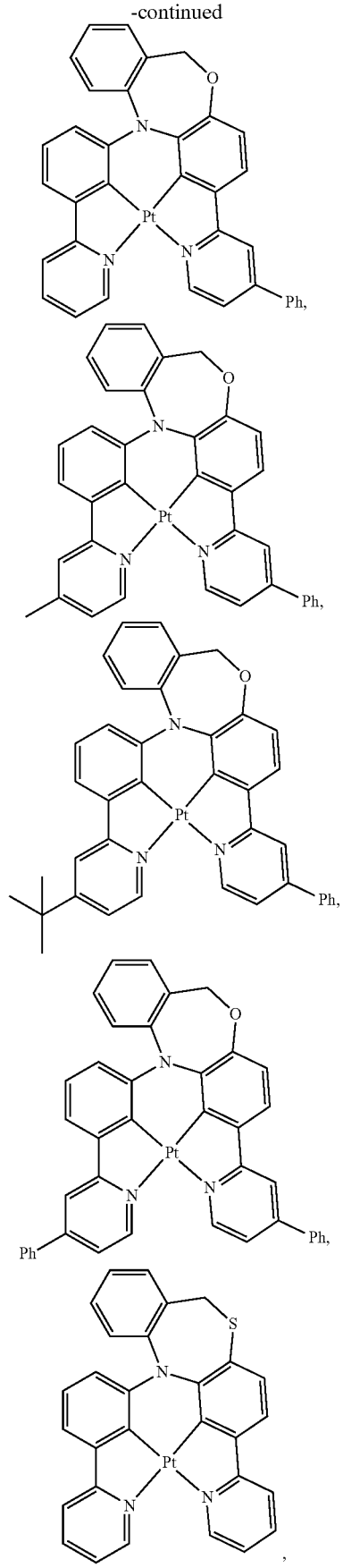
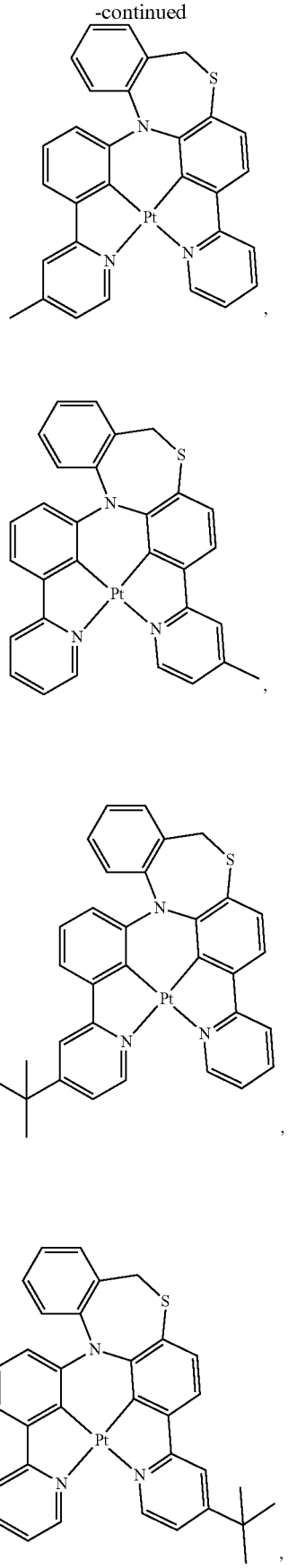

77
-continued
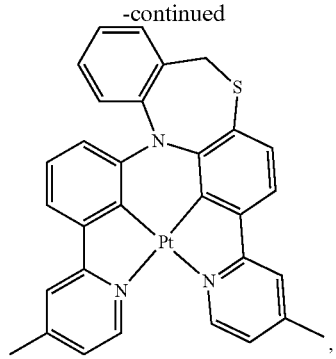
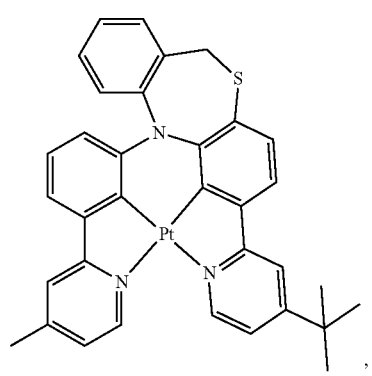
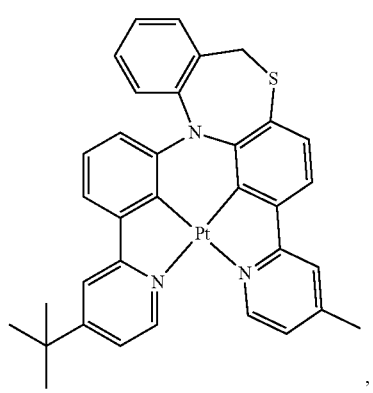
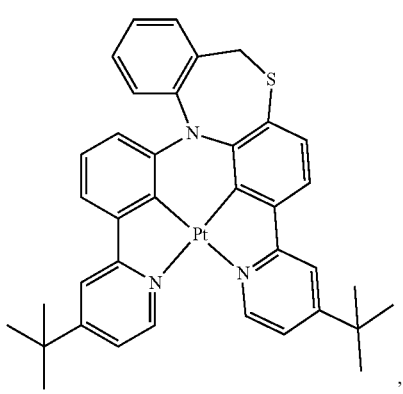
78
-continued
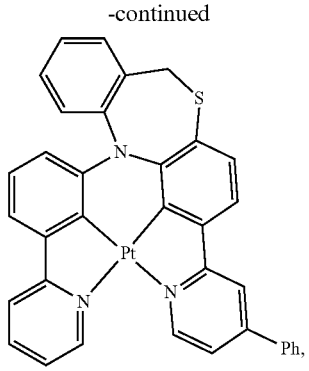
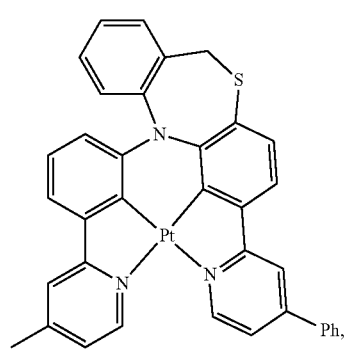
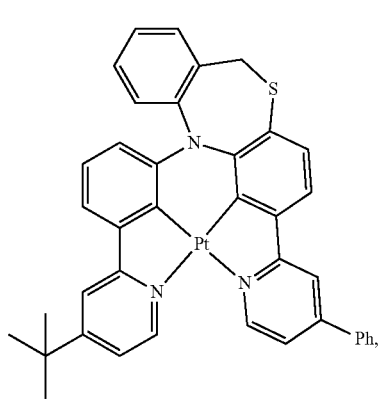
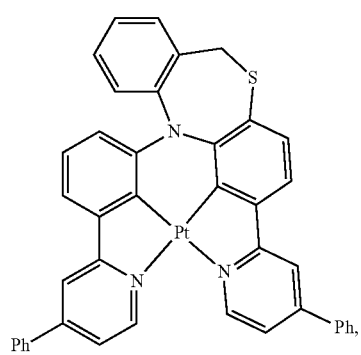

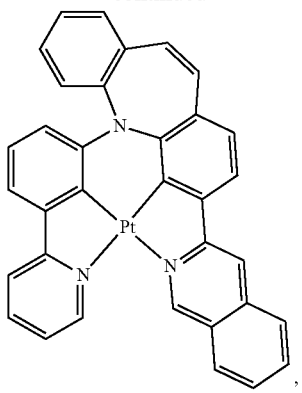
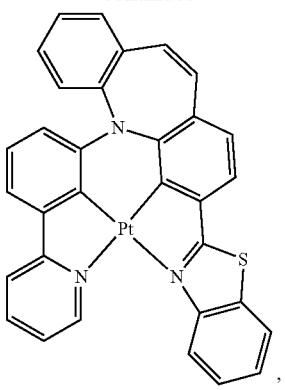
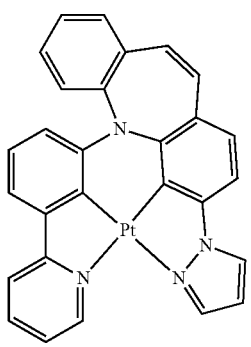
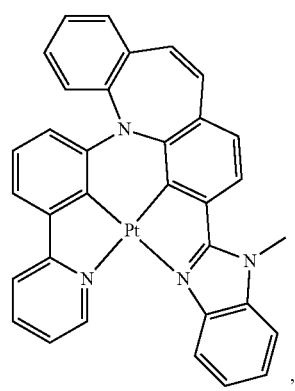
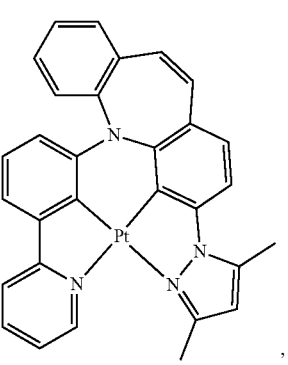
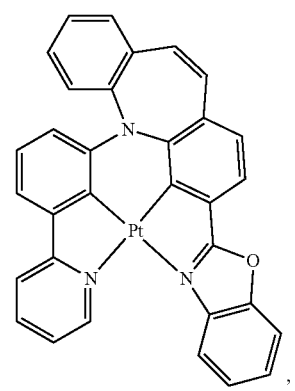
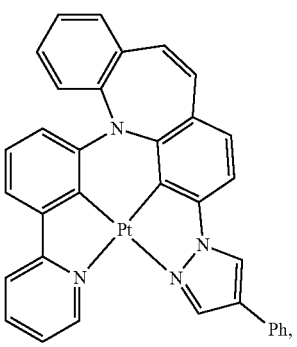

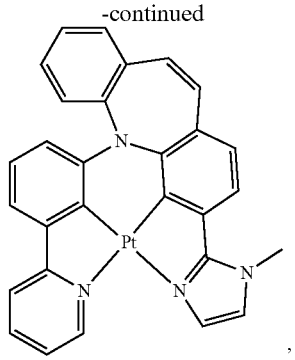
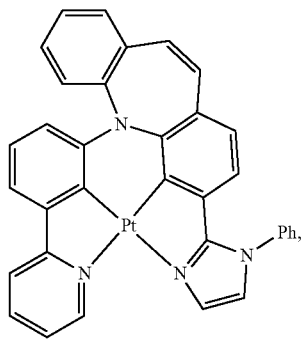
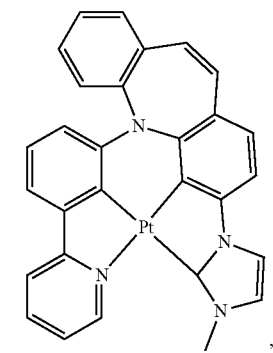
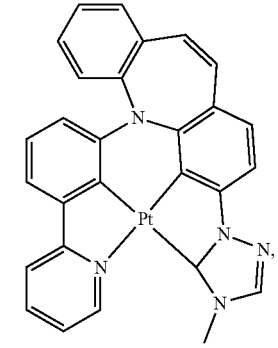
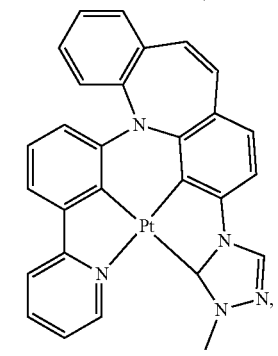
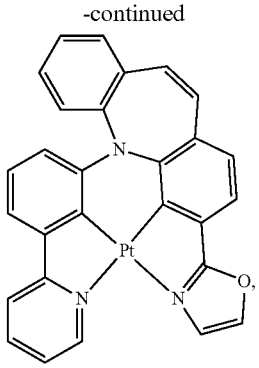
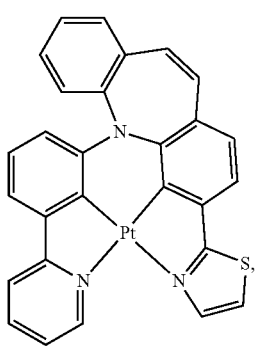
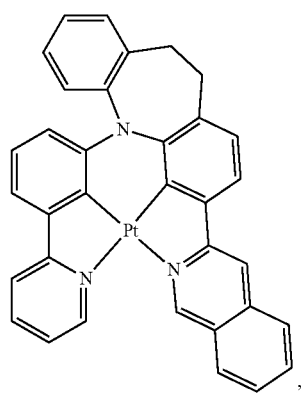
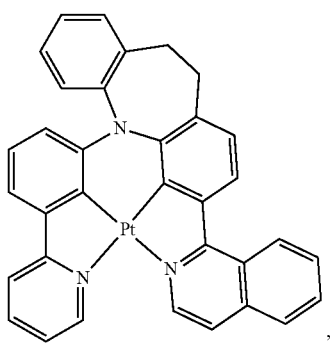

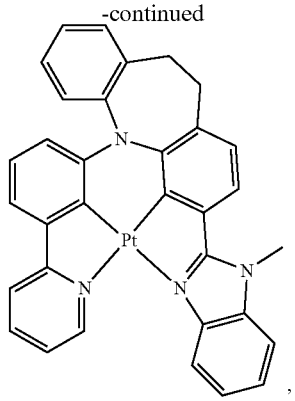
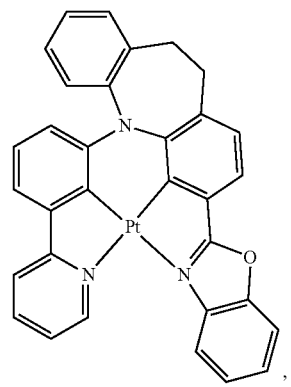
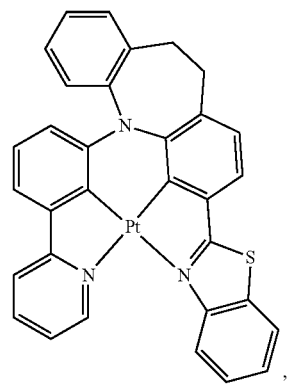
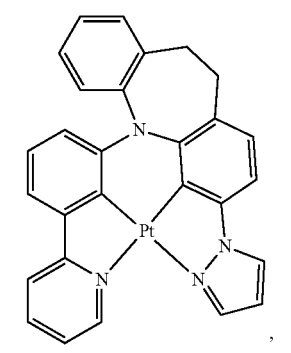
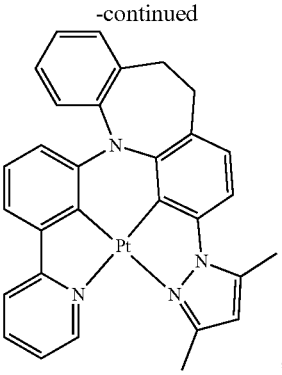
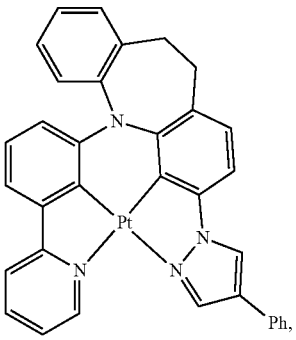
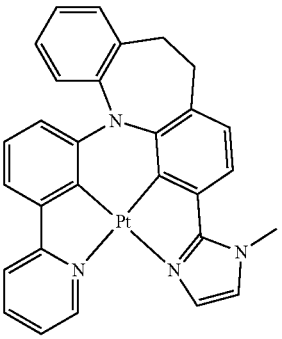
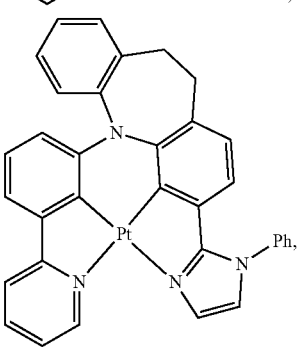
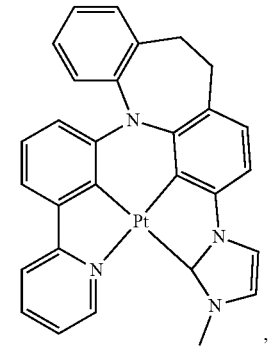

85
-continued
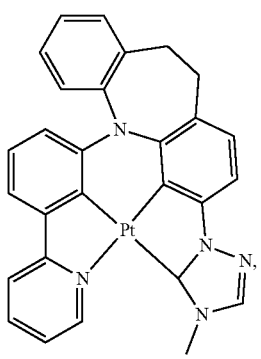
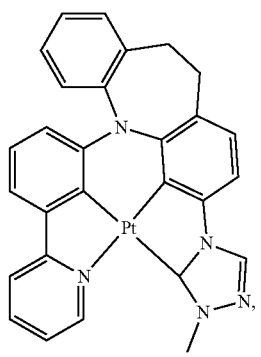
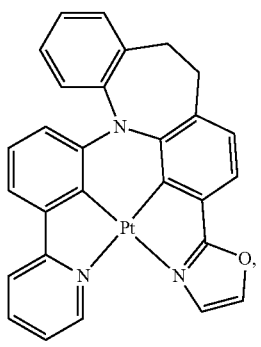
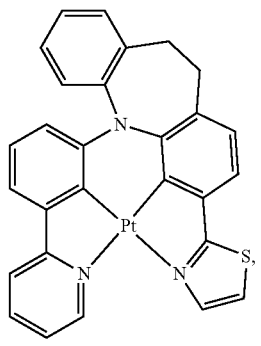
86
-continued
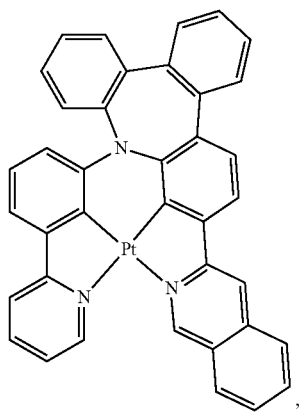
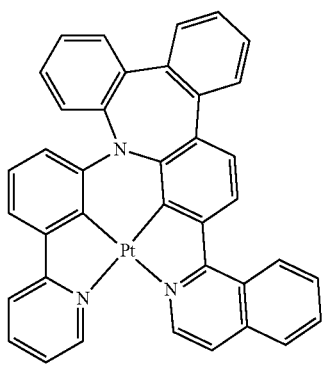
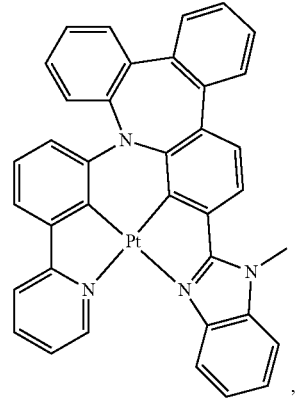
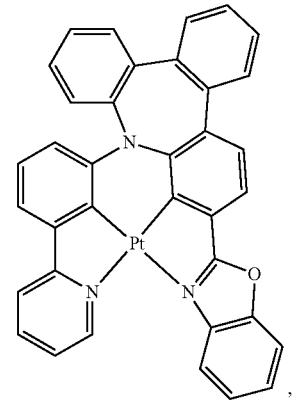

| 87 -continued | 88 -continued |
|---|---|
| 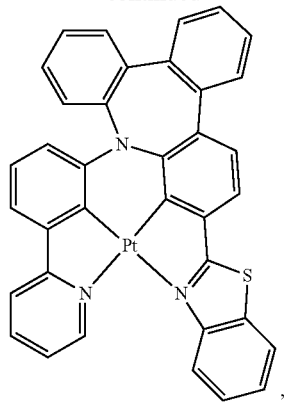 | 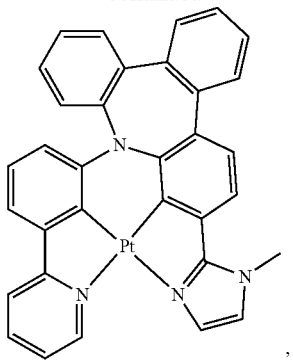 |
| 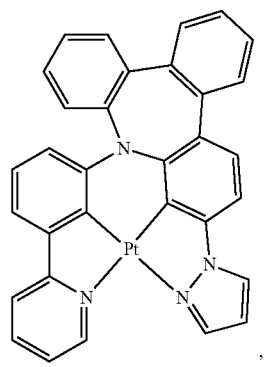 | 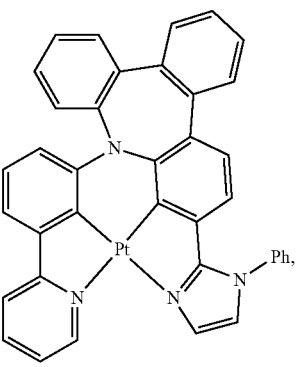 |
| 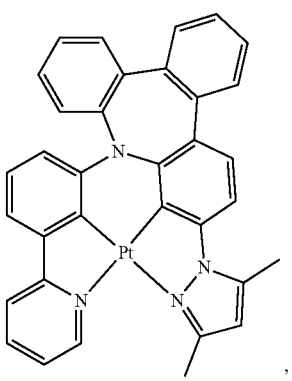 | 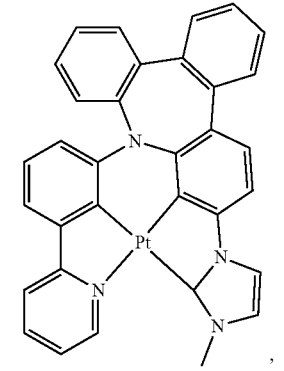 |
| 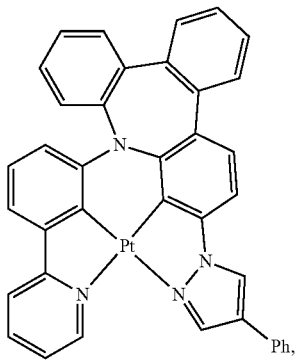 | 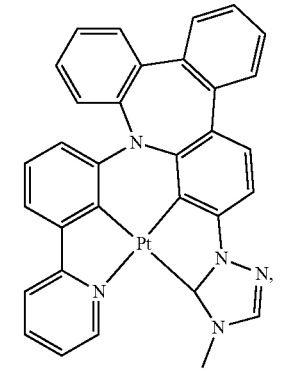 |

89
-continued
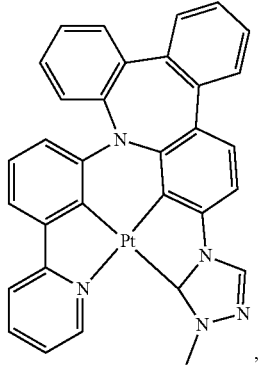
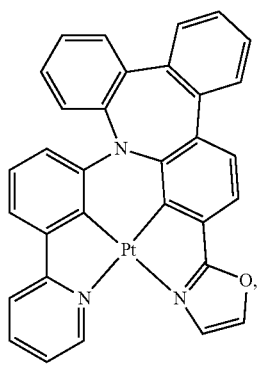
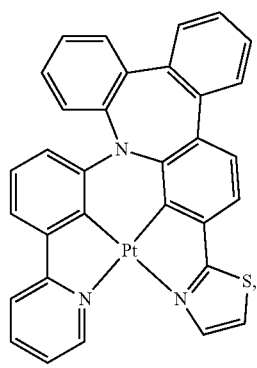
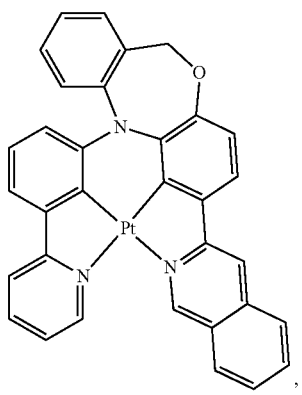
90
-continued
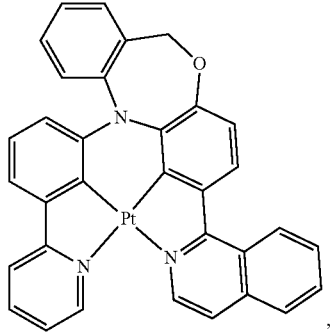
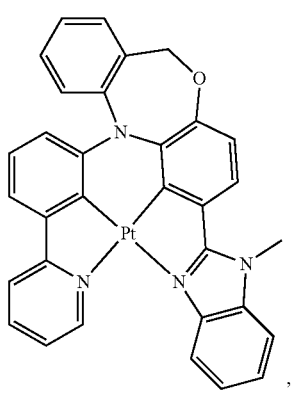
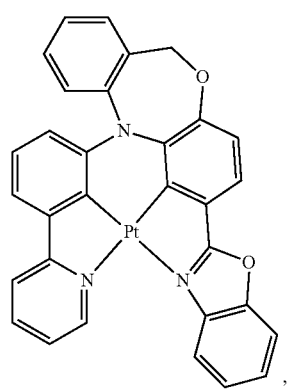
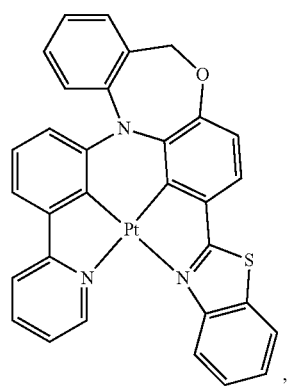

91
-continued
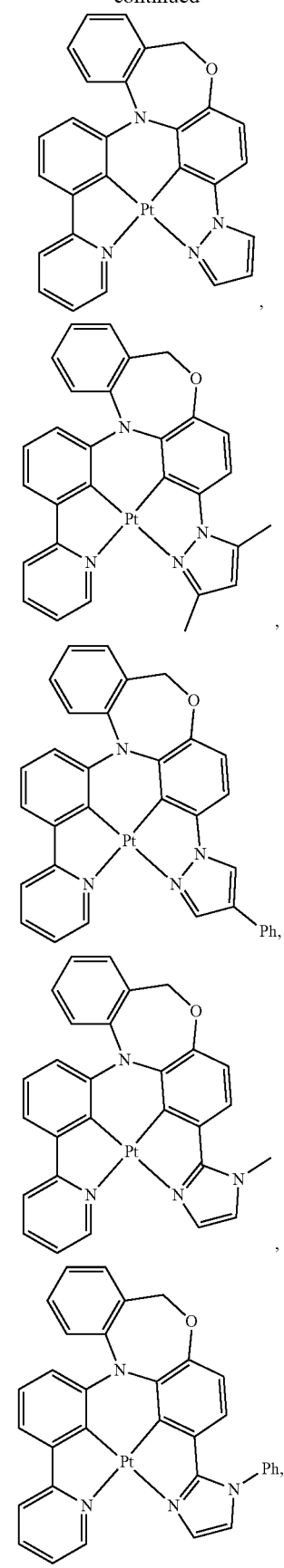
92
-continued
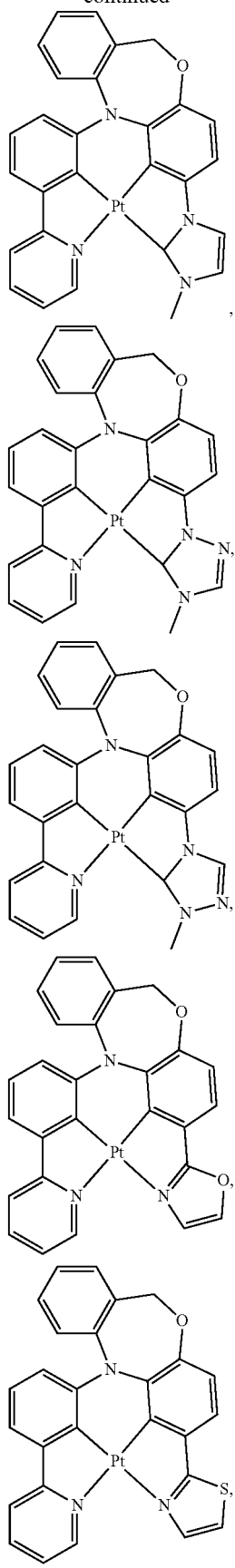

93
-continued
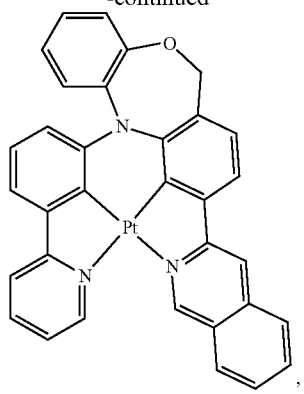
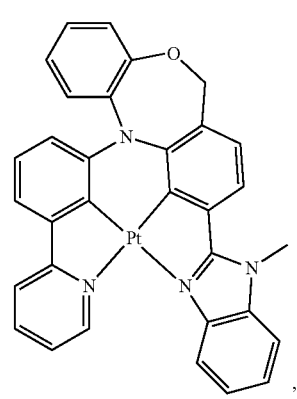
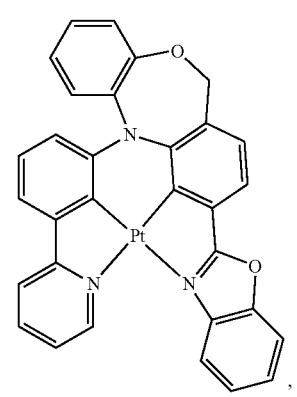
94
-continued
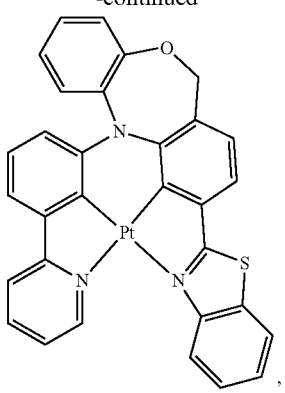
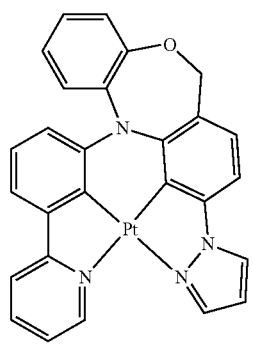
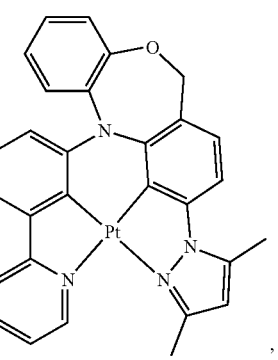
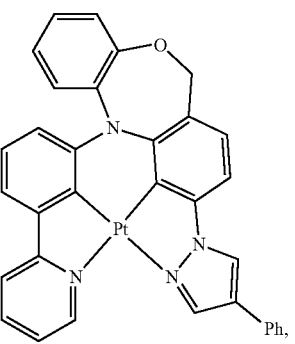

95
-continued
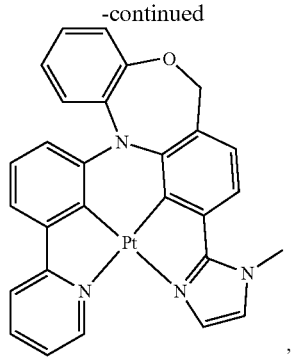
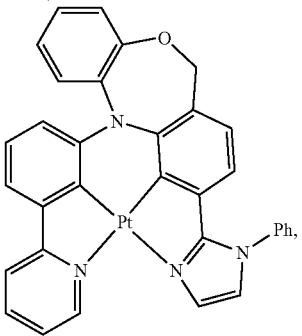
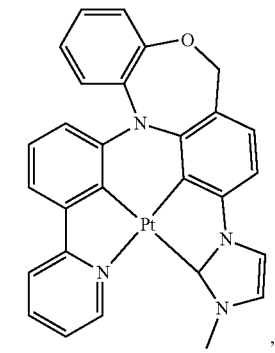
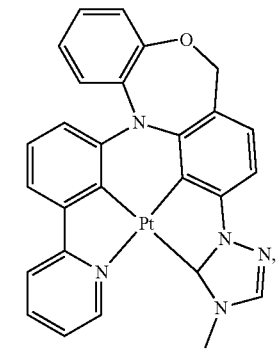
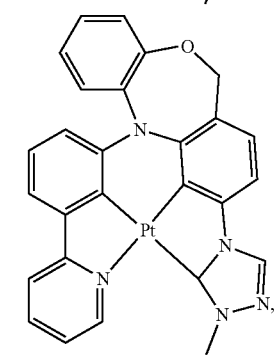
96
-continued
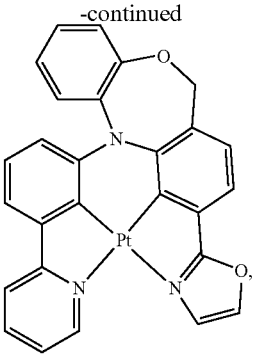
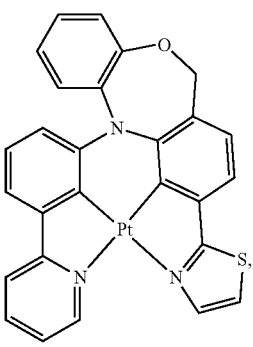
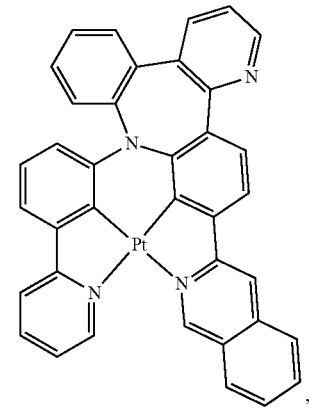
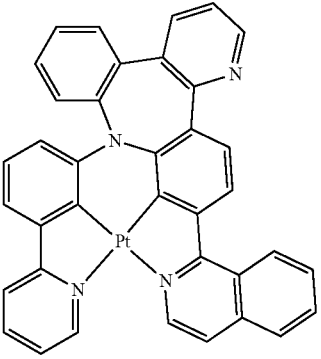

97
-continued
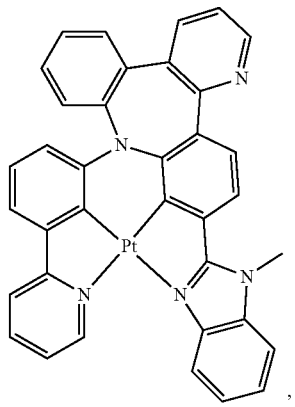
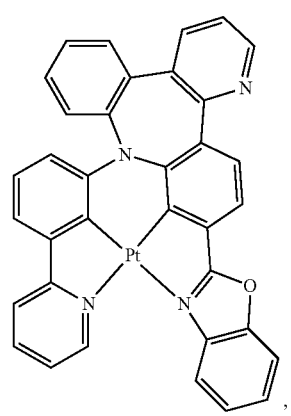
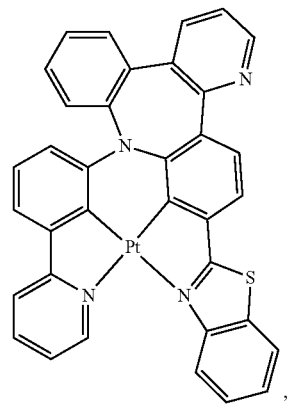
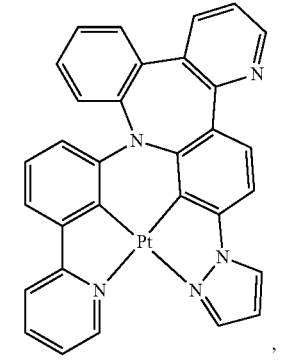
98
-continued
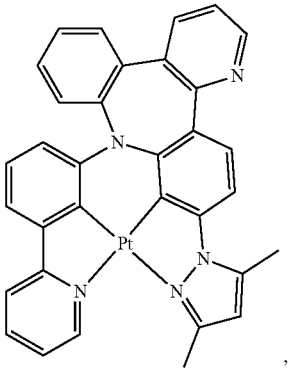
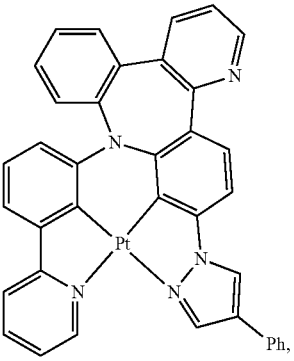
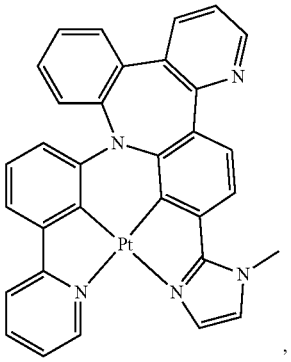
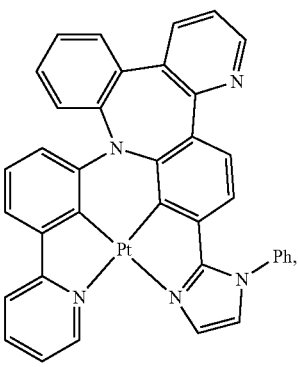

99 -continued

100 -continued

101
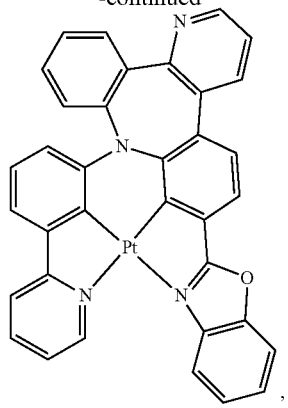
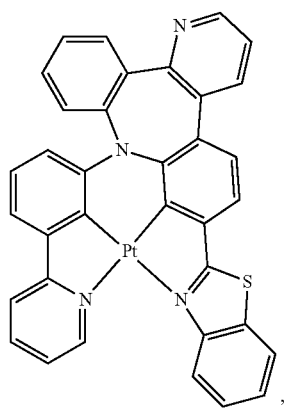
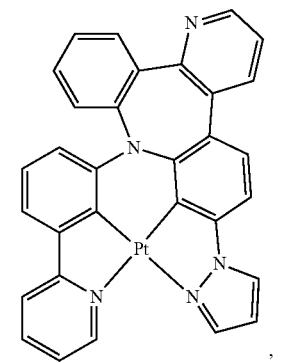
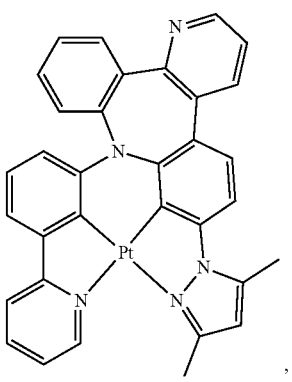
102
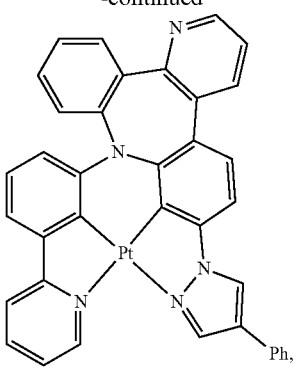
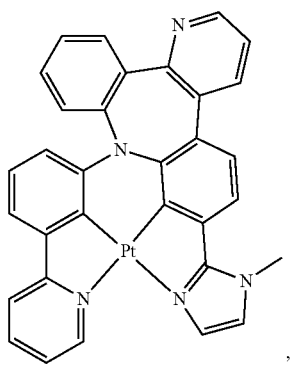
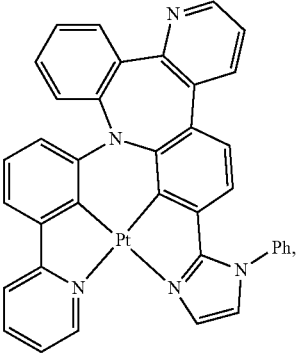
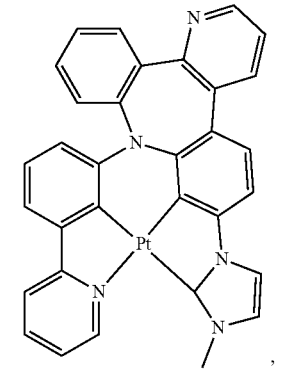

103
-continued
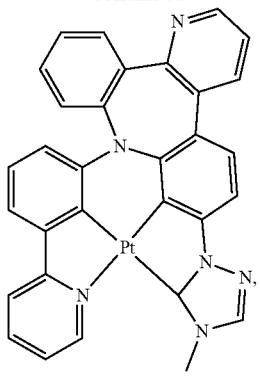
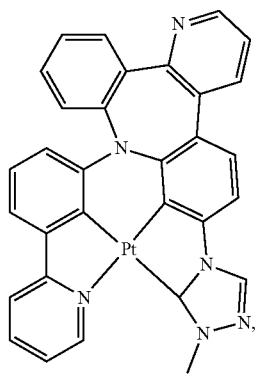
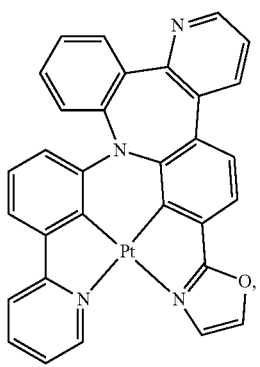
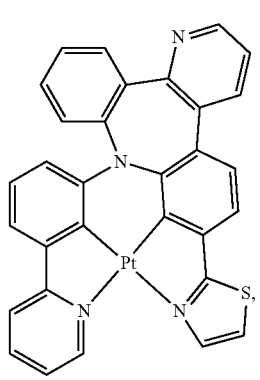
104
-continued
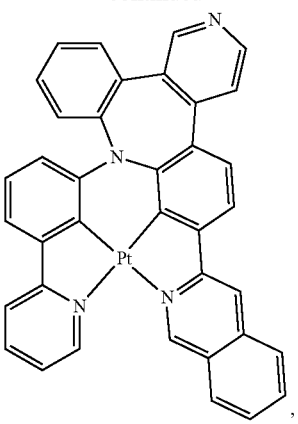
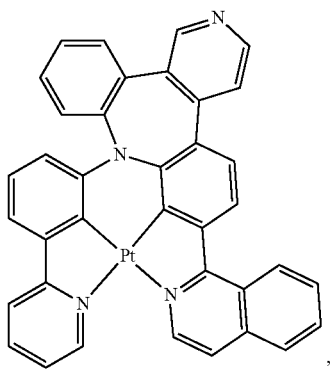
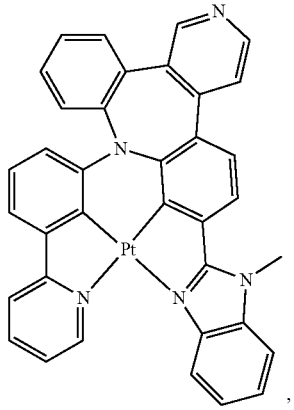
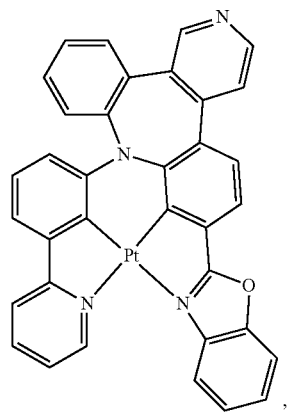

105
-continued
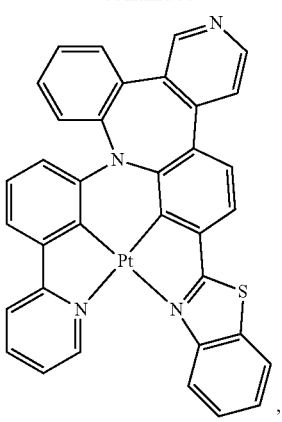
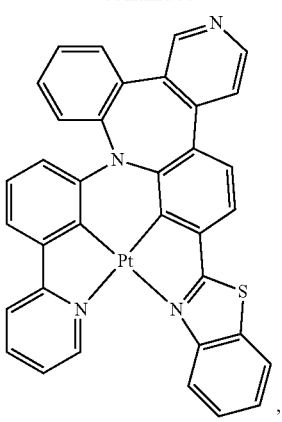
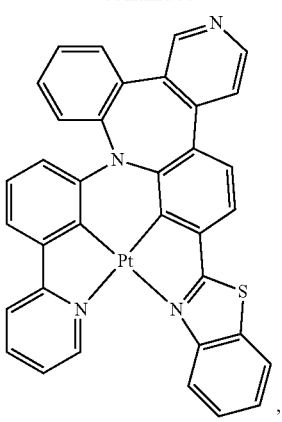
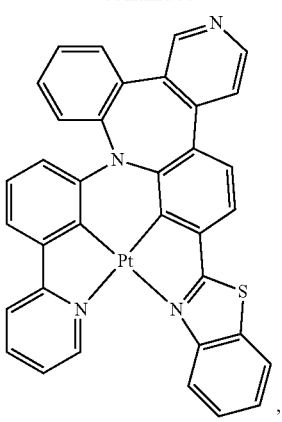
106
-continued
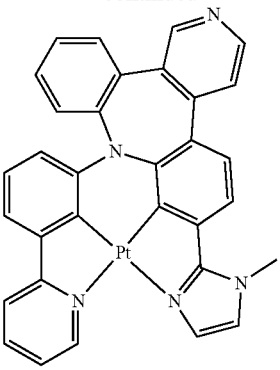
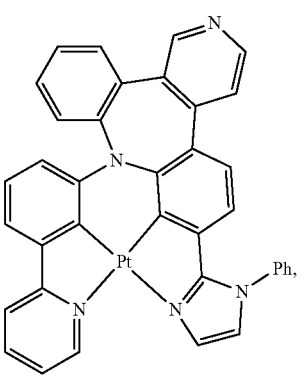
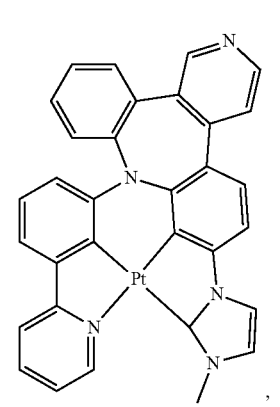
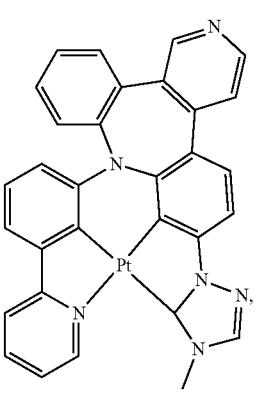

107
-continued
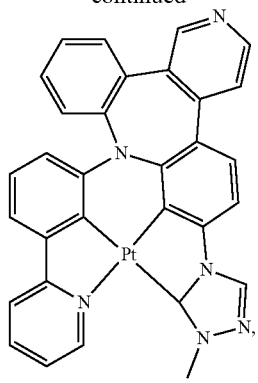
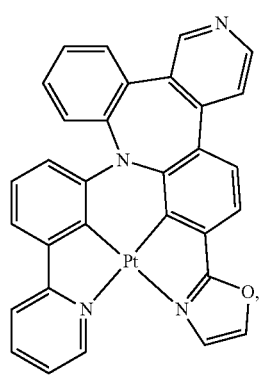
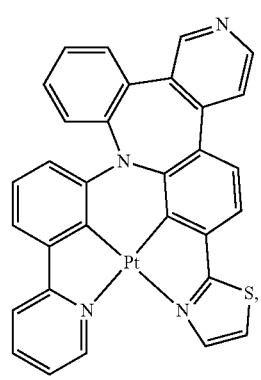
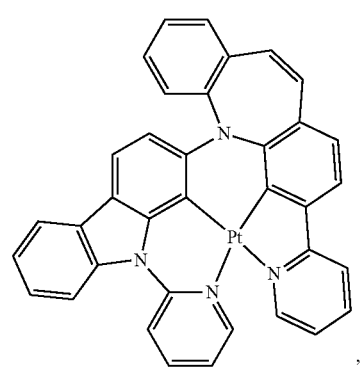
108
-continued
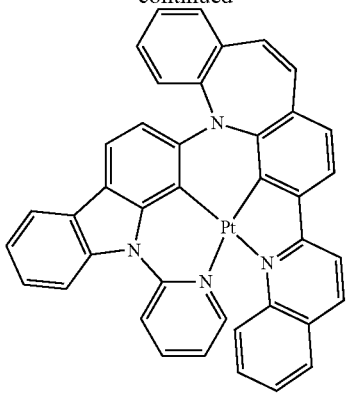
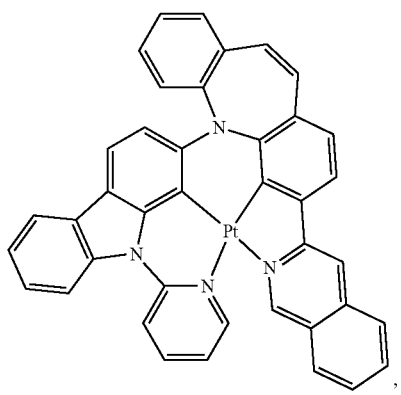
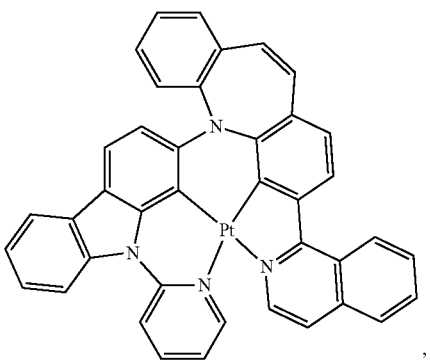
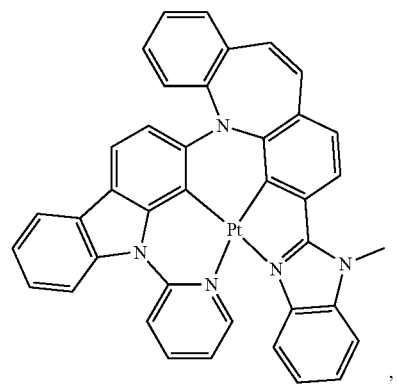

109
-continued
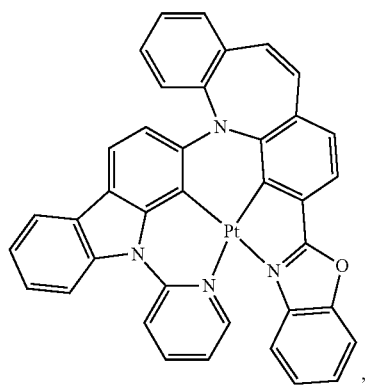
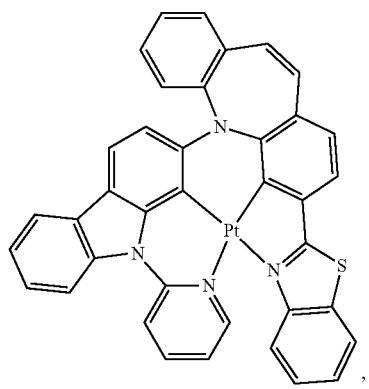
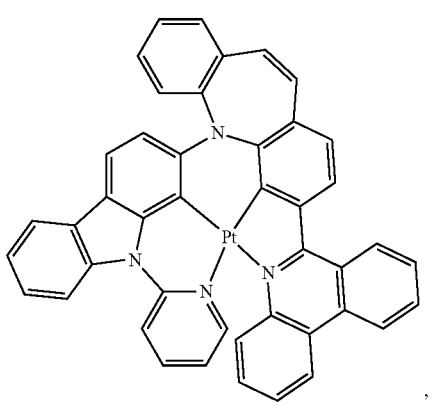
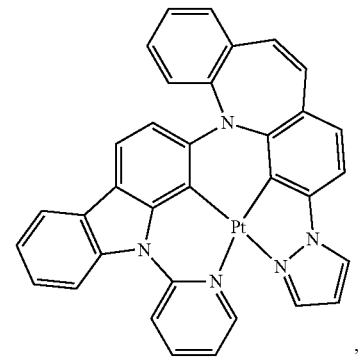
110
-continued
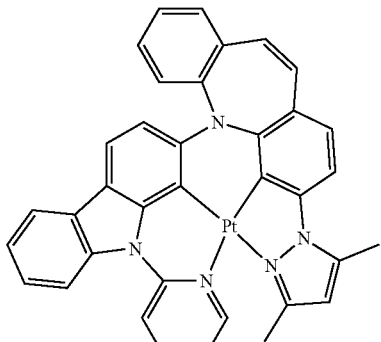
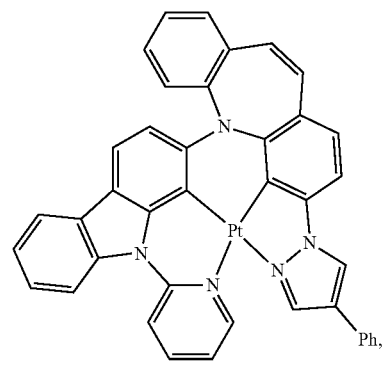
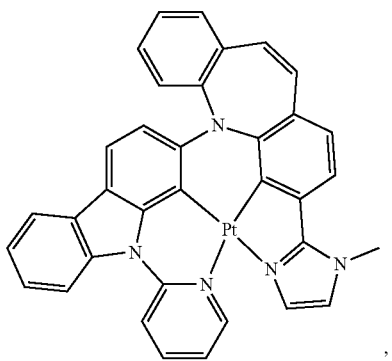
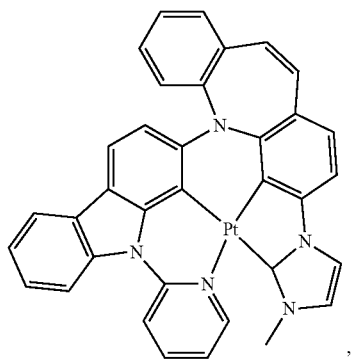

| 111 | 112 |
|---|---|
| 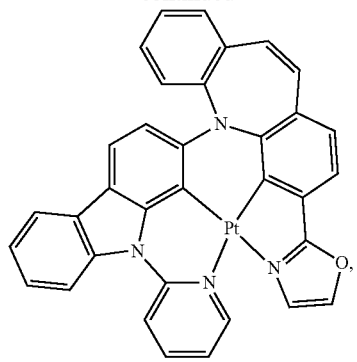 | 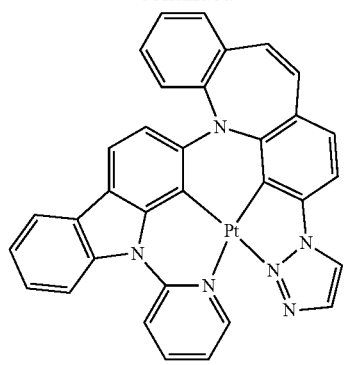 |
| | 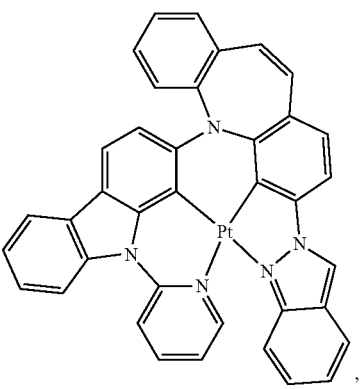 |
| 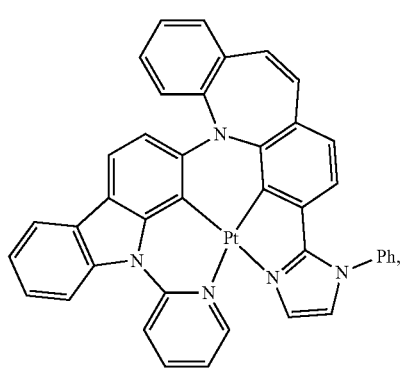 | 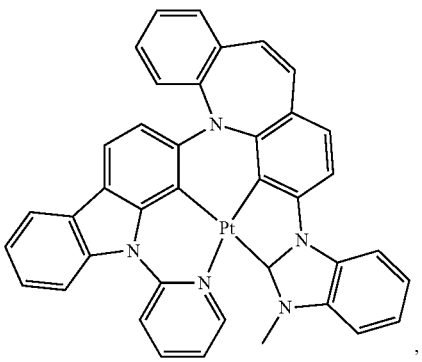 |
| 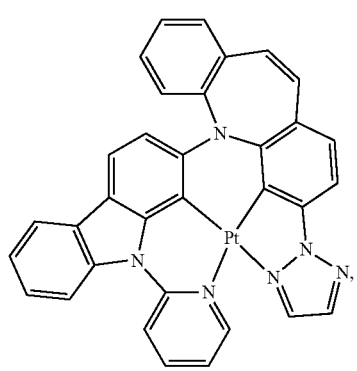 | 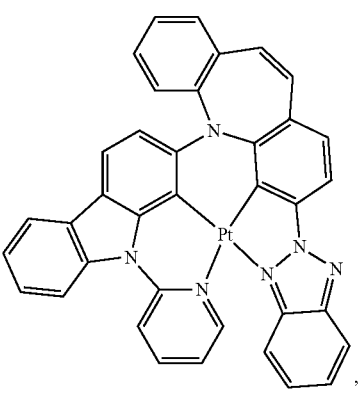 |

113
-continued
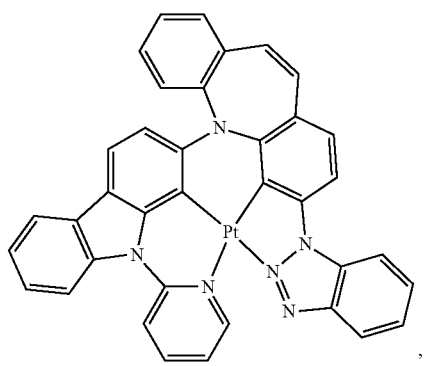
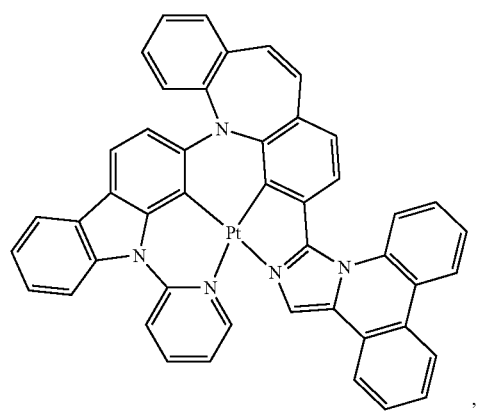
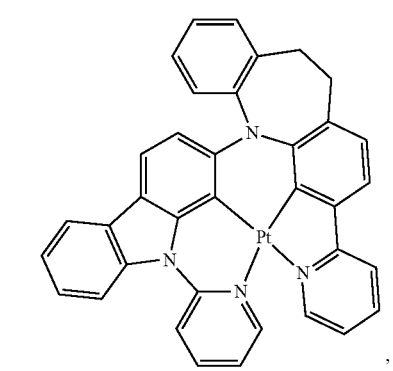
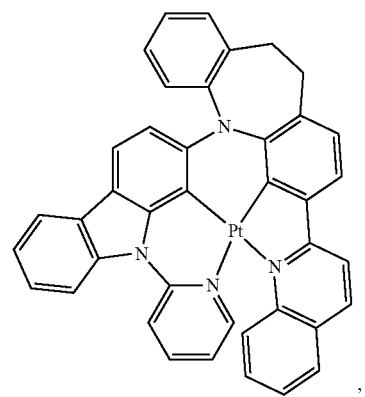
114
-continued
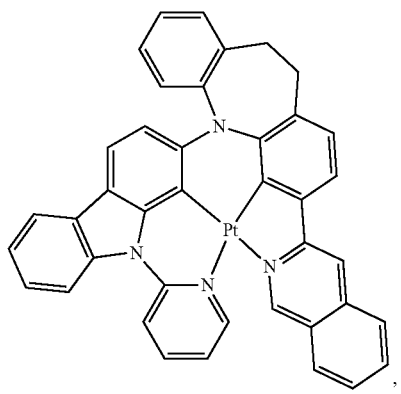
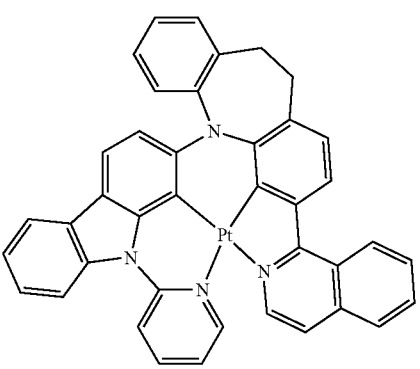
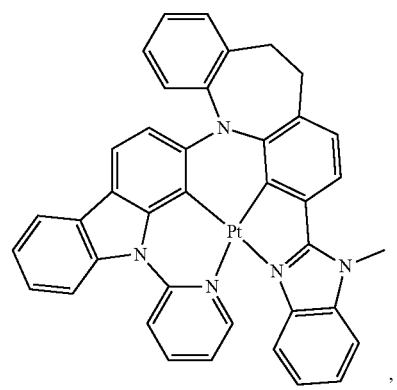
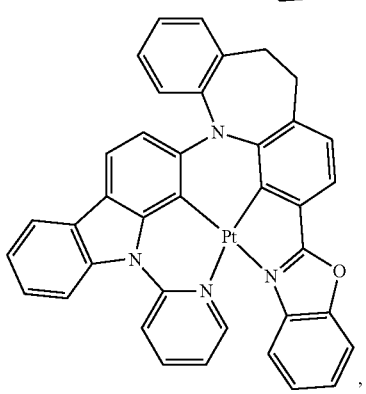

115
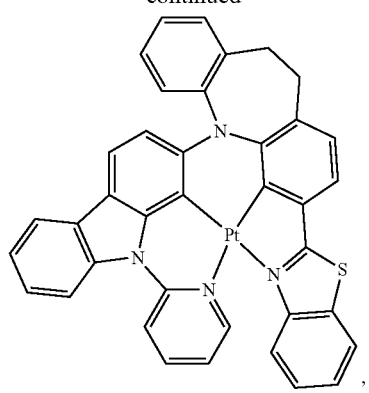
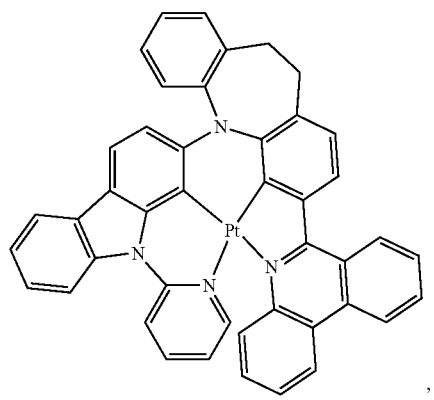
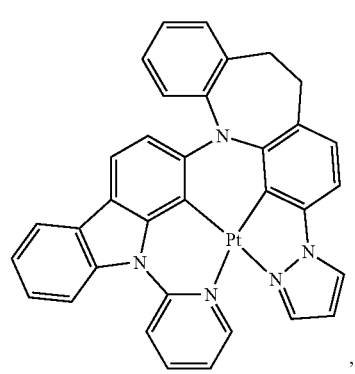
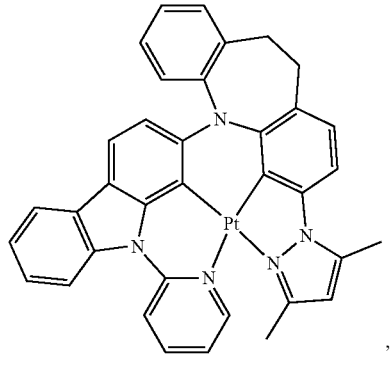
116
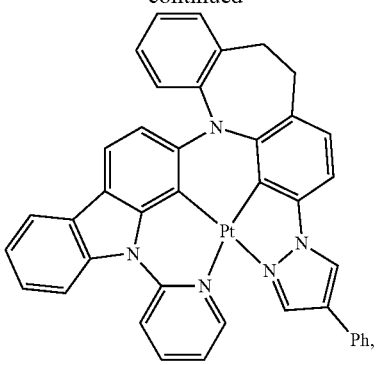
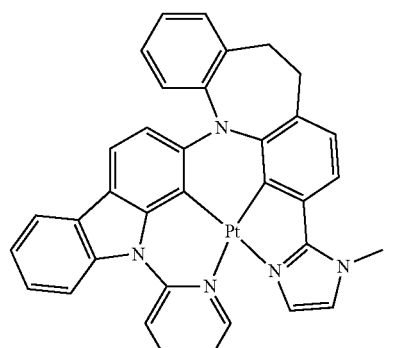
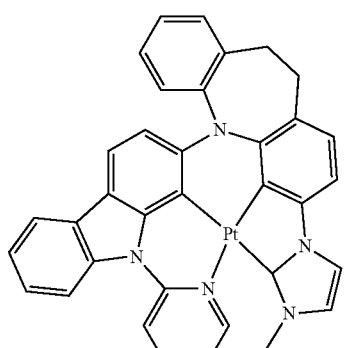
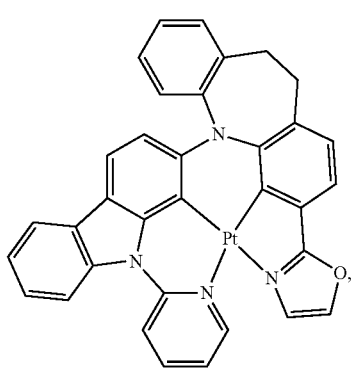

117
118
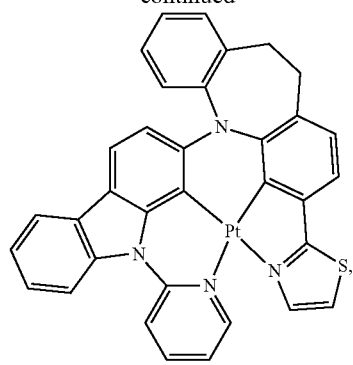
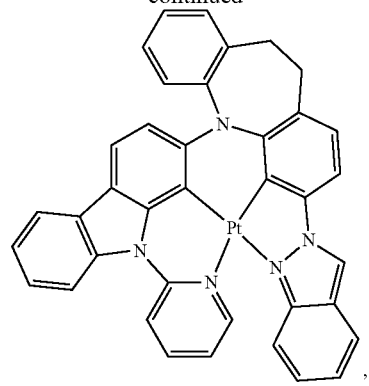
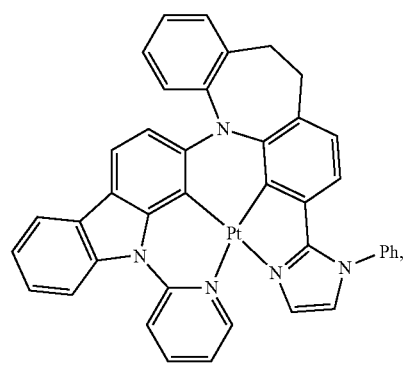
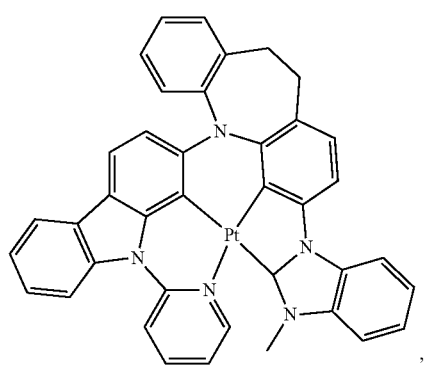
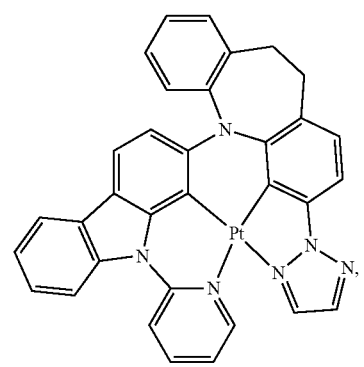
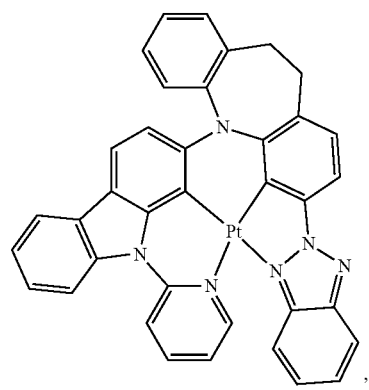
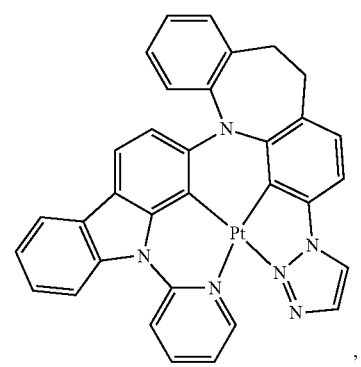
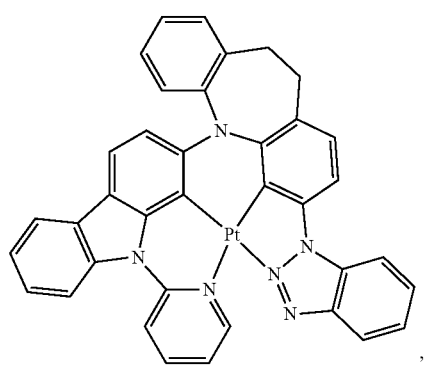

119
-continued

120
-continued

121
-continued
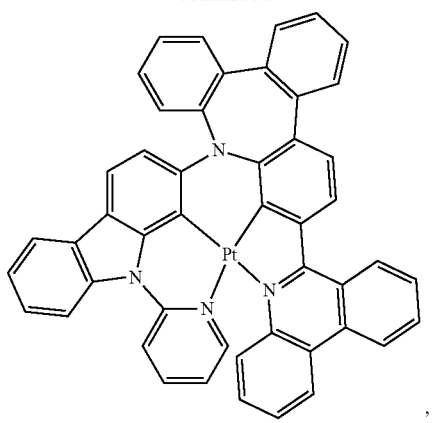
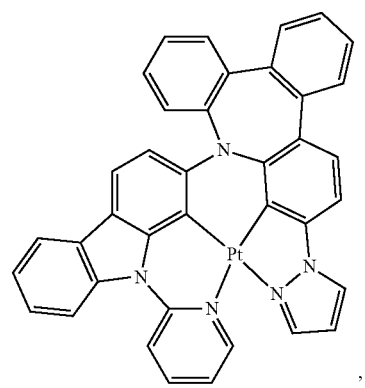
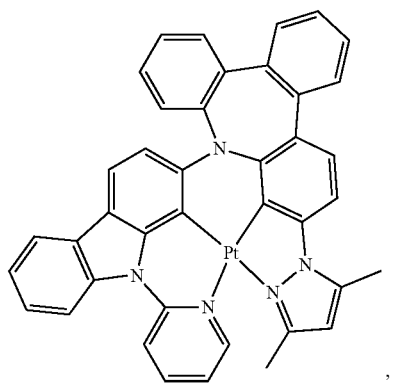
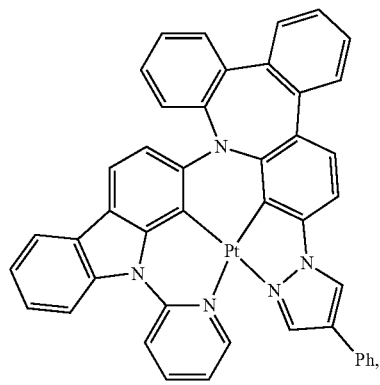
122
-continued
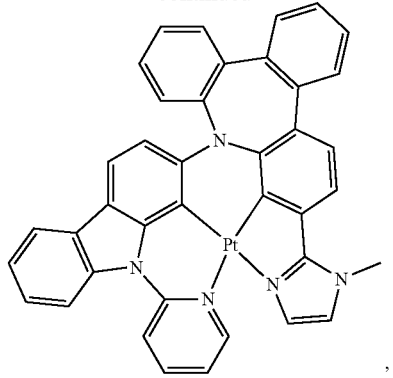
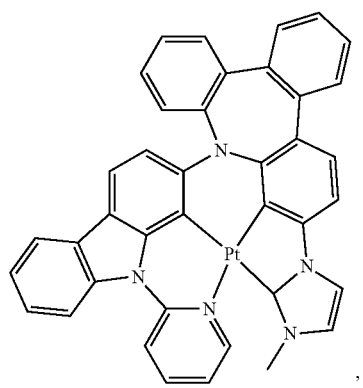
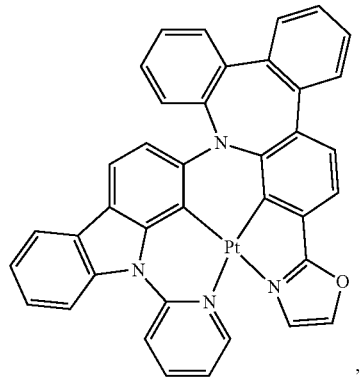
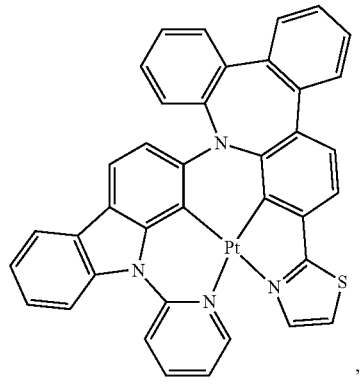

123
-continued
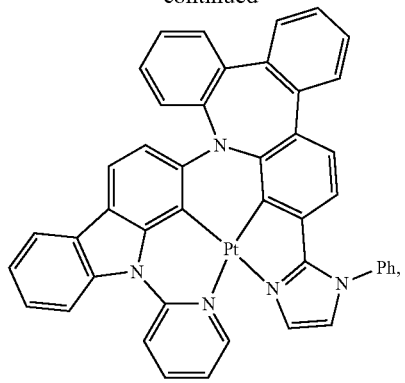
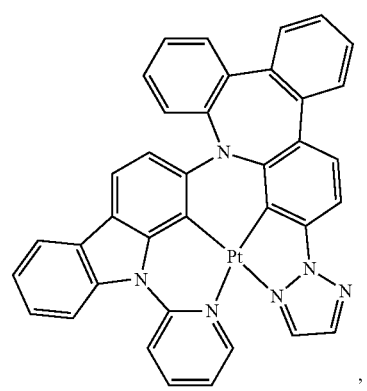
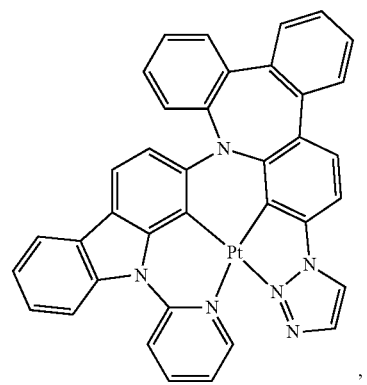
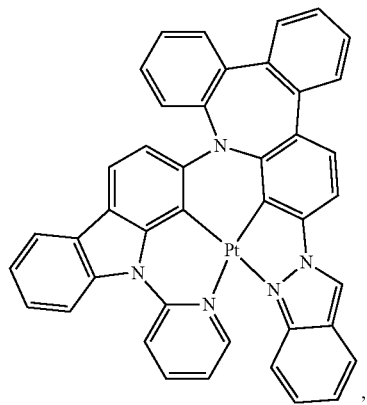
124
-continued
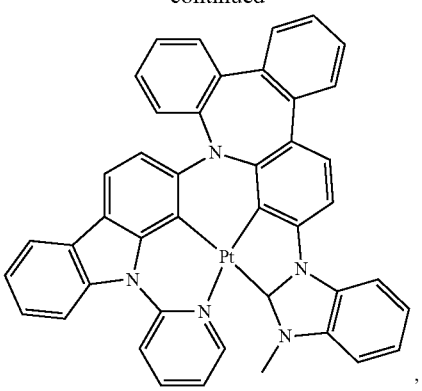
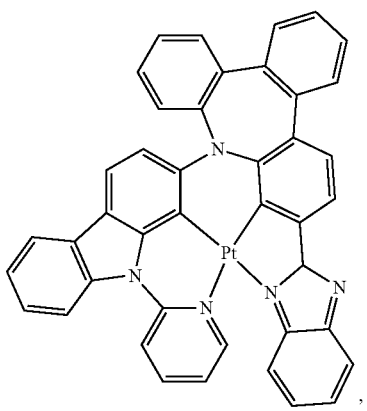
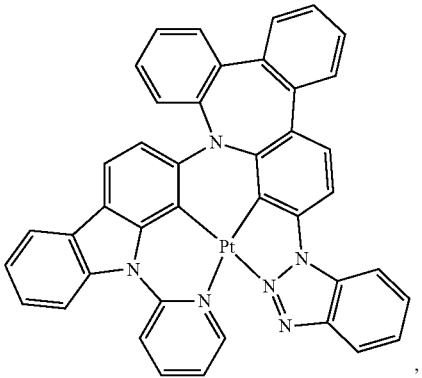
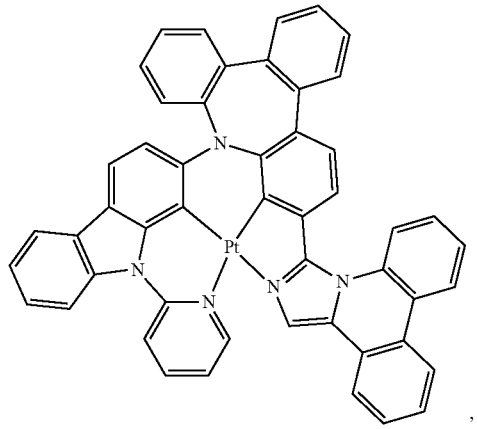

125
-continued
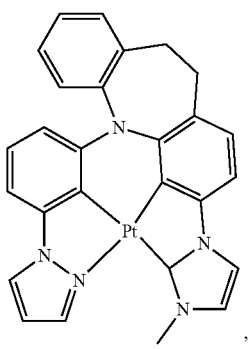
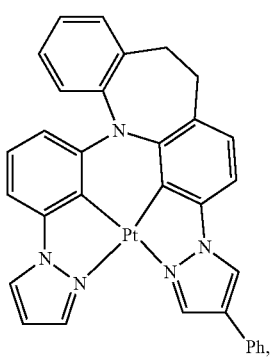
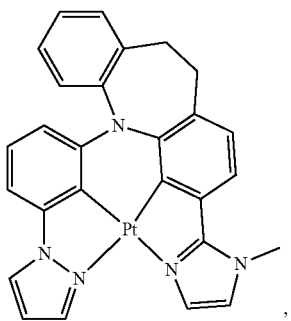
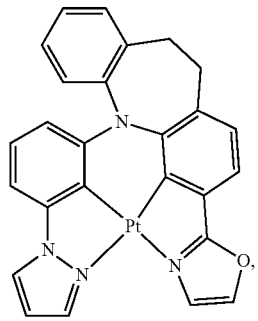
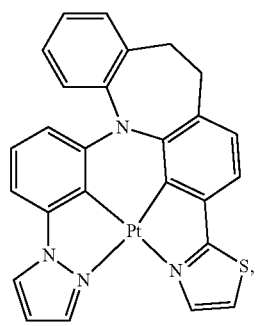
126
-continued
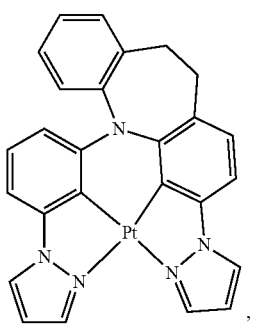
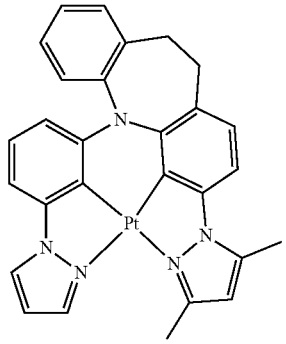
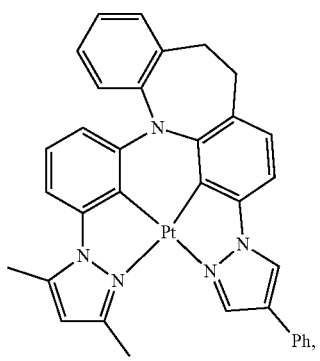
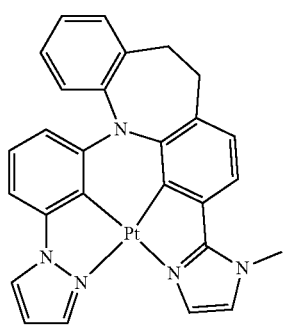
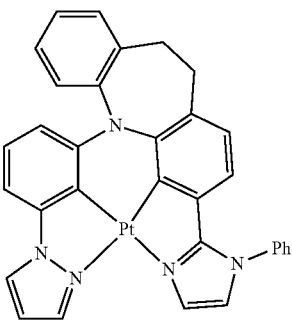

127
-continued
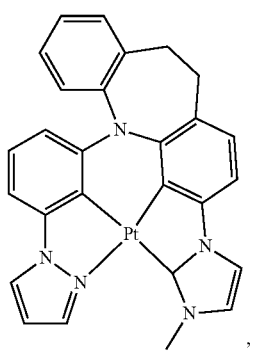
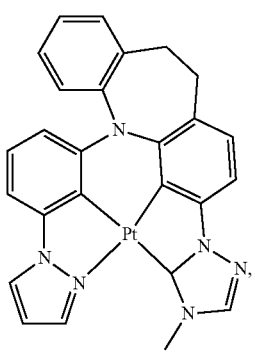
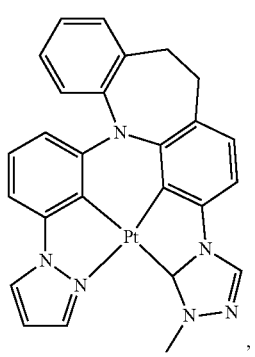
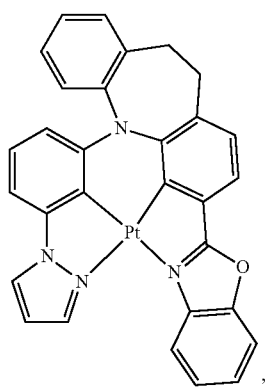
128
-continued
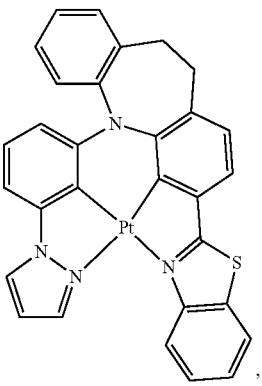
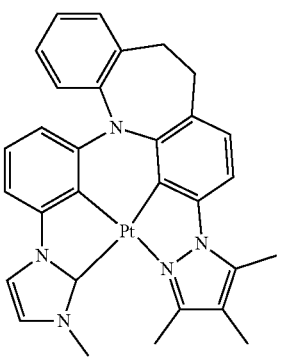
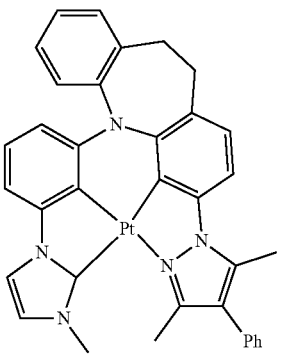
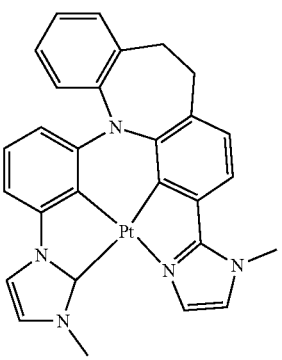

129
-continued
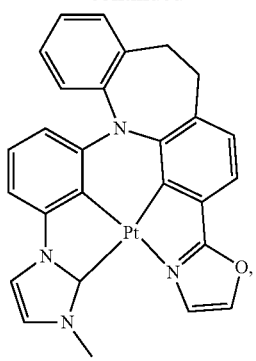
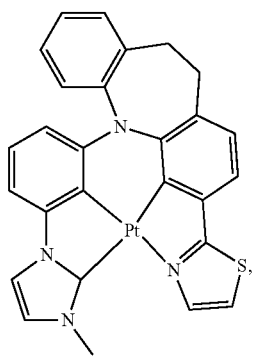
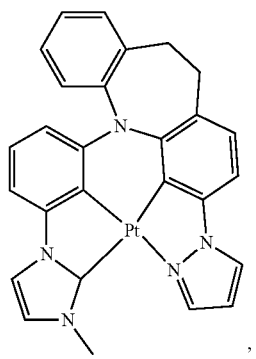
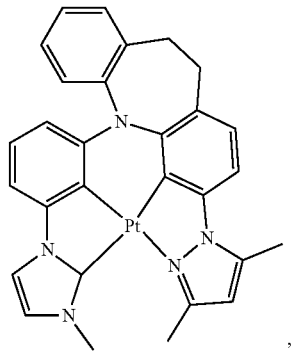
130
-continued
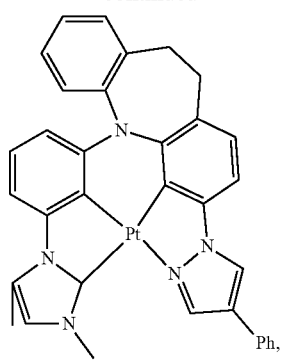
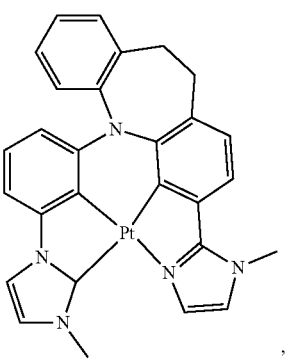
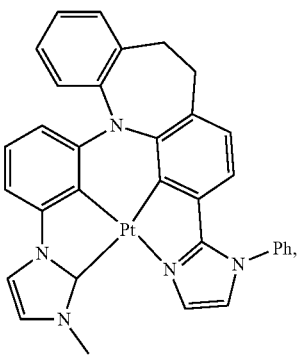
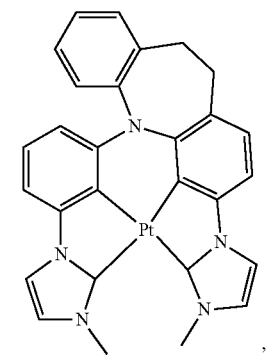

131
-continued
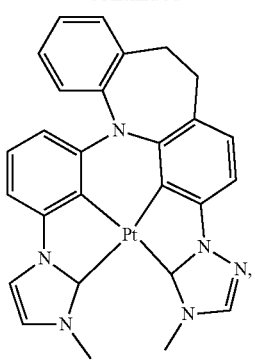
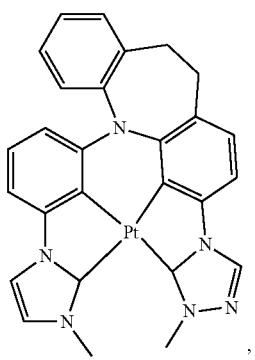,
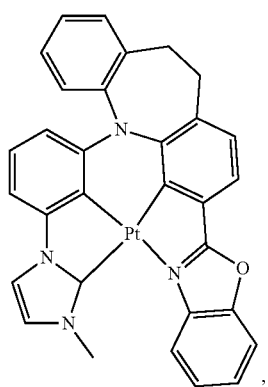,
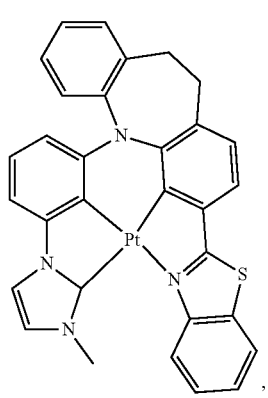,
132
-continued
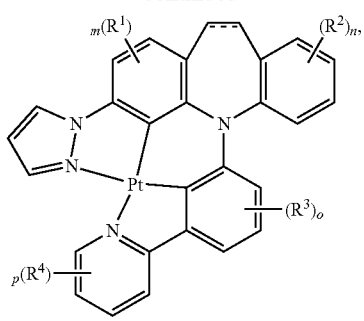,
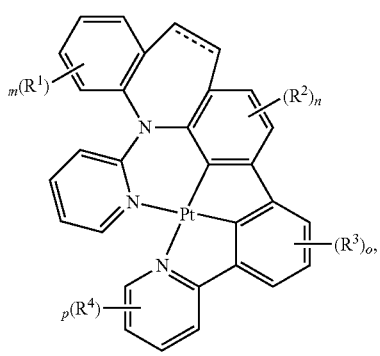,
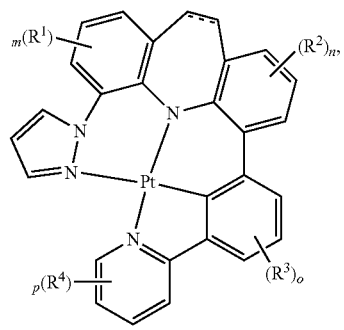,
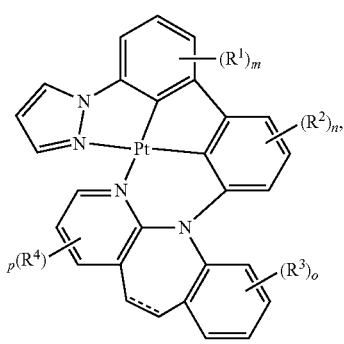,
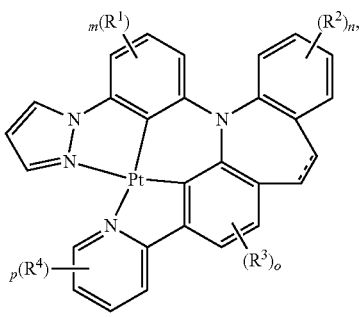, -continued
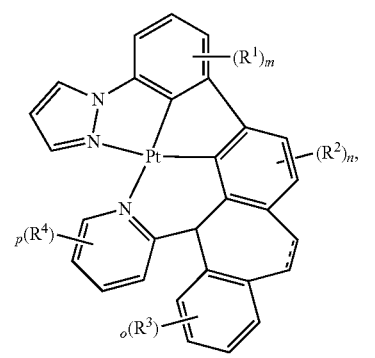
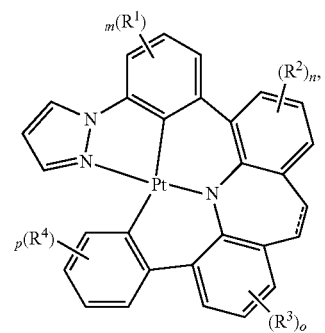
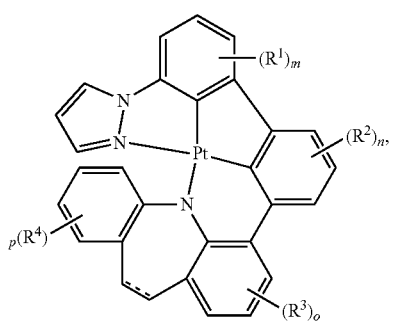
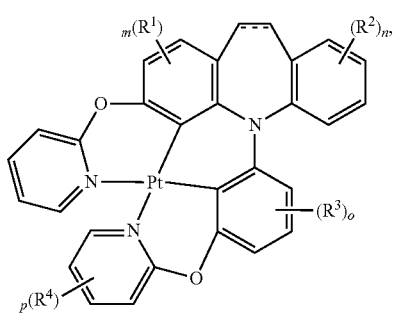
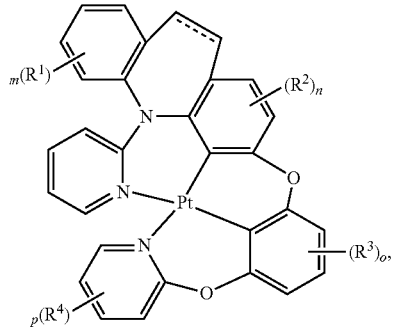
-continued
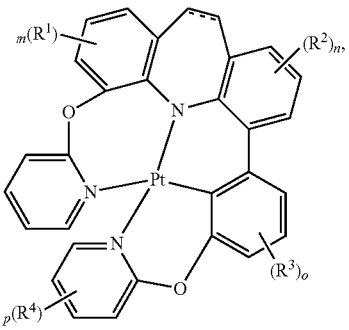
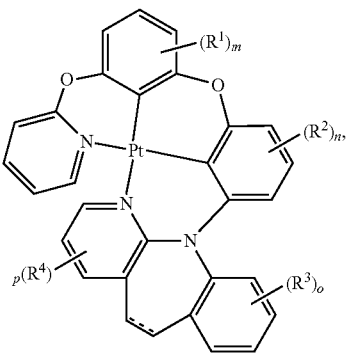
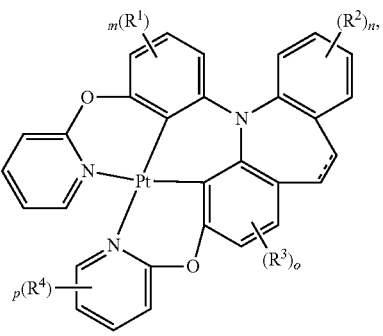
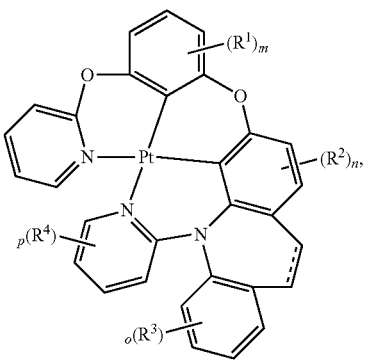
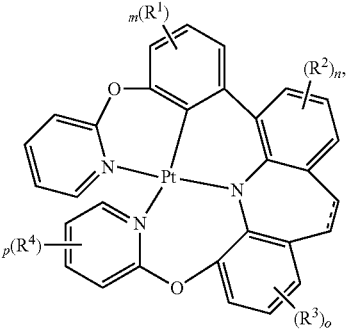

-continued
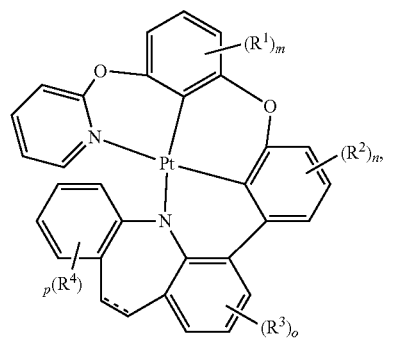
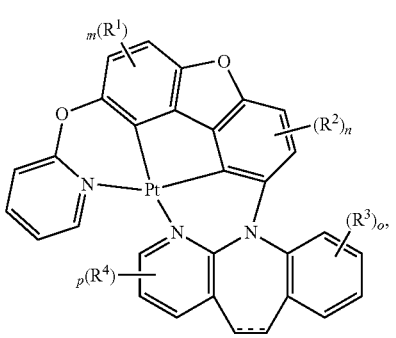
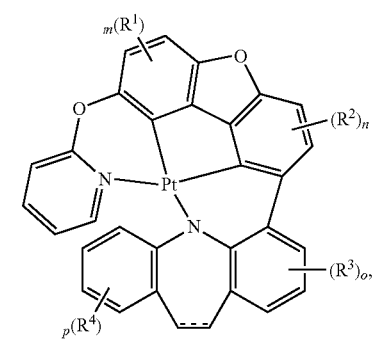
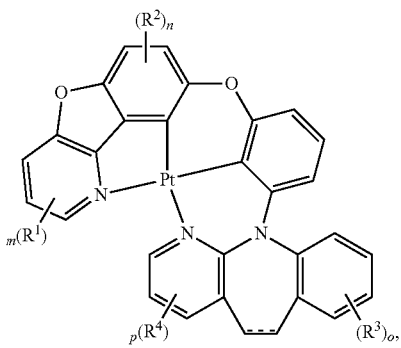
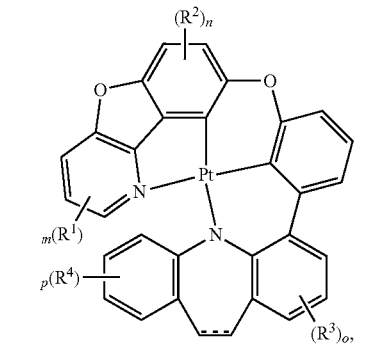
-continued
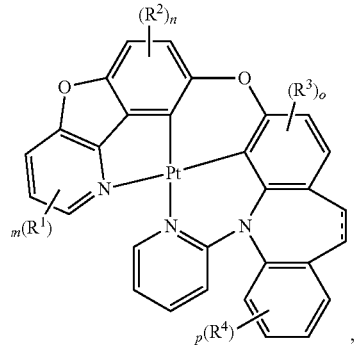
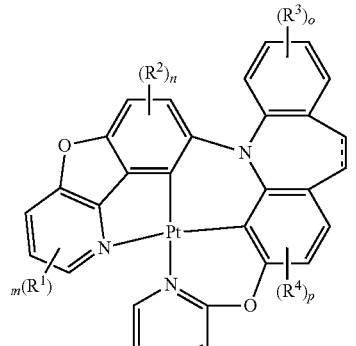
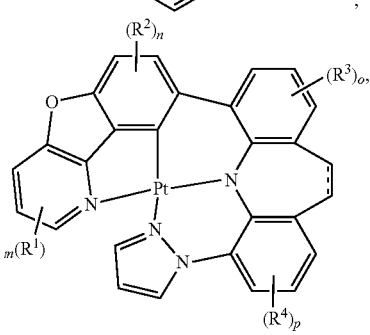
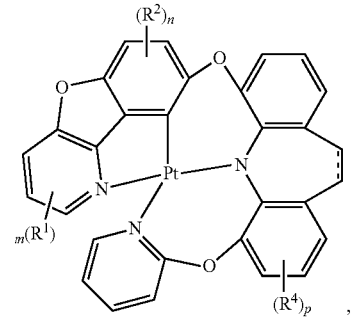
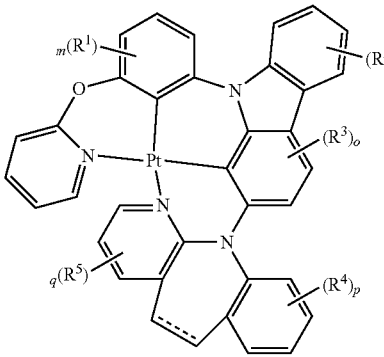

137
-continued
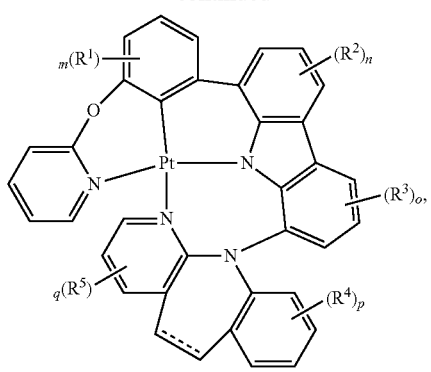
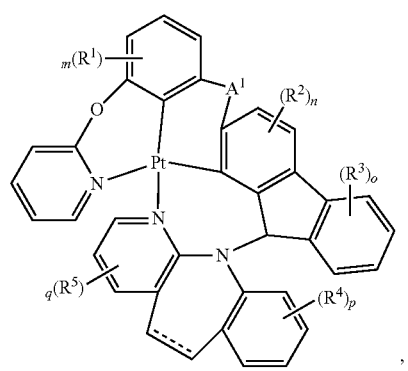
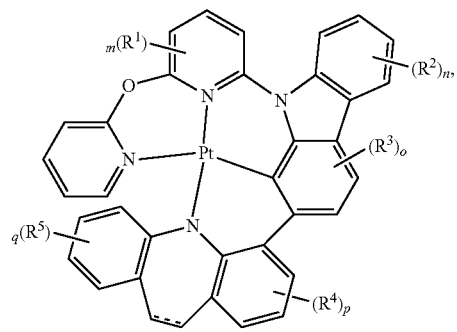
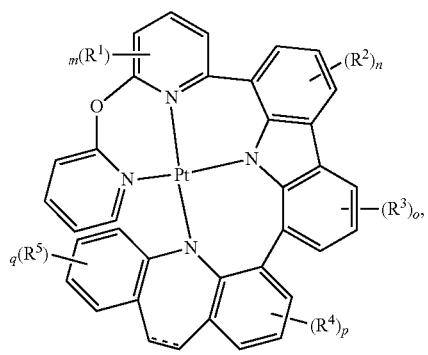
138
-continued
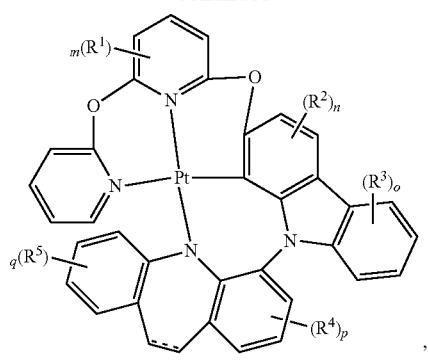
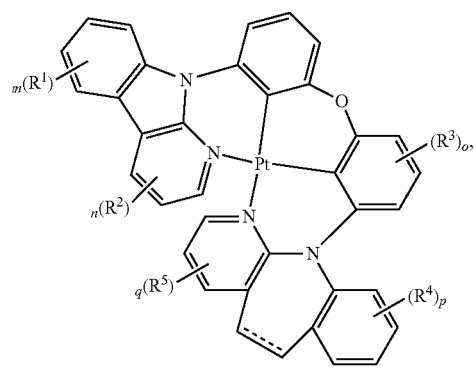
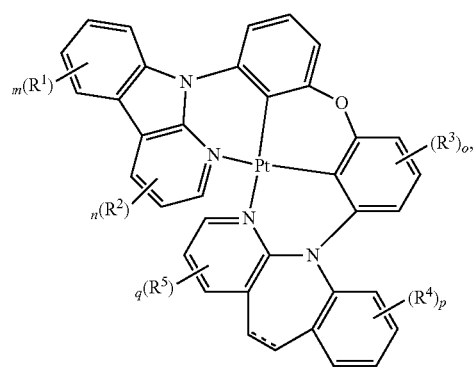
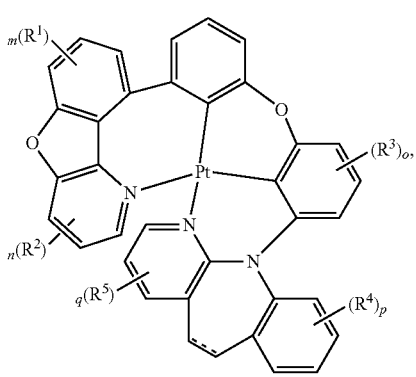

-continued
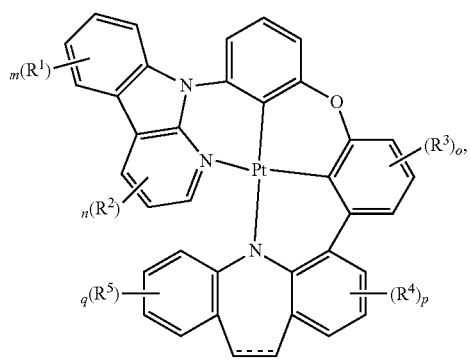
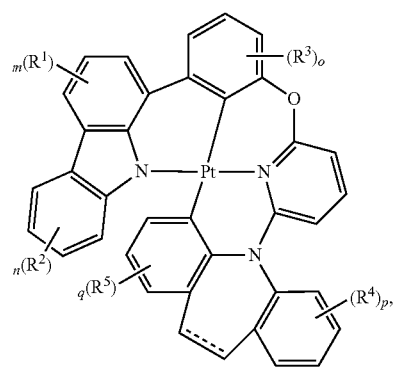
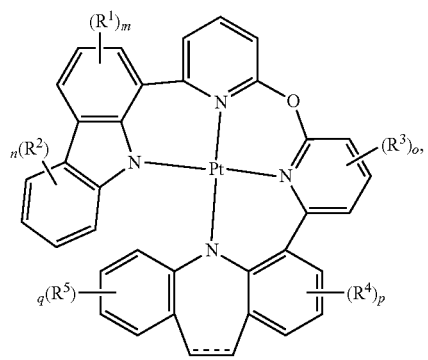
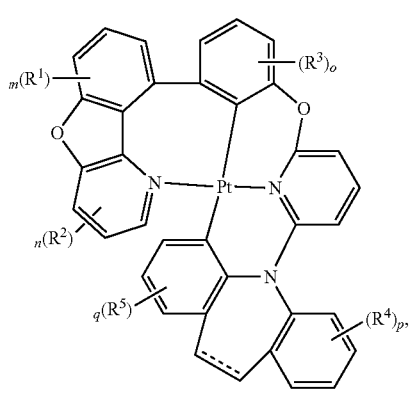
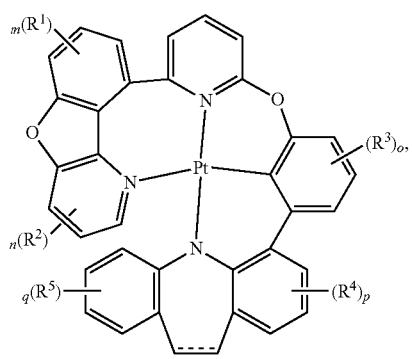
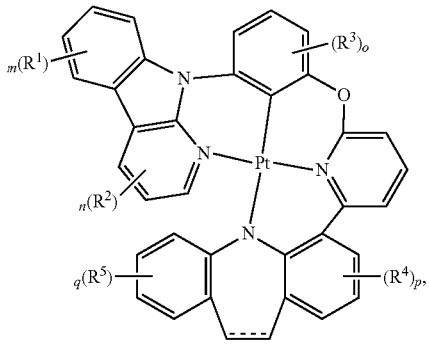
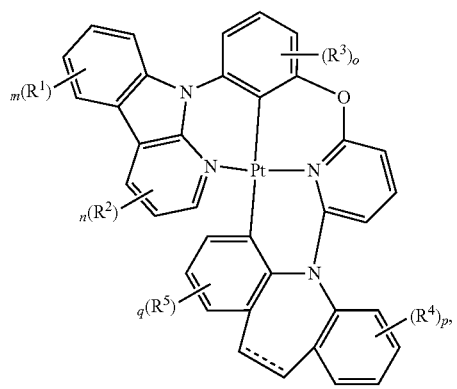
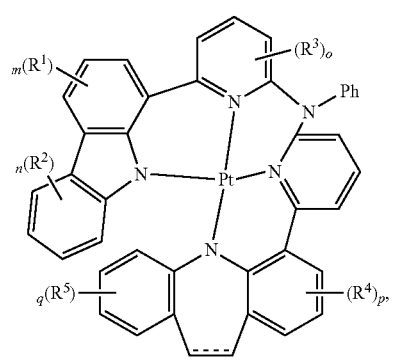

141
-continued
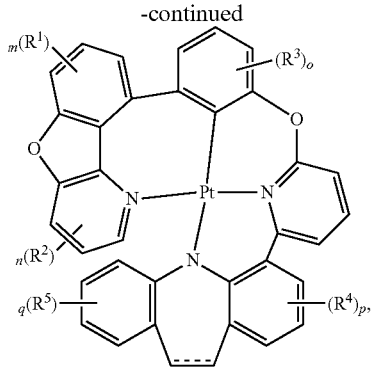
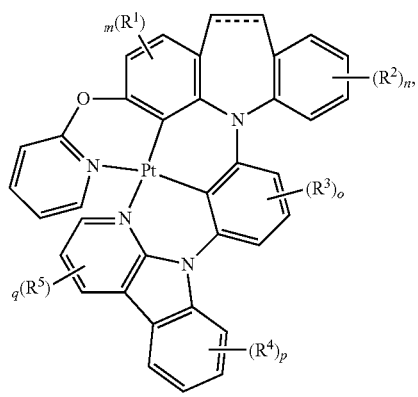
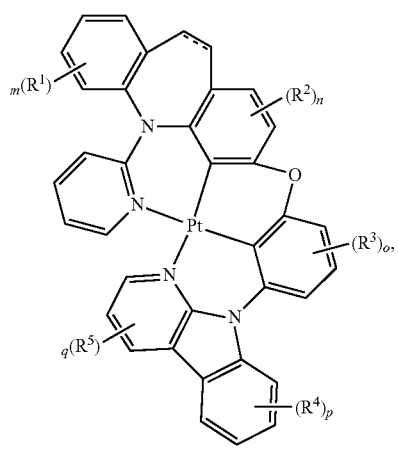
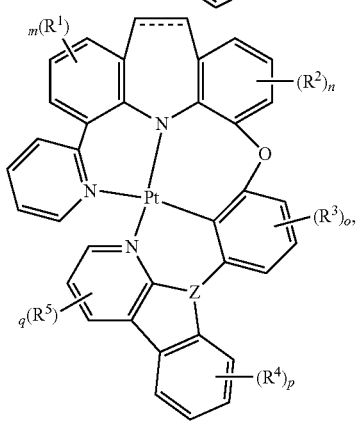
142
-continued
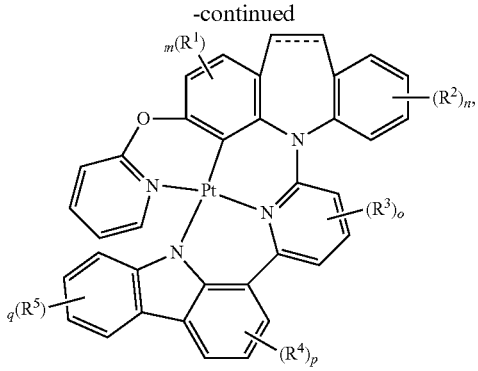
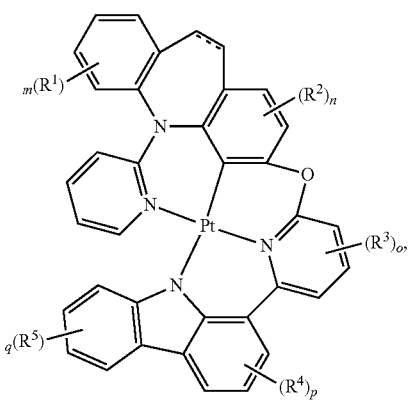
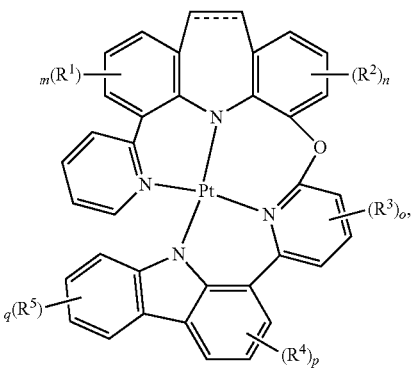
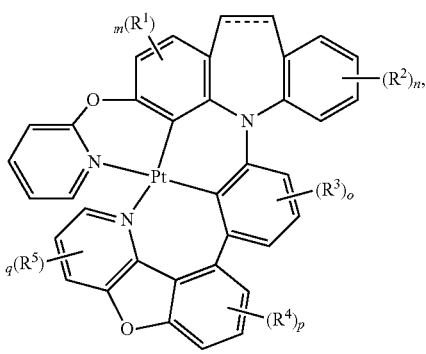

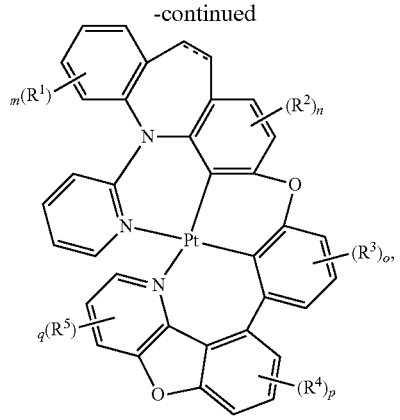
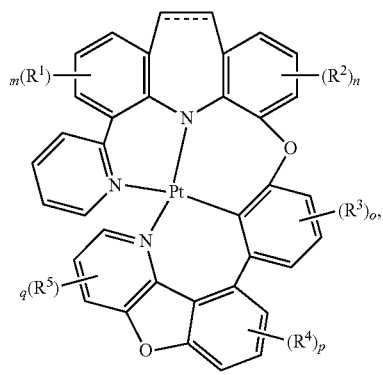
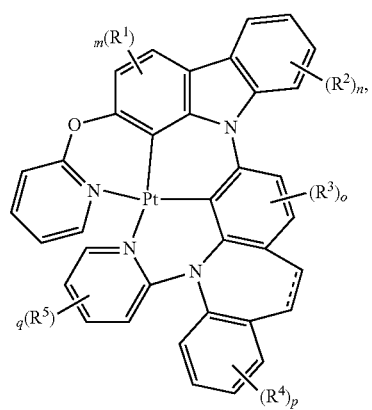
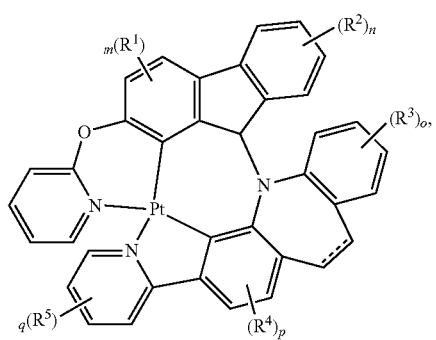
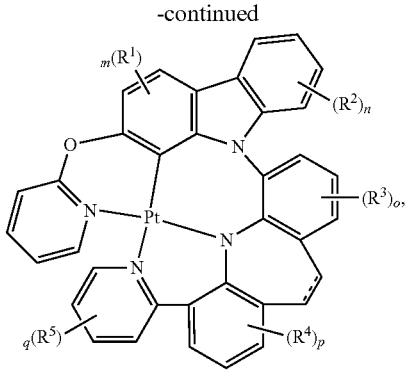
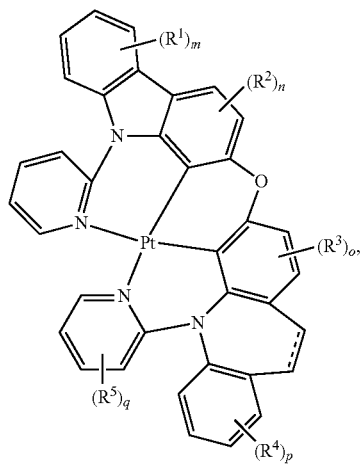
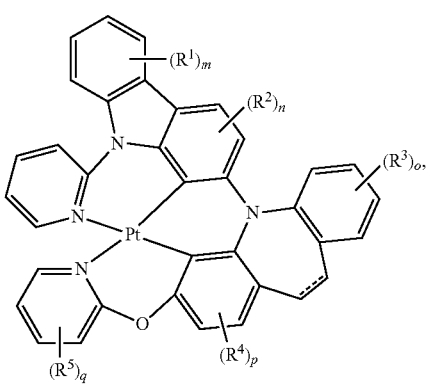
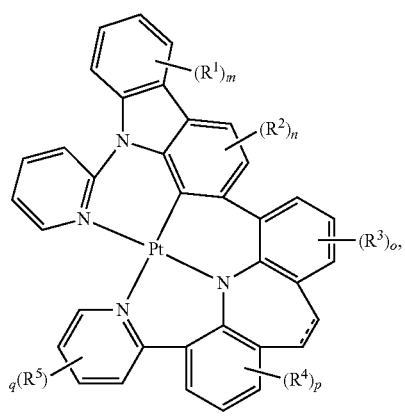

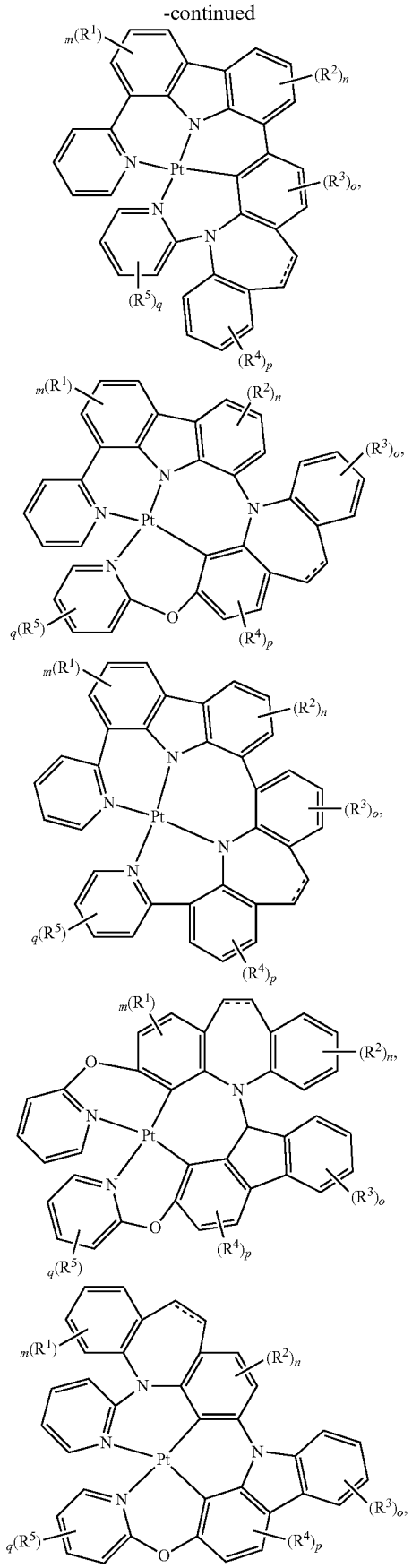
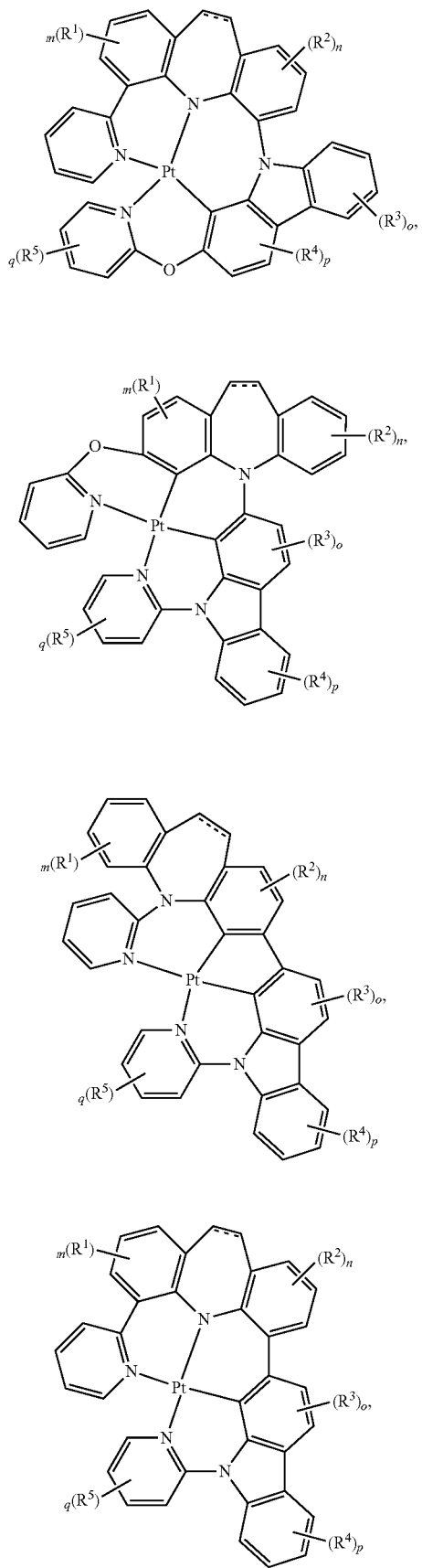

-continued
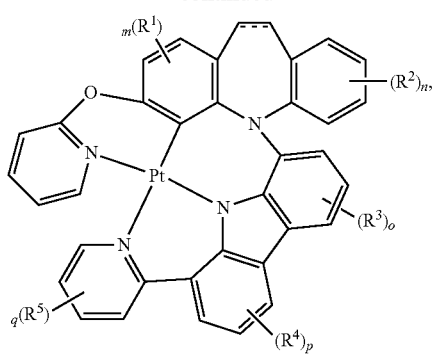
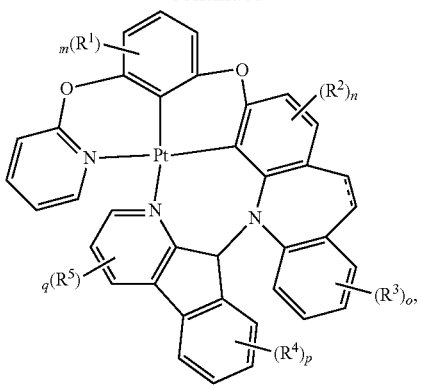
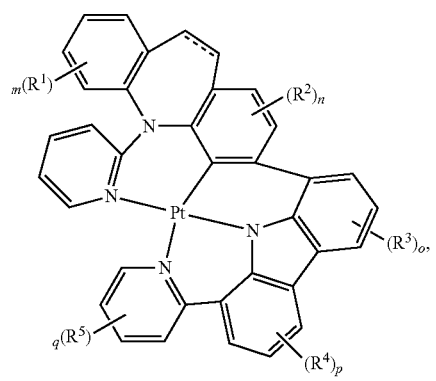
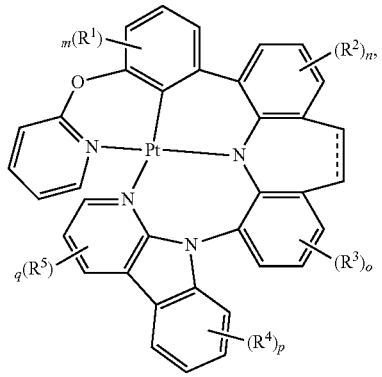
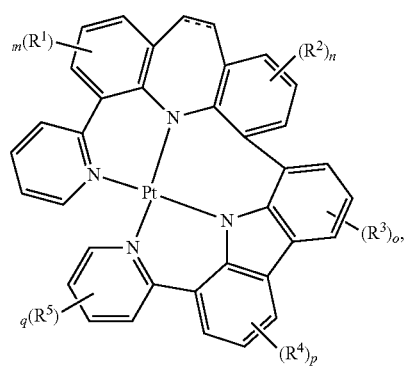
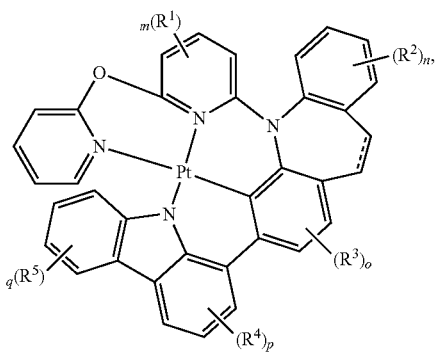
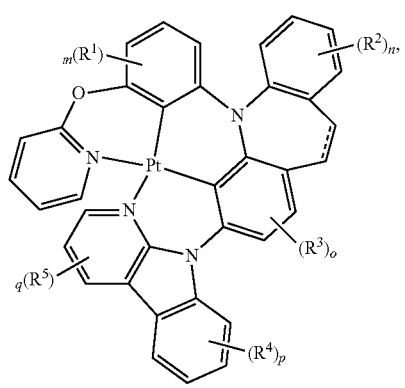
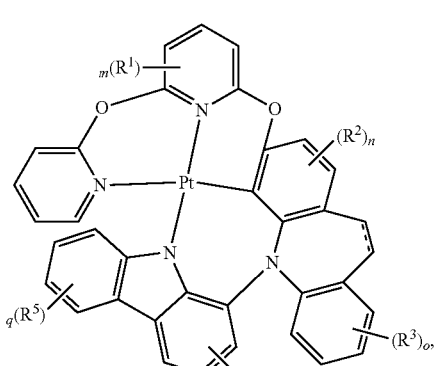

-continued
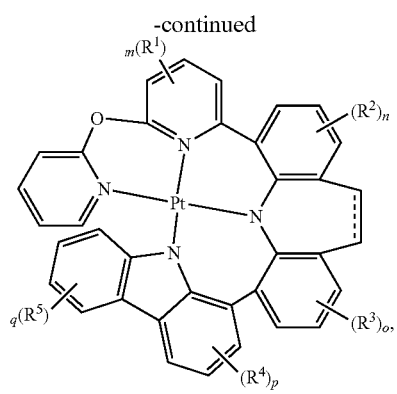
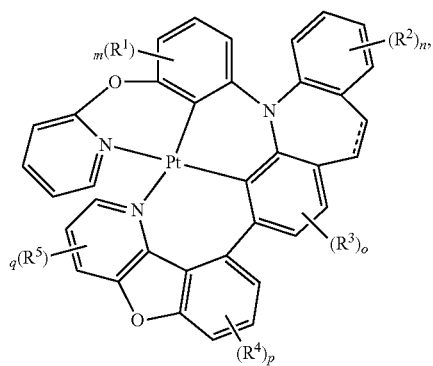
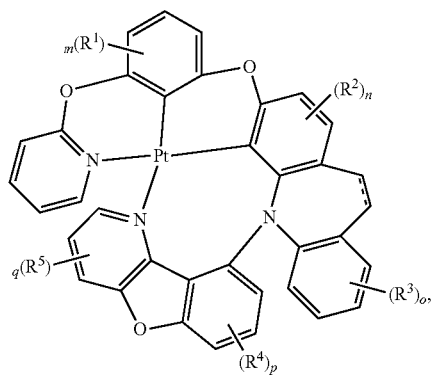
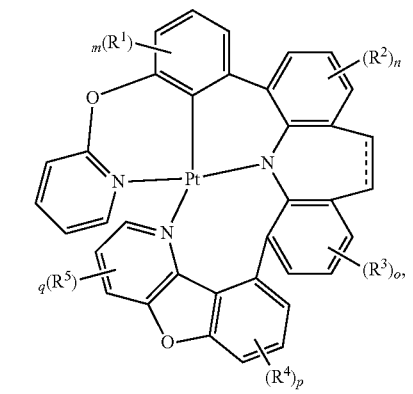
-continued
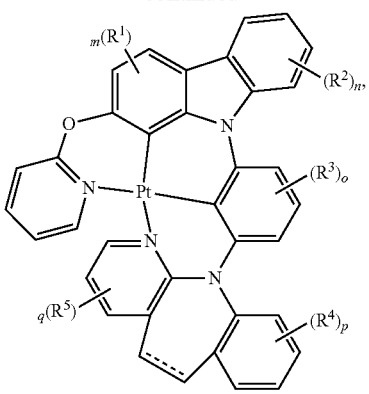
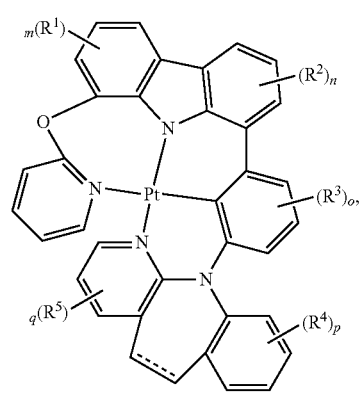
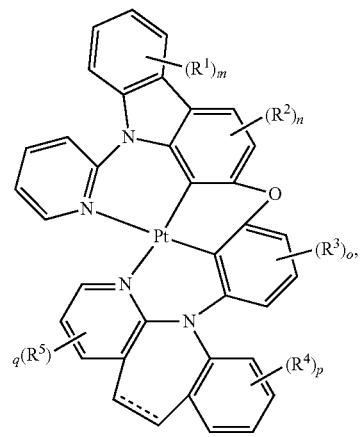
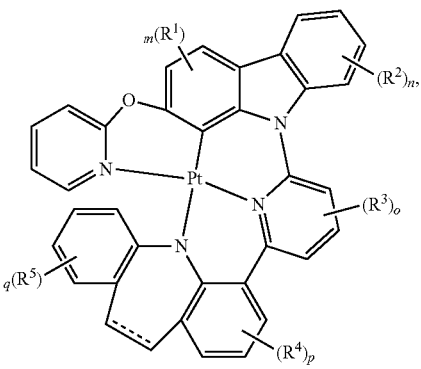

151
-continued
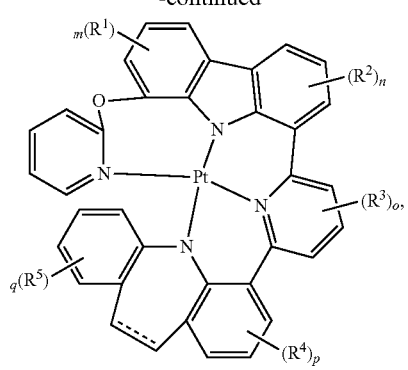
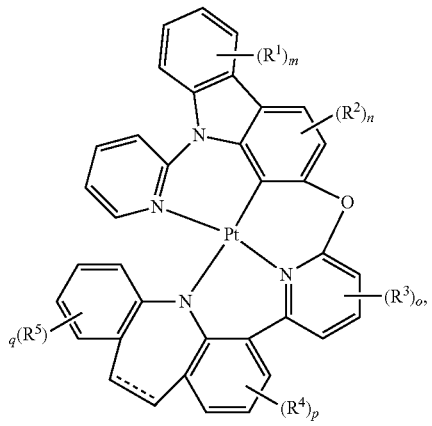
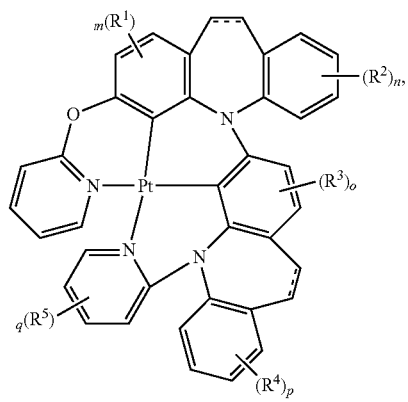
152
-continued
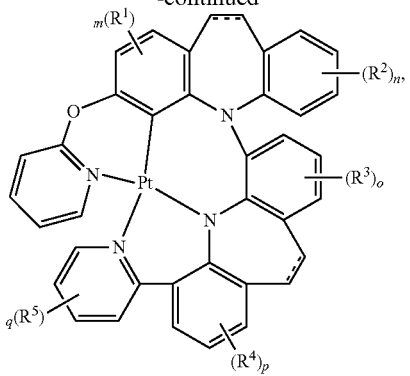
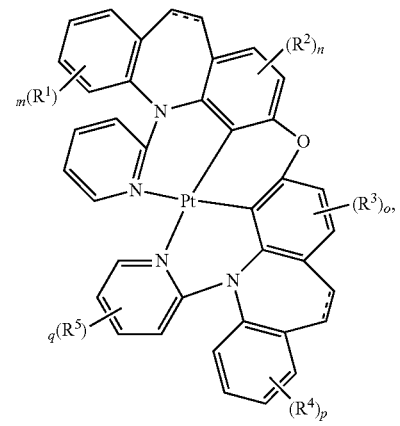
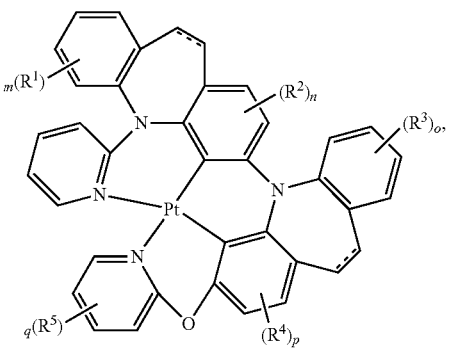
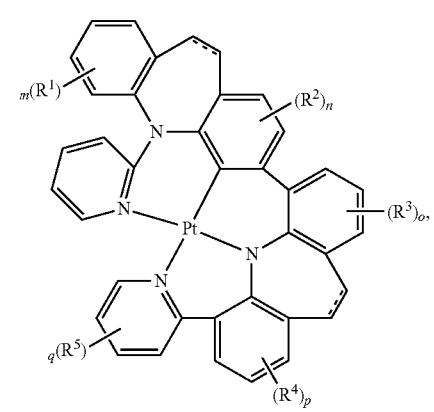

153
-continued
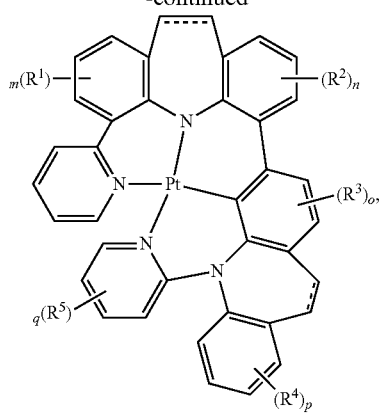
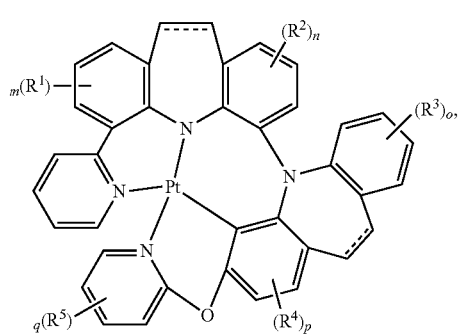
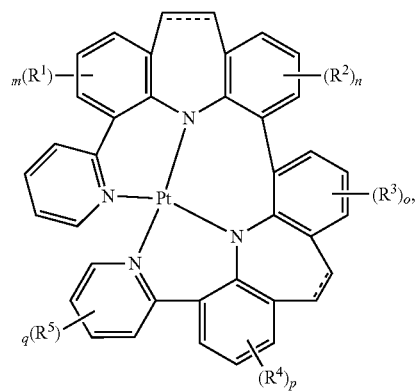
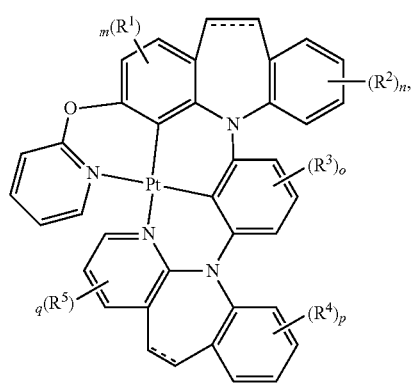
154
-continued
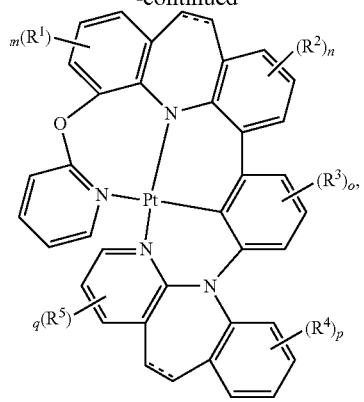
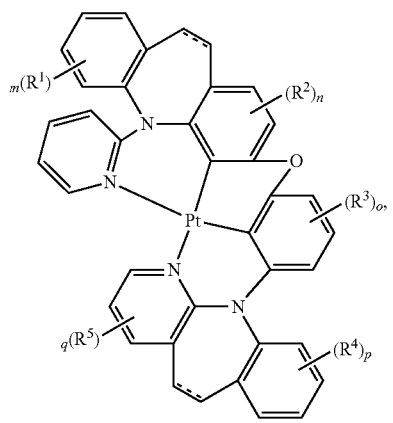
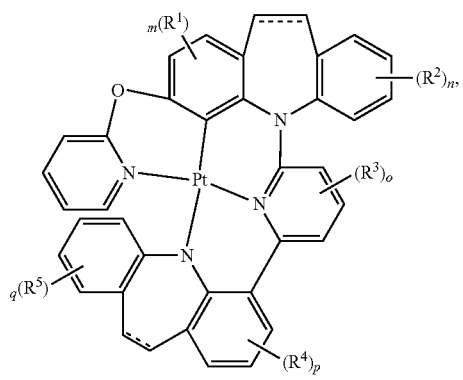
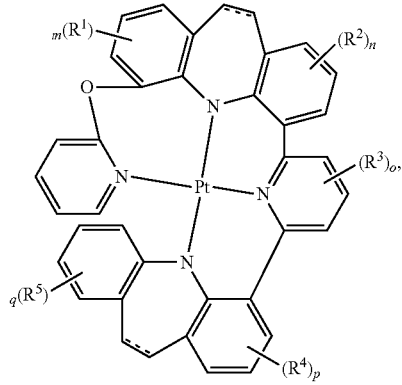

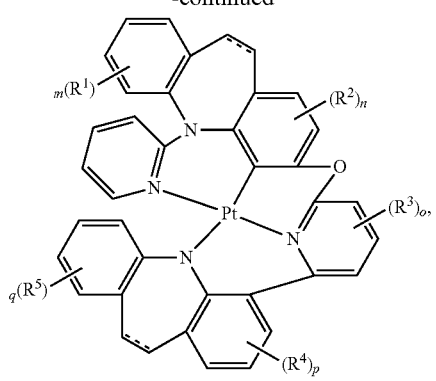
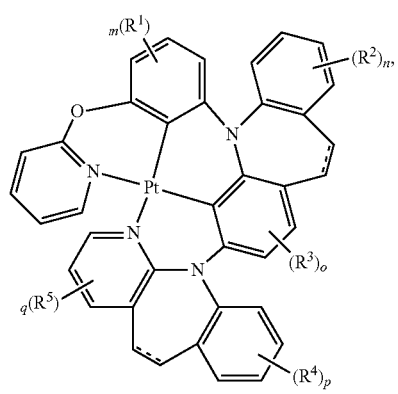
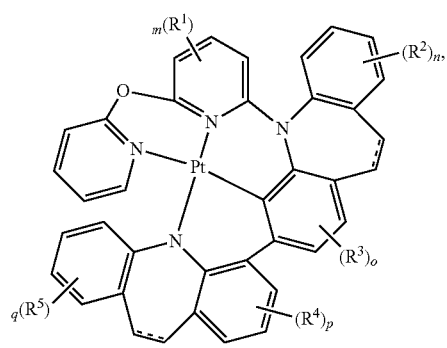
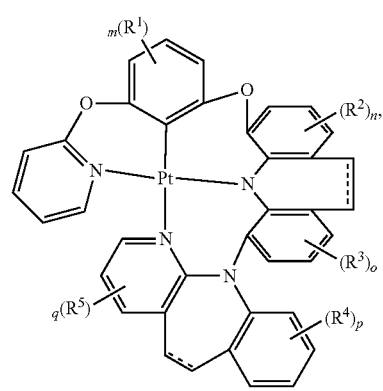
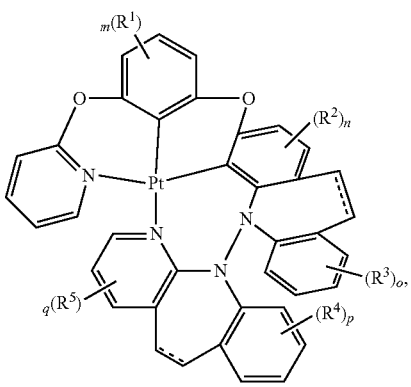
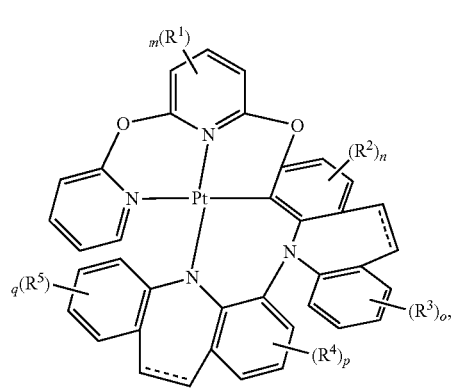
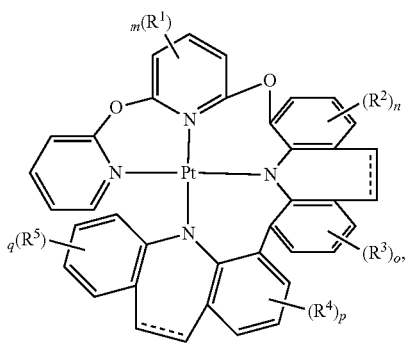
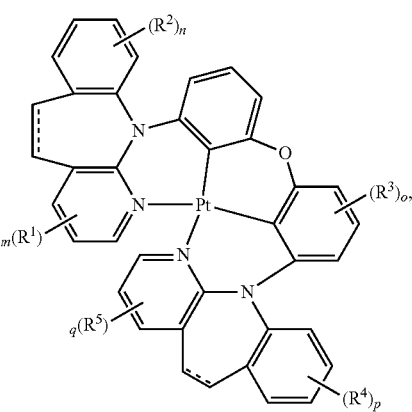

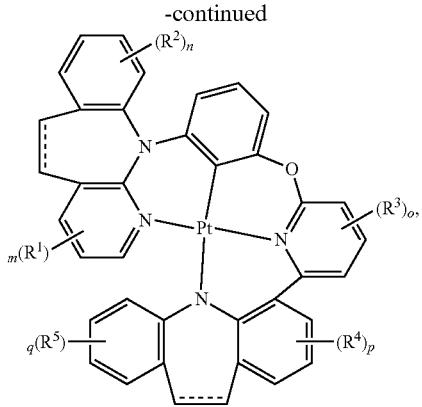
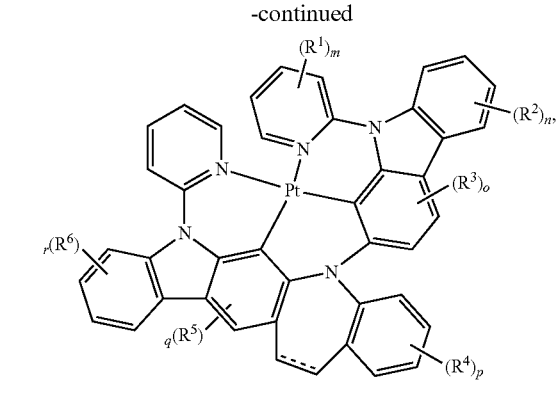
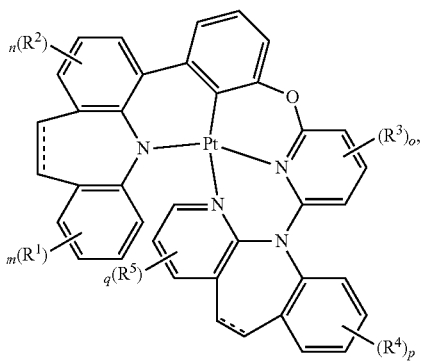
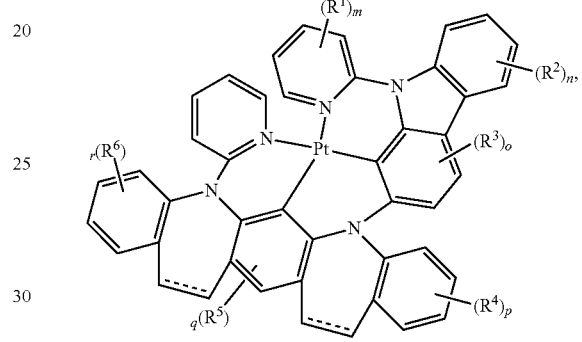
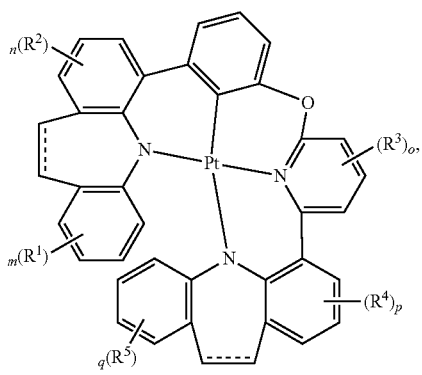
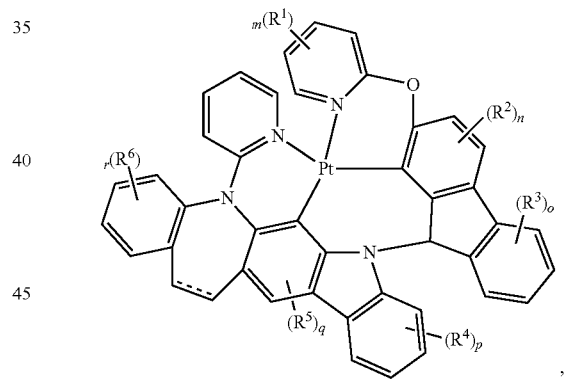
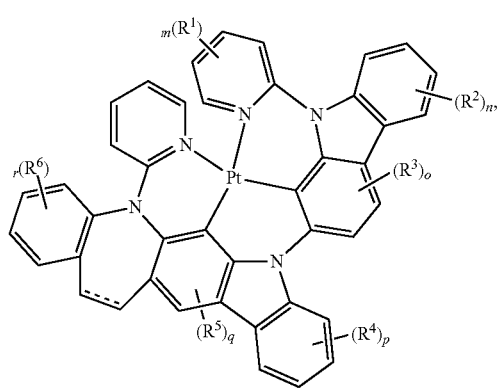
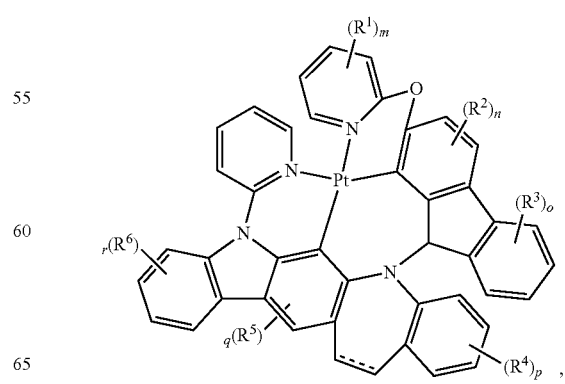

-continued
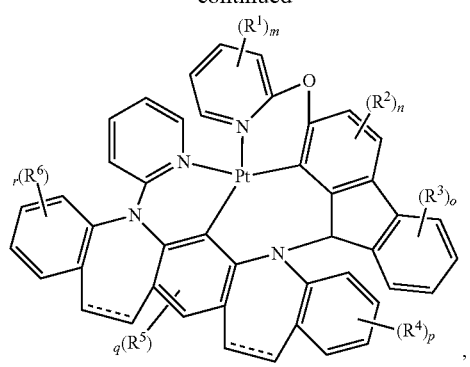
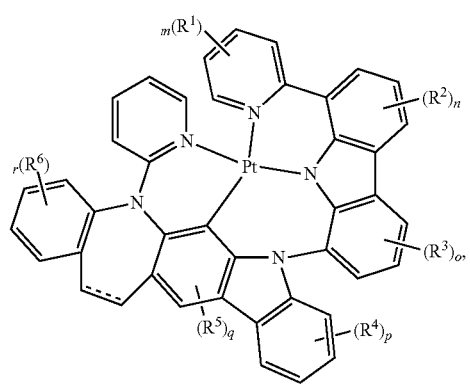
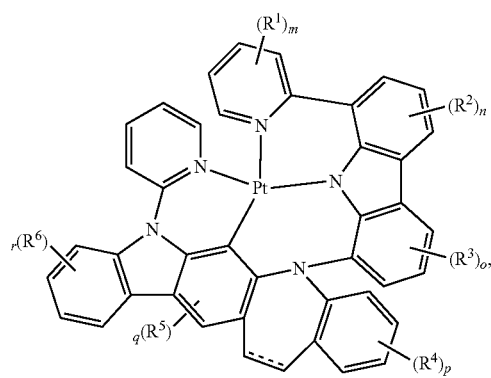
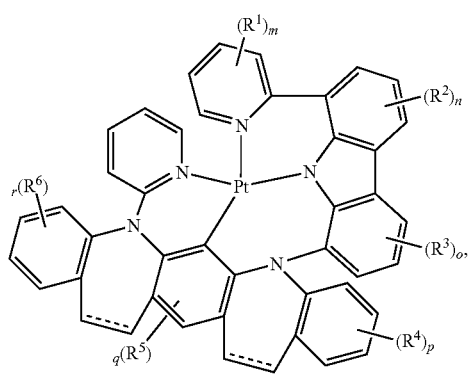
-continued
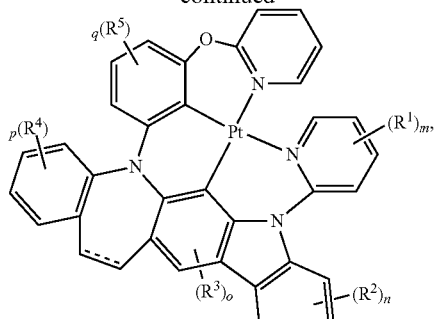
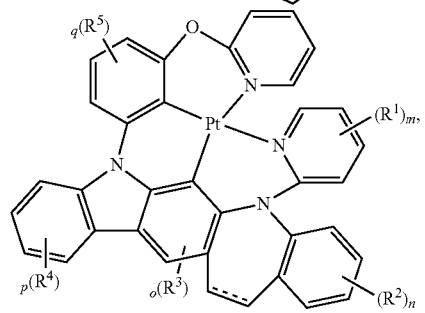
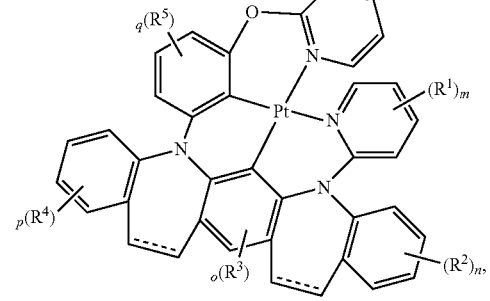
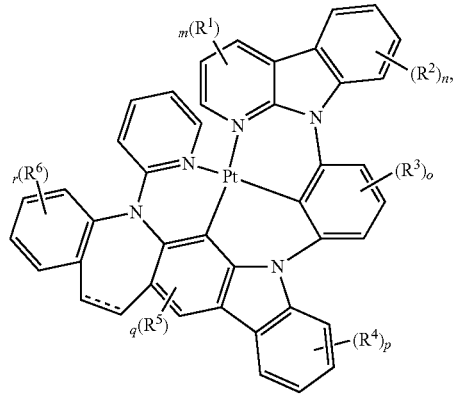
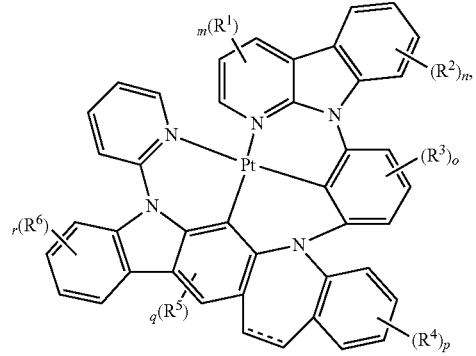

-continued

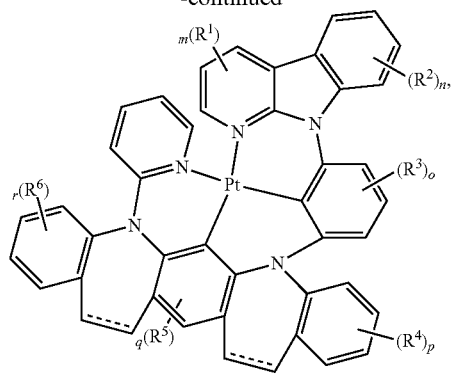

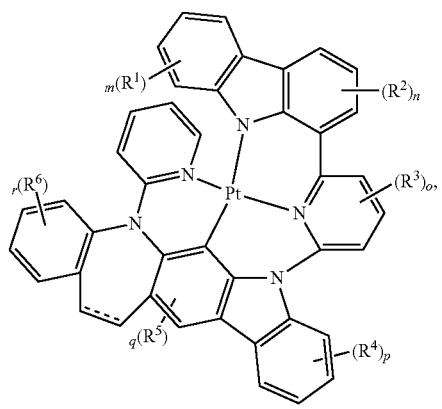

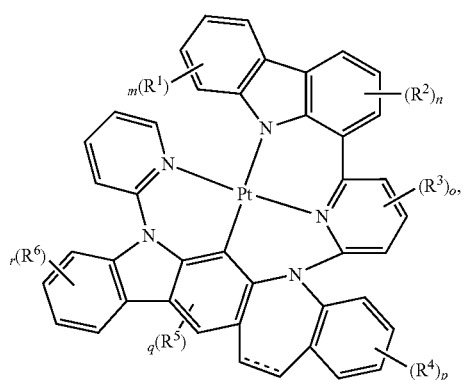

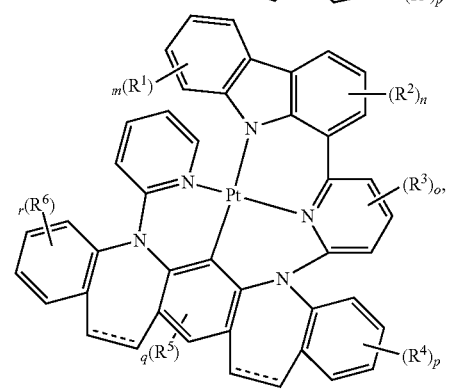

In one aspect, the compound has the structure:

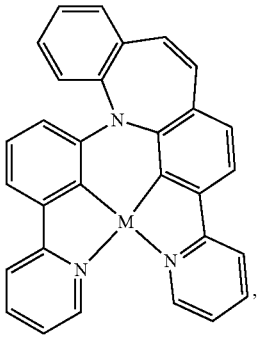

such as, for example

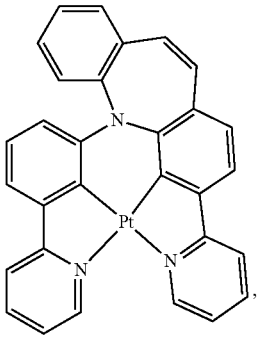

PtN″3PPy

It should be noted that each of multiple recitations or illustrations of a particular structure, reference letter or numeral, etc., appearing in one or more structures of this disclosure can represent the same or different species, and that both aspects wherein they represent the same and wherein they represent different species are intended to be disclosed.

3. Methods

The disclosed compound can be made by one or more of the methods of synthesizing disclosed herein.

In one aspect, the disclosed compounds can be made by a synthesis comprising one or more of the following reactions or steps:

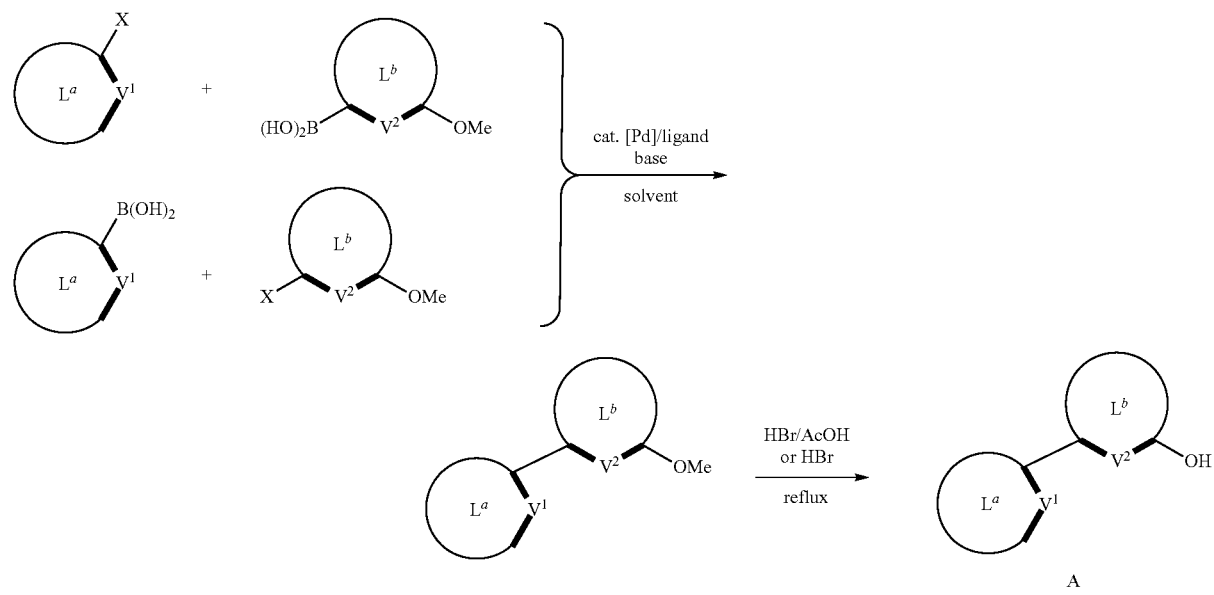
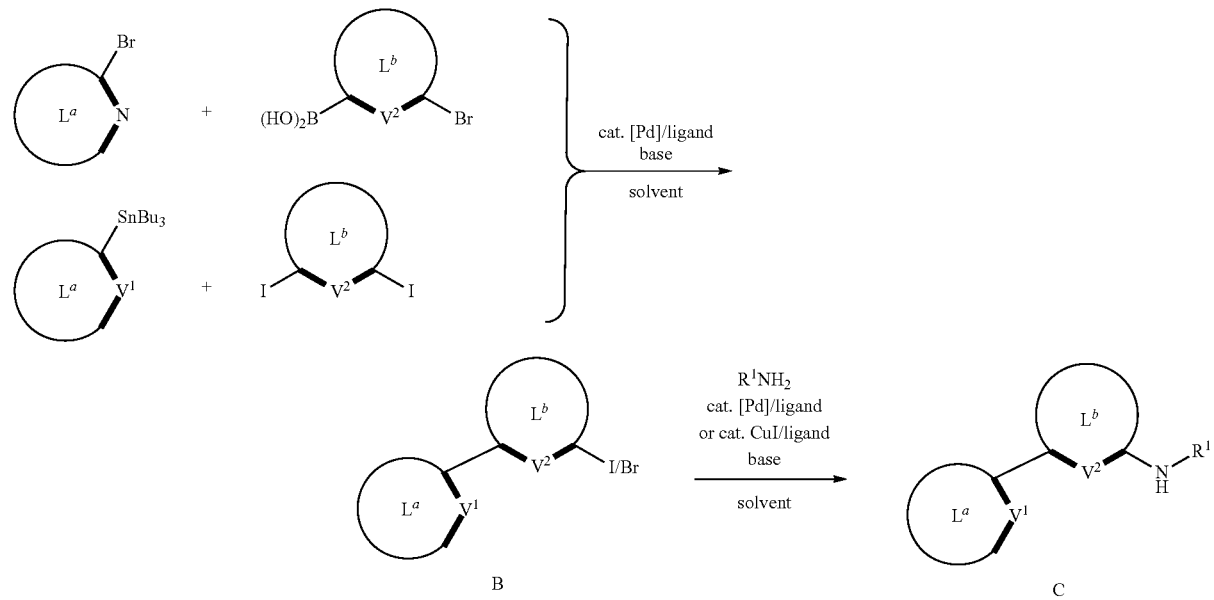
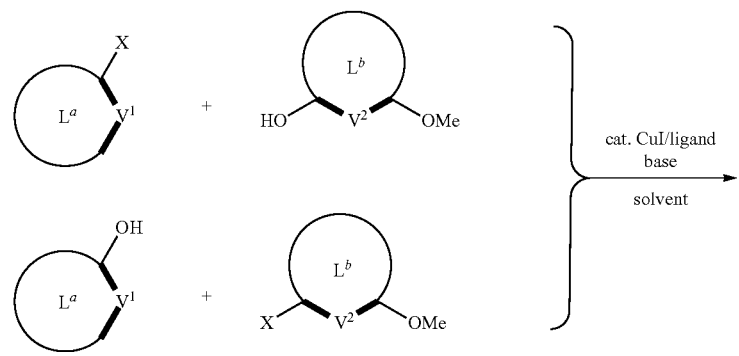

-continued
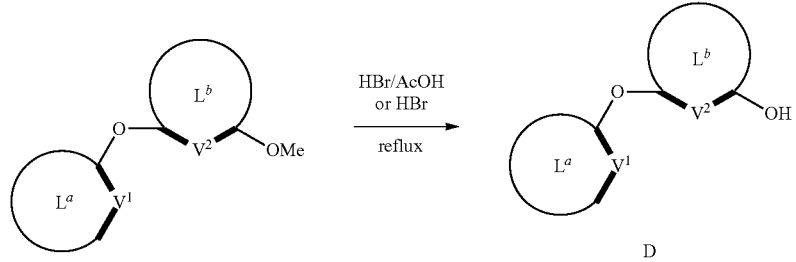
D
X = I, Br
$L^a = L^1$ or $L^4$
$L^b = L^2$ or $L^3$
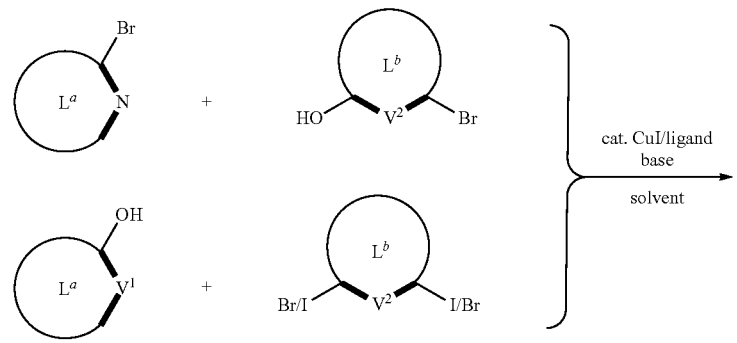
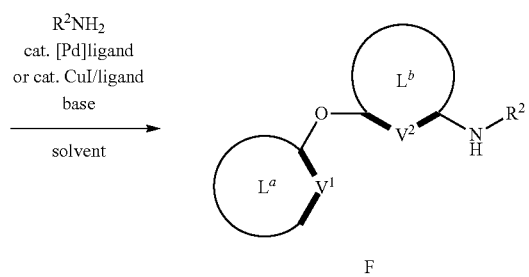
E → F
$L^a = L^1$ or $L^4$
$L^b = L^2$ or $L^3$
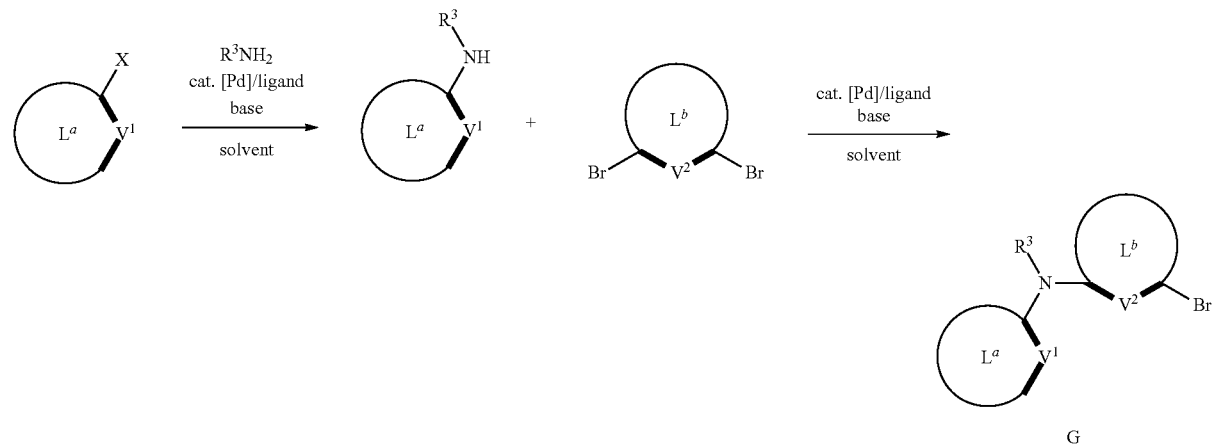
G
$L^a = L^1$ or $L^4$
$L^b = L^2$ or $L^3$ In another aspect, the disclosed compounds can be made by a synthesis comprising one or more of the following reactions or steps:
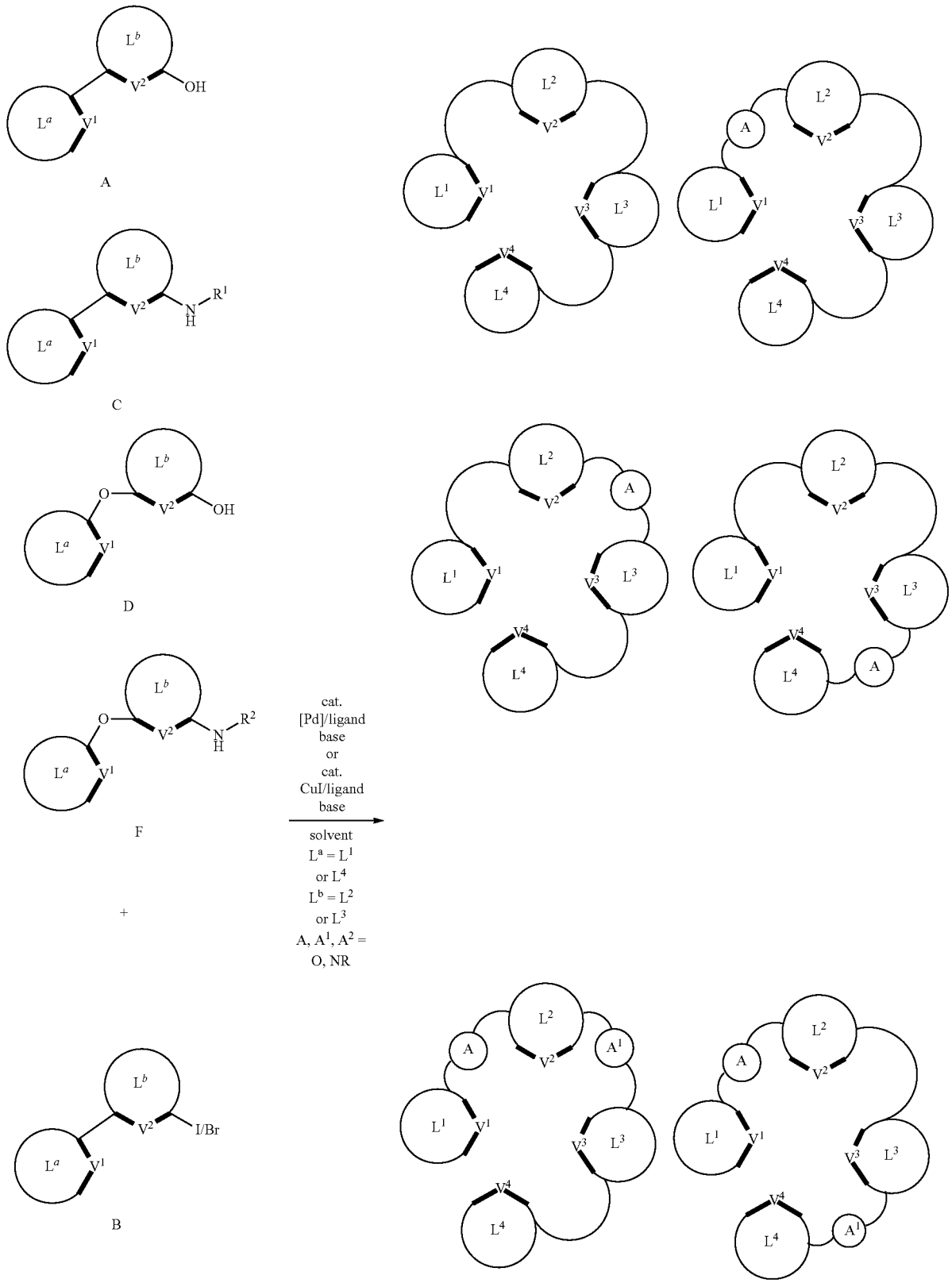

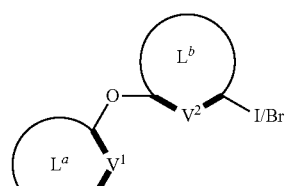

E

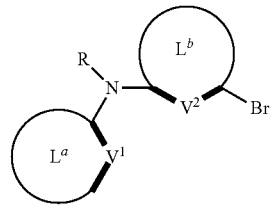

G

In another aspect, the disclosed compounds can be made by a synthesis comprising one or more of the following reactions or steps:

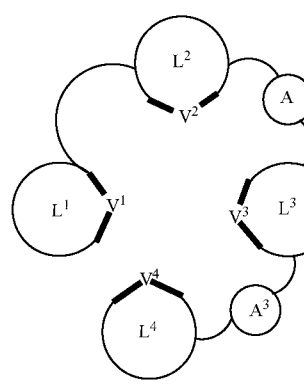

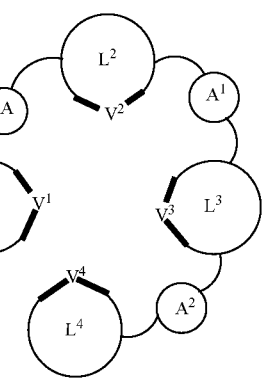

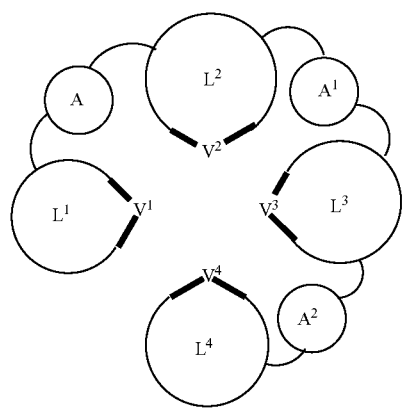

K$_2$PtCl$_4$
cat. $^n$Bu$_4$NBr
───────────────→
AcOH, rt, then
108–115° C.
under N$_2$ or Ar -continued

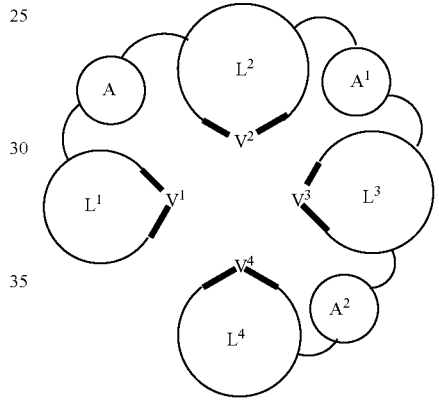

Pd(OAc)$_2$
cat. $^n$Bu$_4$NBr
───────────────→
AcOH, reflux
under N$_2$ or Ar

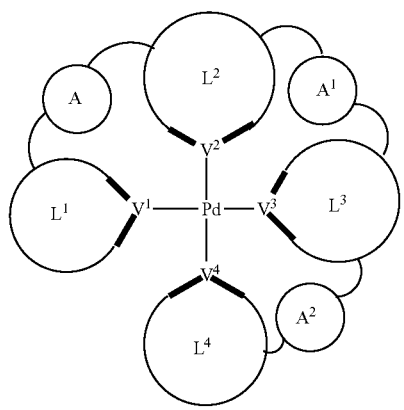

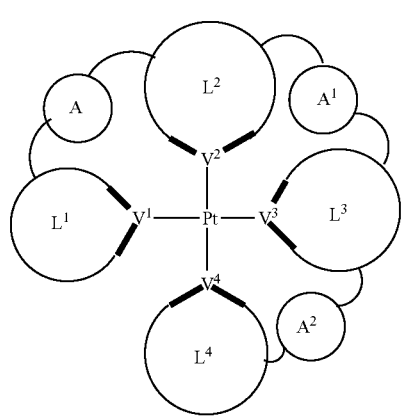

In yet another aspect, some of the disclosed compounds can be made by a synthesis comprising one or more of the following reactions or steps:

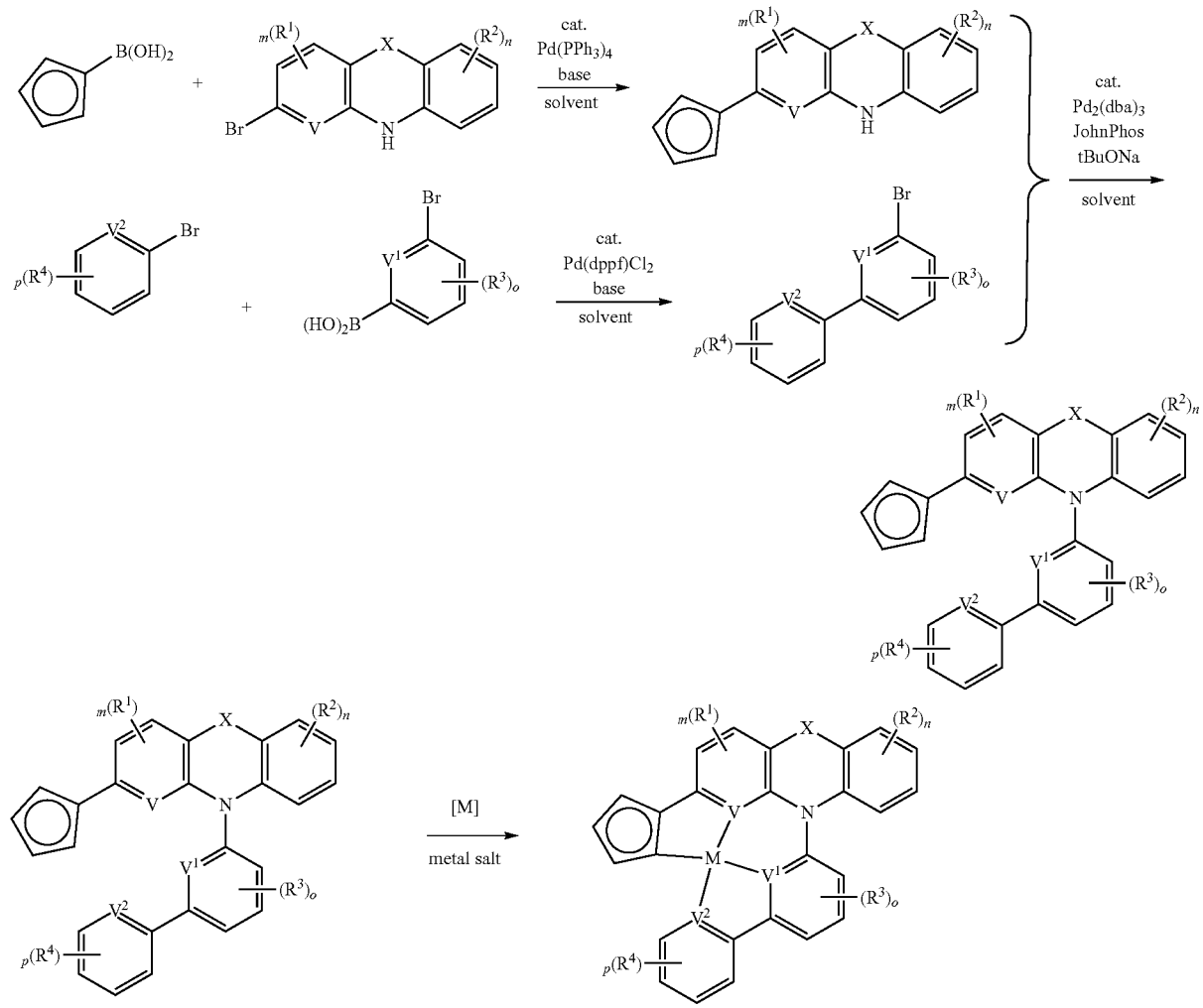
For example, a platinum compound can be made by a reaction comprising one or more of the following reactions or steps:
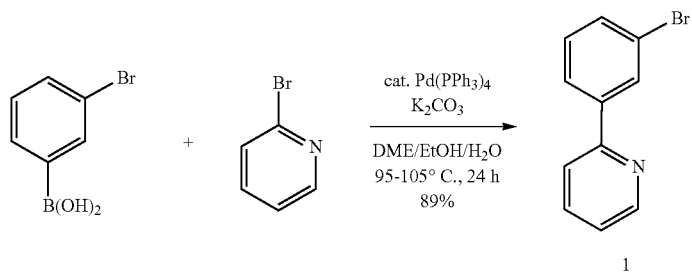
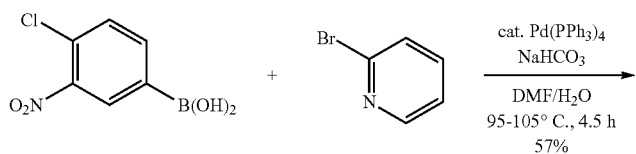

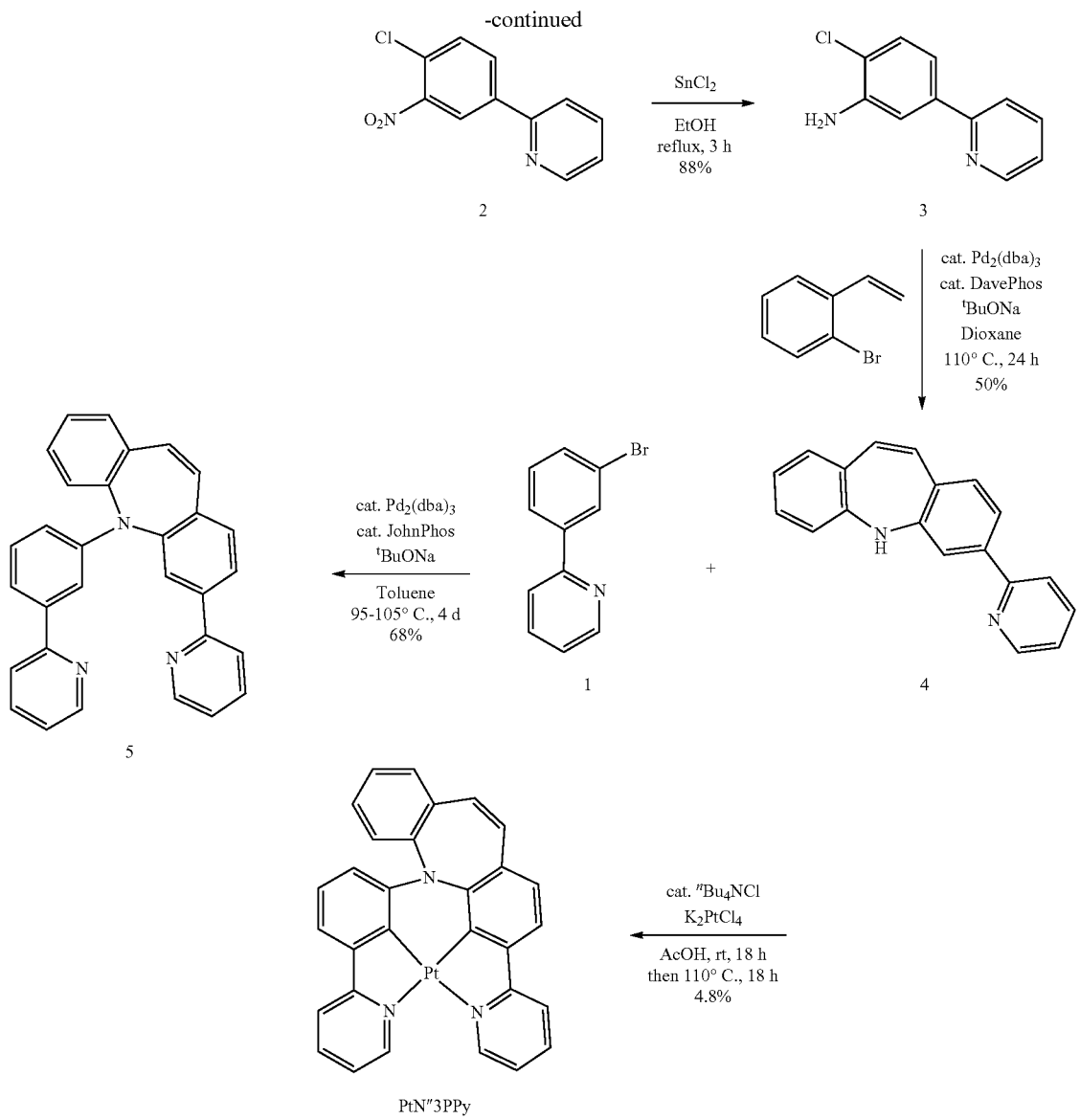

4. Devices

As briefly described above, the present invention is directed to metal compounds. In one aspect, the compounds disclosed herein can be used as host materials for OLED applications, such as full color displays.

The disclosed compounds can be useful in a wide variety of applications, such as, for example, lighting devices. In a particular aspect, one or more of the compounds can be host materials for an organic light emitting display device.

The compounds are useful in a variety of applications. As light emitting materials, the compounds can be useful in organic light emitting diodes (OLED)s, luminescent devices and displays, and other light emitting devices. The device can be a phosphorescent OLED device. The device can also be a fluorescent OLED device.

In one aspect, the device is a photovoltaic device. In another aspect, the device is a luminescent display device. In yet another aspect, the device is a light emitting device.

The energy profile of the compounds can be tuned by varying the structure of the ligand surrounding the metal center. For example, compounds having a ligand with electron withdrawing substituents will generally exhibit different properties, than compounds having a ligand with electron donating substituents. Generally, a chemical structural change affects the electronic structure of the compound, which thereby affects the electrical transport and transfer functions of the material. Thus, the compounds of the present invention can be tailored or tuned to a specific application that desires an energy or transport characteristic.

In another aspect, the disclosed compounds can provide improved efficiency and/or operational lifetimes in lighting devices, such as, for example, organic light emitting devices, as compared to conventional materials.

In other various aspects, the disclosed compounds can be useful as, for example, host materials for organic light emitting diodes, lighting applications, and combinations thereof.

In one embodiment, the compounds can be used in an OLED. FIG. 1 shows a cross-sectional view of an OLED 100, which includes substrate 102 with an anode 104, which is typically a transparent material, such as indium tin oxide, a layer of hole-transporting material(s) (HTL) 106, a layer of light processing material 108, such as an emissive material (EML) including an emitter and a host, a layer of electron-transporting material(s) (ETL) 110, and a metal cathode layer 112.

In one aspect, a light emitting device, such as, for example, an OLED, can comprise one or more layers. In various aspects, any of the one or more layers can comprise indium tin oxide (ITO), poly(3,4-ethylenedioxythiophene) (PEDOT), polystyrene sulfonate (PSS), N,N'-di-1-naphthyl-N,N'-diphenyl-1,1'-biphenyl-4,4'diamine (NPD), 1,1-bis ((di-4-tolylamino)phenyl) cyclohexane (TAPC), 2,6-Bis(N-carbazolyl)pyridine (mCpy), 2,8-bis(diphenylphosphoryl) dibenzothiophene (PO15), LiF, Al, or a combination thereof.

In this embodiment, the layer of light processing material 108 can comprise one or more of the disclosed compounds optionally together with a host material. The host material can be any suitable host material known in the art. The emission color of an OLED is determined by the emission energy (optical energy gap) of the light processing material 108, which as discussed above can be tuned by tuning the electronic structure of the emitting compounds and/or the host material. Both the hole-transporting material in the HTL layer 106 and the electron-transporting material(s) in the ETL layer 110 can comprise any suitable hole-transporter known in the art. A selection of which is well within the purview of those skilled in the art.

It will be apparent that the compounds of the present invention can exhibit phosphorescence. Phosphorescent OLEDs (i.e., OLEDs with phosphorescent emitters) typically have higher device efficiencies than other OLEDs, such as fluorescent OLEDs. Light emitting devices based on electrophosphorescent emitters are described in more detail in WO2000/070655 to Baldo et al., which is incorporated herein by this reference for its teaching of OLEDs, and in particular phosphorescent OLEDs.

The compounds of the invention can be made using a variety of methods, including, but not limited to those recited in the examples provided herein. In other aspects, one of skill in the art, in possession of this disclosure, could readily determine an appropriate method for the preparation of an iridium complex as recited herein.

Examples

The following examples are put forth so as to provide those of ordinary skill in the art with a complete disclosure and description of how the compounds, compositions, articles, devices and/or methods claimed herein are made and evaluated, and are intended to be purely exemplary of the invention and are not intended to limit the scope of what the inventors regard as their invention. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Hereinafter, the preparation method of the compounds for the displays and lighting applications will be illustrated. However, the following embodiments are only exemplary and do not limit the scope of the present invention. Temperatures, catalysts, concentrations, reactant compositions, and other process conditions can vary, and one of skill in the art, in possession of this disclosure, could readily select appropriate reactants and conditions for a desired complex.

1. Prophetic Synthetic Routes

A general proposed synthetic route for the compounds disclosed herein includes:

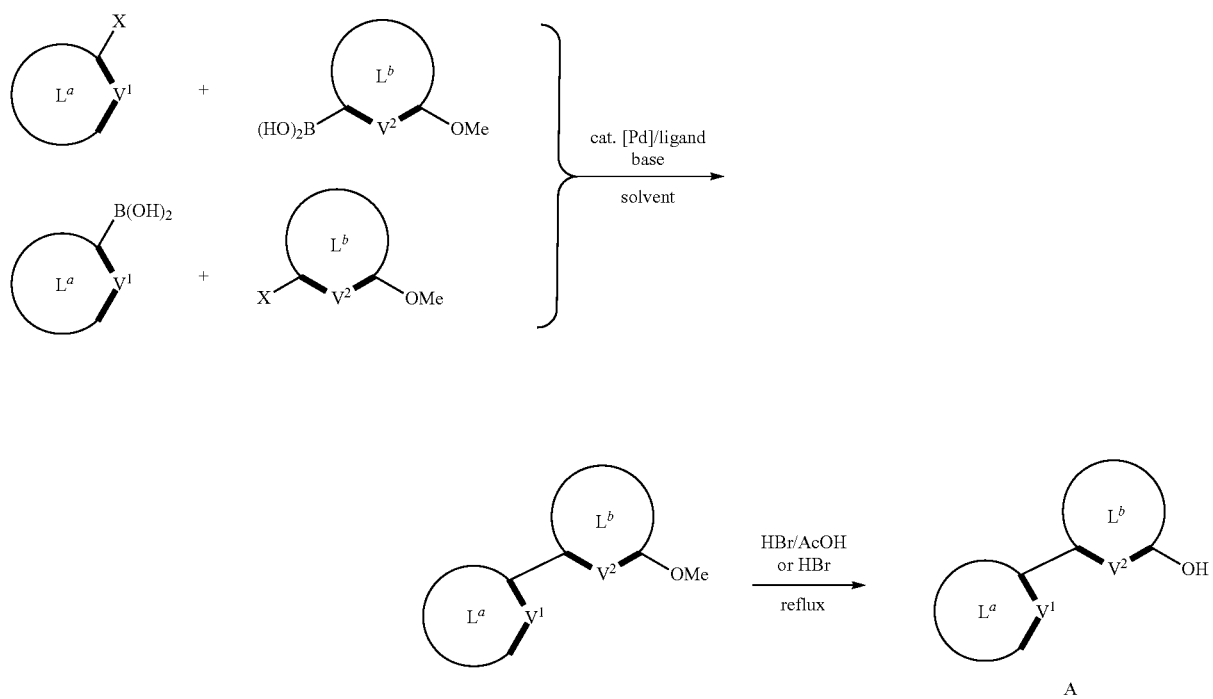

X = I, Br, Cl, OTf
L$^a$ = L$^1$ or L$^4$
L$^b$ = L$^2$ or L$^3$

-continued
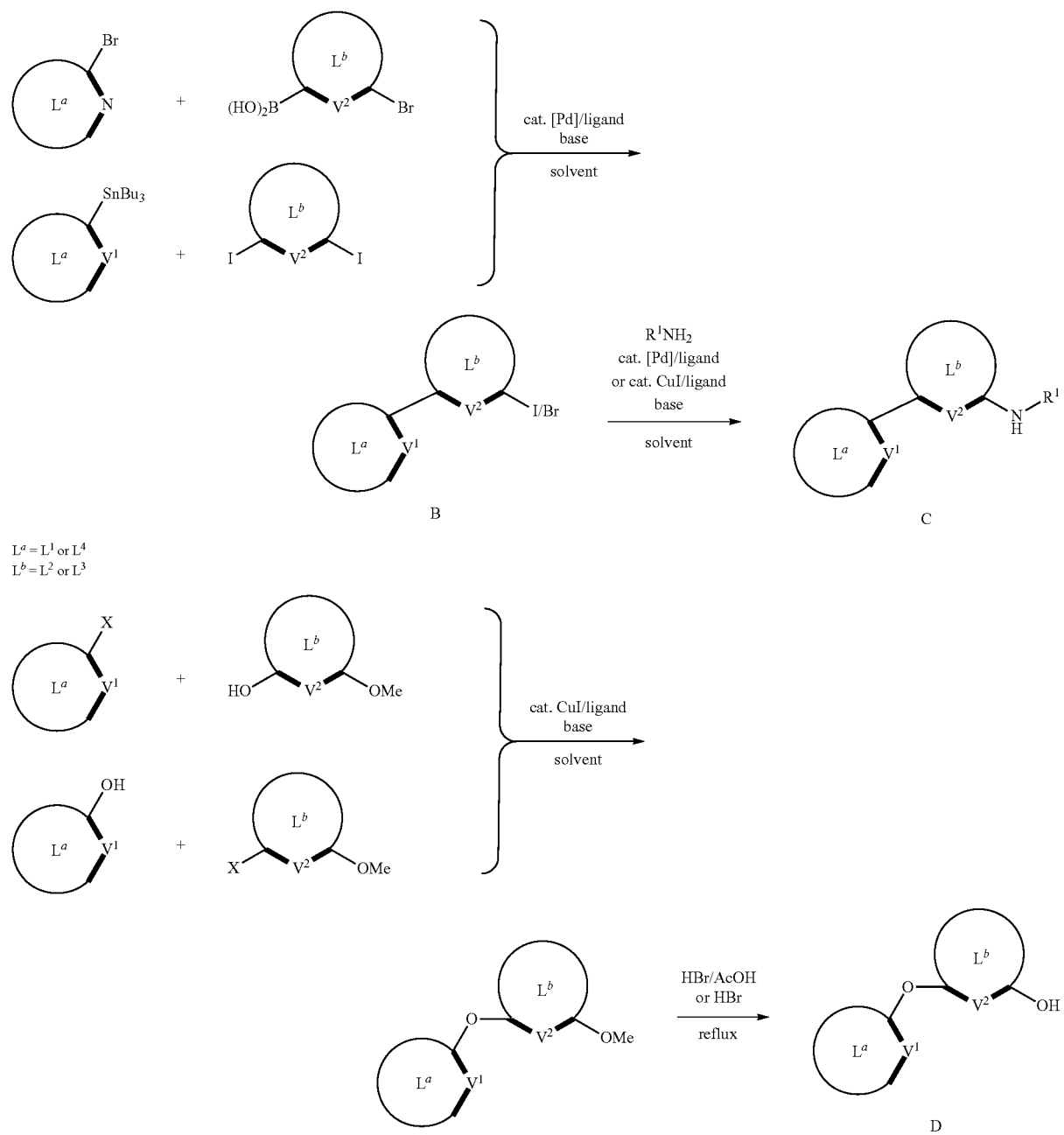
$L^a = L^1$ or $L^4$
$L^b = L^2$ or $L^3$
$X = I, Br$
$L^a = L^1$ or $L^4$
$L^b = L^2$ or $L^3$
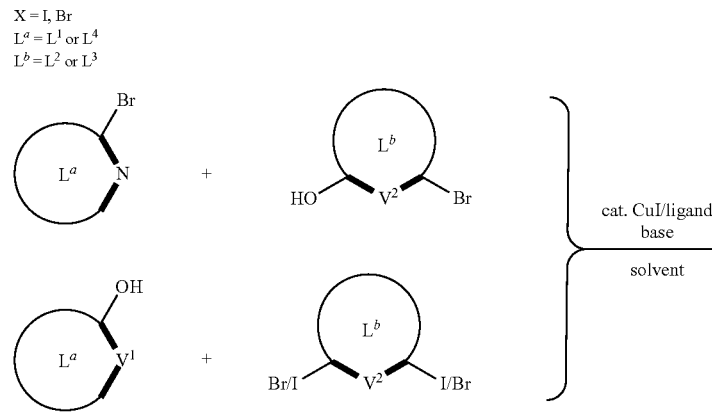

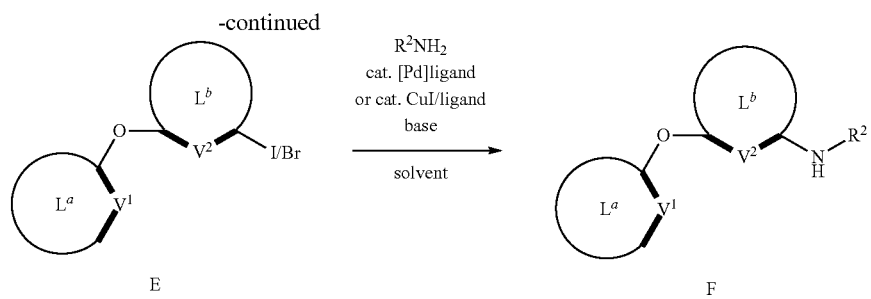
E → F
$L^a = L^1$ or $L^4$
$L^b = L^2$ or $L^3$
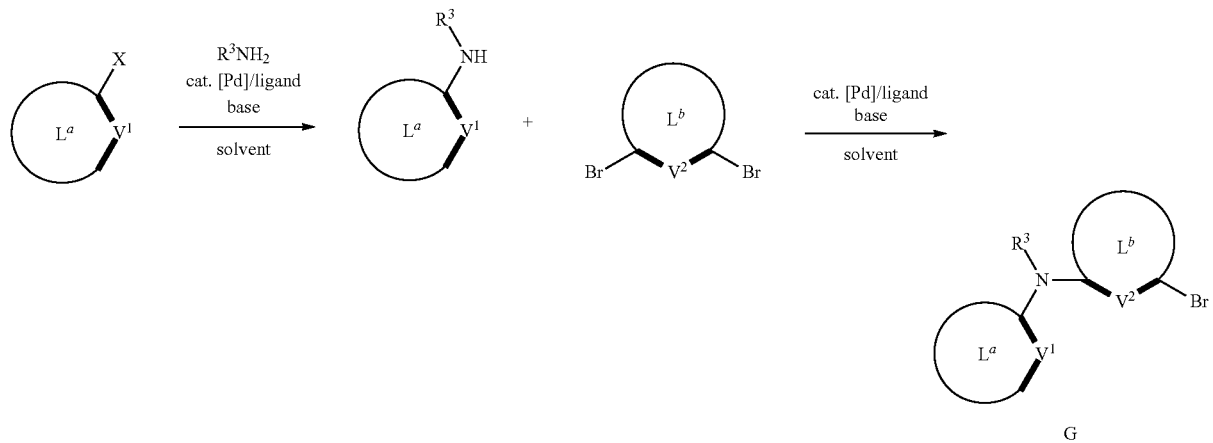
G
$L^a = L^1$ or $L^4$
$L^b = L^2$ or $L^3$
A proposed synthesis for the disclosed compounds herein also includes:
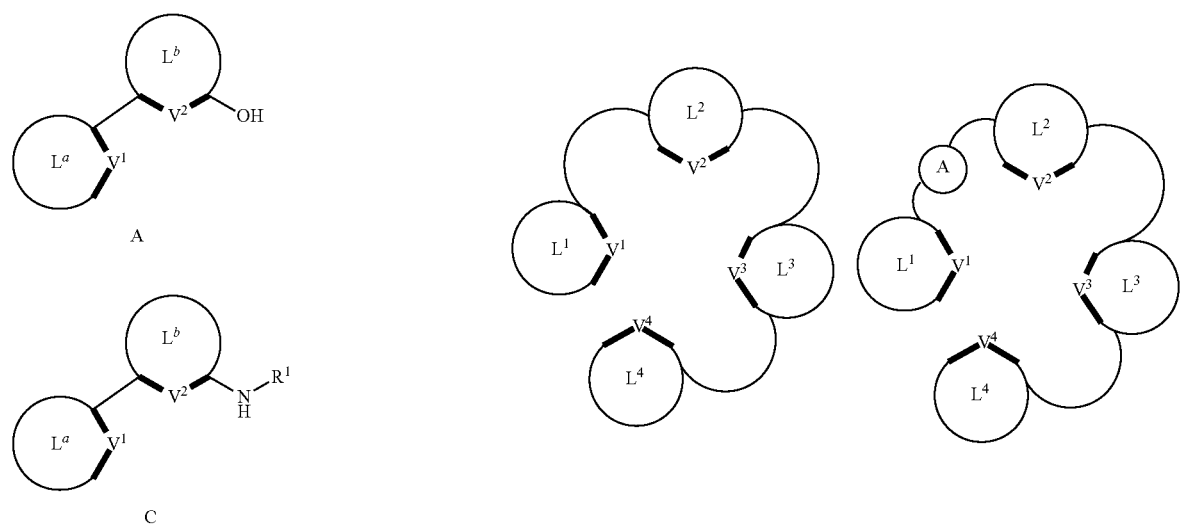

-continued
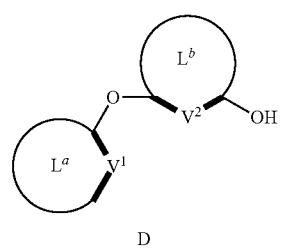
D
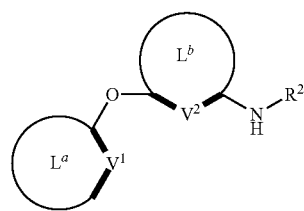
F
+
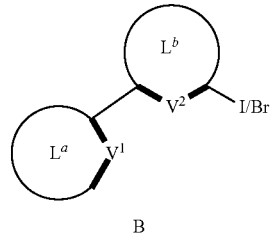
B
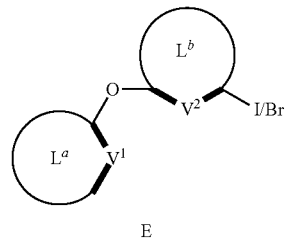
E
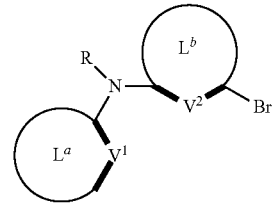
G
cat. [Pd]/ligand
base
or
cat. CuI/ligand
base
solvent
$L^a = L^1$
or $L^4$
$L^b = L^2$
or $L^3$
A, $A^1$, $A^2$ =
O, NR
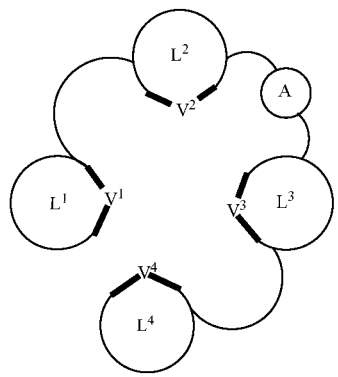
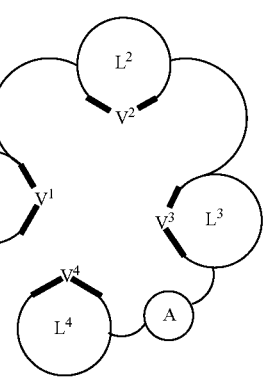
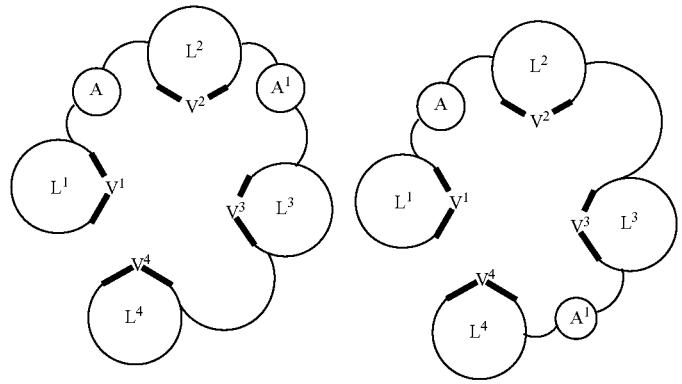
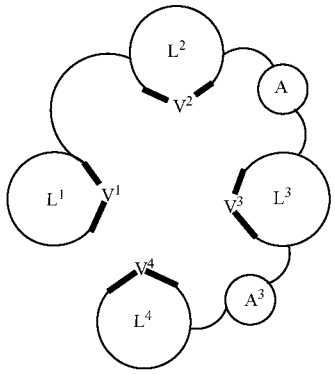
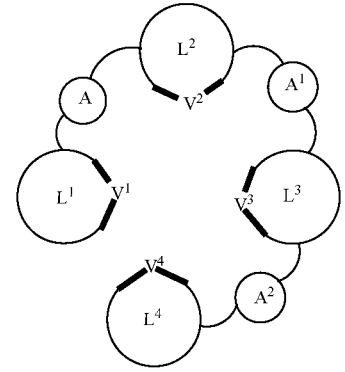

A proposed synthesis for some of the metal compounds, such as platinum or palladium compounds, disclosed herein is.
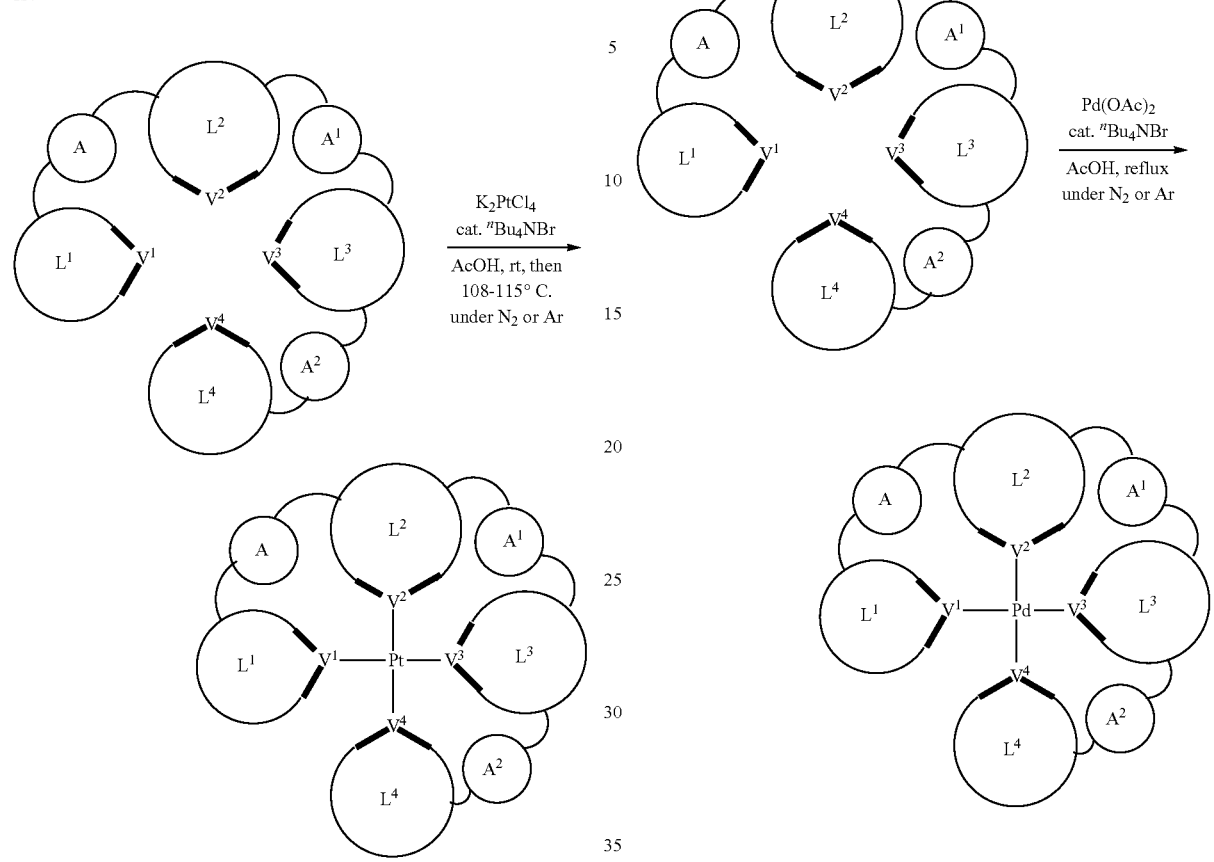
A proposed synthesis for a metal compound is:
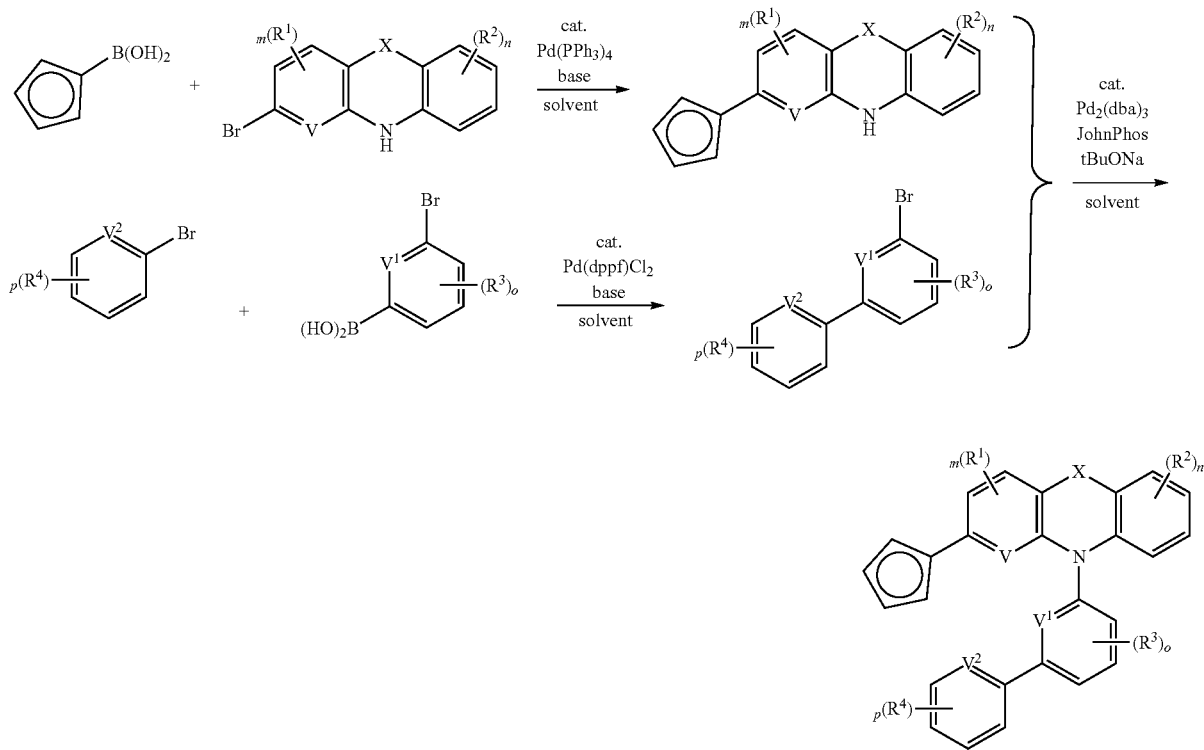

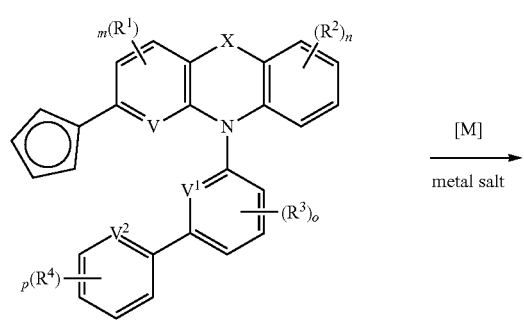
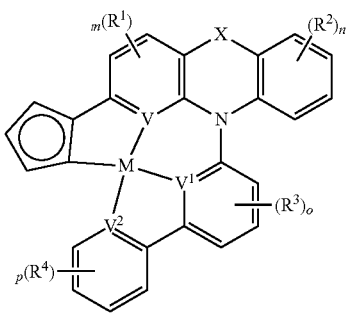
2. Synthesis of PtN3″PPy
Platinum complex PtN3″PPy was prepared according to the following scheme:
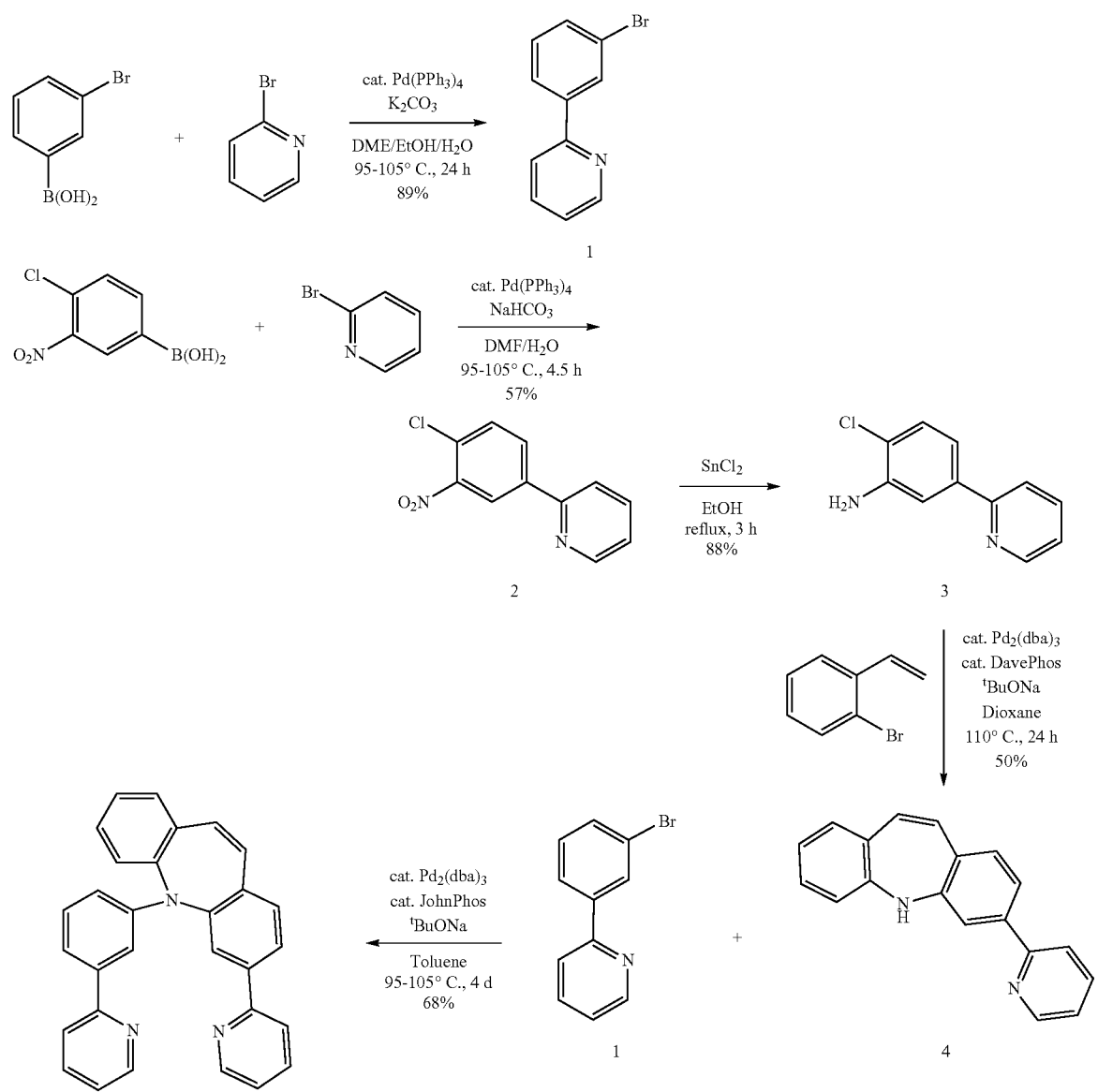

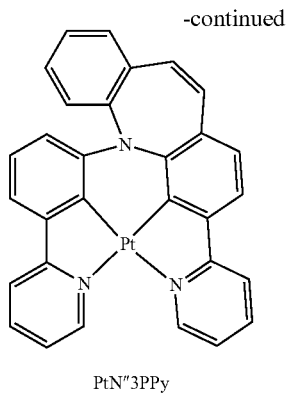

PtN"3PPy cat. $^n$Bu$_4$NCl
K$_2$PtCl$_4$
←
AcOH, rt, 18 h
then 110° C., 18 h
4.8%

Synthesis of 2-(3-bromophenyl)pyridine 1: To a three-necked flask equipped with a magnetic stir bar and a condenser, added 3-bromophenylboronic acid (8033 mg, 40 mmol) and K$_2$CO$_3$ (12.16 g, 88 mmol). The flask was sealed and then evacuated and backfilled with nitrogen. Repeated the evacuation and backfill procedure four additional times. After that solvents DME (100 mL), EtOH (32 mL) and H$_2$O (44 mL) were added independently by syringe. The mixture was bubbled with nitrogen through a needle for 30 minutes. Then 2-bromopyridine (3.89 mL, 40 mmol) and Pd(PPh$_3$)$_4$ (924 mg, 0.8 mmol) were added under the atmosphere of nitrogen. The mixture was heated to reflux (about 95-105° C.) in an oil bath. The reaction was monitored by TLC and about 24 hours later the reaction was completed. Then cooled down to ambient temperature and water was added until the salt dissolved completely. Then the organic layer was separated and the aqueous layer was extracted with ethyl acetate for twice. The combined organic layer was dried over sodium sulfate. Then filtered and washed with ethyl acetate. The filtrate was concentrated under reduced pressure using a rotary evaporator and the residue was purified through column chromatography on silica gel using hexane and ethyl acetate (20:1) as eluent to afford the desired product 2-(3-bromophenyl)pyridine 1 as a colorless liquid 8.33 g in 89% yield. $^1$H NMR (CDCl$_3$, Me$_4$Si, 400 MHz): δ 7.25-7.28 (m, 1H), 7.34 (td, J=8.0, 1.2 Hz, 1H), 7.53-7.56 (m, 1H), 7.71 (dd, J=8.0, 0.8 Hz, 1H), 7.75-7.80 (m, 1H), 7.90-7.93 (m, 1H), 8.18-8.19 (m, 1H), 8.70-8.81 (m, 1H). $^1$H NMR (DMSO-d$_6$, 400 MHz): δ 7.39-7.42 (m, 1H), 7.47 (t, J=8.0 Hz, 1H), 7.65 (dt, J=8.4, 0.8 Hz, 1H), 7.91 (tt, J=7.2, 0.8 Hz, 1H), 8.02-8.04 (m, 1H), 8.09-8.12 (m, 1H), 8.29-8.30 (m, 1H), 8.68-8.70 (m, 1H).

Synthesis of 2-(4-chloro-3-nitrophenyl)pyridine 2: To a three-necked flask equipped with a magnetic stir bar and a condenser, added 4-chloro-3-nitrophenylboronic acid (3968 mg, 19.7 mmol) and NaHCO$_3$ (3310 mg, 39.4 mmol). The flask was sealed and then evacuated and backfilled with nitrogen. Repeated the evacuation and backfill procedure four additional times. After that solvents DMF (40 mL) and H$_2$O (20 mL) were added independently by syringe. The mixture was bubbled with nitrogen through a needle for 30 minutes. Then 2-bromopyridine (3.11 mL, 21.7 mmol) and Pd(PPh$_3$)$_4$ (1138 mg, 0.99 mmol) were added under the atmosphere of nitrogen. The mixture was heated to reflux (about 95-105° C.) in an oil bath. The reaction was monitored by TLC and after about 4.5 hours the reaction was completed. Then cooled down to ambient temperature and water was added. Then the mixture was filtered and washed with ethyl acetate. The organic layer of the filtrate was separated and the aqueous layer was extracted with ethyl acetate for twice. The combined organic layer was dried over sodium sulfate. Then filtered and washed with ethyl acetate. The filtrate was concentrated under reduced pressure using a rotary evaporator and the residue was purified through column chromatography on silica gel using hexane and ethyl acetate (20:1-15:1-10:1-5:1) as eluent to afford the desired product 2-(4-chloro-3-nitrophenyl)pyridine 2 as a grey solid 2.65 g in 57% yield. $^1$H NMR (DMSO-d$_6$, 400 MHz): δ 7.47-7.50 (m, 1H), 7.92 (d, J=8.4 Hz, 1H), 7.99 (td, J=7.6, 0.8 Hz, 1H), 8.16 (d, J=8.0 Hz, 1H), 8.44 (dd, J=8.0, 0.8 Hz, 1H), 8.74-8.75 (m, 1H), 8.77 (d, J=2.0 Hz, 1H).

Synthesis of 2-chloro-5-(pyridin-2-yl)benzenamine 3: To a single-necked flask equipped with a magnetic stir bar, added 2-(4-chloro-3-nitrophenyl)pyridine 2 (2.65 g, 11.29 mmol) and SnCl$_2$ (21.41 g, 112.90 mmol). Then a condenser was equipped and the system was evacuated and backfilled with nitrogen. Repeated the evacuation and backfill procedure twice additional times. After that solvent EtOH (150 mL) was added under the atmosphere of nitrogen. The mixture was heated to 60-70° C. in an oil bath. The reaction was monitored by TLC and after about 3 hours the reaction was completed. Then cooled down to ambient temperature and quenched with water. Then the pH of the mixture was adjusted to 9-10 using 1 N NaOH aqueous solution. Filtered and washed with ethyl acetate. The organic layer of the filtrate was separated and the aqueous layer was extracted with ethyl acetate for three times. The combined organic layer was dried over sodium sulfate. Then filtered and washed with ethyl acetate. The filtrate was concentrated under reduced pressure using a rotary evaporator and the residue was purified through column chromatography on silica gel using hexane and ethyl acetate (5:1-3:1-2:1) as eluent to afford the desired product 2-chloro-5-(pyridin-2-yl)benzenamine 3 as a colorless liquid 2.03 g in 88% yield. $^1$H NMR (DMSO-d$_6$, 400 MHz): δ 5.48 (bs, 2H), 7.23 (dd, J=8.0, 2.0 Hz, 1H), 7.29 (d, J=8.0 Hz, 1H), 7.33-7.36 (m, 1H), 7.60 (d, J=2.0 Hz, 1H), 7.82-7.89 (m, 2H), 8.63-8.64 (m, 1H).

Synthesis of 3-(pyridin-2-yl)-5H-dibenzo[b,f]azepine 4: To an oven dried pressure vessel equipped with a magnetic stir bar, added Pd$_2$(dba)$_3$ (268 mg, 0.29 mmol), DavePhos (346 mg, 0.88 mmol) and $^t$BuONa (2817 mg, 29.31 mmol). The vessel was evacuated and backfilled with nitrogen. Repeated the evacuation and backfill procedure four additional times. Then a degassed solution of 2-chloro-5-(pyridin-2-yl)benzenamine 3 (2000 mg, 9.77 mmol) and 2-bromostyrene (1.52 mL, 11.72 mmol) in dioxane (20 mL) was added under the atmosphere of nitrogen. The sealed vessel was then placed in a preheated oil bath at a temperature of 110° C. The reaction was stirred and monitored by TLC and after about 24 hours the reaction was completed. Cooled down to ambient temperature and quenched with water. Then diluted with ethyl acetate and stirred for 10 minutes, filtered and washed with ethyl acetate. The organic layer of the filtrate was separated and the aqueous layer was extracted with ethyl acetate for three times. The combined organic layer was dried over sodium sulfate. Then filtered and washed with ethyl acetate. The filtrate was concentrated under reduced pressure using a rotary evaporator and the residue was purified through column chromatography on silica gel using hexane and ethyl acetate (5:1-3:1) as eluent to afford the desired product 3-(pyridin-2-yl)-5H-dibenzo[b,f]azepine 4 as a brown-yellow solid 1.33 g in 50% yield. $^1$H NMR (DMSO-d$_6$, 400 MHz): δ 6.10 (s, 2H), 6.65 (d, J=8.0 Hz, 1H), 6.69 (td, J=7.6, 1.2 Hz, 1H), 6.76 (dd, J=7.6, 1.6 Hz, 1H), 6.85 (d, J=8.0 Hz, 1H), 6.98 (td, J=8.0, 1.6 Hz, 1H), 7.13 (s, 1H), 7.33-7.39 (m, 2H), 7.47 (d, J=1.6 Hz, 1H), 7.82-7.89 (m, 2H), 8.64 (dd, J=4.8, 0.8 Hz, 1H).

Synthesis of 3-(pyridin-2-yl)-5-(3-(pyridin-2-yl)phenyl)-5H-dibenzo[b,f]azepine 5: To an oven dried pressure vessel equipped with a magnetic stir bar, added 3-(pyridin-2-yl)-5H-dibenzo[b,f]azepine 4 (1.33 g, 4.92 mmol), Pd$_2$(dba)$_3$ (180 mg, 0.20 mmol), JohnPhos (118 mg, 0.39 mmol) and $^t$BuONa (756 mg, 7.87 mmol). The vessel was evacuated and backfilled with nitrogen. Repeated the evacuation and backfill procedure four additional times. Then a degassed solution of 2-(3-bromophenyl)pyridine 1 (1728 mg, 7.38 mmol) in toluene (20 mL) was added under the atmosphere of nitrogen. The sealed vessel was then placed in a preheated oil bath at a temperature of 95-105° C. The reaction was stirred and monitored by TLC and after about 4 days the reaction was completed. Cooled down to ambient temperature. The solvent was removed under reduced pressure using a rotary evaporator and the residue was purified through column chromatography on silica gel using hexane and ethyl acetate (5:1-3:1) as eluent to afford the desired ligand 3-(pyridin-2-yl)-5-(3-(pyridin-2-yl)phenyl)-5H-dibenzo[b,f]azepine 5 as a brown solid 1.42 g in 68% yield. $^1$H NMR (DMSO-d$_6$, 400 MHz): δ 6.25 (dd, J=8.0, 2.4 Hz, 1H), 6.97-6.98 (m, 1H), 7.01 (s, 2H), 7.11 (t, J=8.0 Hz, 1H), 7.23-7.27 (m, 1H), 7.29 (d, J=7.6 Hz, 1H), 7.38-7.42 (m, 1H), 7.47-7.51 (m, 1H), 7.61 (s, 1H), 7.63 (s, 1H), 7.65 (dd, J=7.2, 1.6 Hz, 1H), 7.68 (dd, J=7.6, 1.6 Hz, 1H), 7.71 (d, J=8.4 Hz, 1H), 7.78 (td, J=7.6, 2.0 Hz, 1H), 7.92 (td, J=8.0, 1.6 Hz, 1H), 8.11 (d, J=8.0, 1H), 8.20 (dd, J=8.0, 2.0 Hz, 1H), 8.33 (d, J=2.0 Hz, 1H), 8.51 (dd, J=4.8, 0.8 Hz, 1H), 8.71 (dd, J=4.8, 0.8 Hz, 1H).

Synthesis of platinum complex PtN"3PPy: To an oven dried pressure vessel equipped with a magnetic stir bar, ligand 3-(pyridin-2-yl)-5-(3-(pyridin-2-yl)phenyl)-5H-dibenzo[b,f]azepine 5 (84.7 mg, 0.20 mmol), K$_2$PtCl$_4$ (87.2 mg, 0.21 mmol) and $^n$Bu$_4$NCl (5.5 mg, 0.02 mmol). The vessel was taken into a glove box. Then solvent acetic acid (12 mL) was added. The mixture was bubbled with nitrogen for 30 minutes. Then the vessel was sealed and taken out of the glove box and stirred at ambient temperature for 18 hours. After that the mixture was heated in an oil bath at a temperature of 110° C. for another 18 hours. Cooled down to ambient temperature and water (about 24 mL) was added. The precipitate was collected through filter and washed with water for three times. The precipitate was dried in air and purified through column chromatography on silica gel using dichloromethane as eluent to obtain a crude product which was further purified by recrystallization in dichloromethane and ether at refrigerator to get the desired platinum complex PtN"3PPy as a brown-yellow solid 5.9 mg in 4.8% yield. $^1$H NMR (DMSO-d$_6$, 400 MHz): δ 6.43 (d, J=8.0 Hz, 1H), 6.75 (d, J=8.4 Hz, 1H), 6.92 (d, J=7.2 Hz, 1H), 6.98-7.07 (m, 5H), 7.19 (dd, J=7.4, 1.6 Hz, 1H), 7.58-7.63 (m, 3H), 7.67 (d, J=8.0 Hz, 1H), 8.11 (d, J=7.2 Hz, 1H), 8.15 (d, J=7.6 Hz, 1H), 8.21 (d, J=8.0 Hz, 1H), 8.11 (d, J=8.0, 1H), 8.25 (d, J=7.6 Hz, 1H), 9.15 (d, J=5.2 Hz, 1H), 8.17 (d, J=5.2 Hz, 1H); HRMS (MALDI/DHB) for C$_{30}$H$_{20}$N$_3$Pt [M+H]$^+$: calcd 617.13, found 617.33.

3. Synthesis of PtN"3N

Platinum complex PtN"3N can be prepared according to the following scheme:

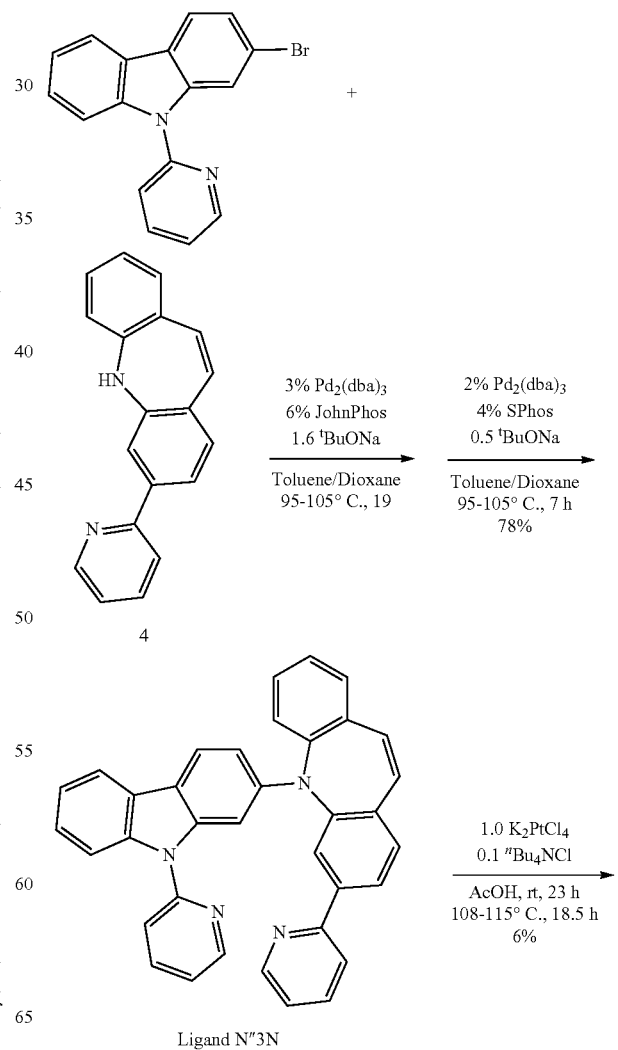

Ligand N"3N

-continued

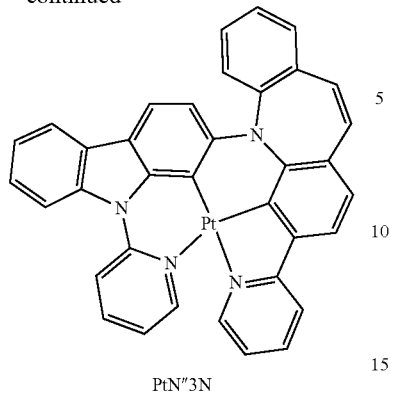

PtN"3N

Synthesis of 3-(pyridin-2-yl)-5-(9-(pyridin-2-yl)-9H-carbazol-2-yl)-5H-dibenzo[b,f]azepine Ligand N"3N: To a dry Schlenk tube equipped with a magnetic stir bar, added of 3-(pyridin-2-yl)-5H-dibenzo[b,f]azepine 4 (92 mg, 0.34 mmol, 1.0 eq), 2-bromo-9-(pyridin-2-yl)-9H-carbazole (132 mg, 0.41 mmol, 1.2 eq), $Pd_2(dba)_3$ (9 mg, 0.010 mmol, 0.03 eq), JohnPhos (6 mg, 0.020 mmol, 0.06 eq) and 'BuONa (52 mg, 0.54 mmol, 1.6 eq). The tube was evacuated and back-filled with nitrogen and this evacuation/back-fill procedure was repeated for another twice. Then dry solvents toluene (4 mL) and dioxane (3 mL) were added under the atmosphere of nitrogen, the tube was then sealed quickly. And then the mixture was stirred in an oil bath at a temperature of 95-105° C. The reaction was monitored by TLC. 19 hours later, much of the starting material 4 was not consumed. So more $Pd_2(dba)_3$ (6 mg, 0.0067 mmol, 0.02 eq), and SPhos (5.6 mg, 0.0134 mmol, 0.04 eq), 'BuONa (16 mg, 0.21 mmol, 0.5 eq) were added. The mixture was stirred in an oil bath at a temperature of 95-105° C. for another 7 hours, cooled down to ambient temperature. The mixture was concentrated and the residue was purified through column chromatography on silica gel using hexane/ethyl acetate (20:1-10:1-5:1-3:1)) as eluent to obtain the desired product Ligand N"3N as a brown solid 135 mg in 78% yield. $^1$H NMR (DMSO-$d_6$, 400 MHz): δ 6.26 (dd, J=8.4, 2.4 Hz, 1H), 6.73 (d, J=1.6 Hz, 1H), 6.98 (s, 2H), 7.21 (t, J=7.6 Hz, 1H), 7.26-7.31 (m, 2H), 7.41-7.52 (m, 3H), 7.60-7.70 (m, 5H), 7.79-7.83 (m, 2H), 7.93-7.97 (m, 2H), 8.11 (d, J=7.2 Hz, 1H), 8.18 (dd, J=7.6, 2.4 Hz, 1H), 8.36 (d, J=1.6 Hz, 1H), 8.40 (dd, J=4.8, 2.0 Hz, 1H), 8.72-8.73 (m, 1H).

Synthesis of 3-(pyridin-2-yl)-5-(9-(pyridin-2-yl)-9H-carbazol-2-yl)-5H-dibenzo[b,f]azepine platinum complex PtN"3N: To a dry pressure tube equipped with a magnetic stir bar, added 3-(pyridin-2-yl)-5-(9-(pyridin-2-yl)-9H-carbazol-2-yl)-5H-dibenzo[b,f]azepine Ligand N3"N (51 mg, 0.1 mmol, 1.0 eq), $K_2PtCl_4$ (42 mg, 0.1 mmol, 1.0 eq) and "$Bu_4NCl$ (2.8 mg, 0.01 mmol, 0.1 eq). Then the tube was taken into a glove box. Solvent acetic acid (6 mL) was added. The mixture was bubbled with nitrogen for 30 minutes and then the tube was sealed. The tube was taken out of the glove box and the mixture was stirred in an oil bath at a temperature of 108-115° C. for 18.5 hours. Then the mixture was cooled down to ambient temperature and water (12 mL) was added slowly. The precipitate was filtered off and washed with water for three times. Then the solid was dried in air under reduced pressure. The collected solid was purified through column chromatography on silica gel using dichloromethane/hexane (1:1) as eluent to obtain the desired product PtN"3N 4.5 mg in 6% yield.

What is claimed is:
1. A compound having the formula

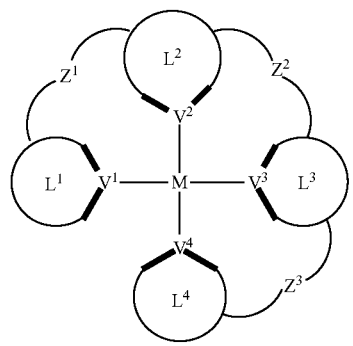

wherein each of $L^1$, $L^2$, $L^3$, and $L^4$ independently is a substituted or unsubstituted aryl, cycloalkyl, cycloalkenyl, heterocyclyl, heteroaryl, carbene, or N-heterocyclic carbene;

$Z^1$, $Z^2$, and $Z^3$ independently is a single bond, A, $A^1$, or $A^2$;

wherein each of A, $A^1$, and $A^2$ independently is O, S, S=O, $SO_2$, Se, $NR^3$, $PR^3$, RP=O, $CR^1R^2$, C=O, $SiR^1R^2$, $GeR^1R^2$, BH, P(O)H, PH, NH, $CR^1H$, $CH_2$, $SiH_2$, $SiHR^1$, or $BR^3$;

wherein M is Pt, Pd, Au, Ir, Rh, Ru, Fe, Co, Ni, Cu, Zn, Ag, Hg, Cd, or Zr;

wherein at least one of $L^1$, $L^2$, $L^3$, or $L^4$ comprises

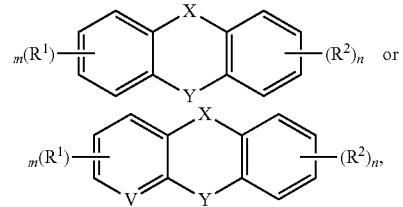

wherein m and n independently is an integer from 0 to 4;

wherein each of V and Y independently is $V^1$, $V^2$, $V^3$, $V^4$, O, S, S=O, $SO_2$, Se, N, $NR^3$, $PR^3$, $R^1P$=O, $CR^1R^2$, C=O, $SiR^1R^2$, $GeR^1R^2$, BH, P(O)H, PH, NH, $CR^1H$, $CH_2$, $SiH_2$, $SiHR^1$, or $BR^3$, wherein X is $BR^3$;

wherein at least one of V or Y is $V^1$, $V^2$, $V^3$, or $V^4$;

wherein each of $V^1$, $V^2$, $V^3$, and $V^4$ independently is coordinated to M;

wherein each of $V^1$, $V^2$, $V^3$, and $V^4$ independently is N, C, CH, P, B, SiH, or Si; provided that at least one of $V^2$ or $V^3$ is C; and wherein each of R, $R^1$, $R^2$, and $R^3$ independently is hydrogen, aryl, cycloalkyl, cycloalkenyl, heterocyclyl, heteroaryl, alkyl, alkenyl, alkynyl, deuterium, halogen, hydroxyl, thiol, nitro, cyano, amino, a mono- or dialkylamino, a mono- or diaryl amino, alkoxy, aryloxy, haloalkyl, aralkyl, ester, nitrile, isonitrile, alkoxycarbonyl, acylamino, alkoxycarbonylamino, aryloxycarbonylamino, sulfonylamino, sulfamoyl, carbamoyl, alkylthio, sulfinyl, ureido, phosphoramide, amercapto, sulfo, carboxyl, hydrazino, substituted silyl, or polymerizable, or any conjugate or combination thereof.

2. The compound of claim 1, wherein one of $Z^1$, $Z^2$, or $Z^3$ is A, $A^1$, or $A^2$ and two of $Z^1$, $Z^2$, and $Z^3$ are a single bond.

3. The compound of claim 1, wherein two of $Z^1$, $Z^2$, and $Z^3$ are A, $A^1$, or $A^2$; and one of $Z^1$, $Z^2$, or $Z^3$ is a single bond.

4. The compound of claim 1, wherein each of $Z^1$, $Z^2$, and $Z^3$ independently is a single bond.

5. The compound of claim 1, wherein the compound has the structure

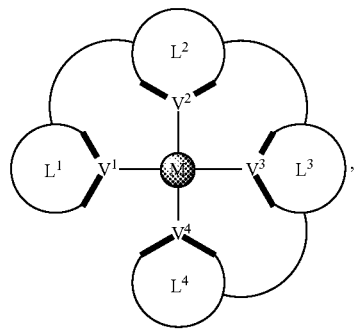,

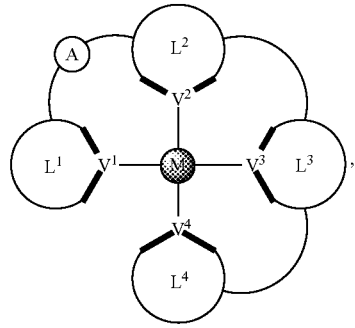,

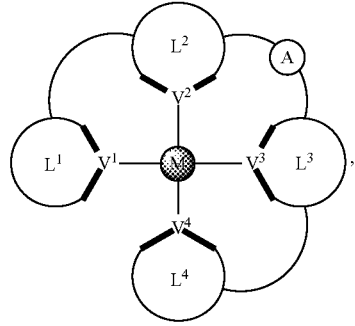,

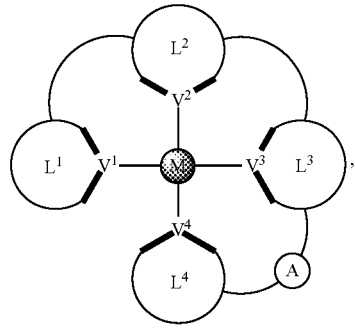,

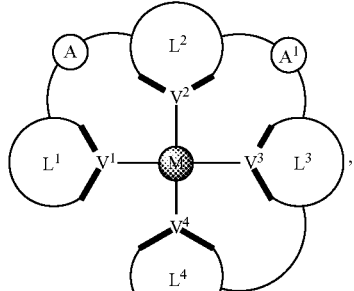,

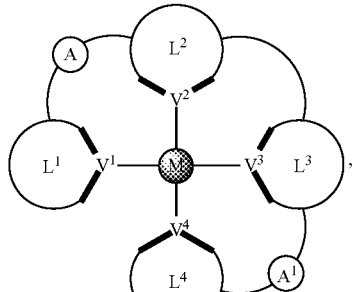,

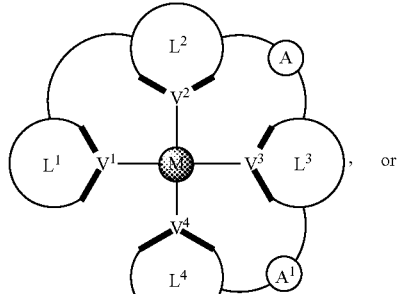, or

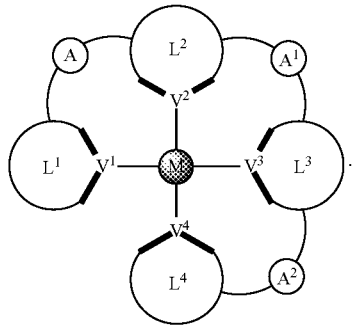.

6. The compound of claim 1, wherein $R^3$ bound to B is aryl, cycloalkyl, cycloalkenyl, heterocyclyl, heteroaryl, alkyl, alkenyl, alkynyl, halogen, hydroxyl, thiol, nitro, cyano, amino, a mono- or di-alkylamino, a mono- or diaryl amino, alkoxy, aryloxy, haloalkyl, aralkyl, ester, nitrile, isonitrile, alkoxycarbonyl, acylamino, alkoxycarbonylamino, aryloxycarbonylamino, sulfonylamino, sulfamoyl, carbamoyl, alkylthio, sulfinyl, ureido, phosphoramide, amercapto, sulfo, carboxyl, hydrzino, substituted silyl, or polymerizable, or any conjugate or combination thereof.

7. The compound of claim 1, wherein at least one of $V^1$, $V^2$, $V^3$, or $V^4$ is N.

8. The compound of claim 1, wherein at least one of $V^1$, $V^2$, $V^3$, or $V^4$ is C.

9. The compound of claim 1, wherein M is Pt or Pd.
10. The compound of claim 1, wherein at least one of $L^1$, $L^2$, $L^3$, or $L^4$, together with $V^1$, $V^2$, $V^3$, and $V^4$, respectively, comprises one or more of the following structures:
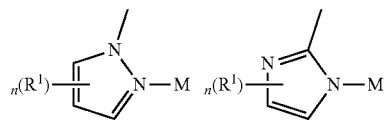
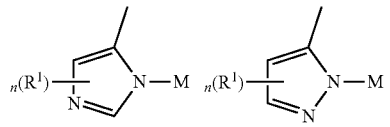
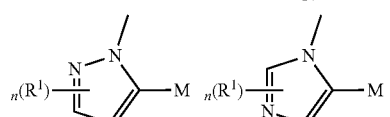
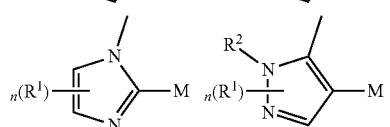
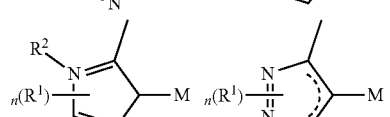
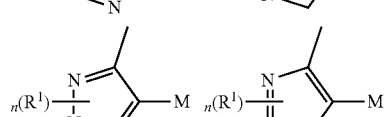
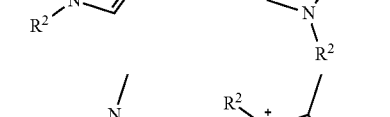
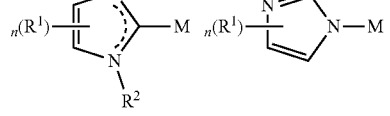
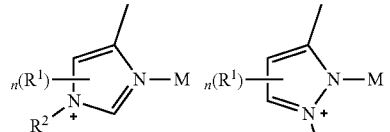
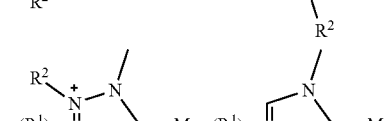
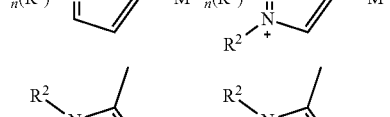
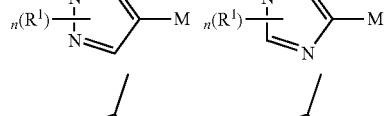
-continued
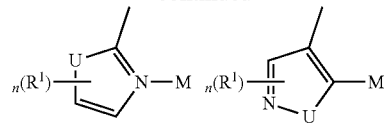
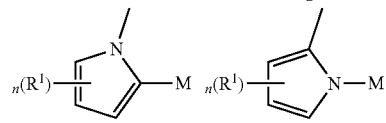
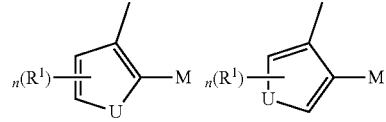
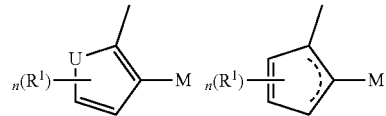
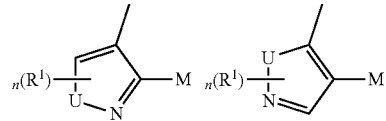
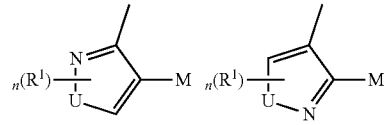
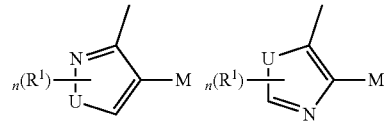
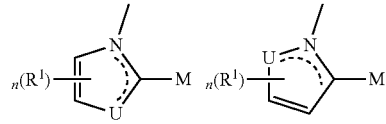
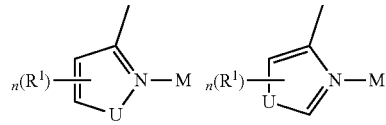
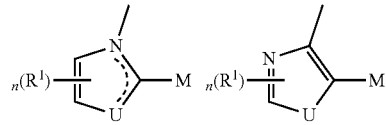
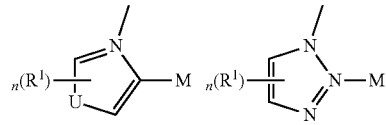
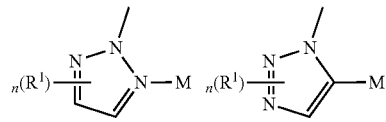
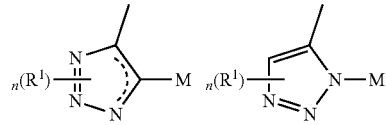
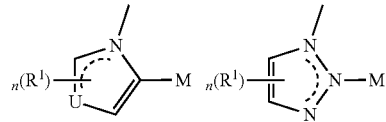

-continued
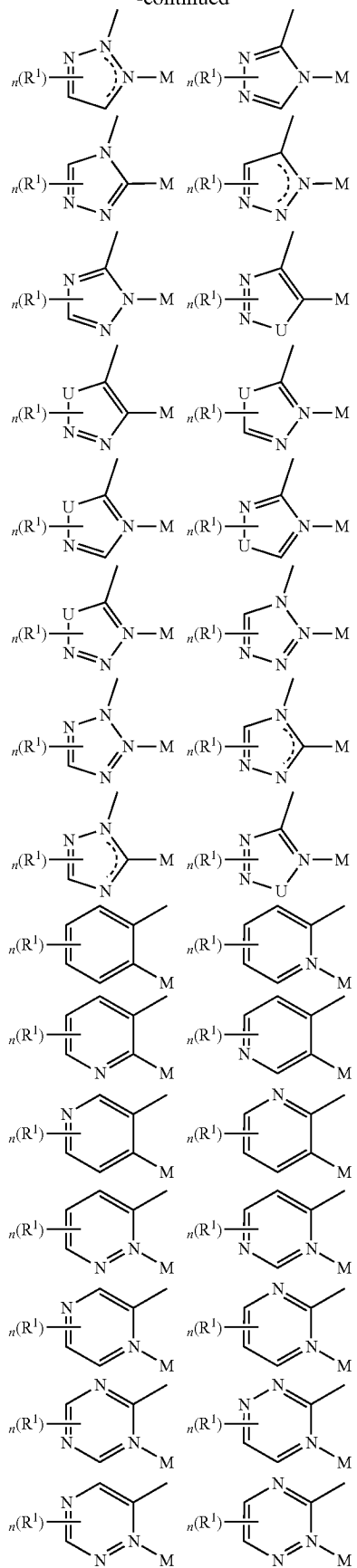
-continued
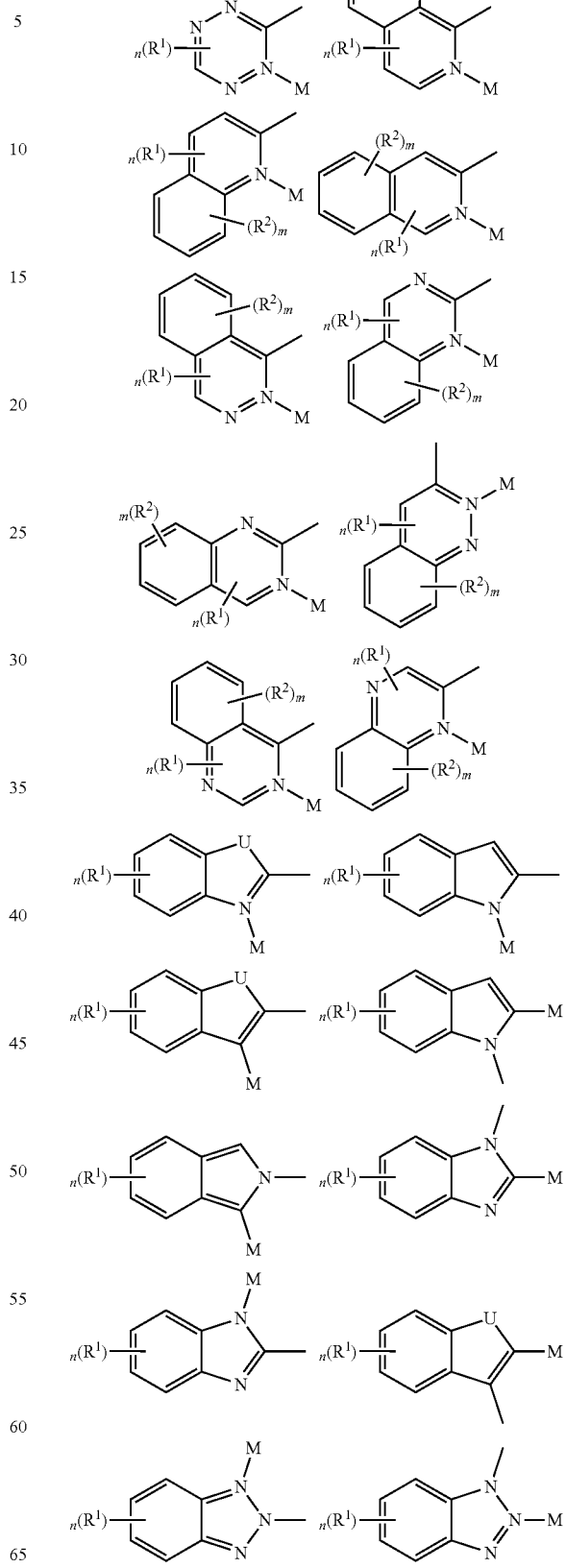

-continued
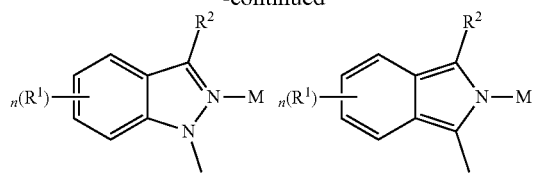
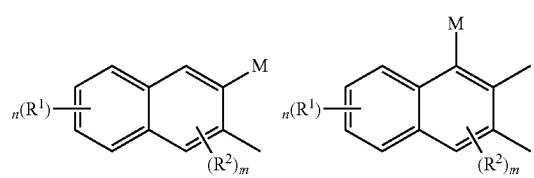
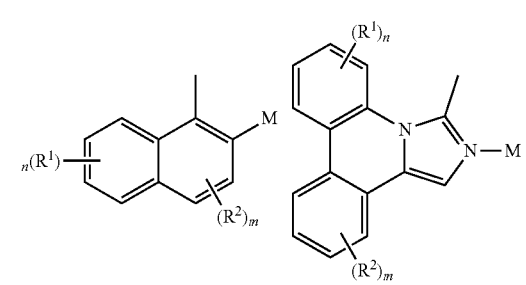
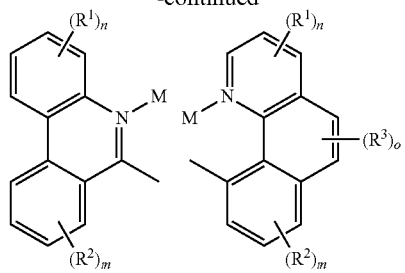
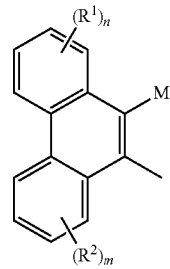
wherein U is independently $V^1$, $V^2$, $V^3$, $V^4$, O, S, S=O, $SO_2$, Se, N, $NR^3$, P, $PR^3$, $R^1P$=O, $CR^1R^2$, C=O, $SiR^1R^2$, $GeR^1R^2$, BH, P(O)H, PH, NH, $CR^1H$, $CH_2$, $SiH_2$, $SiHR^1$, B, BH, or $BR^3$.
11. An organic light emitting device comprising one or more compounds of claim 1.
12. A full color display comprising one or more light emitting devices of claim 11.
* * * * *